(12) United States Patent
Bertin et al.

(10) Patent No.: US 8,319,205 B2
(45) Date of Patent: Nov. 27, 2012

(54) NONVOLATILE NANOTUBE PROGRAMMABLE LOGIC DEVICES AND A NONVOLATILE NANOTUBE FIELD PROGRAMMABLE GATE ARRAY USING SAME

(75) Inventors: Claude L. Bertin, Venice, FL (US); Thomas Rueckes, Rockport, MA (US); H. M. Manning, Eagle, ID (US)

(73) Assignee: Nantero Inc., Woburn, MA (US)

( * ) Notice: Subject to any disclaimer, the term of this patent is extended or adjusted under 35 U.S.C. 154(b) by 98 days.

(21) Appl. No.: 12/536,815

(22) Filed: Aug. 6, 2009

(65) Prior Publication Data

US 2010/0072459 A1 Mar. 25, 2010

Related U.S. Application Data

(60) Provisional application No. 61/088,828, filed on Aug. 14, 2008.

(51) Int. Cl.
*H01L 29/66* (2006.01)

(52) U.S. Cl. .............. 257/24; 257/E29.168; 257/209; 257/213; 977/762; 977/938

(58) Field of Classification Search .......... 257/24, 257/529, 530, 209, E23.147; 385/148, 151; 977/943

See application file for complete search history.

(56) References Cited

U.S. PATENT DOCUMENTS

| | | | |
|---|---|---|---|
| 5,978,256 A | 11/1999 | Sohn et al. | |
| 6,128,214 A | 10/2000 | Kuekes et al. | |
| 6,256,767 B1 | 7/2001 | Kuekes et al. | |
| 6,308,311 B1 | 10/2001 | Carmichael et al. | |
| 6,314,019 B1 | 11/2001 | Kuekes et al. | |
| 6,422,450 B1 | 7/2002 | Zhou et al. | |
| 6,423,583 B1 | 7/2002 | Avouris et al. | |
| 6,445,006 B1 | 9/2002 | Brandes et al. | |
| 6,528,020 B1 | 3/2003 | Dai et al. | |
| 6,548,841 B2 | 4/2003 | Frazier et al. | |
| 6,707,098 B2 | 3/2004 | Hofmann et al. | |
| 6,759,693 B2 | 7/2004 | Vogeli et al. | |
| 6,803,840 B2 | 10/2004 | Hunt et al. | |
| 6,808,746 B1 | 10/2004 | Dai et al. | |
| 6,809,465 B2 | 10/2004 | Jin | |
| 6,888,773 B2 | 5/2005 | Morimoto | |
| 6,890,780 B2 | 5/2005 | Lee | |
| 6,894,359 B2 | 5/2005 | Bradley et al. | |
| 6,899,945 B2 | 5/2005 | Smalley et al. | |
| 6,905,892 B2 | 6/2005 | Esmark et al. | |
| 6,918,284 B2 | 7/2005 | Snow et al. | |

(Continued)

FOREIGN PATENT DOCUMENTS

EP 2 053 108 A1 4/2006

(Continued)

OTHER PUBLICATIONS

International Search Report and Written Opinion mailed for corresponding International Patent Application No. PCT/US2009/052975.

(Continued)

*Primary Examiner* — Mamadou Diallo

(74) *Attorney, Agent, or Firm* — Nantero Inc.

(57) ABSTRACT

Field programmable device (FPD) chips with large logic capacity and field programmability that are in-circuit programmable are described. FPDs use small versatile nonvolatile nanotube switches that enable efficient architectures for dense low power and high performance chip implementations and are compatible with low cost CMOS technologies and simple to integrate.

1 Claim, 105 Drawing Sheets

U.S. PATENT DOCUMENTS

| | | | |
|---|---|---|---|
| 6,919,592 | B2 | 7/2005 | Segal et al. |
| 6,919,740 | B2 | 7/2005 | Snider |
| 6,921,575 | B2 | 7/2005 | Horiuchi et al. |
| 6,990,009 | B2 | 1/2006 | Bertin et al. |
| 7,015,500 | B2 | 3/2006 | Choi et al. |
| 7,115,901 | B2 | 10/2006 | Bertin et al. |
| 7,115,960 | B2 | 10/2006 | Bertin et al. |
| 7,161,403 | B2 | 1/2007 | Bertin |
| 7,667,999 | B2 | 2/2010 | Herner et al. |
| 7,710,157 | B2 | 5/2010 | Bertin et al. |
| 7,982,209 | B2 | 7/2011 | Herner et al. |
| 2001/0023986 | A1 | 9/2001 | Mancevski |
| 2002/0175390 | A1 | 11/2002 | Goldstein et al. |
| 2003/0200521 | A1 | 10/2003 | DeHon et al. |
| 2004/0031975 | A1 | 2/2004 | Kern et al. |
| 2004/0132070 | A1 | 7/2004 | Star et al. |
| 2004/0238887 | A1 | 12/2004 | Nihey |
| 2004/0266106 | A1 | 12/2004 | Lee |
| 2005/0056877 | A1 | 3/2005 | Rueckes et al. |
| 2005/0079659 | A1 | 4/2005 | Duan et al. |
| 2005/0212014 | A1 | 9/2005 | Horibe et al. |
| 2006/0237537 | A1 | 10/2006 | Empedocles et al. |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2007/0020859 | A1 | 1/2007 | Bertin et al. |
| 2007/0115713 | A1 | 5/2007 | Trossen et al. |
| 2007/0146012 | A1 | 6/2007 | Murphy et al. |
| 2008/0012047 | A1 | 1/2008 | Bertin et al. |
| 2008/0017888 | A1 | 1/2008 | Bertin et al. |
| 2008/0079027 | A1 | 4/2008 | Bertin et al. |
| 2008/0099757 | A1 | 5/2008 | Furukawa et al. |
| 2008/0142850 | A1 | 6/2008 | Bertin et al. |
| 2008/0157126 | A1 | 7/2008 | Bertin et al. |
| 2008/0159042 | A1 | 7/2008 | Bertin et al. |
| 2009/0166609 | A1 | 7/2009 | Schricker et al. |
| 2009/0166610 | A1 | 7/2009 | Schricker et al. |
| 2009/0168491 | A1 | 7/2009 | Schricker et al. |
| 2009/0194839 | A1 | 8/2009 | Bertin et al. |
| 2010/0038625 | A1 | 2/2010 | Bertin |
| 2010/0078723 | A1 | 4/2010 | Bertin et al. |
| 2010/0079165 | A1 | 4/2010 | Bertin et al. |
| 2010/0140066 | A1 | 6/2010 | Feng et al. |

FOREIGN PATENT DOCUMENTS

| | | |
|---|---|---|
| GB | 2364933 | 2/2002 |
| WO | WO-00/48195 | 8/2000 |
| WO | WO-01/03208 A1 | 1/2001 |
| WO | WO-2005/001899 A2 | 1/2005 |

OTHER PUBLICATIONS

International Search Report and Written Opinion mailed for corresponding International Patent Application No. PCT/US2009/052977.

Derycke, V., "Controlling Doping and Carrier Injection in Carbon NanotubeTransistors", Applied Physics Letters, 2002. 80 (15) 2773-2775.

Derycke, V., et al., "Carbon Nanotube Inter- and Intramolecular Logic Gates," Nano Letters, Sep. 2001, vol. 1, No. 9, pp. 453-456.

Wind, S. J. et al., "Fabrication and Electrical Characterization of Top Gate Single-Wall Carbon Nanotube Field-Effect Transistors", 14 pages.

Awano, Y., "Graphene for VLSI: FET and Interconnect Applications," IEDM 2009 Technical Digest, pp. 10.1.1-10.1.4.

Brown, K. M., "System in package "The Rebirth of SIP"," 2004 IEEE Custom Integrated Circuits, May 2004, 6 pgs.

Crowley, et al., "512 Mb PROM with 8 layers of antifuse/Diode cells," IEEE International Solid-State Circuits Conference, vol. XLVI, Feb. 2003, pp. 284-285.

Huai, Y., "Spin-Transfet Torque MRAM (STT-MTAM): Challenges and Prospects," AAPS Bulletin, vol. 18, No. 6, Dec. 2008, pp. 33-40.

Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.

Servalli, G., "A 45 nm Generation Phase Change Memory Technology," IEDM 2009 Technical Digest, pp. 5.7.1-5.7.4.

Avouris, "Carbon nanotube electronics", Chemical Physics, vol. 281, pp. 429-445, 2002.

Bachtold, A., et al, "Logic Circuits Based on Carbon Nanotubes," Physica (2003) pp. 42-46.

Chen, J., et al, "Self-aligned Carbon Nanotube Transistors with Charge Transfer Doping," Applied Physics Letters (2005) 86:123108-1-3.

Chen, J., et al, "Self-aligned Carbon Nanotube Transistors with Novel Chemicsl Doping," IEDM (2004) 04:695-698.

Collins, et al., Engineering Carbon Nanotubes and Nanotube Circuits Using Electrical Breakdown, Science, vol. 292, pp. 706-709, Apr. 2001.

International Search Report and Written Opinion mailed for corresponding International Patent Application No. PCT/US2009/052975, (2009).

International Search Report and Written Opinion mailed for corresponding International Patent Application No. PCT/US2009/052977, (2009).

Derycke, V., "Controlling Doping and Carrier Injection in Carbon NanotubeTransistors", Applied Physics Letters, 2002. 80 (15) 2773-2775. cited by other, (2002).

Derycke, V., et al., "Carbon Nanotube Inter- and Intramolecular Logic Gates," Nano Letters, Sep. 2001, vol. 1, No. 9, pp. 453-456.

Dong, C. et al., "3-D nFPGA: A Reconfigurable Architecture for 3-D CMOS/Nanomaterial Hybrid Digital Circuits," IEEE Transactions on Circuits and Systems—I: Regular papers, vol. 54, No. 11, Nov. 2007, pp. 2489-2501.

Duan, X. et al., "Nonvolatile Memory and Programmable Logic from Molecule-Gated Nanowires", Nano Letters, vol. 0, No. 0, pp. A-D, 2002.

Heinze, S. et al., "Carbon Nanotubes as Schottky Barrier Transistsors", Physical Review Letters, vol. 89, No. 10, pp. 16801-1-106801-4, 2002.

Hone, J., "Phonons and Thermal Properties of Carbon Nanotubes", Carbon Nanotubes, Topics Appl. Phys., vol. 80, pp. 273-286, 2001.

Huang, Y., et al, "Logic Gates and Computation from Assembled Nanowire Building Blocks," Science (2001) 294(9):1313-1317.

Javey, A., et al, "Carbon Nanotube Field-Effect Transistors with Integrated Ohmic Contacts and High-κ Gate Dielectrics," Nano Letters (2004) 4(3): 447-450.

Javey, A., et al., "High-κ Dielectrics for Advanced Carbon-Nanotube Transistors and Logic Gates," Nature Materials (2002) 1:241-246.

Javey, A., et al., "Carbon Nanotube Transistor Arrays for Multistage Complementary Logic and Ring Oscillators," Nano Letters, 2002, vol. 2, No. 9, pp. 929-932.

Johnson, R. Colin, "IBM fellow unrolls blueprint for nano", EETimes, Mar. 6, 2006, 3 pages, http://www.eetimes.com/showArticle.jhtml?articleID=181500304.

Kong, J. et al., "Quantum Interference and Ballistic Transmission in Nanotube Electron Waveguides", The American Physical Society, vol. 87, No. 10, pp. 106801-1-106801-4, Sep. 3, 2001.

Langer, L. et al., "Electrical Resistance of a Carbon Nanotube Bundle," J. Mater. Res. vol. 9, No. 4, Apr. 1994, 6 pages.

Lin, Y., et al, "Novel Carbon Nanotube FET Design with Tunable Polarity," IEDM (2004) 4:687-690.

Martel, R., et al, "Carbon Nanotube Field-Effect Transistors and Logic Circuits," DAC 2002, Jun. 10-12, 2002, vol. 7.4, pp. 94-98.

Onoa, G.B. et al., "Bulk production of singly dispersed carbon nanotubes with prescribed lengths," Nanotechnology, vol. 16, pp. 2799-2803, 2005.

Radosavljevic, M. et al., "Nonvolatile Molecular Memory Elements Based on Ambipolar Nanotube Field Effect Transistors", Nano Letters, vol. 2, No. 7, pp. 761-764, 2002.

Rueckes, et al., "Carbon nanotube-based nonvolatile random access memory for molecular computing", *Science*, vol. 289, pp. 94-97, Jul. 7, 2000.

Wind, S. J. et al., "Fabrication and Electrical Characterization of Top Gate Single-Wall Carbon Nanotube Field-Effect Transistors", 14 pages, (2002).

Wind, S., et al, "Vertical Scaling of Carbon Nanotube Field-Effect Transistors Using Top Gate Electrodes," Applied Physics Letters (2002), 80(20):3817-3819.

Cui, J.B. et al., "Carbon nanotube memory devices of high charge storage stability," Applied Physics Letters, vol. 81, No. 17, Oct. 21, 2002, pp. 3260-3262.

Fuhrer, M.S. et al., "High-Mobility Nanotube Transistor Memory," Nano Letters, 2002, vol. 2, No. 7, pp. 755-759.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Novak, J.P. et al., "Nerve agent detection using networks of single-walled carbon nanotubes," Applied Physics Letters, vol. 83, No. 19, Nov. 10, 2003, pp. 4026-4028.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Snow, E.S. et al., "Random networks of carbon nanotubes as an electronic material," Applied Physics Letters, vol. 82, No. 13, Mar. 31, 2003, pp. 2145-2147.

* Trademark of AMD

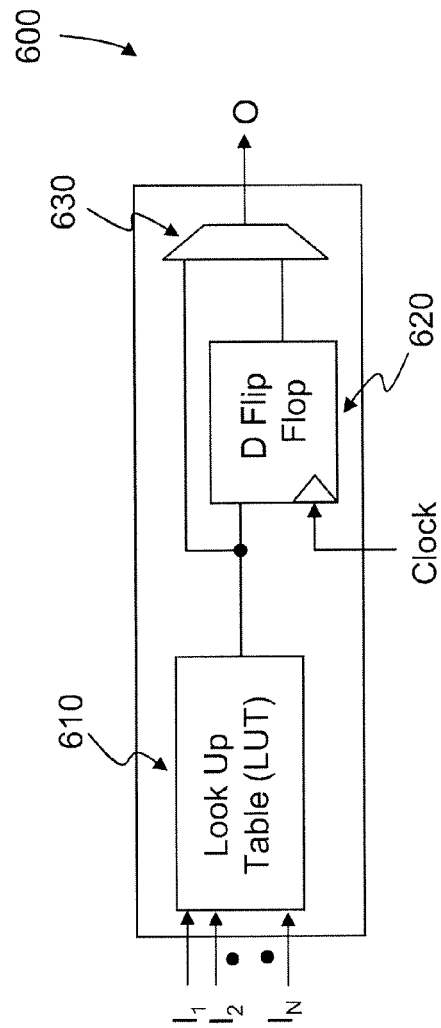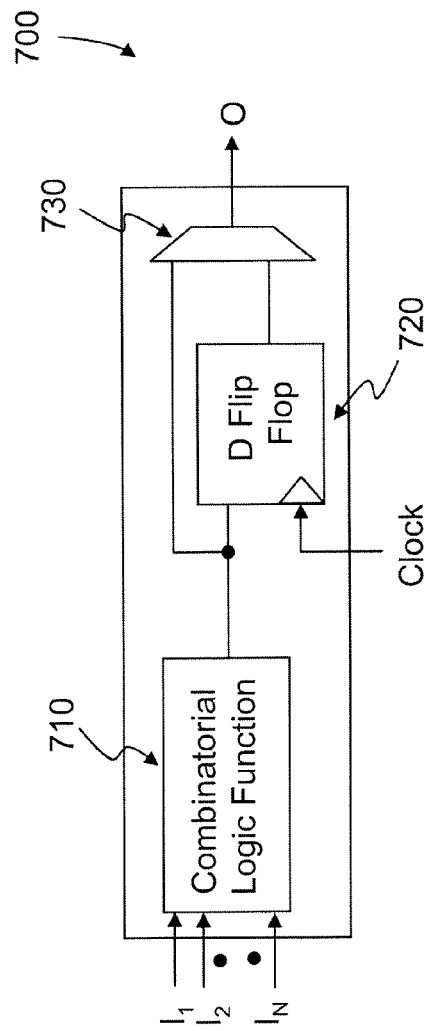
Figure 6
Figure 7

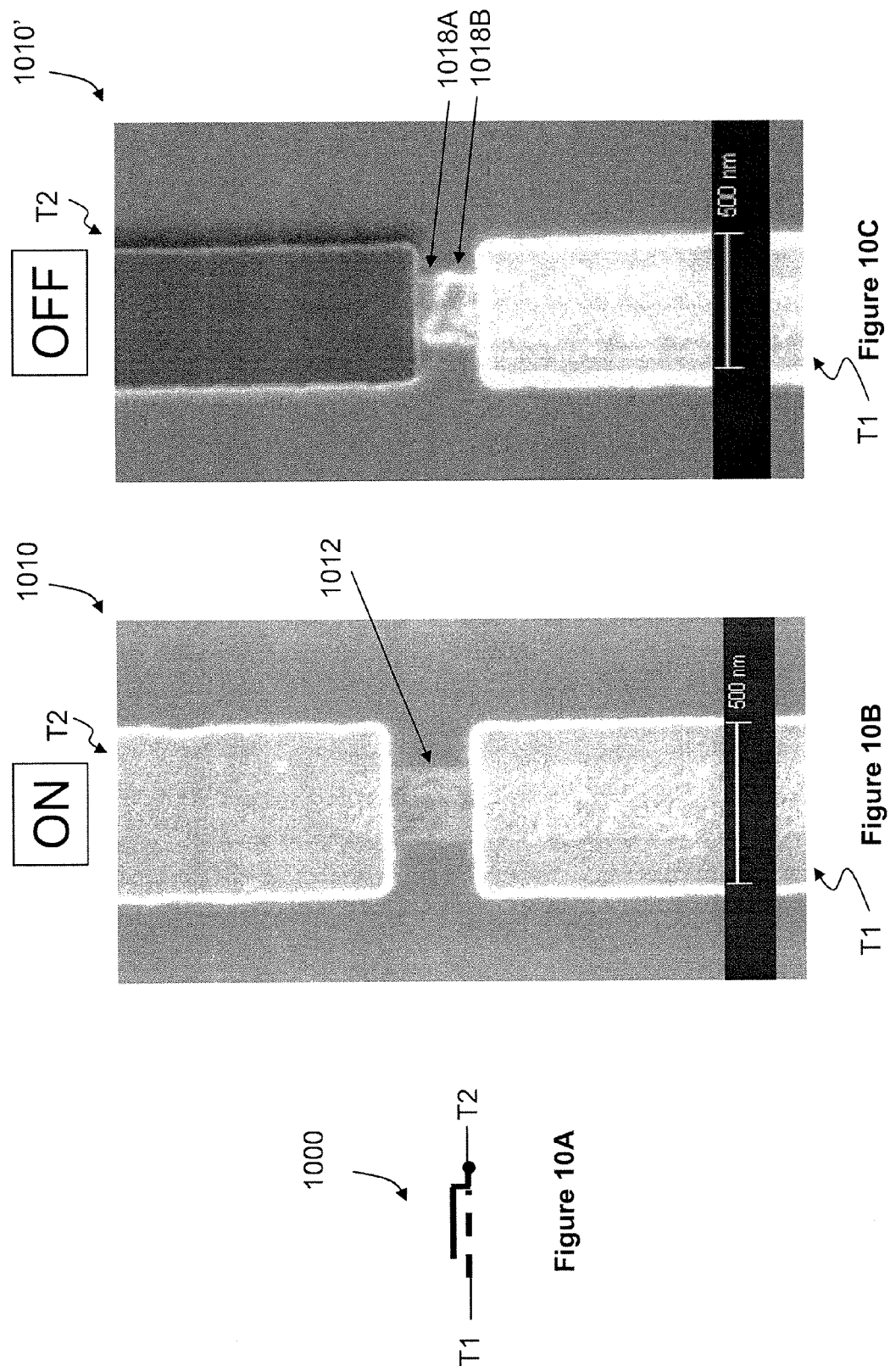

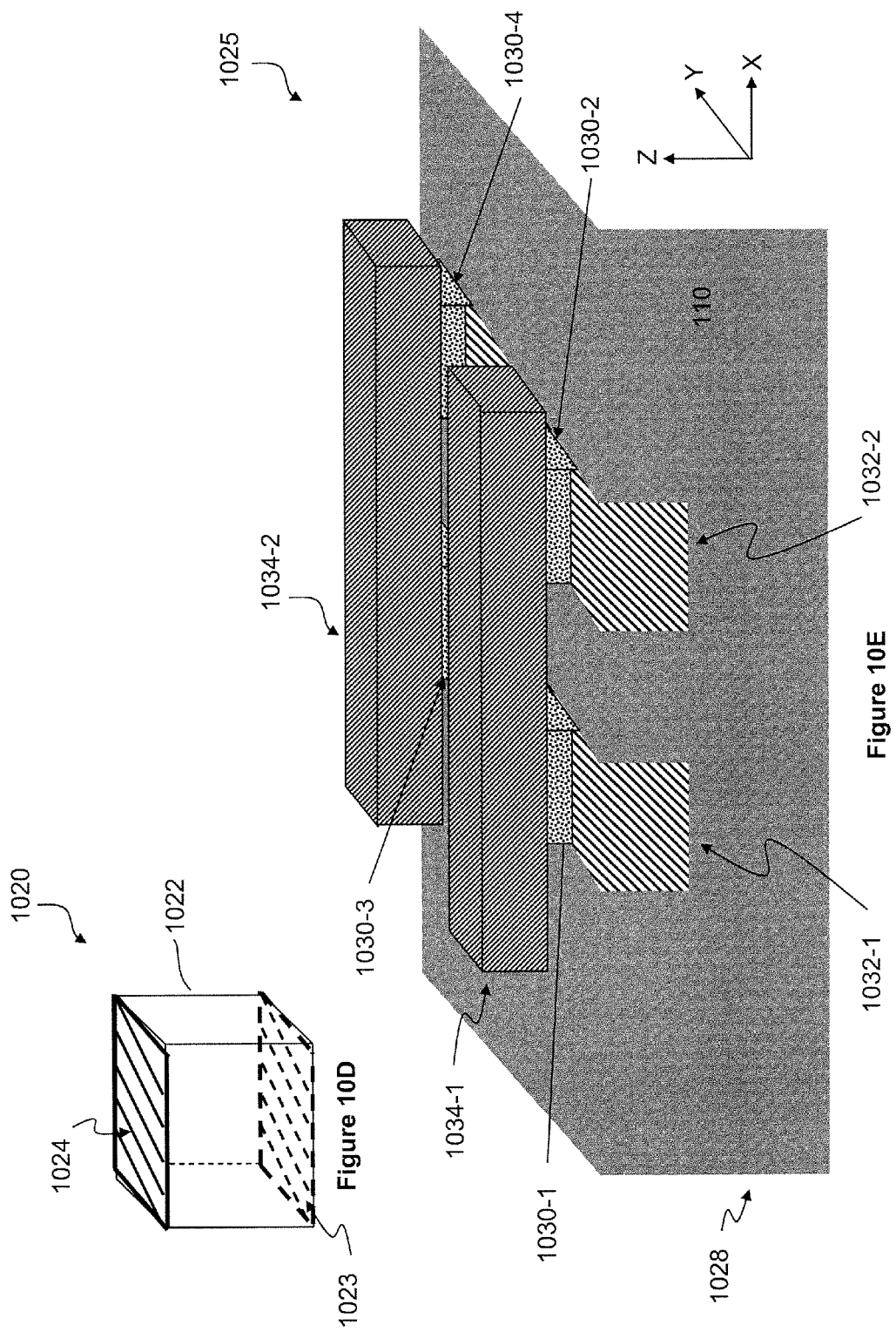

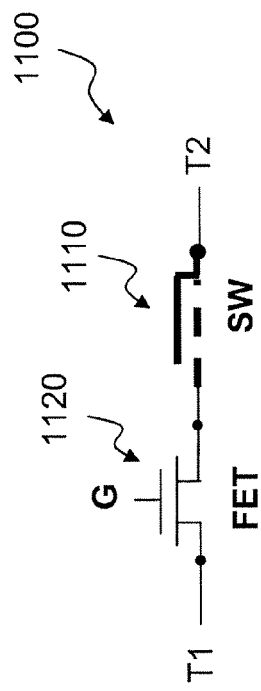
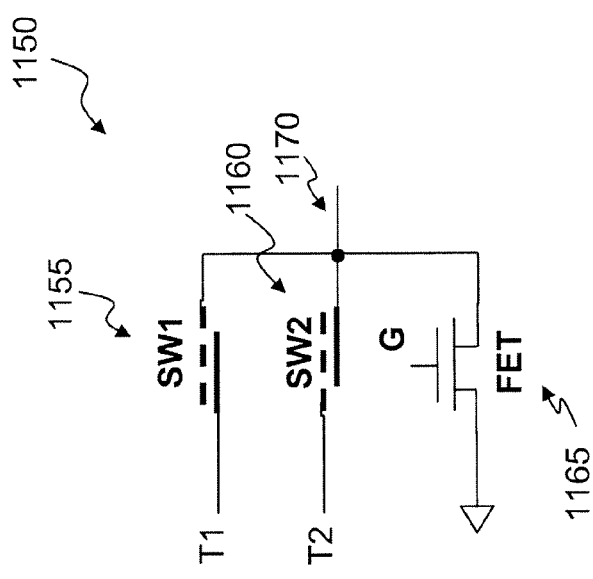
Figure 11A
Figure 11B

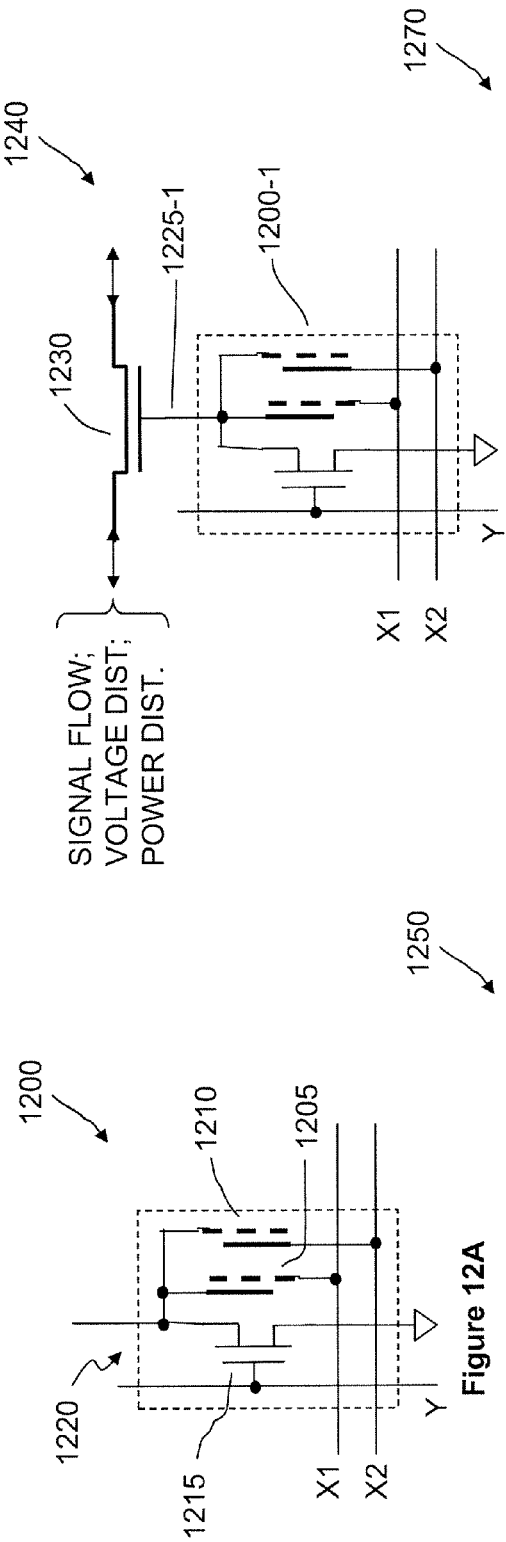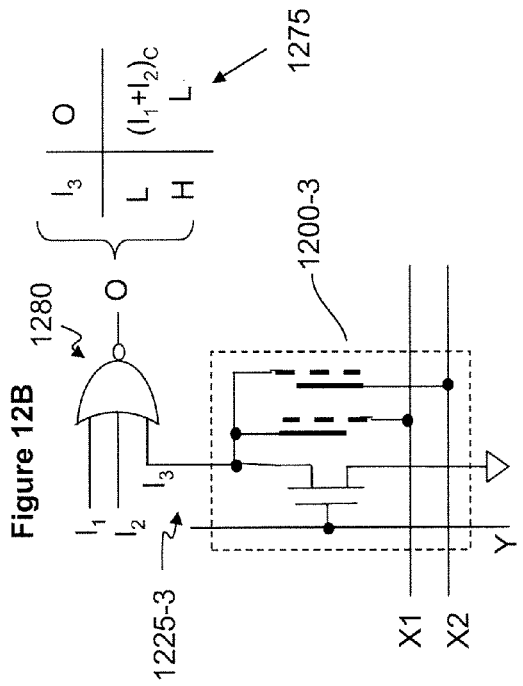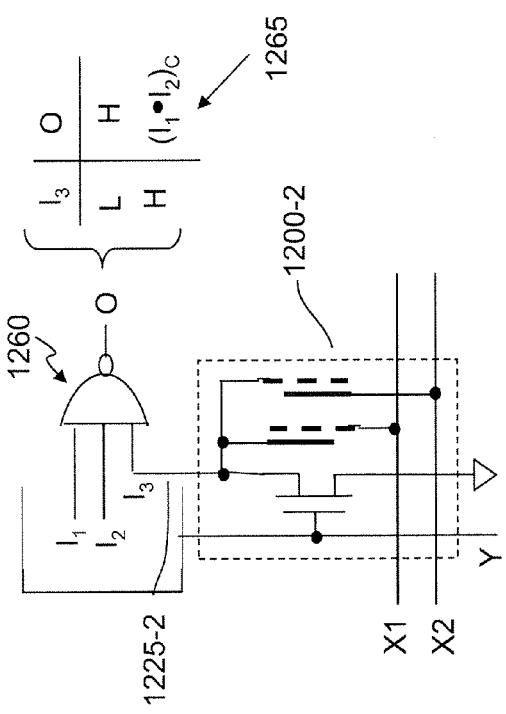
Figure 12A Figure 12B Figure 12C Figure 12D

| CKT CONFIG. # | C0 | C0' | C1 | C1' | C2 | C2' | C3 | C3' | C4 | C5 | Output F C6: 1 C6': 0 | Output F C6: 0 C6': 1 |
|---|---|---|---|---|---|---|---|---|---|---|---|---|
| 1 | 1 | 0 | X | X | 1 | 0 | X | X | 1 | 0 | A + B | Z |
| 2 | 1 | 0 | X | X | 0 | 1 | X | X | 1 | 0 | A + B' | Z |
| 3 | 0 | 1 | X | X | 1 | 0 | X | X | 1 | 0 | A' + B | Z |
| 4 | 0 | 1 | X | X | 0 | 1 | X | X | 1 | 0 | A' + B' | Z |
| 5 | X | X | 1 | 0 | X | X | 1 | 0 | 0 | 1 | (AB)' | Z |
| 6 | X | X | 1 | 0 | X | X | 0 | 1 | 0 | 1 | (AB')' | Z |
| 7 | X | X | 0 | 1 | X | X | 1 | 0 | 0 | 1 | (A'B)' | Z |
| 8 | X | X | 0 | 1 | X | X | 0 | 1 | 0 | 1 | (A'B')' | Z |

Various logic circuit configurations formed by the nonvolatile nanotube configuration logic block of figure 14A based on the state of nonvolatile nanotube control bits C0 – C3': Lower Order Control Bits to Configurable Logic Circuits
C4 & C5: Higher Order Control Bits to Configurable Logic Circuits
C6 & C6': Logic Output (F) Control Bits to Tristate Logic Circuit A: Logic Input
B: Logic Input
F: Logic Output 0 – logic low
1 – logic high
X – "don't care" state
Z – high impedance output

Logic Inputs (assumes simple logic inputs)
  A, B, C & Complements

Array Product Terms
  PT1 = NOR (A, B', C)
  PT2 = NOR (A, B, C')
  PT3 = NOR (B,C)
  PT4 = NOR (A')

Logic Outputs (assumes O1 = ST1' ......, O4 = ST4')
  O1 = [NOR (PT4)]'      = A
  O2 = [NOR (PT2, PT4)]' = A'B'C + A
  O3 = [NOR (PT2)]'      = A'C'
  O4 = [NOR (PT1, PT2)]' = A'B'C' + A'B'C

Figure 37

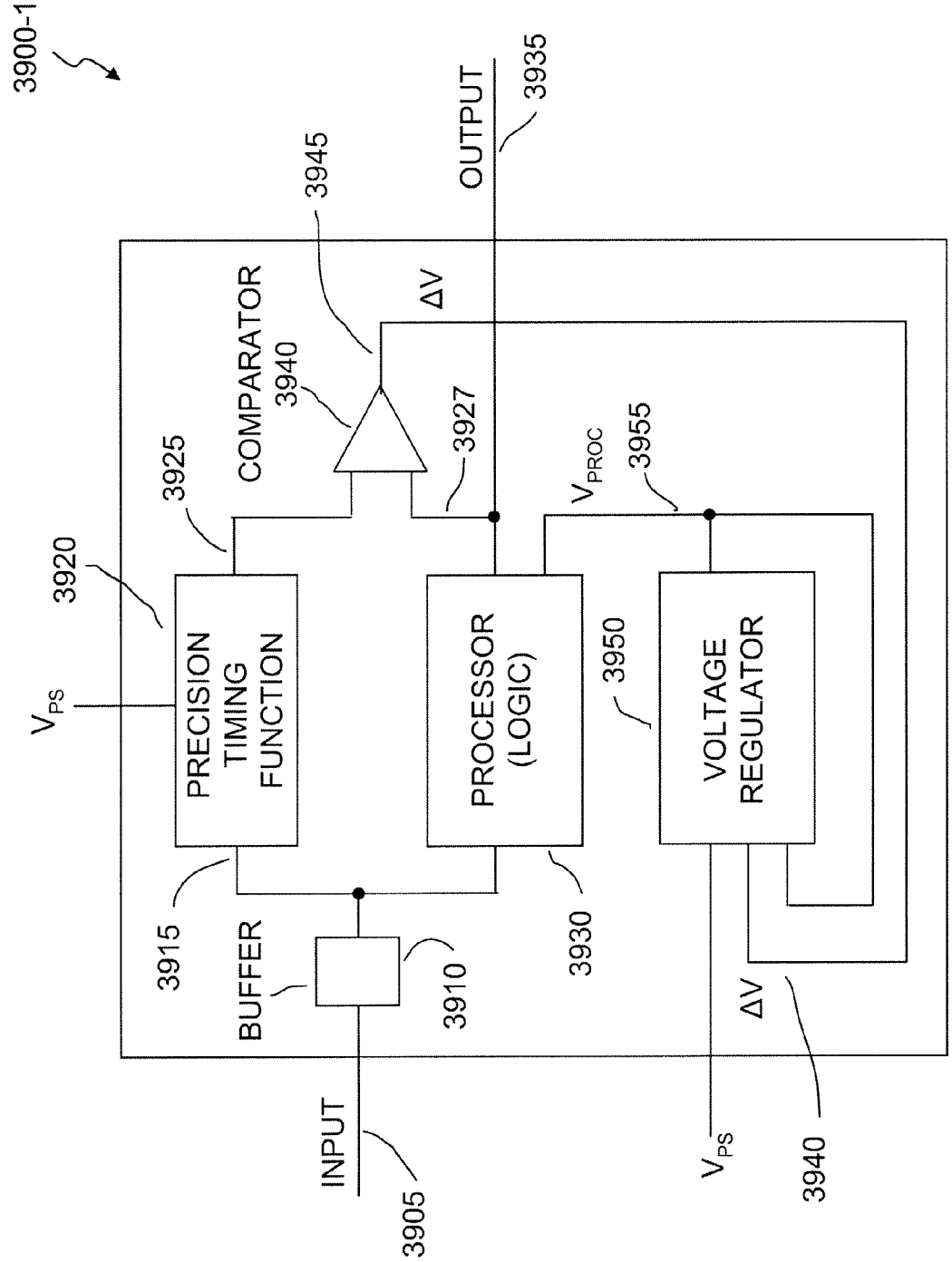
Prior Art Figure 39A

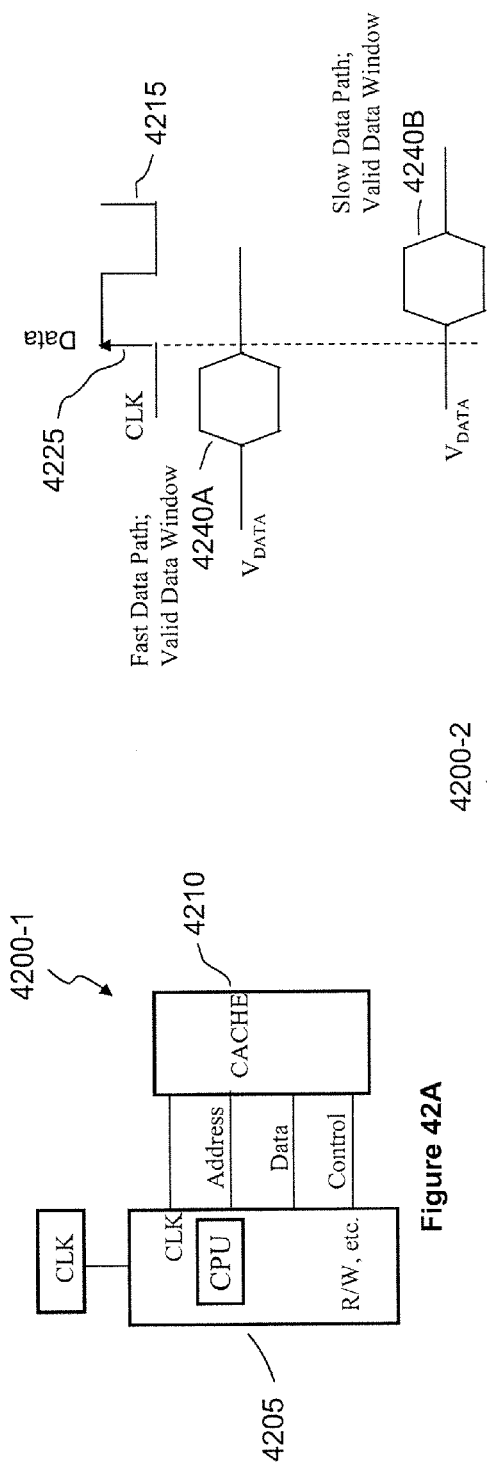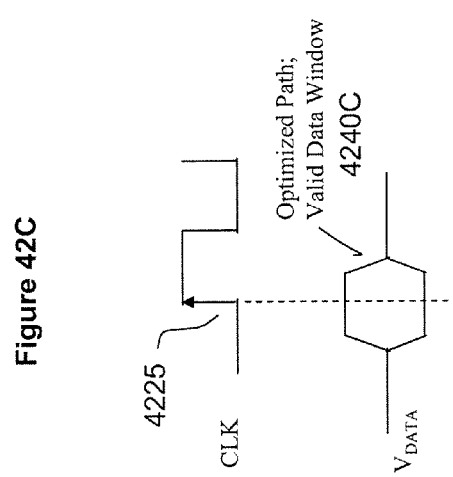
Figure 42C
Figure 42D
Figure 42A
Figure 42B

| Materials | $\varepsilon_R$ | Velocity (cm/ns) | $L_s$ (um) for $T_s$ = 1 ps | $L_s$ (um) for $T_s$ = 0.1 ps | $L_s$ (um) for $T_s$ = 0.01 ps |
|---|---|---|---|---|---|
| Polyimide | 2.5-3.5 | 19-16 | 185-160 | 18.5-16 | 1.85-1.6 |
| Silicon Dioxide ($SiO_2$) | 3.9 | 15 | 150 | 15 | 1.5 |
| Silicon Nitride (SiN) | 7.5 | 11 | 110 | 11 | 1.1 |
| Alumina ($Al_2O_3$) | 9.5 | 10 | 100 | 10 | 1 |
| Tantalum Pentoxide ($TaO_5$) | 20 | 6.5 | 65 | 6.5 | 0.65 |

➤ System Access Time (Delay to Valid Data) for 100 MHz Clock:
$f_{CLK} = 100$ GHz; $\tau_{CLK} = 10$ ps
System Access Time = $2\, T_{BUS} + 2\, T_{SK}$ (Memory Access)

❖ Valid Data in One Clock Cycle:
BUS1 example: BUS 1 + Memory Delay = 10 ps
$2T_{BUS1} = 1$ps; $2T_{S1} = 9$ps; $T_{S1} = 4.5$ ps
  For $SiO_2$: $L_{S1} = 495$ um
  For $TaO_5$: $L_{S1} = 292.5$ um ❖ Valid Data in Two Clock Cycles:
BUS2 example: BUS 2 + Memory Delay = 20 ps
$2T_{BUS2} = 4$ps; $2T_{S2} = 16$ps; $T_{S2} = 8$ ps
  For $SiO_2$: $L_{S2} = 880$ um
  For $TaO_5$: $L_{S2} = 520$ um ❖ Valid Data in Three Clock Cycles:
BUS3 example: BUS 3 + Memory Delay = 30 ps
$2T_{BUS3} = 6$ps; $2T_{S3} = 24$ps; $T_{S3} = 12$ ps
  For $SiO_2$: $L_{S3} = 1,320$ um
  For $TaO_5$: $L_{S3} = 780$ um

Figure 47

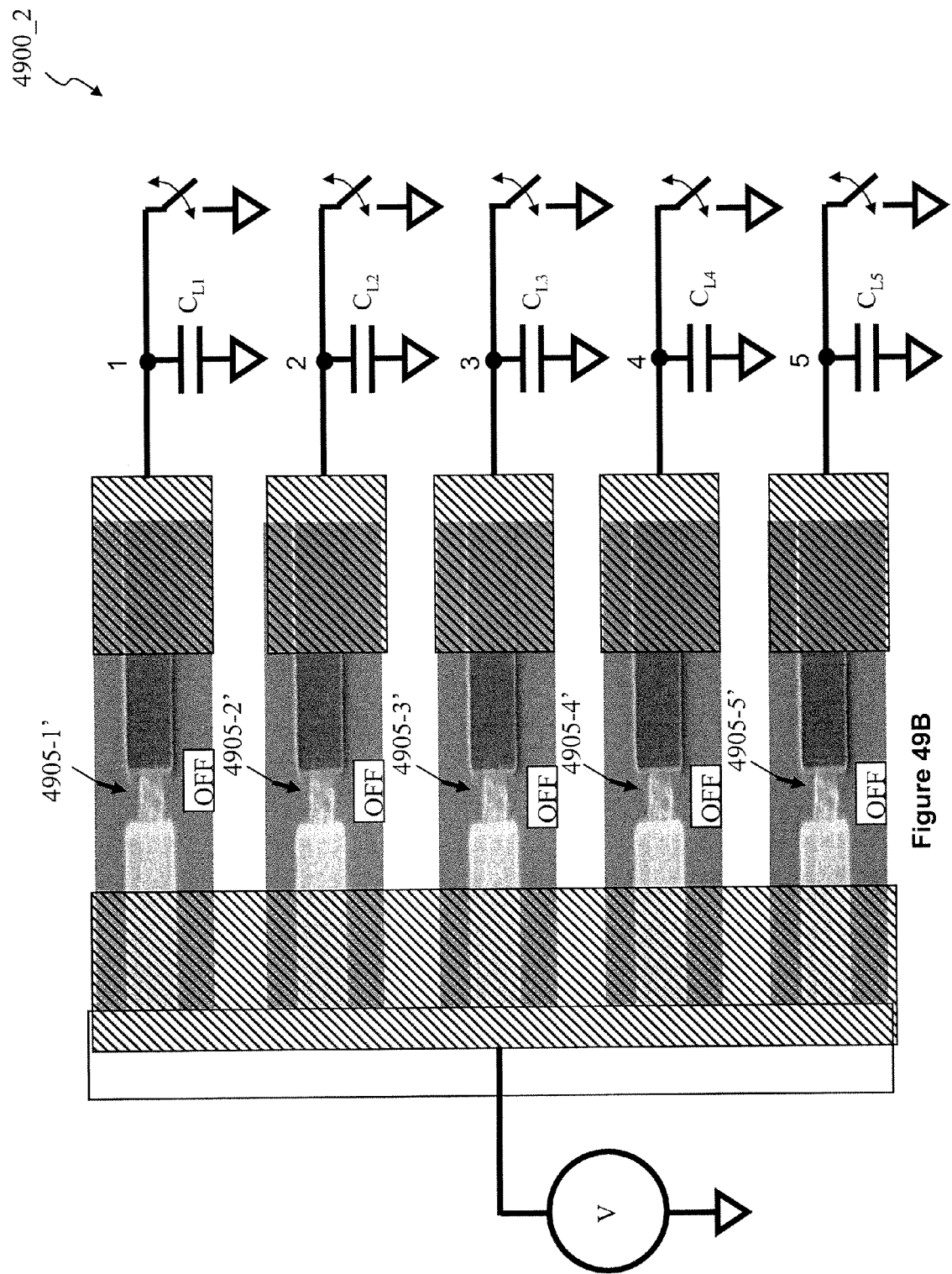

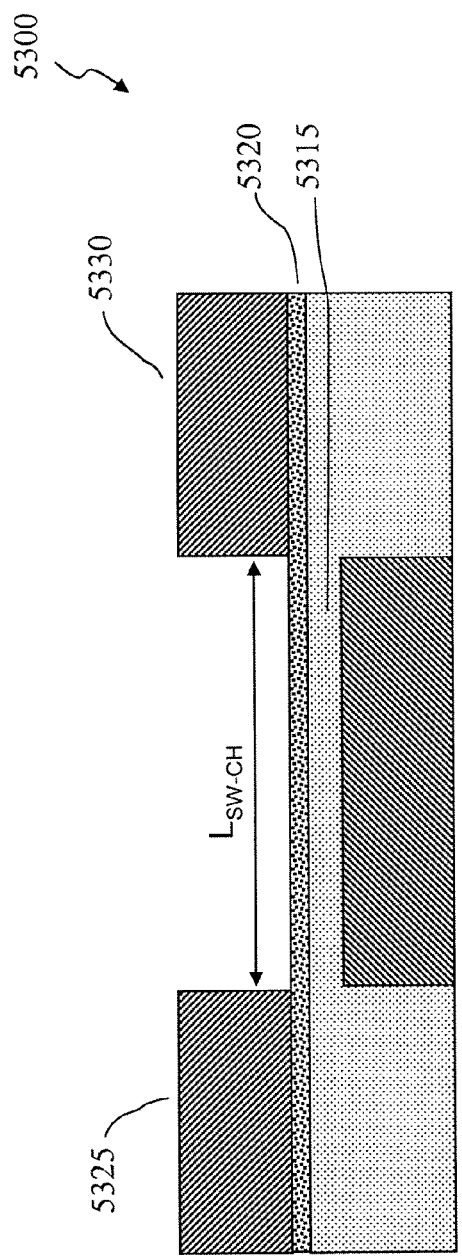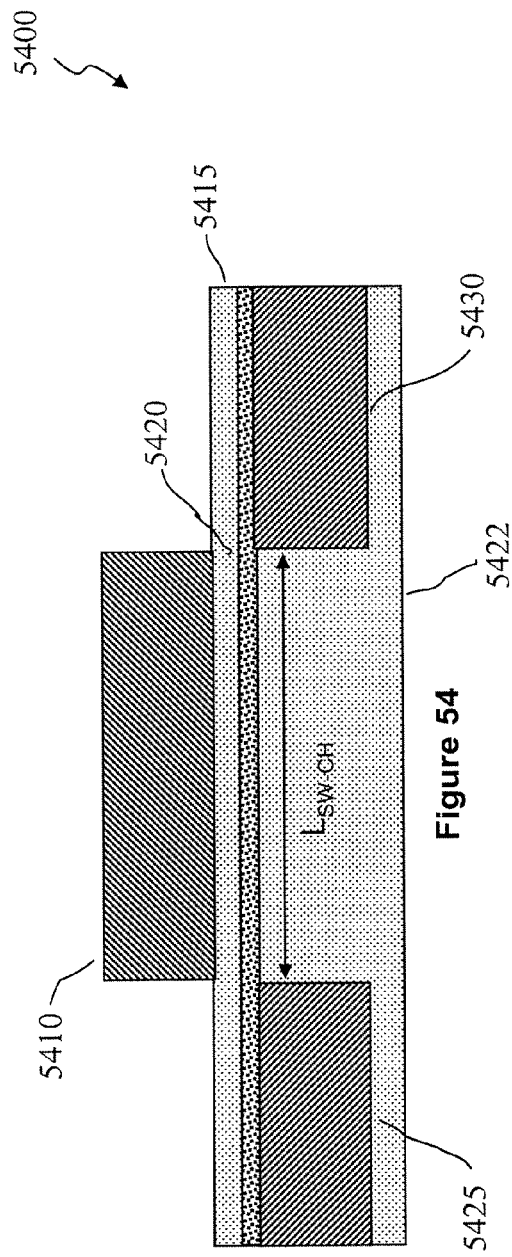
Figure 53
Figure 54

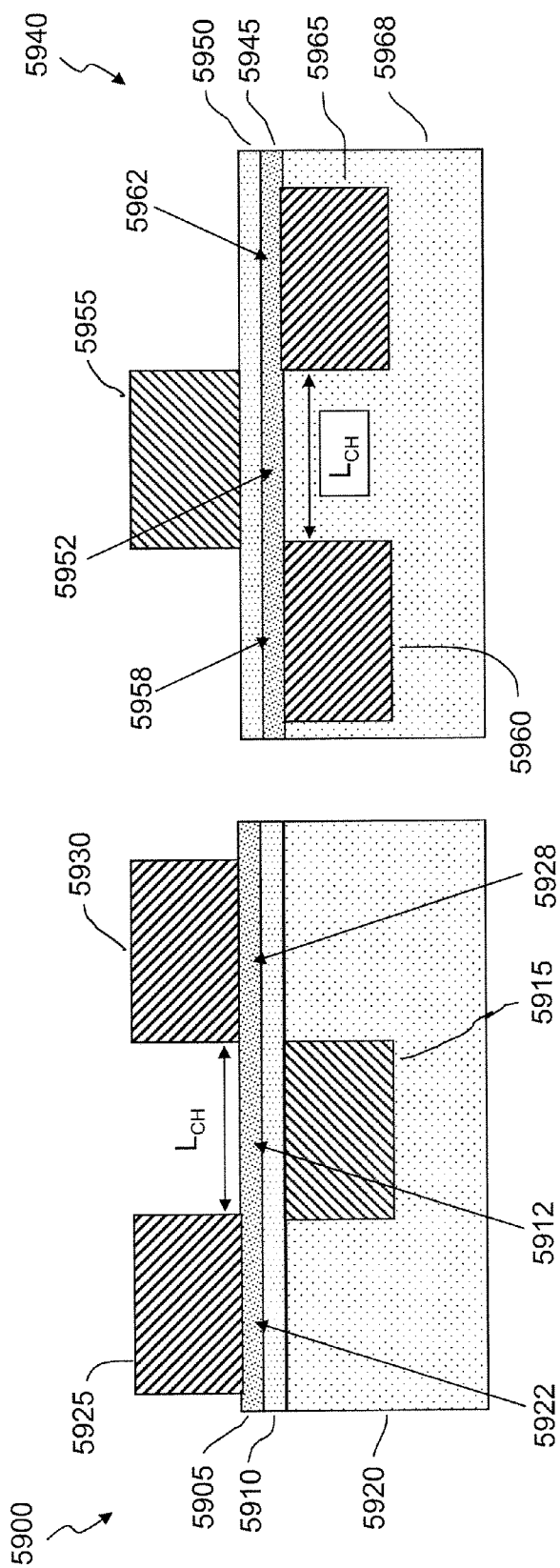

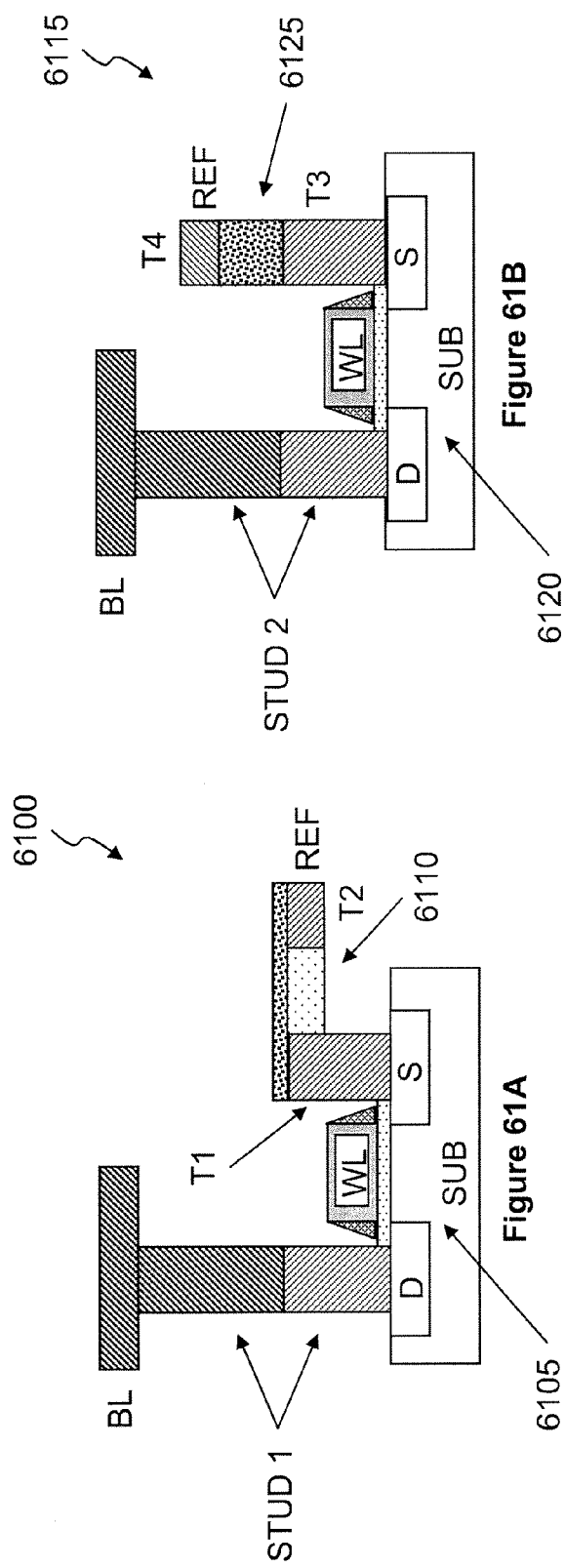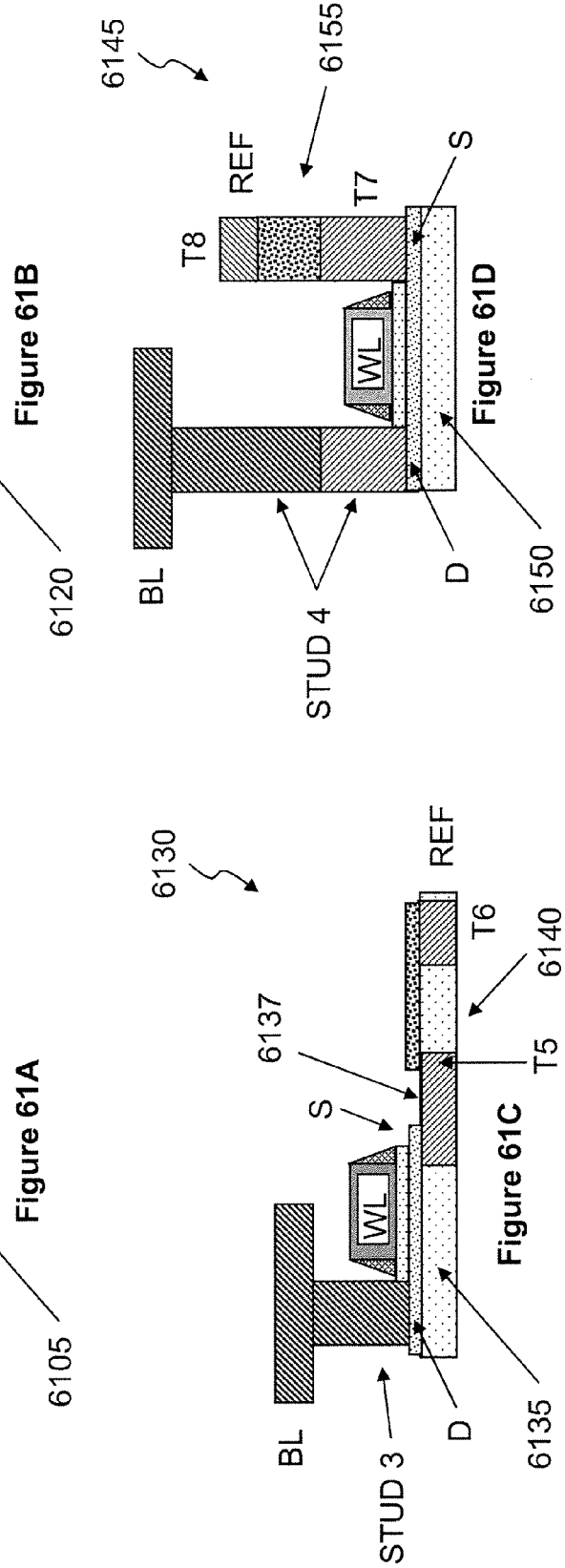
Figure 61A
Figure 61B
Figure 61C
Figure 61D

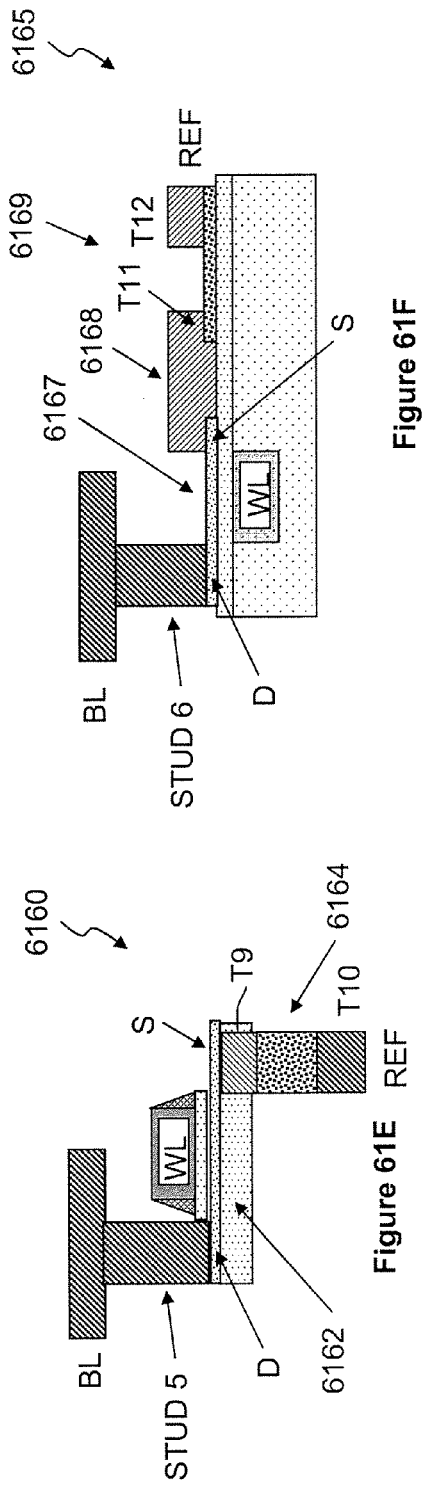
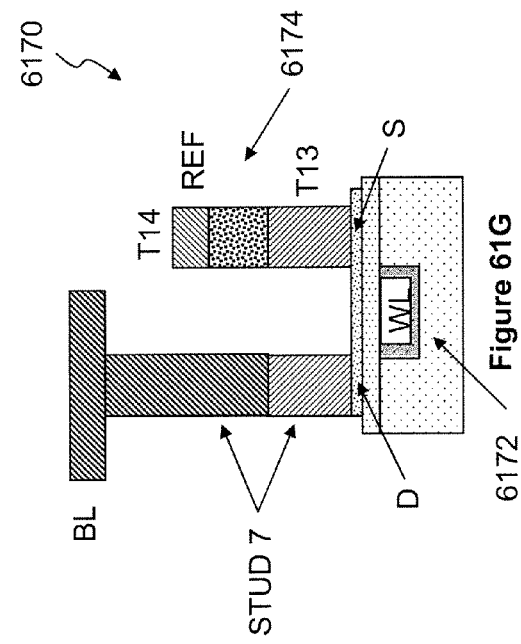
Figure 61E
Figure 61F
Figure 61G

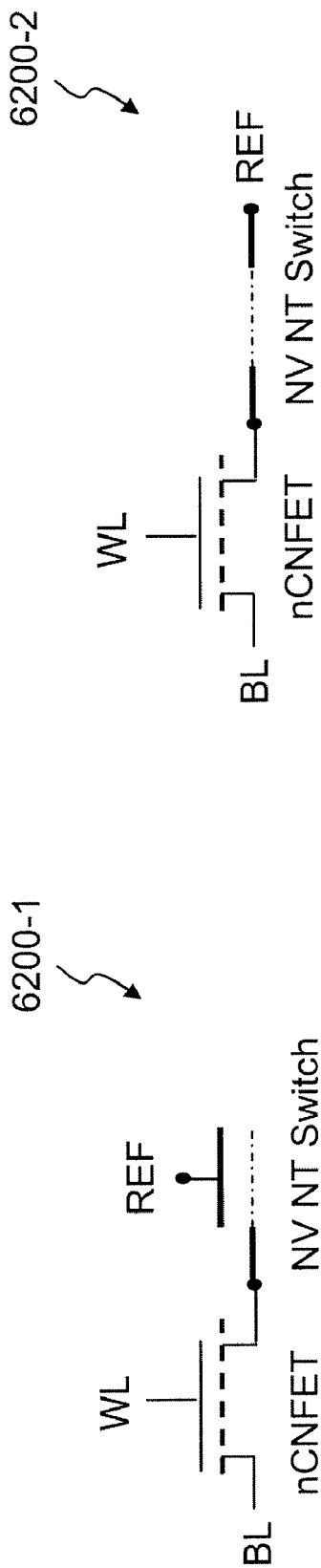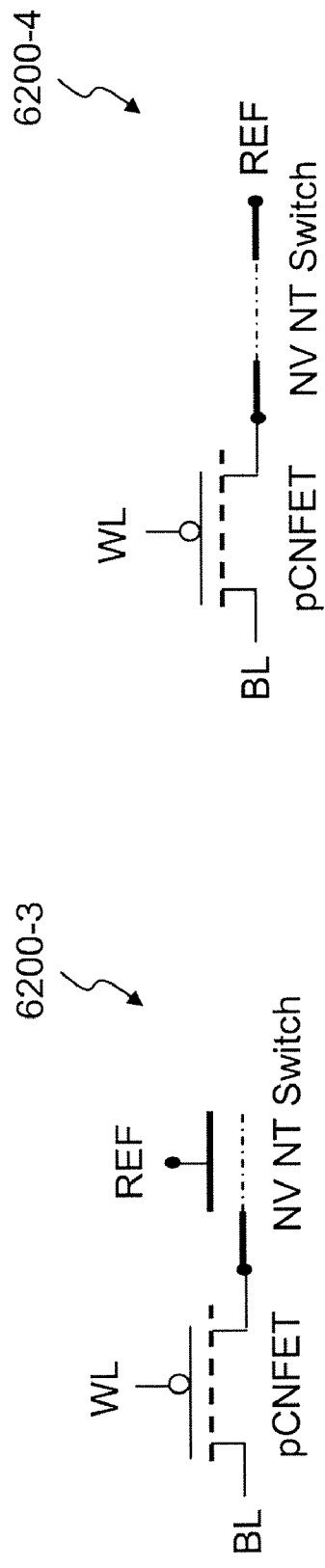
Figure 62A-1
Figure 62A-2
Figure 62B-1
Figure 62B-2

NONVOLATILE NANOTUBE PROGRAMMABLE LOGIC DEVICES AND A NONVOLATILE NANOTUBE FIELD PROGRAMMABLE GATE ARRAY USING SAME

CROSS REFERENCES TO RELATED APPLICATIONS

This application claims priority under 25 U.S.C. §119(e) to U.S. Provisional Patent Application No. 61/088,828, filed Aug. 14, 2008, entitled "Nonvolatile Nanotube Programmable Logic Devices and a Nonvolatile Nanotube Field Programmable Gate Array Using Same."

This application is related to the following applications, the entire contents of which are incorporated herein by reference in their entirety:

- U.S. patent application Ser. No. TBA, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;
- U.S. patent application Ser. No. TBA, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;
- U.S. patent application Ser. No. TBA, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;
- U.S. patent application Ser. No. TBA, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;
- U.S. patent application Ser. No. TBA, filed concurrently herewith, entitled NONVOLATILE NANOTUBE PROGRAMMABLE LOGIC DEVICES AND A NONVOLATILE NANOTUBE FIELD PROGRAMMABLE GATE ARRAY USING SAME;
- U.S. patent application Ser. No. 11/280,786, filed on Nov. 15, 2005, entitled TWO-TERMINAL NANOTUBE DEVICES AND SYSTEMS AND METHODS OF MAKING SAME;
- U.S. patent application Ser. No. 11/835,583, filed on Aug. 8, 2007, entitled LATCH CIRCUITS AND OPERATION CIRCUITS HAVING SCALABLE NONVOLATILE NANOTUBE SWITCHES AS ELECTRONIC FUSE REPLACEMENT ELEMENTS;
- U.S. patent application Ser. No. 11/835,651, filed on Aug. 8, 2007, entitled NONVOLATILE NANOTUBE DIODES AND NONVOLATILE NANOTUBE BLOCKS AND SYSTEMS USING SAME AND METHODS OF MAKING SAME; and
- U.S. patent application Ser. No. 12/486,602, filed on Jun. 17, 2009, entitled NRAM ARRAYS WITH NANOTUBE BLOCKS, NANOTUBE TRACES, AND NANOTUBE PLANES AND METHODS OF MAKING SAME.

TECHNICAL FIELD

The present application is generally related to the field of field programmable devices (FPDs), also referred to as programmable logic devices (PLDs), and, more specifically, to logic circuits formed from nanotube devices.

BACKGROUND

Discussion of Related Art

Field programmable devices (FPDs) have grown rapidly because integrated circuits for a wide variety of product applications in a competitive environment require fast time-to-market for new designs and low (or zero) non-recurring engineering cost (NRE) and low fabrication cost. Low power is a requirement for most applications as is portability so conservation of battery power is a requirement and nonvolatile operation is advantageous. Also, integration levels (more function) are increasing rapidly as is the requirement for high performance chips with large logic capacity and field programmability that are in-circuit programmable (in-place in the package without requiring sockets). Field programmable devices (FPDs) are also sometimes referred to as programmable logic devices (PLDs) and the terms FPD and PLD are used interchangeably throughout the application.

What is needed in logic design is fast time to market. Lower costs are also important hence more function in smaller chips. Higher performance and lower power are especially important in battery powered applications. Field programmable logic chips are required for fast time to market. What is needed are configurable (programmable) logic functions and efficient programmable wiring that can be configured (programmed) multiple times in chips mounted on a board. Programmable switches must be small in size and nonvolatile to enable efficient wiring architectures for implementing configurable (programmable) logic functions and be compatible with and easily integrated in CMOS technologies. Programmable switches must be easy to use and compatible with high performance applications. Programmable switches must enable fine-tuning of logic timing for optimum performance.

Overview of Field Programmable Devices

Block diagram 100 illustrated in FIG. 1 shows simple programmable logic devices (SPLDs) with a smaller number of equivalent logic gates with thousands or tens of thousands of equivalent logic gates; complex programmable logic devices (CPLDs) that combine multiple SPLDs with programmable wiring (routing) for a higher number of equivalent logic gates such as tens to hundreds of thousands of equivalent logic gates; and field programmable gate arrays (FPGAs) with a large number of equivalent logic gates in the range of millions to tens of million of equivalent logic gates for example and into the hundreds of millions of equivalent logic gates for denser scaled future FPGA chips. A brief discussion of field programmable devices is provided in the sections that follow.

Simple Programmable Logic Devices (SPLDs)

Programmable read-only memories (PROMs) were the first chips to enable user-programmability of the bits in an array. Such chips were used to store code for system startup (BIOS), algorithms, and other functions for example. Simple logic functions can also be performed using PROMs in which address lines can be used as logic circuit inputs and data lines as outputs. However, logic functions typically do not require many product terms but a PROM contains a full decoder for its address inputs. Thus, PROMs are an inefficient architecture for programmable logic function and are rarely used for this purpose and are therefore not included in block diagram 100.

The first SPLD device developed for implementing a field-programmable logic array (FPLA) or PLA for short consisted of two arrays for storing two levels of equivalent logic gates.

A first AND array (or AND-plane) is structured such that any of the AND array inputs or complements of the inputs can be AND'ed together and each AND-array output corresponds to any product term of inputs to the AND array. These product term outputs of the AND array become inputs to a second OR array. OR array outputs can be configured to produce any logical sum of any of the product terms (AND-array outputs) and implements logic functions in sum-of-products form. The PLA architecture is far better for generating logic functions than a PROM because both the AND and OR array terms can have many inputs.

FIG. 2 illustrates a schematic of PLA 200 including programmable AND array 210 and programmable OR array 220. Inputs 225 to input drivers 230 result in logic functions A, B·C, ..., Dc logic inputs to programmable AND array 210. Programmable AND array 210 forms product terms based on the inputs and on the state of nonvolatile bits at the intersection of input lines A, B·C, ..., Dc and provides product terms $PT_1, PT_2, \ldots, PT_M$ as inputs to Programmable OR array 220. Programmable OR array 220 forms sum-of-products (or product terms) outputs $O_1, O_2, \ldots, O_N$ based on product terms inputs and the state of nonvolatile bits at the intersection of product terms $PT_1, PT_2, \ldots, PT_M$ and OR array output lines $O_1, O_2, \ldots, O_N$, which are sent to output drivers 240. Output drivers 240 may be conventional drivers, or may include additional logic function such as XOR and may also include flip flops such as D-flip flops for example. Output drivers 240 drive outputs 245 which is the logic response to inputs 225 based on the ON or OFF bit states of individual nonvolatile bits in the AND and OR arrays. Also, output driver 240 drives feedback loop 250 which supplies output logic response to input drivers 230. Note that some of the output lines 245 may be included in feedback loop 250.

In operation, inputs 225 of PLA 200 result in logic outputs 245 based on the ON and OFF states of devices, such as EPROMs for example, located at the intersection of input lines such as A, B·C, ..., Dc and product term lines $PT_1, PT_2, \ldots, PT_M$ in electrically programmable AND array 210 and the intersection of $PT_1, PT_2, \ldots, PT_M$ and outputs $O_1, O_2, \ldots, O_N$ in programmable OR array 220. Details of PLA operation are well known in the literature, for example, C. Mead and Lynn Conway, "Introduction to VLSI Systems," Addison-Wesley Publishing Company, 1980, pages 79-82.

PLAs such as PLA 200 described further above are the earliest examples of simple SPLDs introduced in the early 1970's. PLAs using mask programmable AND arrays, OR arrays, and feedback loops in a fabricator were successfully used by IBM in many applications for over a decade. However, for field programmable PLAs with two memory arrays (memory planes) requiring electrically programmable AND and OR arrays, field programmable PLAs were difficult to manufacture and introduced significant propagation delays. To address these problems, simpler programmable array logic (PAL) devices were developed which use a programmable AND array to realize product terms and then provide said product terms to fixed (non-programmable) OR-gates. To compensate for the loss of OR array flexibility, product variations were introduced with different number of inputs and outputs and various sizes of OR-gates. Field programmable PALs were widely used in digital hardware immediately after their introduction and form the basis for more recent and more sophisticated architectures. All small programmable logic devices (PLDs) such PLAs and PALs are grouped together and referred to as simple field programmable devices (SPDLs) and are typically low cost with high pin-to-pin speed performance as illustrated by block diagram 100 in FIG. 1.

FIG. 3 illustrates PAL 300 schematic implementation with an electrically programmable AND array 310 that includes nonvolatile nodes 320 and 325 programmed to an ON state, wherein essentially orthogonal programmable AND array lines are electrically coupled, or fused, together (said electrical coupling indicated by an open circle). Intersections of essentially orthogonal programmable AND array lines without circles are in a nonvolatile OFF state, wherein said lines are electrically isolated. Programmable AND array 310 may be formed using one-time-programmable EPROM devices for example. Programmable AND array 310 may be programmed once in the field. If the logic function needs to be changed, a new PAL chip is programmed in the field.

PAL 300 inputs A and B form column logic inputs A, $A_C$, B, and $B_C$ to programmable AND array 310, where $A_C$ indicates the complement of logic variable A and $B_C$ indicates the complement of logic variable B. In this specification, the complement of a logic variable such as logic variable A may be indicated symbolically by $A_C$ or A'. Both symbolical representations for the complement of a logic variable are used interchangeably throughout the specification. Feedback loop 330 provides inputs C and D which form programmable AND array column logic inputs C, $C_C$, D, and $D_C$. Product terms 335-1 and 335-2 form two outputs of programmable AND array 310 and provide inputs to OR logic gate 340. The OR logic gates are not programmable. Product terms 335-3 and 335-4 form another two outputs of programmable AND array 310 and provide inputs to OR logic gate 345. OR-gate 340 provides a sum-of-products (or sum-of-product-terms) output to the input of D-flip flop 350 and OR-gate 345 provides a sum-of-products output to the input of D-flip flop 355. D-flip flop 350 provides output $O_1$ which is connected to input C by feedback loop 330 and D-flip flop 355 provides output $O_2$ which is connected to input D by feedback loop 330.

In operation, inputs A and B to PAL 300 result in logic outputs $O_1$ and $O_2$ based on the ON and OFF states of devices, such as EPROMs for example, located at the intersection of input lines and product term lines in electrically programmable AND array 310. Details of PAL operation are well known in the literature and are available in product specifications.

Complex Programmable Logic Devices (CPLDs)

CPLDs consist of multiple SPLD-like blocks interconnected on a single chip, typically by a programmable global interconnect matrix resulting in a field programmable logic function that is substantially more powerful than is possible with even large individual SPLD functions and represents a category of programmable logic devices (PLDs) as shown in FIG. 1. The difficulty of increasing capacity of a single SPLD architecture is that the array size of the programmable logic-arrays are driven to large dimensions as the number of inputs increase. Therefore as technologies are scaled to smaller dimensions and the number of transistors available on chips increases, it becomes more efficient to limit the size of SPLDs and to interconnect multiple SPLDs with a programmable global interconnect matrix.

FIG. 4 illustrates a schematic of CPLD 400 architecture formed using four SPLD functions, SPLD 410, SPLD 420, SPLD 430, and SPLD 440. In one implementation, for example, electronically programmable SPLD functions may be formed using electronically programmable PALs similar to PAL 300 illustrated in FIG. 3. While four interconnected electronically programmable SPLD functions are illustrated in FIG. 4, dozens of interconnected SPLDs may be used to form a large flexible in-circuit programmable logic function. All connections between SPLDs, in this example PALs similar to PAL 300 described further above with respect to FIG. 3, are routed (wired) through global interconnect matrix 450.

In operation, all communication between SPLD 410 and all other SPLDs used to form CPLD 400 are routed to global interconnect matrix 450 using wire(s) 410-1 and received from global interconnect matrix 450 using wire(s) 410-2. All communication between SPLD 420 and all other SPLDs used to form CPLD 400 flow are routed to global interconnect matrix 450 using wire(s) 420-1 and received from global interconnect matrix 450 using wire(s) 420-2. All communication between SPLD 430 and all other SPLDs used to form CPLD 400 flow are routed to global interconnect matrix 450 using wire(s) 430-1 and received from global interconnect matrix 450 using wire(s) 430-2. And all communication between SPLD 440 and all other SPLDs used to form CPLD 400 flow are routed to global interconnect matrix 450 using wire(s) 440-1 and received from global interconnect matrix 450 using wire(s) 440-2. Multiple inputs and outputs (I/Os) communicate between CPLD 400 and other circuit functions. Since all connections are routed through similar paths, time delays can be predicted which simplifies CPLD design. Buffer circuits (not shown) may be used as well.

Applications that can exploit wide AND/OR gates and do not require a large number of flip flops are good candidates for mapping into CPLDs. Control functions such as graphics controllers and some communication circuit functions map well into CPLD architectures. In-system re-programmability and reasonably predictable speed performance are significant advantages offered by CPLDs.

Field Programmable Gate Array (FPGA) Logic

FPGAs were invented by Ross Freeman, cofounder of the Xilinx Corporation, in 1984 to overcome the limitations of CPLDs. The primary differences between CPLDs and FPGAs are due to differences in chip architecture. As described further above, CPLD architecture consists primarily of programmable sum-of-products logic arrays with a relatively small number of clocked registers (D-flip flops for example) interconnected by a global interconnect matrix as illustrated further above by CPLD 400 shown in FIG. 4. CPLDs typically have relatively high logic-to-interconnect ratios. The result is less architectural flexibility and smaller logic functions (typically limited to tens to hundreds of thousands of equivalent logic gates) but more predictable timing delays and greater ease of programming.

FPGA architectures are dominated by interconnects. FPGAs are therefore much more flexible in terms of the range of designs that can be implemented and logic functions in the millions and tens of millions and eventually in the hundreds of millions of equivalent logic gates may be realized. In addition, the added flexibility enables inclusion of higher-level embedded functions such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks. The FPGA's flexibility, ability to support a large number of equivalent logic gates, and ability to accommodate embedded memory and logic functions are displacing ASICs in many applications because of lower non-recurring engineering (NRE) design costs and faster time-to-market. FPGA architecture is shown in FIG. 1 alongside SPLD and CPLD as a stand-alone category of programmable logic device architecture.

FPGA architecture and circuit implementations are described in U.S. Pat. Re. 34,363 to Freeman, filed on Jun. 24, 1991, and SRAM memory controlled routing switch circuit implementations are described in U.S. Pat. No. 4,670,749 to Freeman, filed on Apr. 13, 1984, the contents of which are incorporated herein by reference in their entirety. FPGA 500 (as shown in FIG. 5) schematically illustrates basic concepts taught by Freeman in the above referenced patents by Freeman.

Referring now to FIG. 5, FPGA 500 includes an array of configurable (programmable) logic blocks (CLBs) such as CLB 510 and programmable switch matrices (PSMs) such as PSM 520. Interconnections between CLBs and PSMs may be relatively short to provide local wiring (such as interconnect 530) or relatively long to provide global wiring (not shown). A programmable switch (routing) matrix PSM1 interconnecting four CLB blocks CLB1, CLB2, CLB3, and CLB4 is illustrated in FIG. 5. In this example, switch 540, one of the switches in PSM1, may be used to interconnect CLB1, CLB2, CLB3, and CLB4 in any combination.

CLBs are typically formed by combining look up tables (LUTs) with flip flops and multiplexers as illustrated schematically by CLB 600 in FIG. 6. Alternatively, CLBs may be formed by combining combinatorial logic with flip flops and multiplexers as illustrated by CLB 700 in FIG. 7.

Referring now to FIG. 6, CLB 600 comprises LUT 610 with inputs $I_1, I_2, \ldots, I_N$. LUT 610 may be a random access memory (RAM) such as an SRAM, an EPROM, an EEPROM, or a flash memory. A typical LUT configuration may be a RAM organized in a 4×4×1 configuration with four inputs and one output. In this example, the LUT 610 output drives the input of clocked D-flip flop 620 which in turn drives an input of multiplexer (MUX) 630. The LUT 610 output may also drive an input of MUX 630 directly. MUX 630 drives (provides) CLB 600 output to terminal O.

Referring now to FIG. 7, CLB 700 includes configurable combinatorial logic function 710 with inputs $I_1, I_2, \ldots, I_N$. Configurable combinatorial logic function 710 may be formed using cascaded transfer devices or random logic blocks such as NAND and NOR functions for example. Configurable combinatorial logic function 710 formed using NanoLogic™ functions may also be used as described further below in FIGS. 12 and 14. Typical configurable combinatorial logic function 710 may be formed using cascaded transfer devices and configuration control bits or random logic blocks and configuration control bits. In this example, the configurable combinatorial logic function 710 output drives the input of clocked D-flip flop 720 which in turn drives an input of MUX 730. The configurable combinatorial logic function 710 output may also drive an input of MUX 730 directly. MUX 730 drives (provides) CLB 700 output to terminal O.

The routing flexibility of FPGAs enables a wide variety of functions to be realized. FIG. 8 illustrates FPGA 800 and shows an example of a static ram (SRAM) controlled routing of signals between various CLBs enabling an in-circuit programmable logic function. CLB 810 includes an AND gate with inputs $I_1$ and $I_2$ and an output $O_1$ which is provided to PSM 812 which includes FET 815 whose ON or OFF states are controlled by SRAM 820. FET 815 terminal 1 is connected to output $O_1$, gate terminal 2 is connected to SRAM 820, and terminal 3 is connected to wire 825. Wire 825 is in turn connected to PSM 828 which includes FET 830 whose ON and OFF states are controlled by SRAM 820. FET 830 terminal 4 is connected to wire 825, gate terminal 5 is connected to SRAM 820, and terminal 6 is connected to wiring 835. Wiring 835 is also connected to an input of MUX 840 which is controlled by SRAM 820. Output $O_2$ of MUX 840 is connected to wire 850 which is connected to an input of an AND gate in CLB 855 providing an output $O_3$. A global wire 860 is shown which is not part of local wiring.

In operation, output $O_1$ is applied to terminal 1 of FET 815 with the logic state (high or low voltage) of gate terminal 2 controlled by SRAM 820. If FET 815 is OFF, low gate voltage in this example, then $O_1$ does not propagate along wire 825. If however, FET 815 is ON, high gate voltage (typically 2.5 volts) in this example, then $O_1$ propagates through the channel region of FET 815 to terminal 3, and then along wire 825 to terminal 4 of FET 830 which is also controlled by SRAM 820. If FET 830 is in an OFF state, then $O_1$ does not propagate to terminal 5. However, if FET 830 is in an ON state, then $O_1$ propagates along wire 835 to an input terminal of MUX 840. If MUX 840 is enabled by SRAM 820, then MUX output $O_2$ is applied to an input terminal of the AND gate in CLB 855 by wire 850. The AND gate output $O_3$ is also the output of CLB 855.

The use of SRAMs to control wiring in FPGAs as illustrated above with respect to FIG. 8 and described in U.S. Pat. No. 4,670,749 has the advantage of compatibility with leading edge CMOS logic processes, is reprogrammable, and supports in-circuit programmability. However, it is the largest area element having 5 to 6 transistors per cell, requires external loading of bits to define the logic function. Further, in such SRAM based designs the FPGA is nonfunctional until loading is complete, is volatile, and has relatively low radiation tolerance. In addition, the large SRAM cell size also requires a large number of wiring layers and impacts architecture because the size of the switch is a key factor in determining FPGA architecture.

A very small switch such as a cross point antifuse may also be used for wiring. Such a small switch results in a different architecture and can reduce chip size by approximately 10× relative to an SRAM-based FPGA implementation. A cross point antifuse is nonvolatile, has very low capacitance (1 fF per node for example), is radiation hard, and does not require external loading of bits to operate. However, programming such antifuse based FPGA devices (such as is depicted in FIG. 9) requires relatively high voltages such as 5 to 10 volts to ensure breakdown and currents in the 5 to 10 mA range. Further such devices are one-time-programmable (OTP) and are difficult to in-circuit program.

FIG. 9 illustrates a schematic of FPGA 900 which includes logic cells such as logic cell 910, vertical wiring 920, horizontal wiring 930, and antifuses such as antifuse 940 at each intersection of vertical and horizontal wires. Such antifuses are typically formed using ONO dielectric-based antifuses or metal-to-metal antifuses. While wiring is showed in channel regions between logic cells, wiring over logic cells (not shown) may be used to further increase density. I/O circuits such as I/O 950 interface internal to FPGA 900 circuits and with output connections on the chip. FPGA 900 with dense wiring is somewhat similar to ASIC-type layouts although antifuse ON resistance may be in range of 25 ohms to several hundred ohms depending on antifuses used. Also, high voltage circuits (not shown) are included to switch selected cross point antifuse switches from an OFF to an ON state.

In operation, high voltages typically in the 5-10 volt range with high currents in the milliampere range are used to program (change) the cross point antifuses from an OFF-to-ON state. Then the logic function can be tested. A new chip is required for each logic function and OTP in-circuit programming is difficult. A socket approach can facilitate programming of FPGA 900.

SUMMARY

A nonvolatile nanotube programmable devices and the nonvolatile nanotube field programmable gate array (NF-PGA) is provided.

Under certain embodiments, one or more nonvolatile nanotube (NV NT) select circuits are used to store (in a first operation) and later provide (in a second operation) one or more control bits to a conventional configurable logic block (CLB) circuit. Said NV NT select circuits comprise a pair of nanotube switches and a field effect transistor (FET). One terminal of each nanotube switch and one terminal of the FET are joined together to form a common node, providing a four terminal device. During a store operation, the resistance of each nanotube switch can be set to provide means for nonvolatile storage of a single control bit. During NFPGA operation, the control bits stored as corresponding nonvolatile high or low resistance states within each NV NT select circuit can be readily accessed and used to configure the CLB circuit. This nonvolatile nanotube based CLB system is referred to as an NCLB.

Under certain embodiments, one or more NV NT select circuits are used to store (in a first operation) and later provide (in a second operation) one or more control bits to a conventional programmable switch matrix (PSM) circuit. During NFPGA operation, the control bits stored as corresponding nonvolatile high or low resistance states within each NV NT select circuit can be readily accessed and used to configure the PSM circuit. This nonvolatile nanotube based PSM system is referred to as an NPSM.

Under certain embodiments, a NV NT select circuit is used to store (in a first operation) and later provide (in a second operation) a control bit to a conventional programmable bidirectional buffer circuit. During NFPGA operation, the control bit stored as corresponding nonvolatile high or low resistance states within the NV NT select circuit can be readily accessed and used to configure the direction of the buffer circuit. Additional NV NT select circuits can also be used to either enable or disable bypass paths around inverter stages within said conventional programmable bidirectional buffer circuit, providing means for signal inversion through the buffer circuit. Further, additional NV NT select circuits (the nanotube switches of which are configured with nonvolatile resistance values such as to provide a specific resistor divider ratio) can be used to provide programmable supply voltages within the buffer circuit, providing means for voltage level translation through the buffer circuit. This nonvolatile nanotube based programmable bidirectional buffer system is referred to as an NT BiDi buffer circuit.

Under certain embodiments, a plurality of nonvolatile NRAM™ cells are combined to form an NRAM™ array, providing means for nonvolatile storage of a plurality of data bits, each data bit corresponding to a unique combination of inputs (address) to the array. This NRAM™ array is then used in place of a conventional (volatile) SRAM array to form a conventional look up table (LUT) circuit. Said NRAM™ cells are comprised of a single nanotube switch wired in series with a FET, providing a three terminal device which can be used to store (in a first operation) and later recall (in a second operation) a single bit of data. During NFPGA operation, the data bits stored within the NRAM array can be readily accessed and provided to an output stage.

Under certain embodiments, a plurality of nonvolatile NRAM™ cells are combined to form an NRAM™ array, providing means for nonvolatile storage of a plurality of control bits. This NRAM™ array is then used to store (in a first operation) and later provide (in a second operation) a plurality of control bits to a conventional CLB circuit. During NFPGA operation, the control bits stored within said NRAM™ array can be readily accessed and used to configure the CLB circuit. This nonvolatile nanotube based CLB system is referred to as an NCLB.

Under certain embodiments, a plurality of nonvolatile NRAM™ cells are combined to form an NRAM™ array, providing means for nonvolatile storage of a plurality of control bits. This NRAM™ array is then used to store (in a first operation) and later provide (in a second operation) a plurality of control bits to a conventional PSM circuit. During NFPGA operation, the control bits stored within said NRAM™ array can be readily accessed and used to configure the PSM circuit. This nonvolatile nanotube based PSM system is referred to as an NPSM.

Under certain embodiments, a pair of nonvolatile NRAM™ cells is used to provide nonvolatile backup storage means within a conventional (volatile) SRAM cell. Prior to power loss in such a system, a store operation is performed which encodes the bit value stored in the volatile SRAM cell within each of the NRAM™ cells (a first NRAM™ cell encodes the true bit value, while a second NRAM™ cell encodes the compliment value). Similarly, a recall operation (typically performed after power up) is used to load the SRAM cell with the bit value stored within the nonvolatile NRAM™ cells.

Under certain embodiments, a plurality of these nanotube supported (or "shadowed") memory devices—termed nonvolatile nanotube shift registers (NS/Rs), having one nonvolatile nanotube shadow device per shift register stage—can be combined to form a nonvolatile nanotube configuration control register (NCCR). Such a device can be used to store (in a first operation) and later provide (in a second operation) a plurality of control bits to either a conventional CLB or a conventional PSM circuit, forming a NCLB or a NPSM, respectively.

Under certain embodiments, a plurality of control bits within a nonvolatile nanotube based programmable logic element (said control bits supplied by an NV NT select circuit, NRAM™, NS/R, or some combination or subcombination of the three) are altered in response to a security event. In this way, the configuration of said programmable logic elements is protected from unauthorized access in, for example, an attempt at reverse engineering a device employing nonvolatile nanotube based programmable logic elements.

Under certain embodiments, programmable supply voltages (programmed using NV NT select circuits as described further above) are set to provide precise signal delay values through one or more nonvolatile nanotube based programmable logic elements. As signal rise time through a CMOS circuit, for example, is directly proportional to supply (or "rail") voltage, precisely selecting a supply voltage for each circuit element provides means for precisely selecting a delay value through said element. Within this aspect, additional inverter stages may be used to restore signal levels to predetermined high and low voltages.

Under certain embodiments, programmable supply voltages (programmed using NV NT select circuits as described further above) provide means to regulate power consumption within a large system of nonvolatile nanotube programmable logic elements, such as, but not limited to, an FPGA.

The nonvolatile nanotube based programmable logic elements can be used together to realize a nonvolatile, rapidly reconfigurable nanotube based FPGA (NFPGA). Said NFPGA is advantageous because a device can be realized in significantly smaller physical dimensions compared to conventional SRAM based FPGAs of comparable logic density. Said NFPGA is further advantageous because it can be readily programmed and reprogrammed in-circuit, in contrast to one-time-programmable (OTP) antifuse or EPROM based FPGAs. Said NFPGA is also advantageous because such a device can be rapidly reconfigured, in whole or in part, during operation (in some cases within a single clock cycle).

Accordingly, a nonvolatile nanotube based configurable logic block (NCLB) is disclosed below. It comprises one or more nonvolatile nanotube (NV NT) select circuits and a conventional CLB circuit, wherein said NV NT select circuits are used to store and provide one or more configuration control bits to said conventional CLB circuit.

A nonvolatile nanotube based configurable logic block (NCLB) comprising an NRAM array is also provided. The array comprises a plurality of NRAM cells, and a conventional CLB circuit, wherein said NRAM array is used to store and provide one or more configuration control bits to said conventional CLB circuit.

A nonvolatile nanotube based programmable switch matrix (NPSM) is provided. It comprises one or more NV NT select circuits and a conventional PSM circuit, wherein said NV NT Select Circuits are used to store and provide one or more configuration control bits to said conventional PSM circuit.

A nonvolatile nanotube based programmable switch matrix (NPSM) is provided. It comprises an NRAM array, said array comprising a plurality of NRAM cells, and a conventional PSM circuit, wherein said NRAM array is used to store and provide one or more configuration control bits to said conventional PSM circuit.

A nonvolatile nanotube based programmable bidirectional (NT BiDi) buffer circuit is provided. It comprises a NV NT switch circuit and a conventional bidirectional buffer circuit, wherein said NV NT switch is used to store and provide a control bit to said conventional bidirectional buffer circuit.

A means within said NT BiDi buffer circuit (through the use of one or more additional NV NT switch circuits) is provided to invert a data signal passing through said buffer circuit.

A means within said NT BiDi buffer circuit (through the use of one or more additional NV NT switch circuits) is provided to level translation of a data signal passing through said buffer circuit.

It is also an object of the present disclosure to provide a nonvolatile nanotube based programmable look up table (LUT) comprising an NRAM array, said array comprising a plurality of NRAM cells, and an output stage, wherein said NRAM array, responsive to a plurality of input signals, provides a previously stored value for each unique combination of input values (address) to said output stage.

It is further an object of the present disclosure to provide a nanotube configuration control register (NCCR), said NCCR comprising a plurality of nonvolatile nanotube shift registers (NS/Rs), which can be used to store and provide a plurality of control bits within an NCLB or NPSM circuit.

It is also an object of the present invention to provide means for responding to a security event (an unauthorized attempt to reverse engineer a device, for example) wherein control bits within one or more nonvolatile nanotube programmable logic devices are altered upon detection of such an event.

It is further an object of the present disclosure to provide means for precision control of signal delay through one or more nonvolatile nanotube programmable logic devices wherein a programmable supply voltage, supplied by one or more NV NT select circuits, is carefully selected to set a desired signal delay.

It is also an object of the present disclosure to provide means to regulate power consumption within one or more nonvolatile nanotube programmable logic devices by selecting programmable supply voltages supplied by one or more NV NT select circuits.

It is further an object of the present disclosure to provide an nonvolatile nanotube based FPGA (NFPGA) comprising an arrangement nonvolatile nanotube programmable devices selected from a group consisting of NCLBs, NPSMs, NT BiDi buffer circuits, NRAM based LUTs, NCCRs.

In one aspect, the present disclosure relates to a nonvolatile nanotube memory cell that can include a nanotube field effect transistor that can include a first nanotube fabric article, the first nanotube fabric article having a drain region and a source region in a spaced relation to one another, wherein the spaced relation defines a channel region in the first nanotube fabric article, and a gate node electrically coupled to the first nanotube fabric, wherein the gate node modulates the conductivity of the channel region to form or unform a first electrically conductive channel between the source and drain regions in response to a first electrical stimulus. The nonvolatile nanotube memory cell can also include a nanotube switching element that can include a second nanotube fabric article electrically coupled to the source region of the nanotube field effect transistor and an electrode, the second nanotube fabric article forming or unforming a second electrically conductive pathway between the source region and the electrode in response to a second electrical stimulus on at least the electrode, wherein the forming of the first and second electrically conductive channels corresponds to at least a first memory state of the nanotube memory cell, and wherein the unforming of the first and second electrically conductive channels corresponds to at least a second memory state of the nanotube memory cell.

Other features and advantages of the disclosure invention will become apparent from the following description of the invention which is provided below in relation to the accompanying drawings.

BRIEF DESCRIPTION OF THE DRAWINGS

FIG. 6 is a block diagram of a configurable logic block (CLB) including a look-up table (LUT), a D-flip flop, and a multiplexer;

FIG. 7 is a block diagram of a configurable logic block (CLB) including a combinational logic function, a D-flip flop, and a multiplexer;

FIG. 10A illustrates a schematic of a nonvolatile nanotube switch (NV NT switch);

FIGS. 10B and 10C show a nonvolatile nanotube switch (NV NT switch) in ON and OFF states, respectively;

FIG. 10D shows a perspective drawing of a nonvolatile nanotube block switch;

FIG. 10E shows a perspective drawing of a cross point switch formed using nonvolatile nanotube blocks described in FIG. 10D;

FIG. 11A shows a schematic representation of an NRAM™ cell;

FIG. 11B shows a schematic representation of a nonvolatile nanotube select circuit;

FIG. 12A shows the nonvolatile nanotube select circuit of FIG. 11B wired as one cell in an X-Y array configuration;

FIG. 12B shows the nonvolatile nanotube select circuit shown of FIG. 12A used to control the ON/OFF state of a transfer device;

FIG. 12C shows the nonvolatile nanotube select circuit of FIG. 12A used as an input that controls a NAND logic circuit operation;

FIG. 12D shows the nonvolatile nanotube select circuit of FIG. 12A used as an input that controls a NOR logic function operation;

FIG. 14B shows various logic circuit configurations formed by the nonvolatile nanotube configuration logic block of FIG. 14A based on the logic state of nonvolatile nanotube select circuits that provide nonvolatile configuration control states (or bits);

FIG. 37 shows a table of outputs as a function of inputs for a personalization of the NPLA of FIG. 36A;

FIG. 39A is a prior art figure that shows a precision timing function used to control the performance and power dissipation of a processor;

FIGS. 42A-42D shows critical timing requirements for a high speed central processor unit (CPU) and high speed cache;

FIG. 46 shows a table of transmission line propagation velocity as a function of dielectric constant and corresponding time delays as a function of distance;

FIG. 47 shows an example of cache valid data access time in terms of the number of clock cycles required as a function of the BUS length between the processor and the cache;

FIG. 49B shows a plan view of the NV NT switches shown in FIG. 49A, but with each of the NV NT switches with capacitive loads in an OFF high resistance state;

FIG. 53 shows a three-terminal gated NV NT switch with a gate placed below the NV NT switch that replaces the substrate shown in FIGS. 51A and 51B;

FIG. 54 shows a three-terminal gated NV NT switch with a gate placed above the NV NT switch;

FIG. 59A shows a cross section of a carbon nanotube device (CNFET device) that includes a patterned semiconducting nanotube fabric on a gate insulator with a gate below the channel region and a pair of contacts to the top surface of the semiconducting nanotube fabric;

FIG. 59B shows a cross section of a CNFET device that includes a patterned semiconductor nanotube fabric with a gate insulator on the top surface and a gate above the channel region and a pair of contacts to the bottom surface of the semiconducting nanotube fabric;

FIG. 59C shows a schematic of an n-type CNFET (nCNFET);

FIG. 59D shows a schematic of a p-type CNFET (pCNFET);

FIG. 61A shows a cross section of an NRAM® nonvolatile cell formed with a select FET and a two-dimensional NV NT switch on a semiconductor substrate;

FIG. 61B shows a cross section of an NRAM® nonvolatile cell formed with a select FET and a three-dimensional NV NT block switch on a semiconductor substrate;

FIGS. 61C-60G show cross sections of NRAM® nonvolatile cells formed with a CNFET select transistor and a two-dimensional NV NT switch or a three-dimensional NV NT block switch on an insulating substrate. Semiconducting substrates are not required when using CNFET select transistors;

FIGS. 62A-1 and 62A-2 show two schematic representations of NRAM® cells using a nCNFET select device and a NV NT switch storage device;

FIGS. 62B-1 and 62B-2 show two schematic representations of NRAM® cells using a pCNFET select device and a NV NT switch storage device;

FIG. 69G shows a cross section of a complementary integrated device pair with self-aligned gates with a pCNFET and an nCNFET ion implanted atoms in the semiconducting nanotube fabric in the channel regions and the contact regions;

FIG. 70 is a schematic representation of an integrated complementary carbon nanotube inverter (CCN-inverter) circuit formed with nCNFET and pCNFET devices;

FIG. 71 is a schematic representation of an integrated complementary carbon nanotube NAND (CCN-NAND) circuit formed with nCNFET and pCNFET devices;

FIG. 72 is a schematic representation of an integrated CNFET differential amplifier circuit formed with nCNFET and pCNFET devices;

Figure 72:
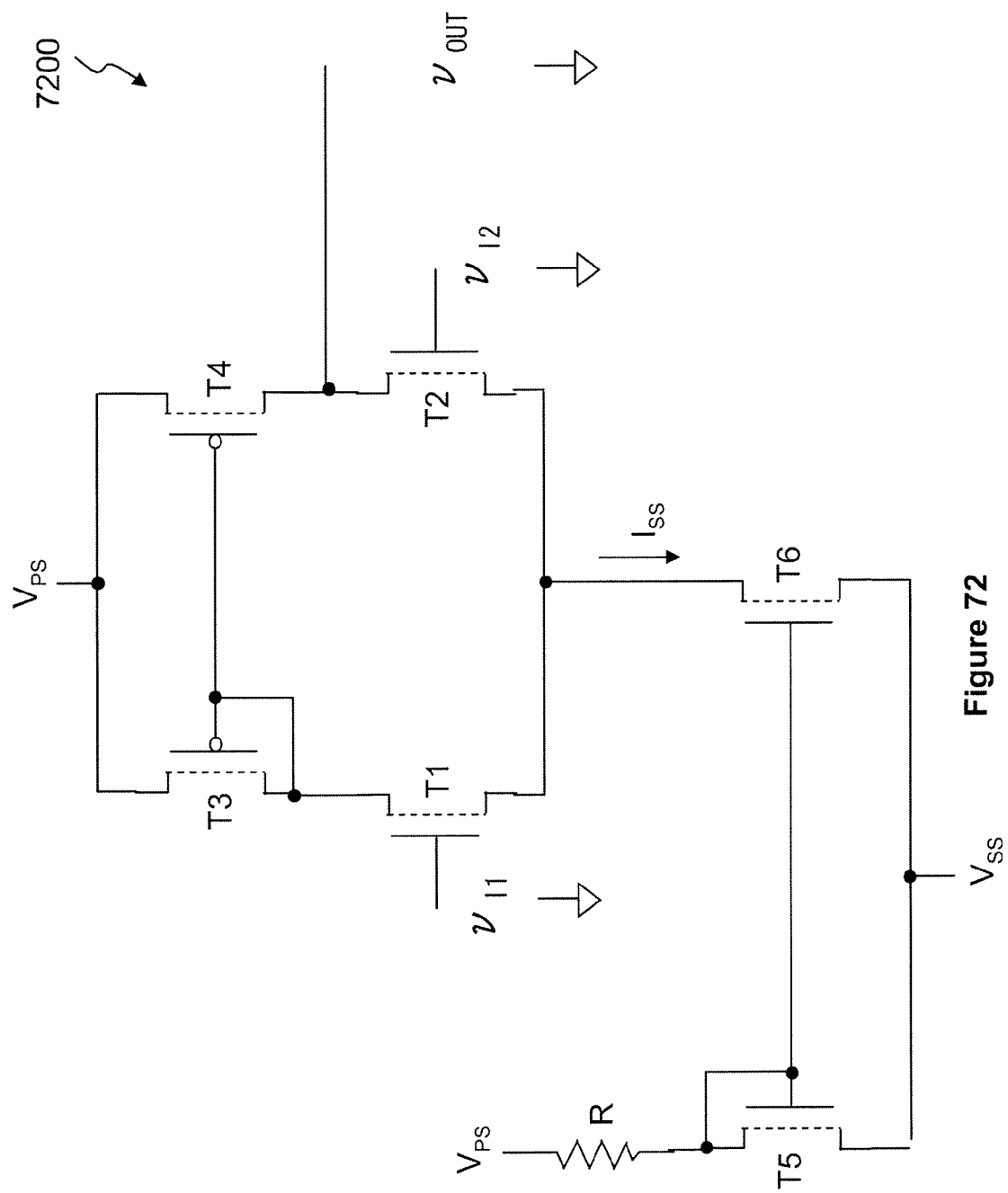
Figure 73:
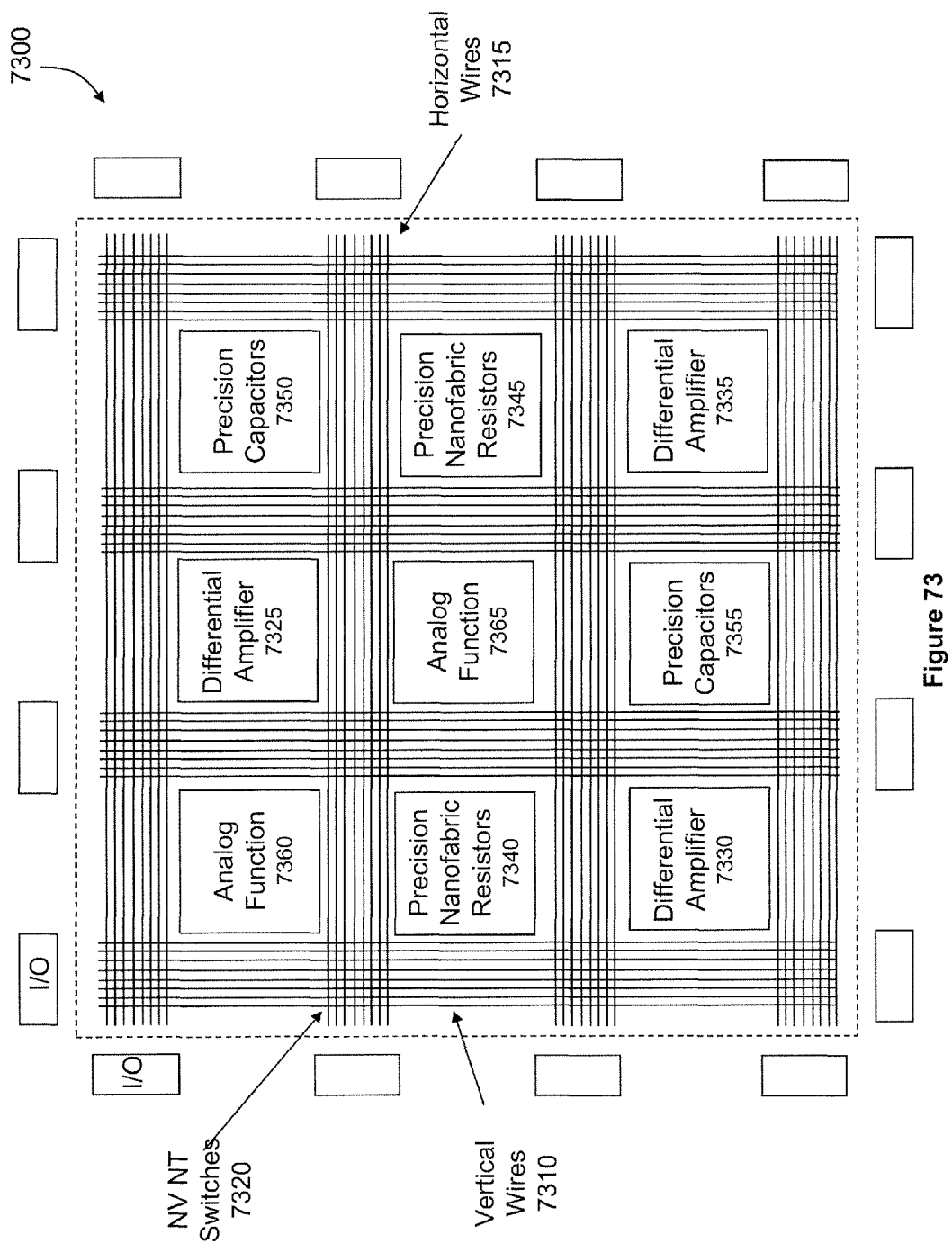
Figure 74:
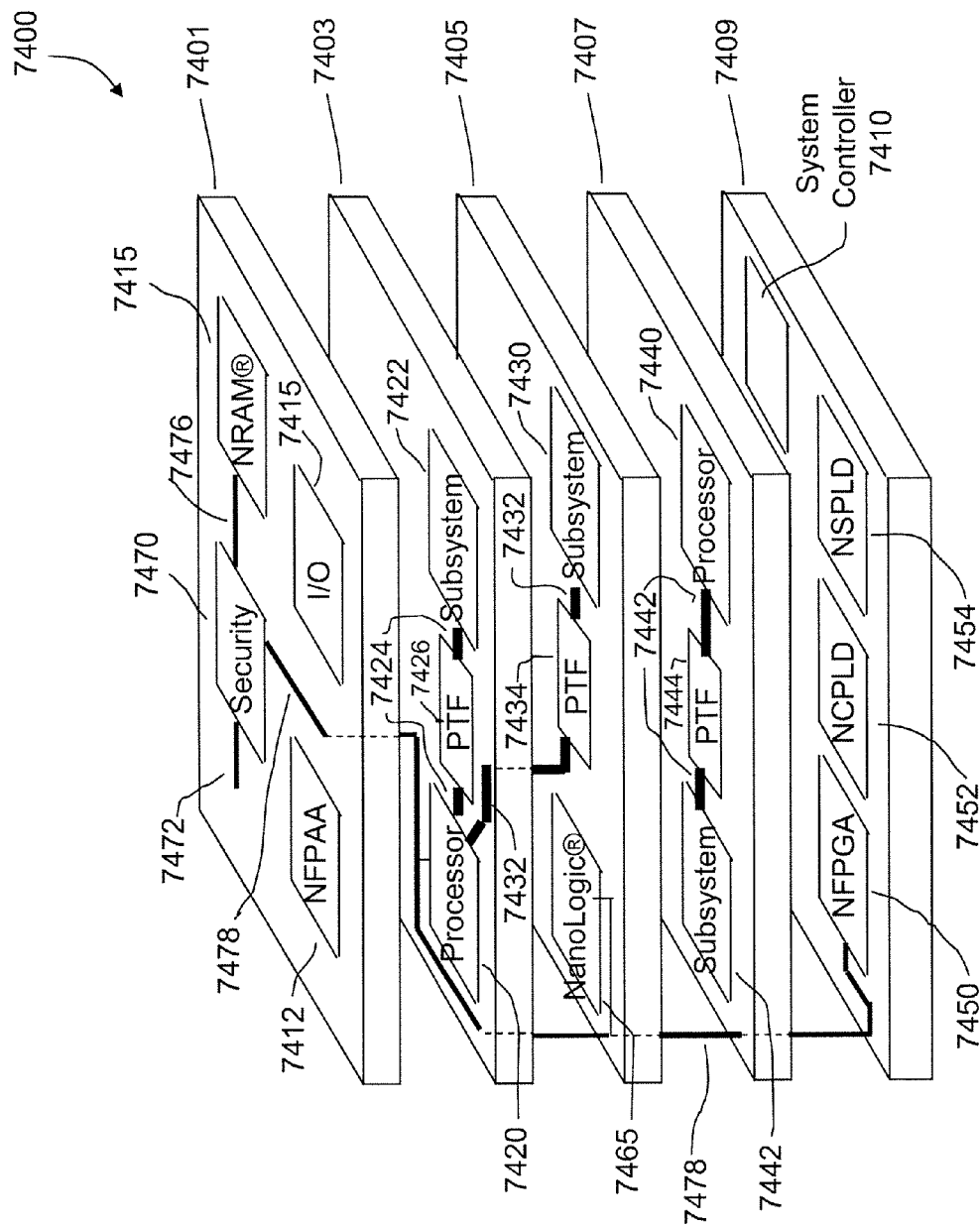

FIG. 73 is a plan view of a nanotube-based field programmable analog array using CNFET differential amplifiers as shown in FIG. 72 and other components with programmable interconnects such as those described in FIGS. 31-34; and FIG. 74 is a three-dimensional system integrated using various combinations of NRAM®, NanoLogic® functions and processors, and other functions formed using nCNFET and pCNFET devices.

DETAILED DESCRIPTION

Integrated circuits for a wide variety of product applications in a competitive environment require fast time-to-market for new designs and low (or zero) non-recurring engineering cost (NRE) and low fabrication cost. As a result, the demand for field programmable devices (FPDs) solutions has increased rapidly. Low power is a requirement for most applications. Applications are increasingly portable so conservation of battery power is a requirement and nonvolatile operation is advantageous, especially since integration levels (more function) are increasing rapidly as is the requirement for high performance.

The present disclosure provides field programmable device (FPD) chips with large logic capacity and field programmability that are in-circuit programmable (in-place in the package without requiring sockets). They use small versatile nonvolatile nanotube switches that enable efficient architectures for dense low power and high performance chip implementations and are compatible with low cost CMOS technologies and simple to integrate (low additional mask count and few additional process steps). Field programmable devices (FPDs) are also sometimes referred to as programmable logic devices (PLDs) and the terms FPD and PLD are used interchangeably throughout the application.

User In-Circuit Programmable Switch Technologies

Overview of User Programmable Switch Technologies

Figure 8:
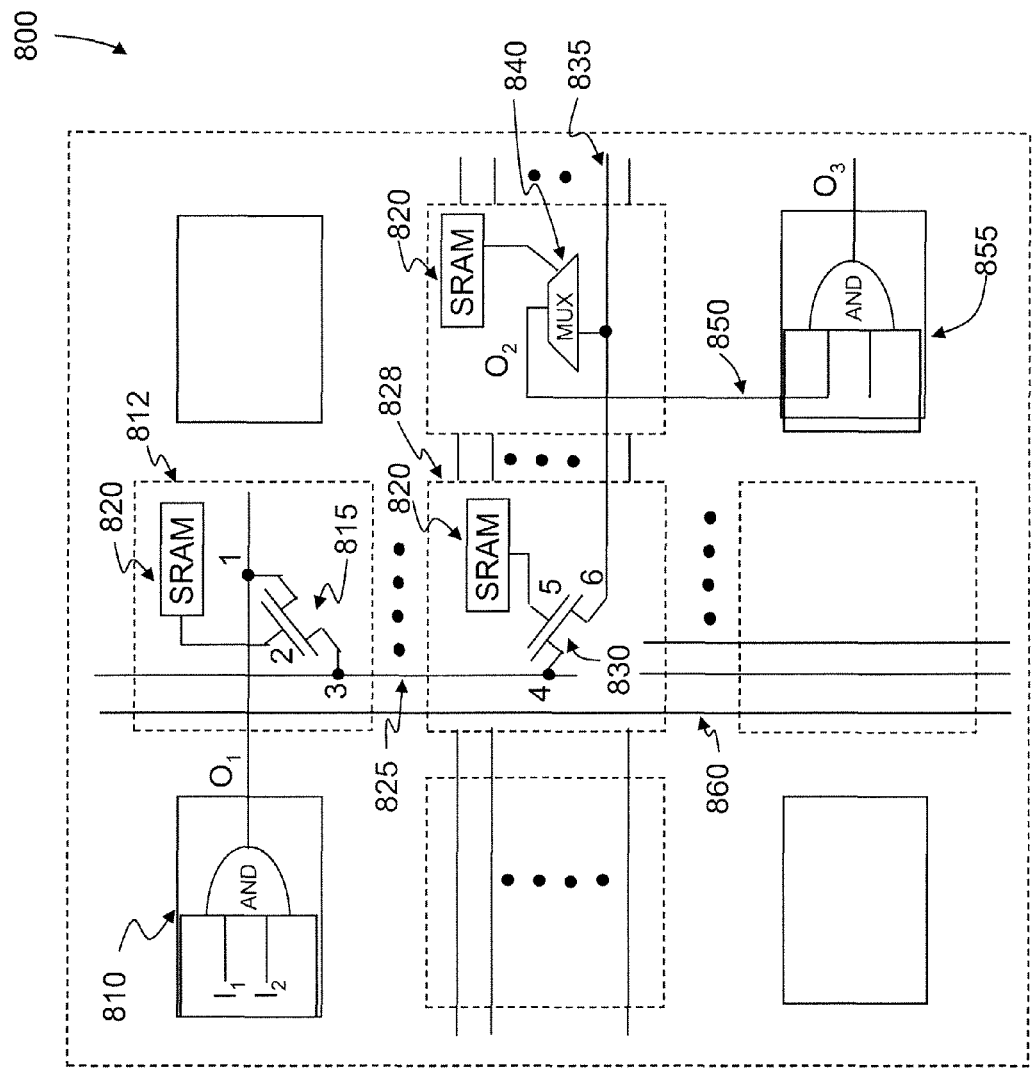
FIG. 8 is a block diagram of a field programmable gate array (FPGA) including an SRAM-configured programmable switch matrix.

Historically, CPLDs use EPROM and EEPROM switches and FPGAs use SRAM and antifuse switches. More recently, flash has also been used. As may be appreciated from the descriptions of FIGS. 8 and 9, the size, performance, and flexibility of switches used in FPGAs essentially determines FPGA architecture because FPGAs use a large amount of programmable wiring.

TABLE 1

| Switch Type | Reprogrammable In Circuit | Volatile | Typical Voltage | Technology |
|---|---|---|---|---|
| EPROM | NO (Out-of-Ckt: YES) | NO | Prog: 5-6 volts Operation: Std | UV-CMOS |
| EEPROM | YES | NO | Prog: 10-15 V Operation: higher voltage | EE-CMOS |
| FLASH | YES | NO | Prog: 10-15 V Operation: Std. | Flash-CMOS |
| SRAM | YES | YES | Std. | CMOS |
| Antifuse (AF) | NO | NO | Prog: 5-10 V. Operation: Std. | CMOS + special oxides & contacts |
| NV NT Switch | YES | NO | Prog: 3-7 V. Operation: Std. | CMOS & patterned nanotube fabric |

Table 1 is a summary of various switch types, their properties, programming and operating voltages, and underlying technologies. In some cases, more that one switch type may be used.

SRAMs used to control switches have the advantage of CMOS technology compatibility with the latest CMOS technology generation and compatibility with the standard (std.) technology operating voltages because no programming is required. However, very large switch area and volatile operation are disadvantages as well as high sensitivity to radiation and designs that can easily be copied. Antifuses have the advantage of small area size but are not reprogrammable because antifuses are OTP so the chip architecture cannot be modified once it is programmed. Antifuses typically require 5-10 volts and relatively high current in the 1-10 milliampere range. Antifuses have relatively high radiation tolerances and designs cannot easily be copied because "reverse engineering" is difficult. EPROMs with UV erase are typically limited to development prototypes. EEPROMs can be reprogrammed in-circuit but are larger than antifuses and require high programming voltage and require higher than standard operating voltages. Flash has high programming voltages but standard operating voltages. Flash devices are small in size but larger than antifuses and may be more sensitive to radiation than antifuses.

Nonvolatile nanotube (NV NT) switches such as those described in U.S. patent application Ser. No. 11/280,786, filed on Nov. 15, 2005, entitled "Two-Terminal Nanotube Devices and Systems and Methods of Making," U.S. Pat. No. 7,394,687 and U.S. patent application Ser. No. 12/165,007, filed on Jun. 30, 2008, entitled "Non-Volatile Shadow Latch Using a Nanotube Switch," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same," and U.S. patent application Ser. No. 11/835,613, filed on Aug. 8, 2007, entitled "Memory Elements and Cross Point Switches and Arrays of Same Using Nonvolatile Nanotube Blocks," may be used to form nonvolatile cross point switches that are as small as antifuses but can be programmed, erased, and reprogrammed multiple times. Such switches have a high tolerance to harsh environments such as high temperature and high radiation levels. NV NT switches may be combined with FETs to form nonvolatile NRAM™ memories with nonvolatile cells smaller than those of SRAMs as described in U.S. patent application Ser. No. 11/274,967, filed on Nov. 15, 2005, entitled "Memory Arrays Using Nanotube Articles with Reprogrammable Resistance." NV NT switches may be combined with FETs to form NanoLogic™ circuits as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," and U.S. Patent Application No. 61/039,204, filed on Mar. 25, 2008, entitled "Carbon Nanotube-Based Neural Networks and Methods of Making and Using Same," that may be used for configurable (programmable) logic functions and programmable wire routing. So NV NT switches, which are compatible with CMOS technology and use programming voltages in the 3-7 volt range and corresponding programming currents in the tens of microamperes or less, are smaller than those of competing nonvolatile in-circuit reprogrammable technologies and operate at standard CMOS operating voltages and enable new more efficient CPLD and FPGA architectures. NV NT switch scaling of dimensions may be used to reduce programming voltages in future generations.

Nanotube switches fabricated as 2-D NV NT switches with a horizontal orientation or as 3-D NV NT block switches with a vertical orientation are illustrated in FIGS. 10A-10D and described in the above referenced patents. Other types of hybrid NanoLogic™ circuits may be fabricated as shown in U.S. Pat. Nos. 7,115,901 and 7,268,044 and U.S. patent application Ser. No. 11/731,946, each entitled "Non-Volatile Electromechanical Field Effect Devices and Circuits Using Same and Methods of Forming Same," U.S. Pat. No. 6,982,903, entitled "Field Effect Devices Having a Source Controlled via a Nanotube Switching Element," U.S. Pat. No. 7,280,394, entitled "Field Effect Devices Having a Drain Controlled via a Nanotube Switching Element," U.S. Pat. No. 7,211,854 and U.S. patent application Ser. No. 11/742,290, filed on Apr. 30, 2007, each entitled "Field Effect Devices Having a Gate Controlled via a Nanotube Switching Element," U.S. Pat. No. 7,301,802, entitled "Circuit Arrays Having Cells with Combinations of Transistors and Nanotube Switching Elements," and U.S. Pat. No. 7,112,493 and U.S. patent application Ser. No. 11/527,127, filed on Sep. 26, 2006, each entitled "Method of Making Non-Volatile Field Effect Devices and Arrays of Same." Also, NanoLogic™ circuits that use only nanotube elements are also possible. Such nanotube-only type of NanoLogic™ circuits are described in U.S. Pat. No. 7,115,960 and U.S. patent application Ser. No. 11/542,524, filed on Oct. 3, 2006, each entitled "Nanotube-Based Switching Elements," U.S. Pat. Nos. 6,990,009, 7,339,401 and U.S. patent application Ser. No. 11/971,476, filed on Jan. 9, 2008, each entitled "Nanotube-Based Switching Elements with Multiple Controls," U.S. Pat. No. 7,228,970 and U.S. patent application Ser. No. 11/929,076, filed on Oct. 30, 2007, each entitled "Integrated Nanotube and Field Effect Switching Device," U.S. Pat. No. 7,329,931 and U.S. patent application Ser. No. 12/029,118, filed on Feb. 11, 2008, each entitled "Receiver Circuit Using Nanotube-Based Switches and Transistors," U.S. Pat. No. 7,330,709 and U.S. patent application Ser. No. 12/029,661, filed on Feb. 12, 2008, each entitled "Receiver Circuit Using Nanotube-Based Switches and Logic," U.S. Pat. Nos. 7,164,744, 7,265,575 and U.S. patent application Ser. No. 11/897,812, filed on Aug. 31, 2007, each entitled "Nanotube-Based Logic Driver Circuits," U.S. Pat. Nos. 7,161,403, 7,405,605 and U.S. patent application Ser. No. 12/147,315, each entitled "Storage Elements Using Nanotube Switching Elements," and U.S. Pat. Nos. 7,167,026, 7,288,961 and U.S. patent application Ser. No. 11/928,538, filed on Oct. 30, 2007, each entitled "Tri-state Circuit Using Nanotube Switching Elements," and may be volatile or nonvolatile in operation. This specification will focus on NV NT switches and NV NT blocks for nonvolatile multiple-cycle cross point switches, hybrid FET-nanotube combinations for NRAM™ storage elements, and NanoLogic™ circuits.

User In-Circuit Nonvolatile Programmable Switch Technologies Using Nanotube Switches, Nanotube Cross Point Switches, NRAM™ Memories, and NanoLogic™ Circuits Examples of certain embodiments of nonvolatile nanotube-based user-programmable switches for use in nanotube FPGA (NFPGA) Logic, nanotube SPLD (NSPLD) logic, and nanotube CPLD (NCPLD) logic are described further below in FIGS. 10A-10G and 11, 12. These include two-dimensional and three-dimensional nonvolatile nanotube switches and dense multi-cycle bidirectional cross point switches, dense directional cross point switches, nonvolatile NRAM™ memory cells, and nonvolatile NanoLogic™ circuits.

Nonvolatile nanotube (NV NT) switch 1000 illustrated in FIG. 10A is a schematic illustration of a two terminal switch with terminals T1 and T2 in contact with opposite ends of a patterned nanofabric (patterned non-woven nanotube fabric) as illustrated in U.S. Pat. Nos. 6,706,402, 6,942,921 and U.S. patent application Ser. Nos. 10/774,682, filed on Feb. 9, 2004, 11/111,582, filed on Apr. 21, 2005, each entitled "Nanotube Films and Articles," U.S. Pat. Nos. 6,835,591, 7,264,990, and 7,335,528, each entitled "Methods of Nanotube Films and Articles," and U.S. patent application Ser. No. 10/341,130, filed on Jan. 13, 2003, entitled "Carbon Nanotube Films, Layers, Fabrics, Ribbons, Elements and Articles." NV NT switch 1000 may be viewed as a resistor that changes resistance value, increasing or decreasing resistance, as a function of applied currents and voltages as described in U.S. patent application Ser. No. 11/280,786, filed on Nov. 15, 2005, entitled "Two-Terminal Nanotube Devices and Systems and Methods of Making," and U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." Resistance values are nonvolatile and are retained (remembered) even if power is removed (switched OFF). In applications such as NRAM™ storage cells, switches may be switched between ON and OFF states in which the ON state resistance may be in the 10 k Ohm to 1 M Ohm range and the OFF state is typically 1 G Ohm and higher.

It is also possible to store multiple bits on a single NV NT switch 1000 using multiple ON resistance values and one OFF value for increased memory density. For example, four resistance states store two bits of information on the same switch as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." Multi-resistance (greater than two) values may also be used in analog applications as described in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." In those applications featuring multi-resistance (greater than two) values, NV NT 1000 switches may be referred to as NANRISTORs. Since most of the NV NT 1000 switches as used in this application are digital (ON or OFF) the term NV NT switch is used.

Switch resistance values for NV NT NRAM™ cells and NanoLogic™ circuits typically range in ON values between 10 kOhm and 1 M Ohm. OFF resistance values are typically 1 G Ohm or higher. In the case of cross point switches, ON resistance values may be in the range of 50 Ohms to 500 Ohms for example because of time delay (performance) considerations. Resistance values are determined by material and geometric properties (dimensions) such as channel length and width and the density of the nanotube fabric. As illustrated above, different applications use different values of NV NT switch resistance values.

FIG. 10B shows a planar voltage contrast SEM image of a two terminal NV NT switch 1010 in an ON state in which nanotube channel region 1012 forms a continuous path between terminals T1 and T2. FIG. 10C shows two terminal NV NT switch 1010' in an OFF state. The same physical NV NT switch is used for both FIGS. 10B and 10C. However, NV NT switch 1010' is in an OFF state; that is there no continuous path between terminals T1 and T2. The nanotube channel region in FIG. 10C is electrically discontinuous with a portion of nanotube channel region 1018A in an OFF state and another series portion of nanotube channel regions 1018B in an ON state. FIGS. 10B and 10C are described in greater detail in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same."

Programmable Wiring Using Nonvolatile Nanotube Cross Point Switches

In cross point switch applications which require high density, vertically oriented nonvolatile nanotube (NV NT) blocks may be used as illustrated by a perspective view of NV NT block 1020 in FIG. 10D. NV NT block 1020 is formed by etching a relatively thick (30 to 40 nm for example) nanofabric layer to form nanofabric block 1022 with bottom contact 1023 and top contact 1024. NV NT block 1020 switches may be in-circuit programmed between ON and OFF states multiple times. So for example, programmable antifuse 940 shown in FIG. 9 (which cannot be programmed or configured in-circuit) may be replaced with in-circuit programmable NV NT block 1020 at comparable densities.

FIG. 10E shows a perspective drawing of bidirectional cross point switch array 1025 formed using four NV NT blocks 1030-1, 1030-2, 1030-3, and 1030-4 corresponding to NV NT block 1020 in FIG. 10D. Traces 1032-1 and 1032-2 correspond to vertical wires 920 and traces 1034-1 and 1034-2 correspond to horizontal wires 930 in FPGA 900 schematic drawing illustrated in FIG. 9. These orthogonal pairs of traces in contact with bottom and top surfaces of NV NT blocks provide FPGA wiring and contacts to the four NV NT blocks thereby forming bidirectional cross point switch array 1025 that supports in-circuit programming (routing). Trace 1032-1 forms array wiring and the bottom contact of NV NT blocks 1030-1 and 1030-3 and trace 1032-2 forms array wiring and the bottom contact of NV NT blocks 1030-2 and 1030-4. Trace 1034-1 forms array wiring and the top contact of NV NT blocks 1030-1 and 1030-2 and trace 1034-2 forms array wiring and the top contact of NV NT blocks 1030-3 and 1030-4.

Figures 10F, 10G:
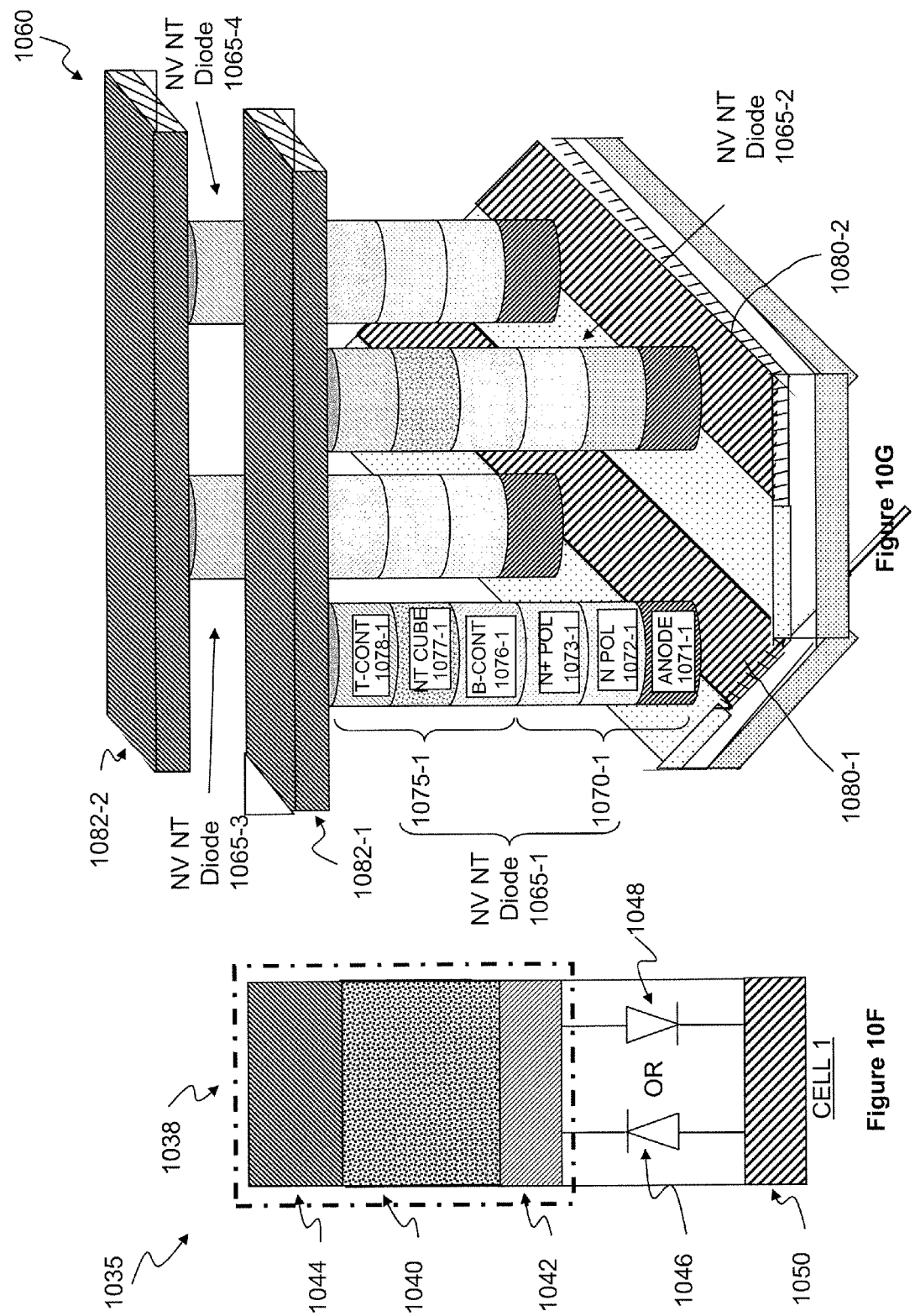
FIG. 10F shows a cross section of a nonvolatile nanotube block in series with steering (select) diodes shown in schematic form, with a first diode having a cathode in contact with a terminal of the nonvolatile nanotube block, or a second diode having an anode in contact with a terminal of the nonvolatile nanotube block.
FIG. 10G shows a perspective drawing of four memory cells (or four cross point switch cells) formed using the memory cell shown in FIG. 10F.

Bidirectional cross point switch array 1025 illustrated in perspective view in FIG. 10E enables or prevent bidirectional flow of signals, currents, voltages, or power in a densely packed array of NV NT block nonvolatile in-circuit programmable switch matrix. It may be desirable for some dense switch matrices to enable or prevent unidirectional flow of signals, currents, voltages, or power in dense arrays nonvolatile switches. FIG. 10F illustrates a nonvolatile nanotube (NV NT) diode 1035 that includes a NV NT block 1038 corresponding to NV NT block 1020 in series with a diode and is described in further detail in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." NV NT block 1038 conducts current in any direction and is not sensitive to voltage polarity. NV NT block 1038 includes NV NT block 1040, bottom contact 1042, and top contact 1044. Diode 1046 illustrated schematically is oriented such that the cathode is connected to bottom contact 1042 and the anode is connected to contact 1050 enabling vertical current flow in the upward direction. Alternatively, diode 1048 illustrated schematically is oriented such that the anode is connected to bottom contact 1042 and the cathode is connected to contact 1050 enabling vertical current flow in the downward direction. Diodes 1046 and 1048 may be may be Schottky diodes, PN diodes, or diodes formed with nanotube fabric anodes as described in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same."

Unidirectional cross point switch array 1060 illustrated in perspective view in FIG. 10G enables or prevent unidirectional flow of signals, currents, voltages, or power in a densely packed array of NV NT block nonvolatile in-circuit programmable switch matrix. Unidirectional cross point switch array 1060 formed using four nonvolatile nanotube (NV NT) diodes 1065-1, 1065-2, 1065-3, and 1065-4 that correspond to NV NT diode 1035 illustrated in FIG. 10F and illustrates a Schottky diode version of diode 1046 as the current steering device. The NV NT diode 1065-1 structure is representative of NV NT diodes 1065-2, 1065-3, and 1065-4. NV NT diode 1065-1 is formed by NV NT block 1075-1 and Schottky diode 1070-1. Note that PN diode and diodes with nanotube anodes may also be used as described in U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." Schottky diode 1070-1 is formed by anode 1071-1 in contact with N-poly 1072-1, in contact with N+ poly 1073-1; NV NT block 1075-1 is formed by NT cube 1077-1 in contact with bottom contact 1076-1 and top contact 1078-1. Traces 1080-1 and 1080-2 correspond to vertical wires 920 and traces 1082-1 and 1082-2 correspond to horizontal wires 930 in FPGA 900 schematic drawing illustrated in FIG. 9. These orthogonal pairs of traces in contact with diode 1070-1 anode 1071-1 for example and top contact 1078-1 for example of NV NT diode 1065-1 and corresponding diode anodes and top contacts of NV NT diodes 1065-2, 1065-3, and 1065-4 simultaneously provide unidirectional FPGA wiring and four NV NT diodes thereby form unidirectional cross point switch array 1060 that supports in-circuit programming. Trace 1080-1 forms array wiring and the contact to anodes of corresponding NV NT diodes 1065-1 and 1065-3 and trace 1080-2 forms array wiring and the top contact of NV NT diodes 1065-2 and 1065-4. Trace 1082-1 forms array wiring and the top contact of NV NT diodes 1065-1 and 1065-2 and trace 1082-2 forms array wiring and the top contact of NV NT diodes 1065-3 and 1034-4.

High Application Function Security Using Programmable Wiring with Nonvolatile Nanotube Cross Point Switches and Programmable Logic Blocks There are certain sensitive applications in which it is desirable that a logic application function remain proprietary. Such applications include intelligence functions, military applications, industrial secrets, and others. However, there are situations in which a logic application function can be determined based on hardware implementations such as in integrated circuit chips for example in which such chips may be stolen or fall into unfriendly territory. In cases where hard wire connections are permanent, hard wires can be traced and the logic function can be identified. Alternatively, in some cases, chips may be interrogated electronically by a security breach in an internet connection. What is needed are effective countermeasures that provide high application function security.

A logic application function can be identified based on the logic blocks used and wiring interconnections between the logic blocks. A logic application function may be secured by reprogramming one or more programmable wiring interconnections between individual wires and logic (or logic and memory) blocks if a security event (breach) is detected. In another approach, a logic application function may be secured by reprogramming one or more programmable logic blocks if a security event is detected. In still another approach, a logic application function may be secured by both reprogramming one or more programmable wiring interconnections and further reprogramming one or more programmable logic blocks if a security event is detected. These and other similar electronic countermeasure approaches to logic application function security require dense nonvolatile switches that can be programmed multiple times and changed in case of a security event.

In certain situations, a security event may be detected and sufficient time exists to deploy electronic countermeasures such as the reprogramming of integrated circuit chips. If a security event is detected, the logic application functions may be changed by altering programmable wiring connections, altering programmable logic blocks, or altering both wiring connections and logic blocks as described further above. However, this requires dense nonvolatile switches such as nonvolatile nanotube cross point switches (FIGS. 10D, 10E, 10F, and 10G) and other nonvolatile nanotube switch types such as the NV NT switch illustrated in FIGS. 10A-10C that can be programmed multiple times. One-time-programmable (OTP) antifuses, or any kind of OTP switch, cannot be used because OTP switches cannot be reprogrammed. Additional examples of nonvolatile nanotube-based switches are illustrated further below with respect to FIGS. 11 and 12 for example, and various FPGA logic examples also illustrated further below. In case of a security event, logic application functions may be altered in many ways, such as, but not limited to, reprogramming said logic application functions in a random manner or setting a plurality of programmable interconnections to an open state. Alternatively, the logic application function may be altered such that a different logic application function is formed to deliberately mislead.

In other situations, a security event may take place which is undetected or in which there is insufficient time to deploy electronic countermeasures. For example, an integrated circuit chip that includes high application function security logic may be stolen. In this situation, chip designs that make the application of advanced reverse engineering (failure analysis) techniques difficult may be used to protect high application function security chips. For example, a high application security function may include extra circuits, devices, and interconnections for the purpose of complicating reverse engineering of integrated circuit chips. For hard-wired logic functions, interconnections and contact regions may be traced (that is, interconnections between circuit elements detected using electronic equipment such as scanning electron microscopes) at high magnification to identify logic functions. If antifuses are used instead of contacts, it is difficult to tell whether an antifuse has been activated (is conductive) and forms a contact or if the antifuse is nonactivated (nonconducting) by examining the chip regions under high magnification. However, since cross sectional techniques to determine oxide integrity are well known in the industry, the logic function may be reverse engineered using known failure analysis techniques to see if an antifuse oxide has been ruptured and is in a conductive state or if the oxide is intact and the antifuse is in a noncontactive state.

Cross point switches using patterned nanofabric, as described in U.S. patent application Ser. No. 11/280,786, filed on Nov. 15, 2005, entitled "Two-Terminal Nanotube Devices and Systems and Methods of Making," to form nonvolatile nanotube switches such as illustrated in FIGS. 10D and 10E are nearly impossible to reverse engineer. Typically, the patterned nanofabric cross point switch area (or volume) is about 90% void or filled with non-carbon nanotube material. Cross sectioning such a cross point switch tends to destroy it completely. Even if the switch is not destroyed completely, it is likely to be damaged so that the state of the switch (low or high resistance) cannot be reliably determined.

Another approach to nanotube-based security is to leverage the difficulty of reverse engineering cross point switches using patterned nanofabric (as described further above) and to include patterned nanofabric contacts in logic as part of logic wiring (interconnects) that are very difficult to reverse engineer. This is possible because such patterned nanofabric contacts are (or can be made) normally as conducting nonvolatile nanotube crosspoint switches as-fabricated. Keeping the logic operating voltages below the switching voltage of the nonvolatile nanotube cross point switches enables the patterned nanofabric to act as a patterned nonfabric contact. The switching voltage of nonvolatile nanotube cross point switches may be increased to well above that the logic voltage swings as needed as to ensure that patterned nanofabric contacts remain conductive, as described in U.S. Pat. Nos. 6,706,402, 6,942,921 and U.S. patent application Ser. Nos. 10/774,682, filed on Feb. 9, 2004, 11/111,582, filed on Apr. 21, 2005, each entitled "Nanotube Films and Articles."

NRAM™ Cells and NanoLogic™ Analog and Digital Circuits

FIG. 11A illustrates NRAM™ cell 1100 comprising NV NT switch 1110 and FET 1120 in series. Nonvolatile NRAM™ memories are formed with multiple NRAM cells similar to NRAM cell 1100 as described in U.S. patent application Ser. No. 11/280,786, filed on Nov. 15, 2005, entitled "Two-Terminal Nanotube Devices and Systems and Methods of Making," and U.S. patent application Ser. No. 11/274,967, filed on Nov. 15, 2005, entitled "Memory Arrays Using Nanotube Articles with Reprogrammable Resistance," and with respect to FIG. 19 further below, with nonvolatile cells smaller in area than volatile 6 FET SRAM cells. Multiple word lines (not shown) are arranged horizontally and in contact with gates of FETs corresponding to gate G of FET 1120; bit lines (not shown) essentially orthogonal to word lines are arranged vertically and contact a diffusion terminal corresponding to terminal T1 in FIG. 11A. One side of the NV NT switches corresponding to NV NT switch 1110 is in contact with a terminal of FETs such as FET 1120 and the other side is in contact with common reference lines (not shown) in contact with a terminal of NV NT switches such as NV NT switch 1110. Such contacts may be formed with reference lines that may be parallel to word or bit lines, or may be formed by a reference plane (not shown), with reference voltage held at a reference voltage such as ground.

In operation, NRAM™ cell 1100 may be programmed to a high resistance state such as 1 G Ohm or higher for example, and a low resistance state in the 100 k Ohm to 1 M Ohm range for example. Voltages in the range of 3-7 volts are applied for write 1 (program) and write 0 (erase) operations with readout voltages in the 1.5 to 2.5 volt range. Operating conditions are a function of the NV NT switch material and geometrical characteristics such as distance between terminal contacts to the patterned nanofabric material. Waveform examples are illustrated in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches."

In order to further facilitate in-circuit configurable (programmable) logic blocks (cells, functions) and in-circuit programmable switch matrices for routing signals, currents, voltages, and/or power for example, NanoLogic™ circuits with various combinations of nonvolatile switches and FETs may be formed. NanoLogic™ circuits may be used in FPGAs, SPLDs, CPLDs, and in other digital circuit applications as well as analog applications. FPGA, SPLD, and CPLD programmable logic functions configured using nanotube-based NanoLogic™ and memory functions such as NRAM™ may be referred to as NFPGA, NSPLD, and NCPLD logic functions, respectively.

FIG. 11B illustrates an embodiment of NanoLogic™ configurable (programmable) NV NT select circuit 1150 formed using NV NT switch 1155 (SW1) and NV NT switch 1160 (SW2) sharing a common node referred to as select node 1170. Terminals T1 and T2 are connected to a second terminal of NV NT switches 1155 and 1160, respectively. FET 1165 has a diffusion connected to common select node 1170 and the other diffusion connected to a reference such as ground as described in U.S. Patent Application No. 61/039,204, filed on Mar. 25, 2008, entitled "Carbon Nanotube-Based Neural Networks and Methods of Making and Using Same."

In operation, when a logic function is programmed, FET 1165 is activated (ON) during program (write 1) or erase (write 0) operations by applying a high voltage to gate G of FET 1165 which connects select node 1170 to ground and provides a current path between terminal T1 and ground and terminal T2 and ground through NV NT switches 1155 and 1160, respectively. Combinations of erase and program operations are used to set resistance states (values) of NV NT switches 1155 and 1160. Erase and program operations are described further above with respect to FIG. 11A and in more detail in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches." NV NT switches 1155 and 1160 may be viewed as NANRISTORS. These resistance states (values) remain nonvolatile even after power is removed or lost. After program or erase operations, FET 1165 is in an (OFF) state by applying a low voltage such as ground to gate G of FET 1165 and select node 1170 is disconnected from ground. NV NT select circuit 1150 is now ready to provide a configured (programmed) logic block function operating at 2.5 volts for example. Note that while NanoLogic™ circuits are designed to be in-circuit programmed, this does not preclude programming in sockets for example as is done in some older technologies. In fact, NanoLogic™ circuits may be embedded and operate in chips with older programmable technologies and with CMOS digital and analog circuits. Note that the terms configurable and programmable are used interchangeably.

During logic operation, after the configurable logic function has been programmed and is stored in a nonvolatile state by NV NT switches 1155 and 1160 operating voltages are kept sufficiently low, less than 3 volts for example, so that the resistance states (values) of NV NT switches 1155 and 1160 are not changed (disturbed) under NFPGA, NCPLD, NSPLD, and other programmable logic function operation. If NV NT switch 1155 is in high resistance state, 1 G Ohm for example, and NV NT switch 1160 is in low resistance state, 100 k Ohms for example, and if T1 is at an on-chip voltage of $V_{DD}=2.5$ volts and T2 is at a reference voltage such as ground (zero volts), then select node 1170 voltage will be at approximately 0 volts. However, if switch NV NT switch 1155 is in a low resistance state, 100 k Ohm for example, and NV NT switch 1160 is in a high resistance state, 1 G Ohm for example, then select node 1170 voltage will be at 2.5 volts. FET 1165 is OFF during logic operations.

Logic operation has been described in terms of applying inputs to terminals T1 and T2 to generate a select node 1170 output voltage. However, an input voltage may be applied to select node 1170 and output voltages may be generated at terminals T1 and T2 based on the resistance states (values) of NV NT switches 1155 and 1160 and circuits (not shown) connected to terminals T1 and T2.

FIGS. 12A-12D illustrate various embodiments of NanoLogic™ nonvolatile nanotube configurable logic blocks (circuits, functions, cells) with inputs X1 and X2 to NV NT switches and a mode control input Y connected to the gate of a mode control (program/erase or operate) FET. Inputs X1 and X2 and mode control input Y may be shared by multiple NanoLogic™ circuits as illustrated further below in FIG. 13. The NanoLogic™ circuits illustrated in FIG. 12 correspond to combinatorial logic function 710 illustrated in FIG. 7. Flip flops and multiplexers often included as part of configurable logic blocks, as illustrated in FIG. 7, are not shown in FIG. 12 but may be included as needed.

NanoLogic™ programmable NV NT select circuit 1200 illustrated in FIG. 12A corresponds to programmable NV NT select circuit 1150 illustrated in FIG. 11B. Inputs X1 and X2 correspond to inputs T1 and T2, respectively; switches 1205 and 1210 correspond to switches 1155 and 1160, respectively; FET 1215 corresponds to FET 1165. Mode control input Y is connected to the gate of FET 1215 which corresponds to gate G of FET 1165. Select node 1220 corresponds to select node 1170. Programmable NV NT select circuit 1200 operation corresponds to the operation of programmable NV NT select circuit 1150 described further above with respect to FIG. 11B.

FIG. 12B illustrates programmable NanoLogic™ circuit 1240 in which programmable NV NT select circuit 1200-1 with select node 1225-1 corresponds to programmable NV NT select circuit 1200, and controls the gate voltage of FET 1230 transfer device. The logic function of programmable NV NT select circuit 1200-1 is determined as described further above with respect to programmable NV NT select circuits 1200 and 1150 and retains the programmed logic function even if power is removed or is lost.

In operation, select node 1225-1 turns FET 1230 ON if it is at a high voltage such as 2.5 volts and turns FET 1230 OFF if is at a low voltage such as ground. When FET 1230 is ON, signal flow, voltage distribution, current distribution, and power distribution are enabled; and when FET 1230 is in an OFF state, then transmission of these functions is disabled. NanoLogic™ circuit 1240 may be used to control switches that route signals as illustrated further below with respect to FIGS. 13, 16, 17A, and 17B. Also, multiple NanoLogic™ circuits 1240 may be combined to generate larger nonvolatile nanotube logic blocks (circuits, functions, cells) as illustrated in FIG. 14, and corresponding FIG. 15 and FIG. 14B.

FIG. 12C illustrates programmable NanoLogic™ circuit 1250 in which programmable NV NT select circuit 1200-2 with select node 1225-2 corresponds to programmable NV NT select circuit 1200, and controls an input voltage of NAND gate 1260. The logic function of programmable NV NT select circuit 1200-2 is determined as described further above with respect to programmable NV NT select circuits 1200 and 1150 and retains the programmed logic function even if power is removed or is lost.

Figure 13:
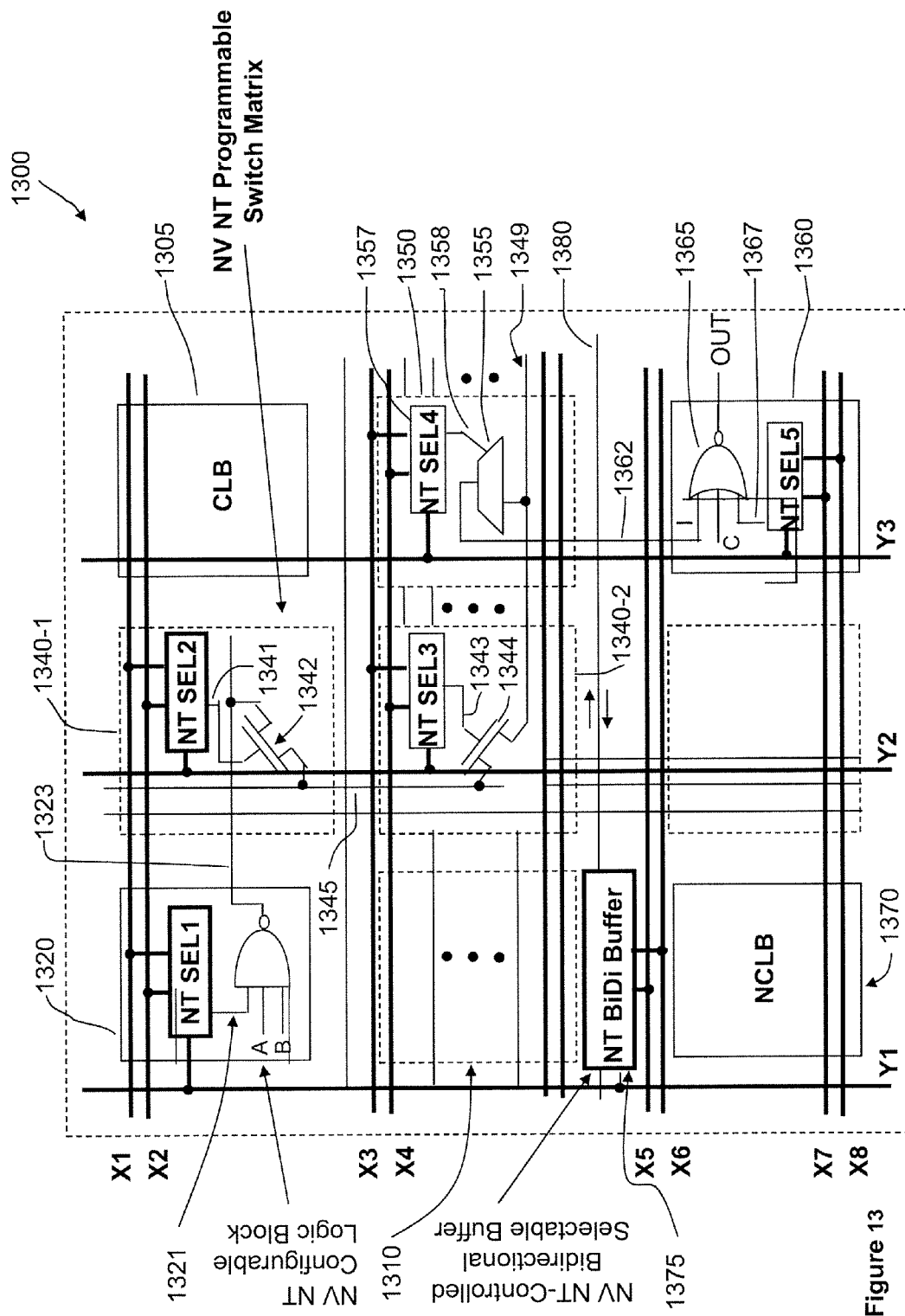
FIG. 13 shows a nonvolatile nanotube field programmable gate array (NFPGA) with configurable logic blocks and programmable switch matrices controlled by nonvolatile nanotube select circuits.
Figure 14A:
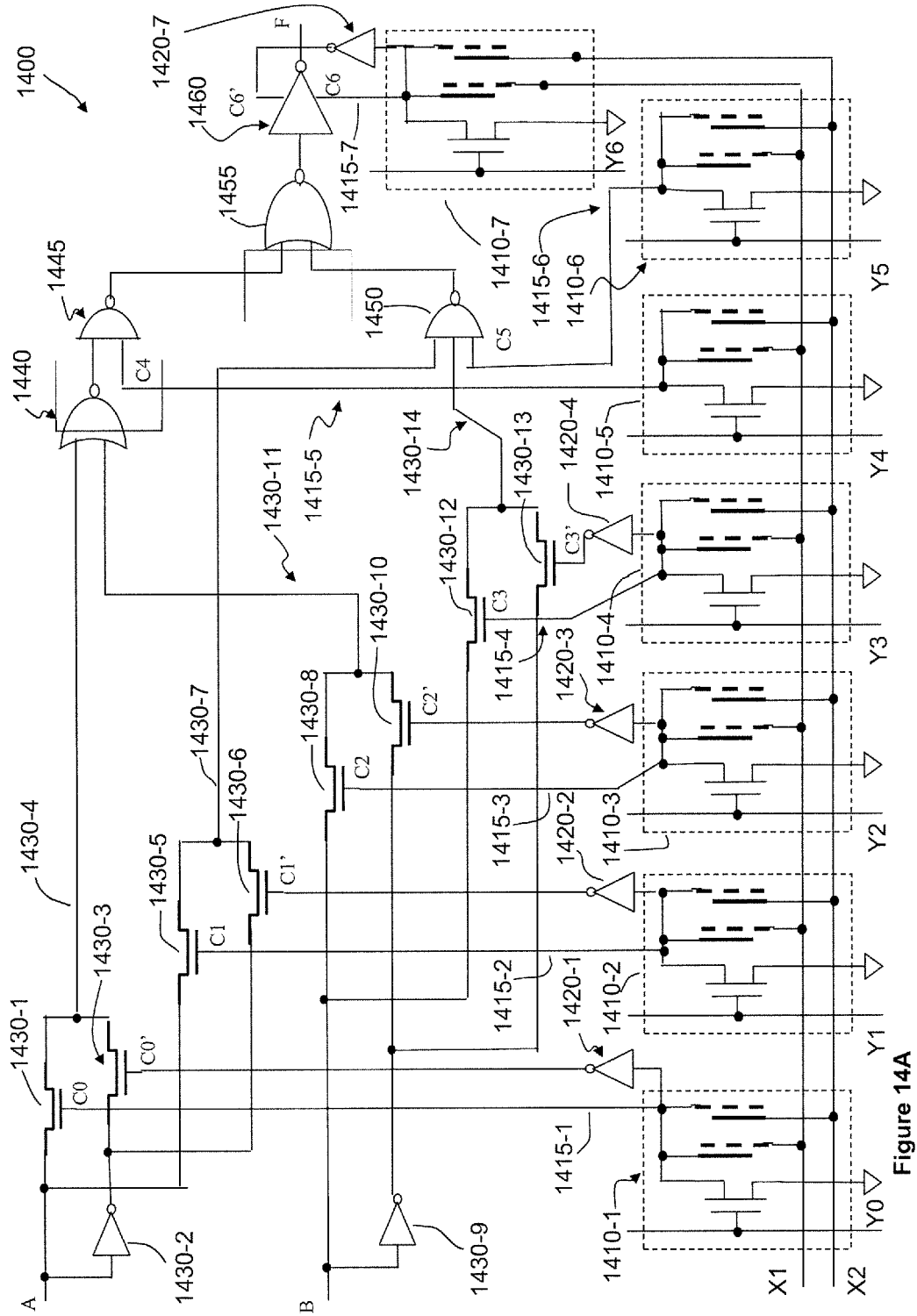
FIG. 14A shows a nonvolatile nanotube configurable logic block (NCLB) formed using transfer gates, NAND, NOR, and tristate circuits whose logic function is determined by logic states provided nonvolatile nanotube select circuits.

In operation, if select node 1225-2 is at a high voltage state H such as 2.5 volts then NAND gate 1260 operates as a two input NAND gate with inputs A and B and the complement of AB $(A \cdot B)_C$ as the output as illustrated in table 1265. However, when select node 1225-2 is at a low voltage state L such as zero volts, NAND gate 1260 output remains at a high voltage state H such as 2.5 volts independent of inputs A and B as illustrated in table 1265. Programmable NanoLogic™ circuit 1250 may be used as a NV NT configurable (programmable) logic block as illustrated in FIG. 13.

FIG. 12D illustrates programmable NanoLogic™ circuit 1270 in which programmable NV NT select circuit 1200-3 with select node 1225-3 corresponds to programmable NV NT select circuit 1200, and controls an input voltage of NOR gate 1280. The logic function of programmable NV NT select circuit 1200-3 is determined as described further above with respect to programmable NV NT select circuits 1200 and 1150 and retains the programmed logic function even if power is removed or is lost.

In operation, if select node 1225-3 is at a low voltage state L such as zero volts then NOR gate 1280 operates as a two input NOR gate with inputs A and B and the complement of the sum of A plus B $(A+B)_C$ as the output as illustrated in table 1275. However, when select node 1225-3 is at a high voltage such as 2.5 volts, NOR gate 1280 output remains at a low voltage state L such as zero volts independent of inputs A and B as illustrated in table 1275. Programmable NanoLogic™ circuit 1270 may be used in a NV NT configurable (programmable) logic block as illustrated in FIG. 13.

Nanotube Nonvolatile NFPGA Logic

FPGA architectures are dominated by interconnects. FPGAs are therefore much more flexible in terms of the range of designs that can be implemented and logic functions in the hundreds of thousands to millions and tens-of-millions of equivalent logic gates may be realized. In addition, the added flexibility enables inclusion of higher-level embedded function such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks.

Nonvolatile nanotube switches combined with basic building blocks of FPGAs such as configurable logic blocks (CLBs), programmable switch matrices (PSMs), bidirectional buffers (BiDi buffers) result denser, low power, and high performance nonvolatile nanotube building blocks such as NCLBs, NPSMs, N-BiDi buffers, and other functions that enable nonvolatile nanotube FPGA (NFPGA) logic operation.

Nonvolatile nanotube select circuits (NV NT select circuits) described in U.S. Patent Application No. 61/039,204, filed on Mar. 25, 2008, entitled "Carbon Nanotube-Based Neural Networks and Methods of Making and Using Same," are combined with CLB and PSM functions to form NCLB and NPSM building blocks that may be integrated to form NFPGA logic as described with respect to FIGS. 13-18 illustrated further below.

NFPGAs which include NCLB, NPSM, N-BiDi, nonvolatile nanotube programmable voltage generators and other logic and memory functions may reprogrammed in case of a security event to protect high application function security integrity as described further above. Thus, for example, configuration control bits supplied by NV NT select circuits or other NanoLogic™ circuits, NRAM™ memory arrays, or nonvolatile nanotube-based shift registers can be dynamically reprogrammed thereby altering the NFPGA logic function in response to a security event (threat).

Nanotube Configurable Logic Blocks (NCLB) & Nanotube Programmable Switch Matrix (NPSM) Using Nonvolatile Nanotube Select Circuits NFPGA Function and Operation Using Nonvolatile Nanotube Select Circuits FIG. 13 illustrates a block diagram of an embodiment of NFPGA 1300 formed using NanoLogic™ circuits that include nonvolatile nanotube (NV NT) select circuits (labeled NT SEL1-5) as part of nanotube configurable logic blocks (NCLBs) such as NCLB 1320 for example and nanotube programmable switch matrices (NPSMs) such as NPSM 1340-1. NFPGA 1300 also includes nanotube bidirectional buffers such as NT BiDi buffer 1375 that controls the direction of signal flow in global wire 1380. Flip flops and multiplexers (shown in FIG. 7) may be included as well. Multiple NV NT select circuits share select/program/operate row lines X1 . . . X8 and mode control lines Y1 . . . Y3.

The NFPGA 1300 logic function is configured by performing program or erase operations on NV NT select circuits, labeled NT SEL1-5 in FIG. 13, using rows of select/program/operate lines X1 . . . X8 and columns of mode control lines Y1 . . . Y3 as described further above with respect to NV NT select circuits 1150 and 1200. Multiple nanotube configurable logic blocks (NCLBs), nanotube programmable switch matrices (NPSMs), and NT BiDi Buffers such as NT BiDi Buffer 1375 are configured (programmed) and define the NFPGA 1300 logic function. Then, X1 . . . X8 voltages are set to a combination of high and low voltage values and Y1 . . . Y3 are set to a low voltage such as ground to enable NFPGA 1300 logic operation as described further above with respect to NV NT select circuit 1150 in FIG. 11B.

NCLB 1320 corresponds to NanoLogic™ circuit 1250 illustrated in FIG. 12C and flip flops and multiplexers (not shown) as needed such as illustrated in FIG. 7; NPSM 1340-1 corresponds to NanoLogic™ circuit 1240 illustrated in FIG. 12B; NPSM 1340-2 also corresponds to NanoLogic™ circuit 1240; NCLB 1360 corresponds to NanoLogic™ circuit 1270 illustrated in FIG. 12D and flip flop and multiplexers (not shown) as needed such as illustrated in FIG. 7; NCLB 1350 includes NT SEL4 also referred to as NV NT select circuit 1357 that corresponds to NV NT select circuit 1200 which controls the operation of multiplexer 1355 and may include flip flops and other multiplexers (not shown) as illustrated in FIG. 7. CLB functions such as 1305 and 1370 may include configurable logic functions such as illustrated in FIGS. 6 and 7 and may or may not include NanoLogic™ functions. Wiring region 1310 shows horizontal wires that may be used for various interconnections (not shown). NT BiDi Buffer 1375 controls the direction of signal flow on wire 1380 as explained further below with respect to FIG. 17.

In logic configuration operations, NV SEL1 . . . NV SEL5 share control and mode select lines X1 . . . X8 and Y1 . . . Y3, respectively. In performing erase and programming operations, it is important not to disturb other NV NT select circuits sharing the same control and mode select lines. One method of implementing a configuration-setting operation is to first erase all pairs of NV NT switches to a high resistance (OFF) state such illustrated by NV NT switch 1010' in FIG. 10C which corresponds to NV NT switches 1155 and 1160 illustrated in FIG. 11B and NV NT switches corresponding to NV NT switches 1205 and 1210 illustrated in FIG. 12A, along pairs of row lines such as X1 and X2. Then, program selected individual NV NT switches to a low resistance (programmed) state, leaving unselected NV NT switches in a high resistance (erased) state as described further below. Another method of implementing a configuration-setting operation is to first program all pairs of NV NT switches to a low resistance (ON) state such as illustrated by NV NT switch 1010 in FIG. 10B which corresponds to NV NT switches 1155 and 1160 illustrated in FIG. 11B and NV NT switches corresponding to NV NT switches 1205 and 1210 illustrated in FIG. 12A, along pairs of row lines such as X1 and X2. Then, program selected individual NV NT switches to a high resistance (erased) state, leaving unselected NV NT switches in a low resistance (erased) state as described further below. Still another method of implementing a configuration-setting operation is to selectively modify those NV NT switches that need to be changed from a low resistance (ON) state to a high resistance (OFF) state or from a high resistance (OFF) state to a low resistance (ON) state. In the operation descriptions that follow, the configuration-setting operation examples are based on erasing all NV NT switches to a high resistance (OFF) state and then selectively programming selected NV NT switches to a low resistance (ON) state.

In this configurable logic configuration-setting operation example, NCLB 1320 NT SEL1 circuit is programmed such that select node 1321 is at a high voltage enabling logic function $(A \cdot B)_C$ output to wire 1323 and NPSM 1340-1 NT SEL2 circuit is programmed such that select node 1341 is at a high voltage which turns FET 1342 to an ON state so that the wire 1323 signal is transmitted to wire 1345.

In an erase operation (low-to-high resistance state transition), X1, X2, X3-X8 control lines are set to zero volts and mode select lines Y1, Y2, and Y3 are set to a high voltage such as 2.5 volts to connect all select nodes, including select nodes 1321 and 1341 to ground. Next, control lines X1 and X2 may be activated using one or more erase pulses $V_E$ such that corresponding NV NT switches in NT SEL1 and NT SEL2 are in a high resistance state. Note that it is also possible to do a block erase of all NT SEL circuits. Erase pulses $V_E$ are typically in the 5 to 7 volt range with relatively fast rise time in nanosecond range.

Next, a programming operation (high-to-low resistance state transition) is performed on NT SEL1 circuit at the intersection of X1, X2, and Y1. In this example, NT SEL 1 select node 1321 is to be in a high voltage state during NFPGA 1300 logic operation. NT SEL1 operation corresponds to NV NT select circuit 1200 operation and corresponding NV NT switch 1205 and 1210 states are set based on NFPGA 1300 operational requirements. Therefore, NV NT switch 1205 (FIG. 12A) is programmed to a low resistance state and NV NT switch 1210 is left in a high resistance state. However, if select node 1321 were to have a low voltage state during logic operation then NV NT switch 1205 would be left in a high resistance state and NV NT switch 1210 would be programmed to a low resistance state.

In a programming operation for NT SEL1, mode line Y1 is set at a high voltage such as 2.5 volts such that select node 1321 is grounded by an FET corresponding to FET 1215 (FIG. 12A) prior to applying programming pulses V. Mode lines Y2 and Y3 are set at ground so that select nodes such as select node 1341 are not held at ground by mode control FETs such as FET 1215. Next, control line X2 is held at $V_P/2$ and control line X1 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X2 is held at $V_P/2$ so that the NV NT switch in NT SEL1 corresponding to NV NT switch 1210 is not disturbed since only $V_P/2$ appears across it and remains in a high resistance state such as 1 G Ohm for example, and also so that NV NT switches in adjacent NT SEL2 circuit corresponding to NV NT switches NV NT 1205 and 1210 are not disturbed and remain in a high resistance state. NT SEL2 NV NT switches corresponding to NV NT switches 1205 and 1210 are not disturbed because the difference between voltages on control lines X1 and X2 is applied to the series combination of two NV NT switches; that is $V_P - V_P/2 = V_P/2$ appears across two NV NT switches in series corresponding to NV NT switches 1205 and 1210 because the mode control FET corresponding to FET 1215 is OFF. Actually, a voltage of $V_P/2$ applied to a single NV NT switch is also insufficient to cause switching. Unselected control line pairs, such as X3-X4; X5-X6, and X7-X8, are held at ground.

Next, in a programming operation for NT SEL2, mode line Y2 is set at a high voltage such as 2.5 volts such that select node 1341 is grounded by an FET corresponding to FET 1215 (FIG. 12A) prior to applying programming pulses $V_P$. Mode lines Y1 and Y3 are set at ground so that select nodes such as select node 1321 are not held at ground by mode control FETs such as FET 1215. Next, control line X2 is held at $V_P/2$ and control line X1 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X2 is held at $V_P/2$ so that the NV NT switch in NT SEL2 corresponding to NV NT switch 1210 is not disturbed since only $V_P/2$ appears across it and remains in a high resistance state such as 1 G Ohm for example, and also so that NV NT switches in adjacent NT SEL1 circuit corresponding to NV NT switches NV NT 1205 and 1210 are not disturbed and remain in a high resistance state. NT SEL1 NV NT switches corresponding to NV NT switches 1205 and 1210 are not disturbed because the difference between voltages on control lines X1 and X2 is applied to the series combination of two NV NT switches; that is $V_P-V_P/2=V_P/2$ appears across two NV NT switches in series corresponding to NV NT switches 1205 and 1210 because the mode control FET corresponding to FET 1215 is OFF. Actually, a voltage of $V_P/2$ applied to a single NV NT switch is also insufficient to cause switching. Unselected control line pairs are held at ground.

Erase and program operations for NT SEL3 and NT SEL4 circuits correspond to those described with respect to NT SEL 1 and SEL2 circuits except that X3 and X4 control lines are used instead of X1 and X2 control lines. Unselected control line pairs are held at ground.

NCLB 1360 corresponds to NanoLogic™ circuit 1250 illustrated in FIG. 12D and flip flops and multiplexers (not shown) such as illustrated in FIG. 7. An erase operation for NanoLogic™ circuit 1360 NT SEL5 circuit is similar to the erase operations described above with respect to NT SEL1 and NT SEL2. However, in this example, select node 1367 output voltage is selected to be zero so that NOR gate 1365 transmits $(C+I)_C$ to output OUT of NCLB 1360 so the programming operation is different.

In a programming operation for NT SEL5, mode line Y3 is set at a high voltage such as 2.5 volts such that select node 1367 is grounded by an FET corresponding to FET 1215 (FIG. 12A) prior to applying programming pulses V. Mode lines Y1 and Y2 are set at ground so that other select nodes (not shown) are not held at ground by mode control FETs such as FET 1215. Next, control line X7 is held at $V_P/2$ and control line X8 is pulsed with programming pulses $V_P$ which are typically in the 3 to 5 volts range with rise times in microsecond range and the NV NT switch corresponding to NV NT switch 1205 is programmed from a high to low resistance state (from 1 G Ohm to 100 k Ohm for example). Control line X7 is held at $V_P/2$ so that the NV NT switch in NT SEL1 corresponding to NV NT switch 1210 is not disturbed since only $V_P/2$ appears across it and remains in a high resistance state such as 1 G Ohm for example, and also so that NV NT switches in adjacent NT SEL circuit (not shown) are not disturbed and remain in a high resistance state. NV NT switches (not shown) are not disturbed because the difference between voltages on control lines X7 and X8 is applied to the series combination of two NV NT switches of any NV SEL circuits that share control lines X7 and X8; that is $V_P-V_P/2=V_P/2$ appears across two NV NT switches in series because the mode control FET corresponding to FET 1215 is OFF. Actually, a voltage of $V_P/2$ applied to a single NV NT switch is also insufficient to cause switching. Unselected control line pairs are held at ground.

The programmed NFPGA 1300 logic function is stored in a nonvolatile state even with no voltage applied to the chip. Voltage may be applied to the entire chip or routed only to portions of the chip required for logic operation in order to reduce overall chip power dissipation. In the NFPGA 1300 logic operating mode, a low voltage such as ground is applied to control lines Y1, Y2, and Y3 and a high voltage such as an on-chip voltage of 2.5 volts is applied to control lines X1, X3, X5, and X7 and ground to control lines X2, X4, X6, and X8 (corresponding controller logic is not shown). Referring to NV NT select circuit 1200 in FIG. 12A, FET 1215 is OFF. If NV NT switch 1205 is programmed to a low resistance state and NV NT switch 1210 is programmed to a high resistance state, then select node 1220 will be at a high voltage state of 2.5 volts when 2.5 volts is applied to X1 and ground is applied to X2. However, if NV NT switch 1205 is in a high resistance state and NV NT switch 1210 is in a low resistance state, then when 2.5 volts is applied to X1 and ground is applied to X2, select node 1220 will be at ground.

NV SEL1-5 circuits shown in NFPGA 1300 correspond to NV NT select circuit 1200 illustrated in FIG. 12A. Programming these switches as described further above with respect to NV NT select circuit 1200 results in select nodes 1321, 1341, 1343, and 1358 at high voltage such as 2.5 volts and select node 1367 at ground. In a logic operation, if A and B inputs are applied to inputs of NCLB 1320, $(A \cdot B)_C$ appears on wire 1323 and since both FET 1342 and 1344 are in an ON state, then $(A \cdot B)_C$ is propagated to wire 1345 and then wire 1349; wire 1349 is connected to the input to multiplexer 1355 which is activated because NT SEL4 NV NT select circuit 1357 has output 1358 at a high voltage of 2.5 volts. Therefore, $(A \cdot B)_C$ propagates along wire 1362 to NOR gate 1365 input I. Because select node 1367 voltage is ground, NOR gate 1365 propagates $((A \cdot B)_C+C)_C$ to NCLB 1360 output node OUT. The subscript $_C$ is used to indicate the complement of a logic term or function.

NCLB Function and Operation using Nonvolatile Nanotube Select Circuits

NFPGA 1300 illustrated in FIG. 13 illustrates nonvolatile configurable logic blocks and nonvolatile programmable switch matrices using relatively simple examples based on NV NT select circuits and NanoLogic™ functions illustrated in FIG. 12. Nonvolatile configurable logic block (NCLB) 1400 illustrates an embodiment of a larger nanotube-based logic function corresponding to combinatorial logic function 710 illustrated in FIG. 7 except that flip flop function and multiplexer are not shown in this example. NCLB 1400 is a configurable (programmable) two input (inputs A and B) one output (output F) logic function formed using a cascade of FET transfer devices and other logic functions such as NAND, NOR, and a tristate output. The ON or OFF state of each transfer gate and logic operation of some NAND and NOR circuits and the state (tristate or nontristate) of the tristate output driver is controlled by a configuration control logic state (or may be referred to as a configuration control bit) supplied by NV NT select circuit nodes. NV NT select circuits 1410-1, 1410-2, ..., 1410-7 corresponding to NV NT select circuit 1150 shown in FIG. 11B and NV NT select circuit 1200 shown in FIG. 12A are used to provide nonvolatile configuration control logic states. The select node logic state of each NV NT select circuit is programmed using X1 and X2 control lines and Y0 to Y6 mode lines as described with respect to FIG. 13. Each select node also includes an inverter where needed so that both true and complement configuration control values are provided for select node outputs. Select node logic states are nonvolatile and remain unchanged even if power is lost or removed from the circuit.

NCLB 1400 includes input A to one terminal of FET 1430-1 and input $A_C$ formed by inverter 1430-2 and applied to one terminal of FET 1430-3, with the second terminal of each of FETs 1430-1 and 1430-3 dotted and connected to wire 1430-4 which drives one input of two input NOR gate 1440. Inputs A and $A_C$ are also connected to one terminal of FET 1430-5 and one terminal of FET 1430-6, respectively, with the second terminal of each of FETs 1430-5 and 1430-6 dotted and connected to wire 1430-7 which is connected to one input of three input NAND gate 1450. NV NT select circuit 1410-1 provides configuration control logic state C0 on select node 1415-1 output to the gate of FET 1430-1 and $C0_C$ formed by inverter 1420-1 to the gate of FET 1430-3. NV NT select circuit 1410-2 provides configuration control logic state C1 on select node 1415-2 output to the gate of FET 1430-5 and $C1_C$ formed by inverter 1420-2 to the gate of FET 1430-6.

NCLB 1400 also includes input B to one terminal of FET 1430-8 and input Bc formed by inverter 1430-9 and applied to one terminal of FET 1430-10, with the second terminal of each of FETs 1430-8 and 1430-10 dotted and connected to wire 1430-11 which drives the second input of two input NOR gate 1440. Inputs B and $B_C$ are also connected to one terminal of FET 1430-12 and one terminal of FET 1430-13, respectively, with the second terminal of each of FETs 1430-12 and 1430-13 dotted and connected to wire 1430-14 which is connected to a second input of three input NAND gate 1450. NV NT select circuit 1410-3 provides configuration control logic state C2 on select node 1415-3 output to the gate of FET 1430-8 and $C2_C$ formed by inverter 1420-3 to the gate of FET 1430-10. NV NT select circuit 1410-4 provides configuration control logic state C3 on select node 1415-4 output to the gate of FET 1430-12 and $C3_C$ formed by inverter 1420-4 to the gate of FET 1430-13.

NCLB 1400 also includes NV NT select circuit 1410-5 with select node 1415-5 providing output C4 to one input of two input NAND gate 1445. The second input to NAND gate 1445 is supplied by the output of NOR gate 1440. NV NT select circuit 1410-6 with select node 1415-6 provides output C5 to the third input of three input NAND gate 1450. The outputs of two input NAND 1445 and three input NAND 1450 drive the two inputs of NOR gate 1455. The output of two input NOR gate 1455 drives the input of tristate inverter 1460. The state of tristate inverter F is controlled by C6 and C6' which are provided by NV NT select circuit 1410-7. Select node 1415-7 provides C6 and inverter 1420-7 provides $C6_C$.

Figure 15:
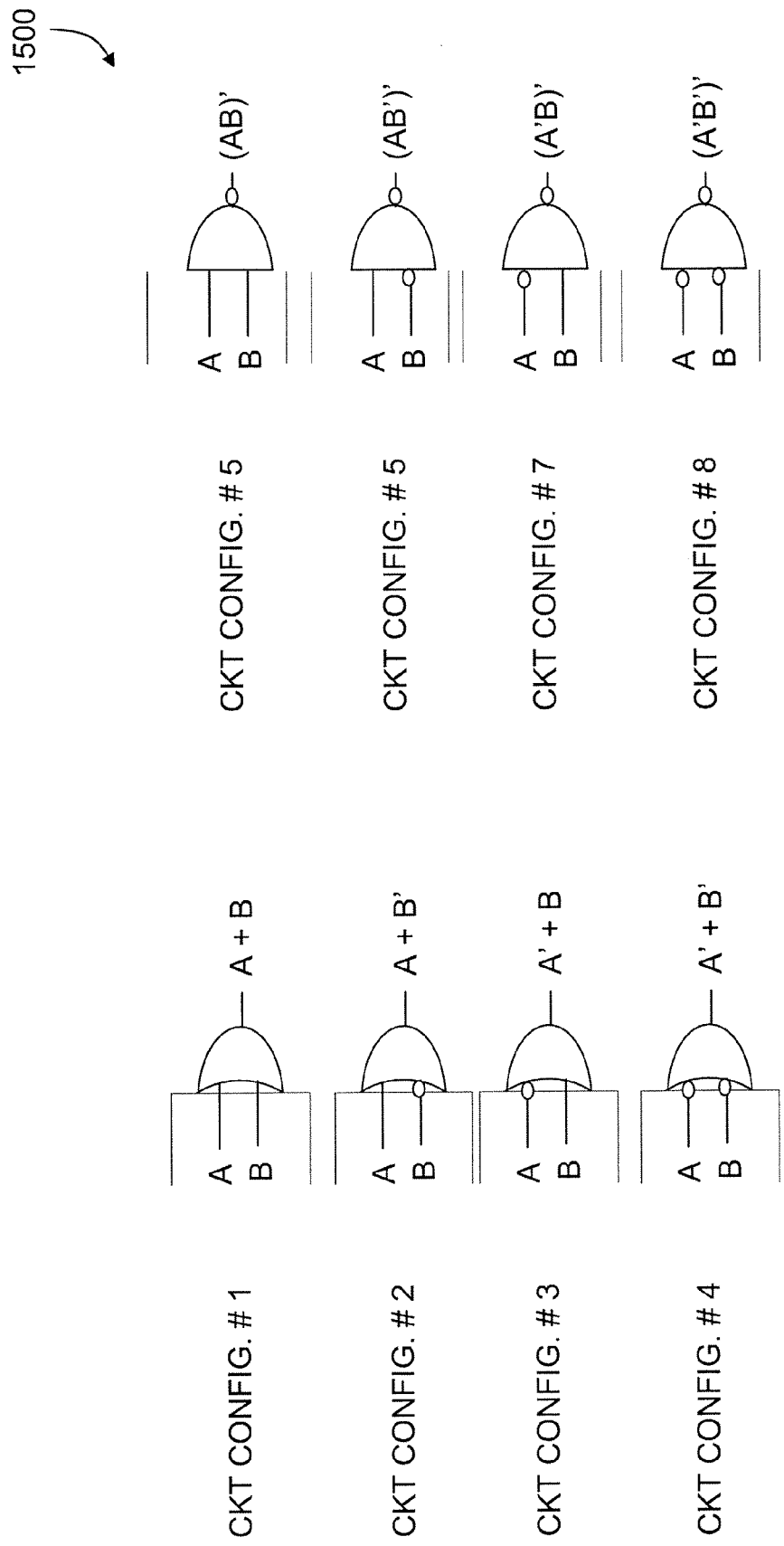
FIG. 15 shows various equivalent logic circuits corresponding to the various logic configurations formed by the nonvolatile nanotube configuration logic block as shown in FIG. 14B.

FIG. 14B illustrates eight nonvolatile circuit configurations (CKT CONFIG. #s 1-8) and the corresponding values of C0, $C0_C$, ..., C5 used to generate CKT CONFIG. #s 1-8 for NCLB 1400. FIG. 14B gives an output F function based on inputs A and B and the configuration control logic states. Output F outputs logic values if the C6 state is a logic 1 and $C6_C$ is a logic 0. However, if the C6 state is a logic 0 state and $C6_C$ is a logic 1, then output F remains tristate with no defined value. FIG. 15 illustrates equivalent circuits 1500 corresponding to CKT CONFIG. 1-8.

NPSM Function and Operation Using Nonvolatile Nanotube Select Circuits

NFPGA 1300 illustrated in FIG. 13 illustrates configurable logic blocks and programmable switch matrices using relatively simple examples based on NV NT select circuits and NanoLogic™ functions illustrated in FIG. 12. Nonvolatile programmable switch matrix (NPSM) 1600 illustrates an embodiment of a larger nanotube-based routing function corresponding to NPSM 1340-1 and NPSM 1340-2 in FIG. 13. NPSM 1600 is a programmable switch matrix 1610 with FET transfer gates controlled by select node outputs from NV NT select circuits 1620-1, 1620-2, ..., 1620-6. PSM 1610 is formed by six FET devices to route signals, voltages, currents, or power between any combination of terminals A, B, C, and D. NV NT select circuits 1620-1, 1620-2, ..., 1620-6 with corresponding select nodes 1630-1, 1630-2, ..., 1630-6 provide corresponding configuration control logic states C1, C2, ..., C6 to control the OFF or ON state of each FET in PSM 1610 by providing high voltages such as 2.5 volts for an ON state and a low voltage such as ground for an OFF state.

PSM 1610 includes FET TS1 with terminals connected to terminals C and D and gate controlled by configuration control logic state C1; FET TS2 with terminals connected to terminals A and D and gate controlled by configuration control logic state C2; FET TS3 with terminals connected to terminals A and C and gate controlled by configuration control logic state C3; FET TS4 with terminals connected to terminals B and D and gate controlled by configuration control logic state C4; FET TS5 with terminals connected to terminals A and B and gate controlled by configuration control logic state C5; and FET TS6 with terminals connected to terminals B and C and gate controlled by configuration control logic state C6.

Figure 16:
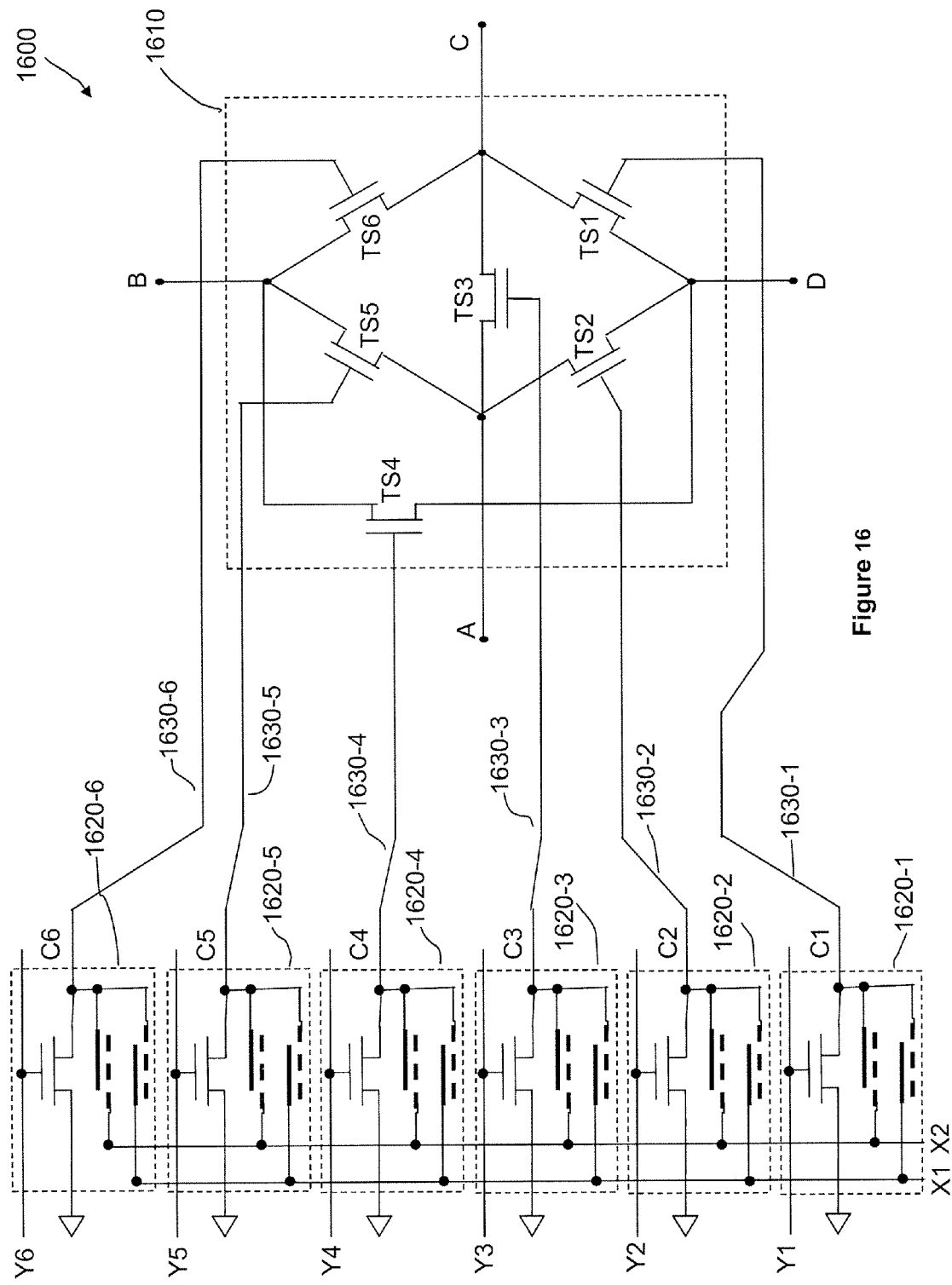
FIG. 16 shows a nonvolatile nanotube programmable switch matrix with various signal routing configurations controlled by nonvolatile nanotube select circuits.

In operation, the nonvolatile state of select nodes 1630-1 (C1), 1620-2 (C2), ..., 1620-6 (C6) are programmed using control lines X1 and X2 and mode lines Y1-Y6 illustrated in FIG. 16. Programming methods correspond to those described further above with respect to FIG. 13. After programming, configuration control logic states $C_1$-$C_6$ at either high voltage such as 2.5 volts or low voltage such as ground are applied to the gates of the FETs in PSM 1610 and signal routing is established.

Configuration control logic states programmed in NPSM 1600 may be used to form various routings between terminals A, B, C, and D. Exemplary interconnections achievable with NPSM 1600 are listed in Table 2 below.

TABLE 2

| Number of FETs in ON State | Possible Terminal Combinations | Comments |
|---|---|---|
| One | AB, AC, AD, BC, BD, CD | Independent paths |
| Two | AB & CD, AD & BC, AC & BD | Independent paths |
| Three | ABC, ABD, ACD, BCD | Shared paths |
| Four | ABCD | Shared paths |

Nanotube programmable switch matrix NPSM 1600 may be used to route signals, voltages, currents, and power as described further above with respect to FIG. 16. Individual FETs included in NPSM 1600 such transfer gate FETs TS1-TS6 enable or disable pathways between terminals such as terminals A, B, C, and D. However, transfer gates enable signal, voltage, current, and power flow in both directions, that is between source and drain or between drain and source of FET transfer devices. In some applications, it is desirable to control signal propagation direction, for example, and bidirectional buffers may be used. Bidirectional buffers may be used in conjunction with NPSMs. The direction of signal propagation may be controlled using a control circuit. If a nonvolatile control circuit is used, then a signal flow direction may be set for a particular direction which remains in effect even if power is removed. The signal flow direction remains the same when power is restored. Signal flow direction may be reversed by changing the state of the nonvolatile control circuit. NPGA 1300 illustrated in FIG. 13 nanotube-based bidirectional buffers such as NT BiDi Buffer 1375 control the direction of voltage propagation (and current flow) on wires such as wire 1380. Voltage waveforms propagate left to right or right to left depending on the nonvolatile state of NT BiDi Buffer 1375 as illustrated further below with respect to FIG. 17.

Figure 17A:
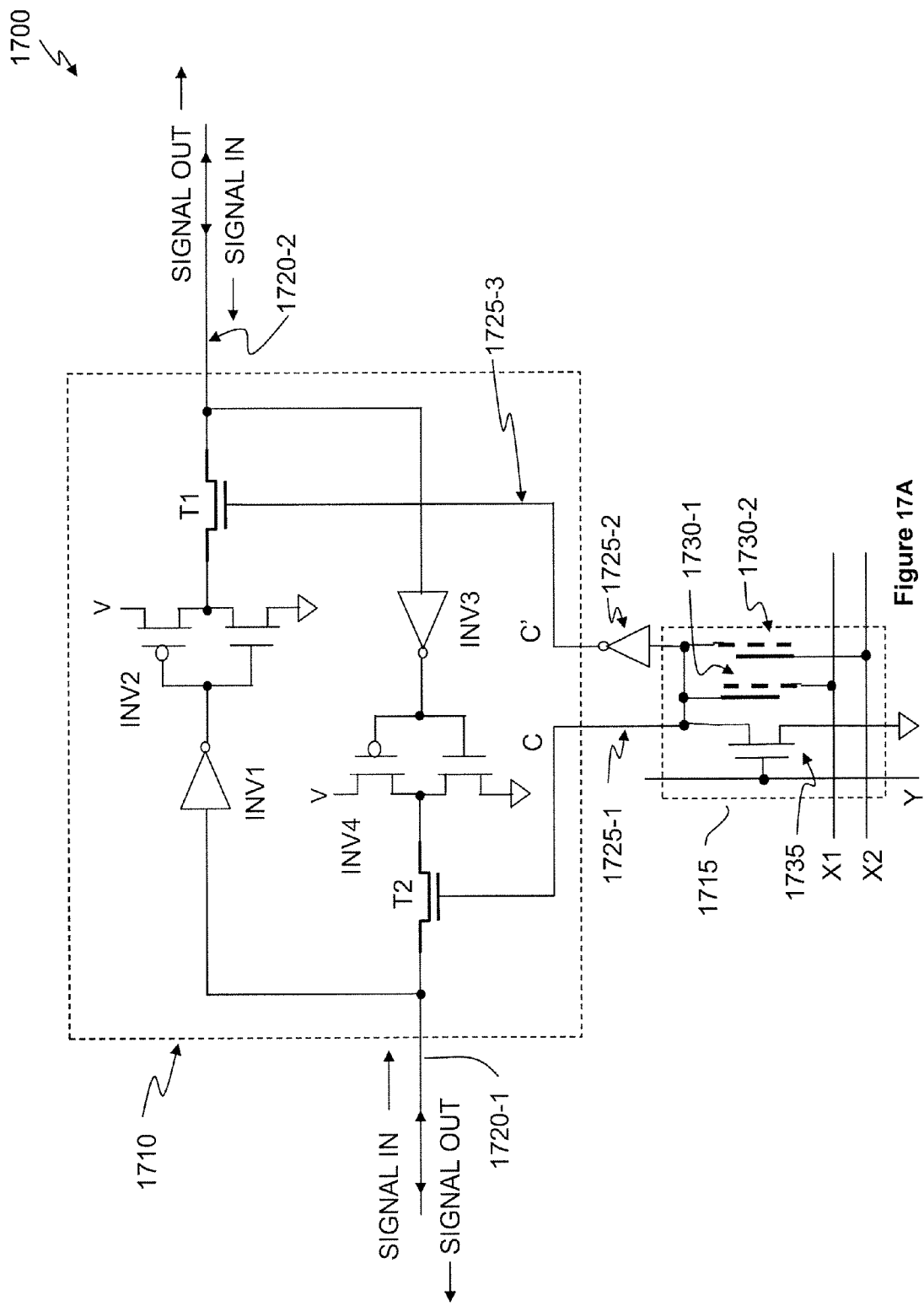
FIG. 17A shows a nonvolatile nanotube bidirectional buffer in which the direction of signal flow is controlled by a nonvolatile nanotube select circuit.

NT Bidirectional Buffer Function and Operation Using Nonvolatile Nanotube Select Circuits FIG. 17A illustrates an embodiment of a nanotube-controlled bidirectional buffer circuit NT BiDi Buffer 1700 which corresponds to NT BiDi Buffer 1375 shown in FIG. 13. The direction of signal flow in bidirectional buffer circuit BiDi Buffer 1710 is controlled by true and complement configuration control logic states C and C' provided by NV NT select circuit 1715. If C is at ground and C' is at a positive voltage such as 2.5 volts for example, then signal-in on wire 1720-1 and signal-out on wire 1720-2 is enabled. However, if C is at a positive and C' is ground, then signal-in on wire 1720-2 and signal-out on 1720-1 is enabled. Signals traveling relatively long distances on global wires may experience waveform deterioration in rise and fall time and also amplitude. Waveforms of signals flowing between wire 1720-1 and 1720-2 or between wire 1720-2 and wire 1720-1 are restored by inverters INV1 and INV2 or by inverters INV3 and INV4, respectively.

BiDi Buffer 1710 includes inverter INV1 with input connected to wire 1720-1 and to a first terminal of FET T2. The output of INV1 drives the input of inverter INV2. The output of INV2 is connected to a first terminal of FET T1 whose gate is controlled by configuration control logic state C' supplied by select node 1725-3 of NV NT select circuit 1715 through inverter 1725-2. A remaining second terminal of FET T1 is connected to wire 1720-2 and also to the input of inverter INV3. The output of INV3 drives the input of inverter INV4 whose output drives a second terminal of FET T2. The gate of FET T2 is controlled configuration control logic state C supplied by select node 1725-1 of NV NT select circuit 1715. The first terminal of FET T2 is connected to wire 1720-1 and to the input of INV1 as described further above.

NV NT select circuit 1715 may be used to control the direction of signal flow in BiDi Buffer 1710. NV NT select circuit 1715 corresponds to NV NT select circuit 1150 shown in FIG. 11B and may be programmed and operated as described with respect to FIG. 11B. NV NT select circuit 1715 also corresponds to NV NT select circuit 1200 shown in FIG. 12A and also to the operation of NT SEL1 circuit as part of in NCLB 1320 shown in FIG. 13. Mode control Y may be set to programming mode or to an operating mode as described further above with respect to FIGS. 11B, 12, and 13 and X1 and X2 may be used to program the nonvolatile resistance states of the NV NT switches. In the operating mode, X1 is set to a high voltage such as 2.5 volts for example and X2 is set to ground. Configuration control logic state C may be at a high voltage such as 2.5 volts and configuration control logic state C' (complement of C) may be at ground (zero volts). Alternatively, configuration control logic state C may be at a low voltage such as ground and configuration control logic state C' (complement of C) may be at a high voltage such as 2.5 volts.

In operation, NT BiDi Buffer 1700 enables signal flow from wire 1720-1 to wire 1720-2 or from wire 1720-2 to wire 1720-1. If C is at ground and C' is at a positive voltage such as 2.5 volts for example, then FET T2 is in an OFF state and FET T1 is in an ON state. A signal arriving on wire 1720-1 propagates through INV1 and INV2 and FET T1 to wire 1720-2. However, a signal arriving on wire 1720-2 can only flow through T1 to the output node of INV2 and is blocked. Similarly, the signal can propagate through INV3 and INV4 but is blocked by FET T2 in an OFF state. Alternatively, if C is at a positive voltage such as 2.5 volts and C' is at ground for example, then FET T1 is in an OFF state and FET T2 is in an ON state. A signal arriving on wire 1720-2 propagates through INV3 and INV4 and FET T2 to wire 1720-1. However, a signal arriving on wire 1720-1 can only flow through T2 to the output node of INV4 and is blocked. Similarly, the signal can propagate through INV1 and INV2 but is blocked by FET T1 in an OFF state. A description of NT-BiDi Buffers similar to NT-BiDi Buffer 1700 may be found in U.S. Patent Application No. 61/039,204, filed on Mar. 25, 2008, entitled "Carbon Nanotube-Based Neural Networks and Methods of Making and Using Same."

Figure 17B:
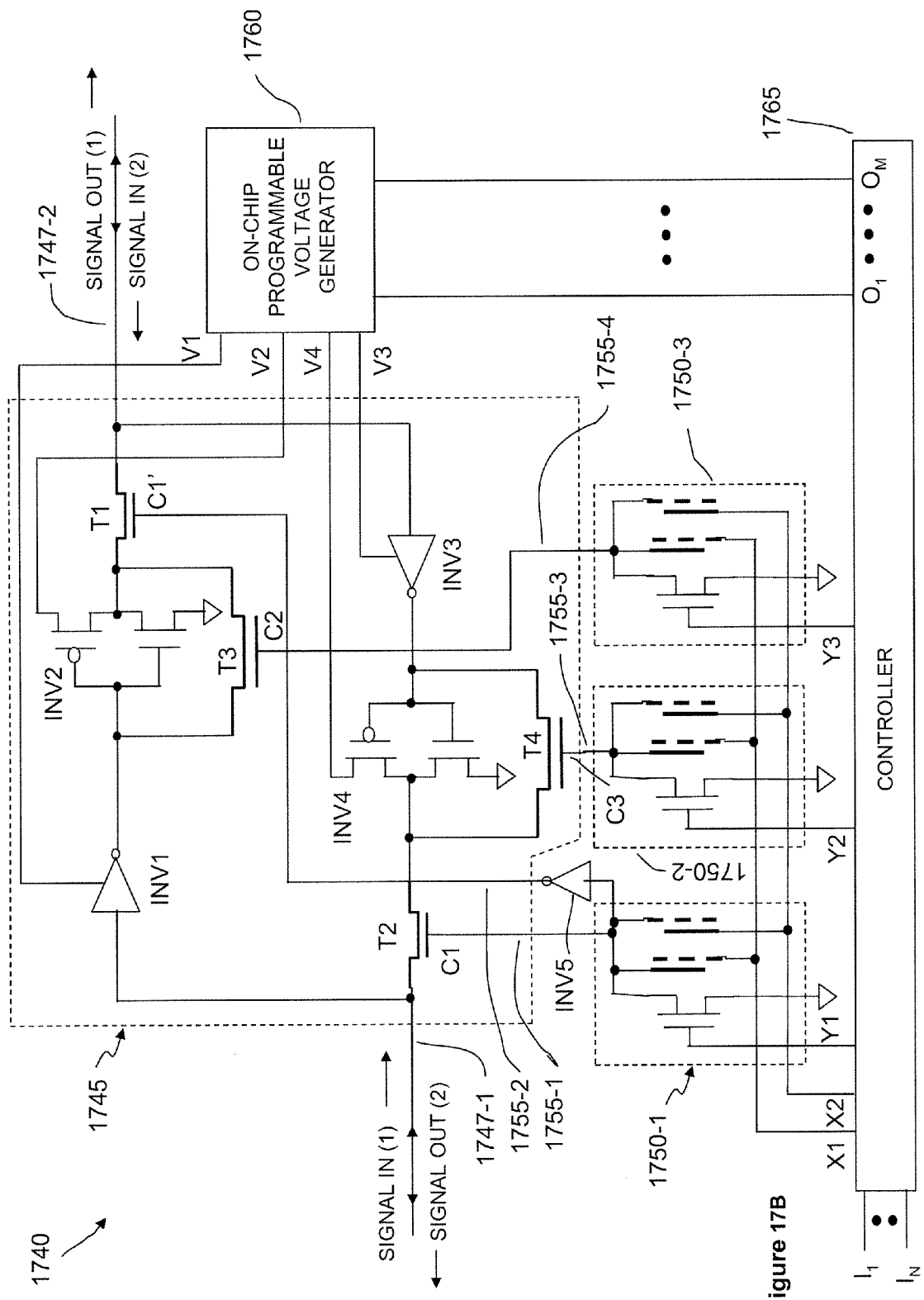
FIG. 17B shows a nonvolatile nanotube enhanced bidirectional buffer in which the direction, polarity, and amplitude of signal flow is controlled by a nonvolatile nanotube select circuit.

FIG. 17B illustrates an embodiment of a NT enhanced bidirectional buffer circuit NT_E-BiDi Buffer 1740 that not only controls the direction of signal flow as does NT BiDi Buffer 1700, but may also be used to invert (or not invert) signal polarity and restore pulses to different (or the same) voltage amplitudes as described further below with respect to FIG. 17B and also with respect to U.S. Patent Application No. 61/039,204, filed on Mar. 25, 2008, entitled "Carbon Nanotube-Based Neural Networks and Methods of Making and Using Same." Signal flow from wire 1747-1 to 1747-2 is processed independently of signal flow from wire 1747-2 to 1747-1.

NT_E-BiDi Buffer 1740 circuit is formed by a combination of enhanced bidirectional buffer circuit E-BiDi buffer 1745, NV NT select circuits 1750-1, 1750-2 and 1750-3, on-chip voltages V1, V2, V3, and V4 generated by on-chip programmable voltage generator 1760, and controller 1765. Note that voltages V1, V2, V3, and V4 are supplied to inverters INV1, INV2, INV3, and INV4, respectively, by on-chip programmable voltage generator 1760. The operation of on-chip programmable voltage generator 1760 is described further below with respect to FIG. 18. The programming and operation of NV NT select circuits 1750-1, 1750-2 and 1750-3 correspond to the programming and operation of NV NT select circuit 1150 shown in FIG. 11B, NV NT select circuit 1200 illustrated in FIG. 12A, the operation of NV NT select circuits 1410-1 ... 1410-7 shown in FIG. 14A, and the operation of NV NT select circuits 1620-1 ... 1620-6 shown in FIG. 16.

E-BiDi Buffer 1745 includes inverter INV1 with input connected to wire 1747-1 and to a first terminal of FET T2. The output of INV1 drives the input of inverter INV2. The output of INV2 is connected to a first terminal of FET T1 whose gate is controlled by configuration control logic state C1' supplied by select node 1755-2 inverter INV5 output whose input is connected to the NV NT select circuit 1750-1 output node. FET T3 is connected in parallel with INV2 with a first terminal connected to the output of INV1 and a second terminal connected to a first terminal of FET T1. The gate of FET T3 is controlled by configuration control logic state C2 supplied by select node 1755-4 of NV NT select circuit 1750-3. A remaining second terminal of FET T1 is connected to wire 1747-2 and also to the input of inverter INV3. The output of INV3 drives the input of inverter INV4. The output of INV4 is connected to a first terminal of FET T2 whose gate is controlled by configuration control logic state C1 supplied by select node 1755-1 of NV NT select circuit 1750-1 output node. FET T4 is connected in parallel with INV4 with a first terminal connected to the output of INV3 and a second terminal connected to a second terminal of FET T2. The gate of FET T4 is controlled by configuration control logic state C3 supplied by select node 1755-3 of NV NT select circuit 1750-2. A remaining second terminal of FET T2 is connected to wire 1747-1 and also to the input of inverter INV1.

On-chip voltages V1, V2, V3, and V4 are supplied to E-BiDi Buffer 1745 by on-chip nonvolatile nanotube programmable voltage generator 1760 as described further below with respect to FIG. 18. V1 (and V2, V3, and V4) may be varied over a relatively large range of voltages (0 to 5 volts, for example). Controller 1765 outputs $O_1 \ldots O_M$ are inputs to on-chip NV NT programmable voltage generator 1760 used to program the values of V1, V2, V3, and V4 as described further below with respect to FIG. 18. Controller 1765 also controls the programming and operation of NV NT select circuits 1750-1, 1750-2, and 1750-3 to control the logical operation of E-BiDi Buffer 1745 with outputs X1, X2, Y1, Y2, and Y3 connected to corresponding NV NT select circuits that control the logic operation of NT_E BiDi buffer 1740. Inputs $I_1 \ldots I_N$ to controller 1765 are processed by the controller 1765 logic (not shown).

In operation, NT BiDi Buffer 1740 enables non-inverted signal flow from wire 1747-1 to wire 1747-2 or from wire 1747-2 to wire 1747-1 if FET T3 and FET T4 are in an OFF state. If C1 is at ground and C1' (logical complement of C1) is at a positive voltage such as 2.5 volts for example, then FET T2 is in an OFF state and FET T1 is in an ON state. A signal arriving on wire 1747-1 propagates through INV1 and INV2 and FET T1 to wire 1747-2. However, a signal arriving on wire 1747-2 can only flow through T1 to the output node of INV2 and is blocked. Similarly, the signal can propagate through INV3 and INV4 but is blocked by FET T2 in an OFF state. Alternatively, if C1 is at a positive voltage such as 2.5 volts and C1' is at ground for example, then FET T1 is in an OFF state and FET T2 is in an ON state. A signal arriving on wire 1747-2 propagates through INV3 and INV4 and FET T2 to wire 1747-1. However, a signal arriving on wire 1747-1 can only flow through T2 to the output node of INV4 and is blocked. Similarly, the signal can propagate through INV1 and INV2 but is blocked by FET T1 in an OFF state.

In operation, on-chip voltage V1 is applied to the inverter INV1 and V2 is applied to inverter INV2 PFET source terminal. Voltages V1 and V2 may be varied over a range of voltages from 0 to 5 volts for example by on-chip NV NT programmable voltage generator 1760. In the case of a non-inverting signal transmission, FET T3 is in OFF state and voltages V1 and V2 may be varied from 1 to 5 volts for example. However, in an inverting operation, voltage V2 is reduced to zero to enable FET T3 turn-ON. V1 may be set in the 1 to 5 volts range and the signal flowing from wire 1747-1 to wire 1747-2 will be inverted and its amplitude may remain the same or may be modified.

In operation, on-chip voltage V3 is applied to the inverter INV3 and V4 is applied to inverter INV4 PFET source terminal. Voltages V3 and V4 may be varied over a range of voltages from 0 to 5 volts for example by on-chip NV NT programmable voltage generator 1760. In the case of a non-inverting signal transmission, FET T4 is in OFF state and voltages V3 and V4 may be varied from 1 to 5 volts for example. However, in an inverting operation, voltage V4 is reduced to zero to enable FET T4 turn-ON. V3 may be set in the 1 to 5 volts range and the signal flowing from wire 1747-2 to wire 1747-1 will be inverted and its amplitude may remain the same or may be modified.

Figure 18:
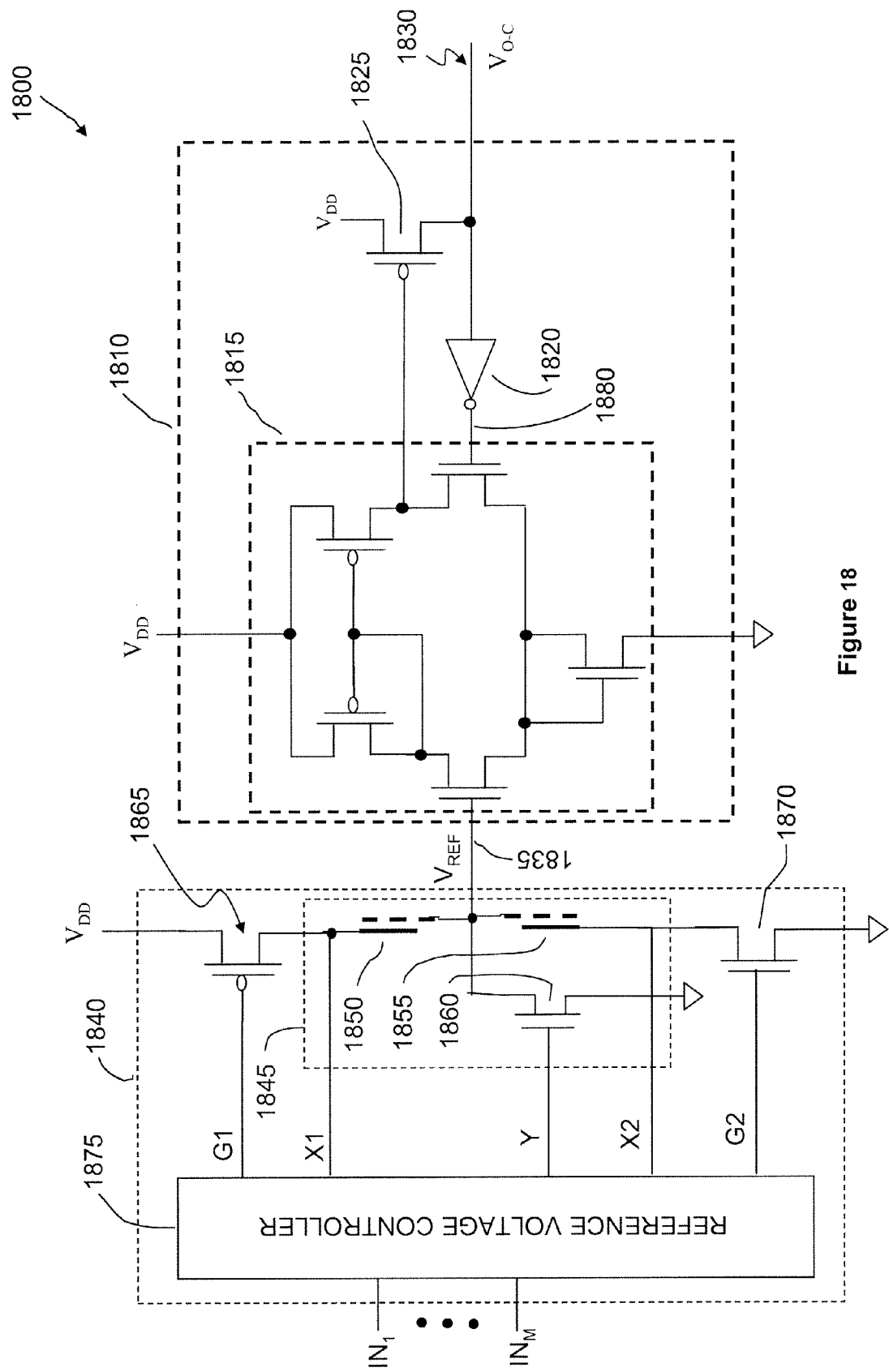
FIG. 18 shows a nonvolatile nanotube programmable voltage generator that generates a programmed on-chip voltage determined by a nonvolatile nanotube select circuit.

FIG. 18 illustrates an embodiment of a nonvolatile nanotube-controlled on-chip programmable voltage generator circuit (NV NT programmable voltage generator 1800) NT_V-GEN 1800 that corresponds to on-chip NV NT programmable voltage generator 1760 illustrated in FIG. 17B. On-chip voltage regulator 1810 is connected to a power source at voltage $V_{DD}$ and generates an on-chip voltage $V_{O-C}$ on output node 1830 when provided with a reference voltage $V_{REF}$ on first input terminal 1835. Differential amplifier 1815 holds output voltage $V_{O-C}$ on output node 1830 equal to reference voltage $V_{REF}$. Differential amplifier 1815 operation is similar to the operation of differential amplifiers described in R, Jacob Baker et al., "CMOS circuit Design, Layout, and Simulation," IEEE Press, 1998, p. 579-592. Regulated output voltage $V_{O-C}$ and corresponding output current to on-chip circuits is supplied by PFET 1825 typically having a wide channel width (width-to-length ratio of 100:1 or more for example). Inverter 1820 provides output voltage feedback to a second input terminal 1880 of differential amplifier 1815. A reference voltage is supplied to a first input terminal 1835 of differential amplifier 1815 by nanotube-controlled nonvolatile nanotube voltage reference generator NT_R-GEN 1840. NT_R-GEN 1840 includes NV NT select circuit 1845 with reference node connected to first input terminal 1835. A pair of NV NT switches is programmed to a ratio of ON resistance values (states) that sets reference voltage $V_{REF}$ based on a ratio of NV NT resistor values. In this application, NV NT switches are used in an analog mode and both NV NT switches are typically in an ON state of different resistance values and are referred to NANRISTORS in which ON resistance values are held in a nonvolatile state. NV NT select circuit 1845 includes NANRISTORS 1850 and 1855 sharing common first nodes which forms a select node that generates $V_{REF}$ on the first input terminal 1835 of differential amplifier 1815. FET 1860 is a mode control FET which is ON during programming and OFF during operation as described further above with respect to NV NT select circuit 1150 in FIG. 11B for example. PFET 1865 has one terminal connected to a second node of NANRISTOR 1850 and a second terminal connected to a power source at voltage $V_{DD}$. NFET 1870 has one terminal connected to a second node of NANRISTOR 1855 and a second terminal connected to a reference voltage such as ground. The gate voltage of PFET 1865 is controlled by reference voltage controller 1875 output G1; the gate of FET 1870 is controlled by output G2, and mode Y output to the gate of FET 1860 selects program or operate modes. X1 and X2 provide programming (program and erase) pulses as described further above with respect to FIG. 11B.

In a programming operation, G1 is at a high voltage such as 2.5 volts for example and PFET 1865 is OFF and G2 is at ground and NFET 1870 is OFF. Y is at a high voltage such as 2.5 volts for example and NFET 1860 is ON and the select node connected to first input terminal 1835 is at ground. X1 and X2 apply pulses to the second terminals of nonvolatile NANRISTORS 1850 and 1855 and resistor values are adjusted such that a ratio of NANRISTOR 1850 and 1855 values results in a voltage $V_{REF}$ when $V_{DD}$ is applied during NT_R-GEN 1840 operation. Programming corresponds to programming as described with respect to NV NT select circuit 1150 in FIG. 11B. All pulses are controlled by reference voltage controller 1875 based on inputs $IN_1 \ldots IN_M$ which correspond to $O_1 \ldots O_M$ in FIG. 17B.

In a reference voltage setting operating mode, Y is at ground and NFET 1860 is OFF. X1 and X2 are tristated. G1 is a ground such that PFET 1865 is ON and connects a second terminal of NANRISTOR 1850 to $V_{DD}$. G2 is at a high voltage such as 2.5 volts such that NFET 1870 is ON. PFET 1865 and NFET 1870 are designed such that the FET ON channel resistance is negligibly small compared to NANRISTOR 1850 and 1855 resistance values which may be in 100 k Ohm to 10 M Ohm range for example. Higher NANRISTOR values result in less current flow during operation. Also, since NANRISTOR values are nonvolatile, power may be removed from portions of chips not in use.

In operation, $V_{REF}$ is determined as follows $$V_{REF} = R_{NANRISTOR\ 1855} \times V_{DD}/(R_{NANRISTOR\ 1850} + R_{NANRISTOR\ 1855})$$

Note: if $R_{NANRISTOR\ 1850} = R_{NANRISTOR\ 1855}$, $V_{REF} = V_{DD}/2$ $V_{REF}$ at first input terminal 1835 of differential amplifier 1815 is set equal to the desired voltage level for $V_{O-C}$ and the output node 1830 of differential amplified 1815 which also corresponds to output node 1830 of NT_V-GEN 1800 is held at $V_{O-C}$ even as circuit load at output 1830 is varied (draws more or less current). NT_V-GEN 1800 circuit output $V_{O-C}$ corresponds to one of voltage outputs V1, V2, V3, and V4 shown in FIG. 17B. The number of NT_V-GEN 1800 circuits needed depends on the number of on-chip voltages to be generated.

NV NT Bidirectional Buffer Function and NV NT Programmable Voltage Generator Used to Generate Precision Timing (Delay) and for Power Management Nonvolatile nanotube programmable voltage (NT_V-GEN) 1800 shown in FIG. 18 may be used to generate and control on-chip voltage to various circuits in an integrated circuit chip such as nonvolatile nanotube bidirectional buffer (NT_E-BiDi Buffer) 1740 shown in FIG. 17B for example. CMOS circuits, as is well known in the industry, swing from rail-to-rail and operate over a wide range of voltages. CMOS circuits with threshold voltages of 0.7 volts, for example, in the range of 1 to 3.5 volts for example but at varying speeds and power dissipation. If the operating voltage is low, approaching 1 volt for example, then CMOS circuits will operate more slowly due to reduced overdrive but also will dissipate less power. However, CMOS circuits will operate at high speed if the circuit is operated at a higher voltage such as 3.5 volts for example. Switching CMOS circuits dissipate power proportional to $f \cdot C \cdot V^2$, where f is the frequency of operation, C is the capacitive load, typically primarily due to wiring capacitance, and the square of the rail-to-rail voltage swing V.

Controller 1765 is described above with respect to control of voltages V1-V4 applied to NT_E-BiDi Buffer 1740 to modify the amplitude and polarity of pulses between input and output of NT-E-BiDi Buffer 1740. However, by controlling the voltage applied to NT-E-BiDi Buffer 1740, controller 1765 also varies power dissipation and delay through the buffer circuit.

Controller 1765 may be used to vary voltages applied to NT_E-BiDi Buffer 1740 to achieve continuous precision timing (delay) control because varying CMOS voltage can be used to control delay through CMOS circuits as described further above. Bertin et al U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," precision timing (delay) control in discrete steps until a pulse appears in a valid data window defined by a strobe pulse. In this case, pulse timing (delay) NT_E-BiDi buffer 1740 circuit may be monitored by sensing for the presence or absence of an output pulse in a valid data window defined by a strobe pulse. Voltages are adjusted by NT_V-GEN 1800, under the control of controller 1765, until the output pulse is detected by a comparator circuit (not shown) and a signal is sent to controller 1765. Reference voltage generator 1875, based on inputs from controller 1765 or another signal source, incrementally changes the ratio of the resistance values of Nanristors 1850 and 1855 in NT_R-GEN 1840 (as described further above) until the output voltage of NT_V-GEN 1840 circuit (or circuits since there may be more than one used) results in the desired timing speed (delay). At this point Nanristor 1850 and 1855 nonvolatile resistance values are left unchanged. As a consequence of this method of continuous speed (delay) adjustment, the amplitude of the signal output may be different to that of the signal input. The amplitude may be restored to a full rail-to-rail swing of, for example, 3.5 volts may be restored by sending the signal through one or more inverter stages (not shown). Delays introduce by inverter(s) are in series with the signal path and will be included in the adjusted precision timed waveform.

Power management (control of power dissipation) may be implemented for various regions of a chip (or the entire chip) by reducing the on-chip voltage output of NT_R-GEN 1840. This may be achieved by inputs to the reference voltage controller 1875 and corresponding adjustment of the values of nanristors 1850 and 1855 as described further above with respect to signal speed (delay) timing control. A power reduction signal may be provided to chips by the system by an OP-Code to a detector as described further below. Alternatively, a temperature sensor may be located on-chip that sends a signal to a controller such as reference controller 1875 to reduce operating voltage which reduces power dissipation.

NV NT Bidirectional Buffer Function and/or NV NT Programmable Voltage Generator Used as Security Event Response Functions In the event that a security event is detected, the operation of NT_E-BiDi buffer 1740 and NT_V-GEN 1800 may be changed. For example, voltages such V1-V4 may be driven to zero and switching operations terminated. Alternatively, voltages may be changed, amplitudes, polarities, timings (delays) may be modified to conditions that do not reflect the correct operating conditions of the application.

One method of detecting a security event is to use an on-chip detector that monitors an OP-Code stream and detects a security event (alarm) code as described in Bertin et al. U.S. Pat. No. 7,394,687. Once detected, programmable wiring and programmable logic and signal routing circuits may be modified as described further so that the high application function security is changed and therefore protected.

Nanotube Configurable Logic Blocks (NT_CLB) & Nanotube Programmable Switch Matrix (NT_PSM) Using Nonvolatile NRAM-Controlled Select Circuits Various NRAM™ memory architectures are combined with CLB and PSM functions to form NCLB and NPSM building blocks that may be integrated to form NFPGA logic as described with respect to FIGS. 19-26 illustrated further below.

NFPGA Function and Operation using NRAM™s

Figure 19:
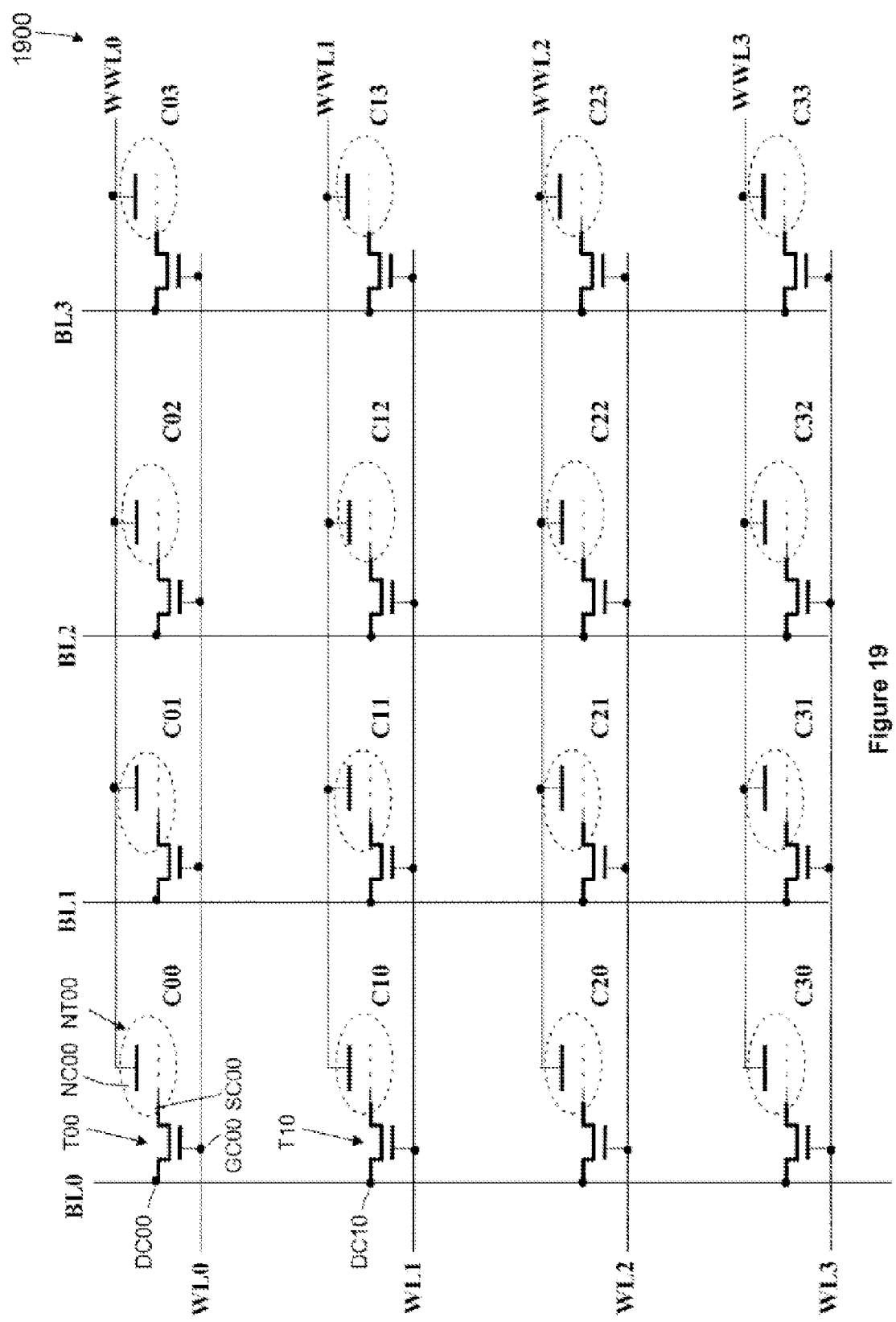
FIG. 19 shows a sixteen bit NRAM™ memory array.

Nonvolatile NRAM™ array schematic 1900 includes a matrix of 16 nonvolatile storage cells C00, C01, . . . , C33 as illustrated in FIG. 19. NRAM™ memory architecture and operation are described in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance," U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," and U.S. patent application Ser. No. 11/835,613, filed on Aug. 8, 2007, entitled "Memory Elements and Cross Point Switches and Arrays of Same Using Nonvolatile Nanotube Blocks," and are hereby incorporated by reference. Each memory cell illustrated in NRAM™ array schematic 1900, such as representative cell C00, includes a select transistor T00 that may be an NFET as shown, or may also be a PFET (not shown) or a CMOS transfer device (not shown) that includes both NFET and PFET devices, or other types of switching devices (not shown) such as diode steering devices as described in U.S. patent application Ser. Nos. 11/835,651, 11/835,759, 11/835, 845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same." Each cell, such as cell C00, also includes a nonvolatile nanotube storage node NT00 such as NV NT switch 1110 as illustrated by NRAM™ cell 1100 in FIG. 11A. Nonvolatile nanotube storage node NT00 (NV NT storage node) may be formed using NV NT switch-types or NV NT block switch-types illustrated further above and summarized in FIGS. 10B, 10C and 10D, respectively.

Nonvolatile storage cells such as cell C00 are formed by connecting the source SC00 of a transistor such as NFET T00 to a first terminal of a NV NT storage node such as NV NT storage node NT00 illustrated in FIG. 19. NRAM™ array schematic 1900 is formed by connecting word lines WL0, WL1, WL2, and WL3 to corresponding gates of NFET select transistors in corresponding storage cells; connecting secondary word lines WWL0, WWL1, WWL2, and WWL3 (typically used as reference lines connected to a voltage such as ground (zero volts)) to corresponding second terminals of NV NT storage nodes in corresponding storage cells; and connecting bit lines BL0, BL1, BL2, and BL3 to corresponding drain diffusions of corresponding NFET select transistors in corresponding nonvolatile storage cells as illustrated in FIG. 19. For example, word line WL0 is connected to the gate of NFET T00 by contact GC00; secondary word line WWL0 is connected to the second terminal of nonvolatile nanotube storage node NT00 by contact NC00; and bit line BL0 is connected to the drain of NFET T00 by contact DC00.

In erase and programming operations, a word line such as word line WL0 is selected and FETs C00, C01, C02, and C03 are turned ON. Word lines WL1, WL2, and WL3 are kept at ground and all other FETs are in an OFF state. In an erase (write "0") operation, bit lines are pulsed in the range of 5 to 7 volts with rise times in the nanosecond range using one or more pulses. One approach is to erase all bits along selected word line WL0 so that all NV NT switches are in a high resistance (OFF) state corresponding to a logical "0" state. Next, selected cells along WL0 are programmed to a low resistance (ON) state corresponding to a logical "1" state. So for example, if cell C00 is to store a low resistance value, a program (write "1") operation is performed in which bit line BL0 is pulsed in the range of 3-5 volts with rise times in the microsecond range using one or more pulses. If cells C01, C02, and C03 are to remain in a high resistance logical "0" state, then bit lines BL1, BL2, and BL3 are held at ground.

In read operating mode, bit lines such as BL0, BL1, BL2, and BL3 are precharged to a voltage such as 2.5 volts for example. A word line such as word line WL0 is selected and select FETs in NRAM™ cells C00, C01, C02, and C03 are turned ON. In this example, cell C00 is in a low resistance state corresponding to a logical "1" state and bit line BL0 is discharged and a logical "1" state will sensed and latched. Since cells C01, C02, and C03 are in a high resistance state, bit lines BL1, BL2, and BL3 will not discharge and a logical "0" state will be sensed and latched. In a ×4 NRAM™ configuration, all 4 bits are provided at the NRAM™ memory output. In a ×1 NRAM™ configuration, 1 of 4 bits is selected and provided at the NRAM™ memory output.

Figure 20:
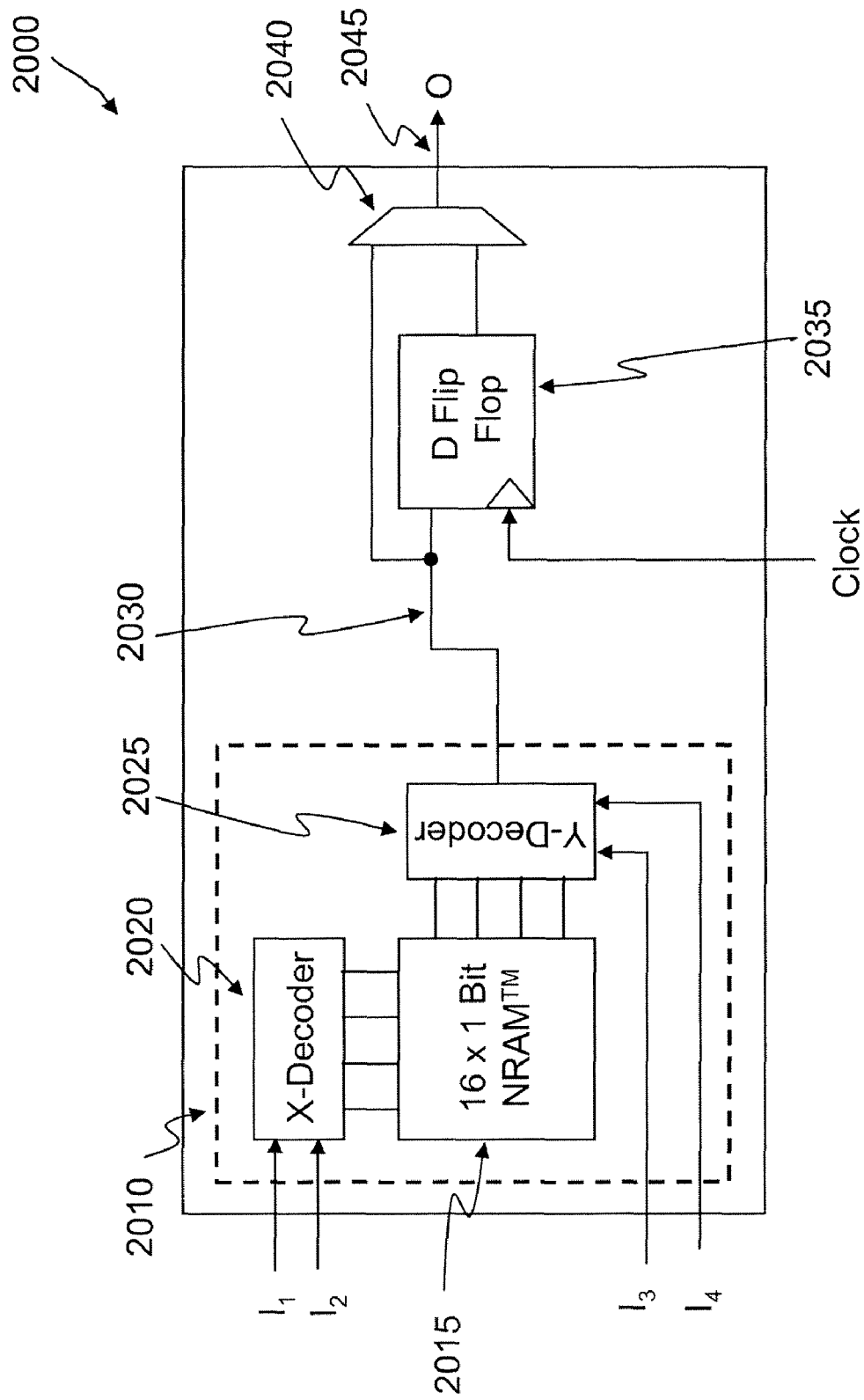
FIG. 20 shows a nonvolatile nanotube configurable logic block with a look-up table formed using a 16 bit NRAM memory, a D-flip flop, and a multiplexer.

FIG. 6 illustrates CLB 600 which includes look up table (LUT) 610. LUT 610 is described further above with respect to FIG. 6 which corresponds to LUTs as described in U.S. Pat. Re. 34,363 Jun. 24, 1991 Ross Freeman in which a 16 bit RAM (a volatile SRAM) in a ×1 configuration is used to generate LUT 610 logic look up table. An NRAM™ may be used instead as the RAM function. An NRAM™ has the advantage of smaller array size because of smaller cell size and nonvolatile operation. FIG. 20 illustrates NCLB 2000 including NLUT 2010 that includes 16 bit NRAM™ array 2015 that corresponds to NRAM™ array schematic 1900 described further above with respect to FIG. 19. Inputs $I_1$ and $I_2$ to X-Decoder 2020 and $I_3$ and $I_4$ to Y-Decoder 2025 select one of 16 bits to output to wire 2030. NLUT 2010 output drives wire 2030 which in turn drives an input to D flip flop 2035, which also includes a clock input, and also drives a first terminal of multiplexer (MUX) 2040. A second terminal of MUX 2040 is driven by the output of D flip flop 2035. MUX 2040 drives wire 2045 providing NCLB 2000 output O.

Figure 21:
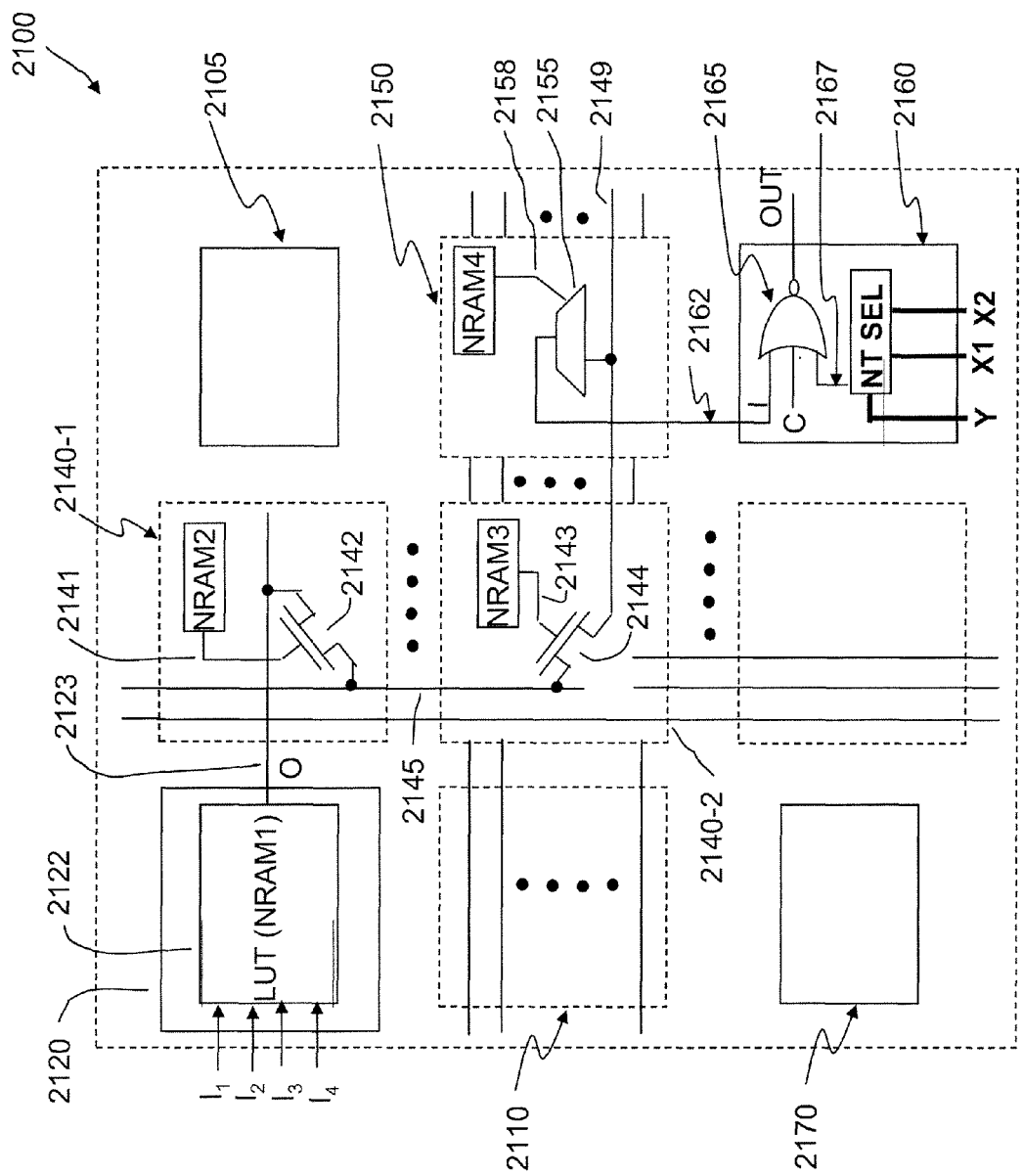
FIG. 21 shows a nonvolatile nanotube field programmable gate array (NFPGA) with configurable logic blocks and programmable switch matrices controlled by nonvolatile NRAM™ memory outputs.

FIG. 21 illustrates a block diagram of an embodiment of NFPGA 2100 formed using NRAM™ controlled NCLBs such as NCLB 2120 and NRAM™ controlled NPSMs such as NPSM 2140-1. NFPGA 2100 also includes a NanoLogic™ circuit that includes a nonvolatile nanotube select circuit (labeled NT SEL) that forms nanotube configurable logic block NCLB 2160 and an NRAM™ controlled MUX 2155 as part of NCLB 2150. NRAM™ controlled bidirectional buffers (not shown) may also be included. Flip flops and multiplexers (shown in FIGS. 6 and 7) may be included as well.

The NFPGA 2100 logic function is configured using NRAM™ memories (or memory sub-arrays) NRAM1-NRAM4 whose operations are described further above with respect to FIGS. 19 and 20. In addition to NRAM™s, NCLB 2160 programming also includes NV NT select circuit NT SEL as shown in FIG. 21 and described further above with respect to FIG. 13 using program and operation inputs X1, X2, and mode control input Y. Multiple nanotube-configurable logic blocks (NCLBs) and nanotube programmable switch matrices (NPSMs) are configured (programmed) and determine NFPGA 2100 logic function.

NCLB 2120 corresponds to NCLB 2000 illustrated in FIG. 20 that may include flip flops and multiplexers (not shown) such as illustrated in FIG. 6; NPSM 2140-1 uses NRAM2 output 2141 to control the ON/OFF state of FET 2142; NPSM 2140-2 uses NRAM3 output 2143 to control the ON/OFF state of FET 2144; NCLB 2160 corresponds to NanoLogic™ circuit 1270 illustrated in FIG. 12D and flip flop and multiplexers (not shown) such as illustrated in FIG. 7; NCLB 2150 includes NRAM4 whose output 2158 controls the operation of multiplexer 2155 and may include flip flops and other multiplexers (not shown) as illustrated in FIG. 7. CLB functions such as 2105 and 2170 may include configurable logic functions such as illustrated in FIGS. 6 and 7 which may or may not include NRAM™ and NanoLogic™ functions. Wiring region 2110 shows horizontal wires that may be used for various interconnections (not shown). NT BiDi Buffers controlled by NRAM™s (not shown) may be used to controls the direction of signal flow on selected wires as explained further above with respect to FIGS. 17A and 17B. Using said NT BiDi Buffers, configuration control logic states (may also be referred to as configuration control bits) are supplied by NRAM™ memory outputs.

In logic configuration setting operations for NCLB 2120, NCLB 2150, NPSM 2140-1 and NPSM 2140-2, NRAM1-NRAM4 are programmed as described with respect to NRAM™ array schematic 1900 (FIG. 19) and NRAM™ array 2015 by word and bit line waveforms selected by X-decoder 2020 and Y-decoder 2025 (FIG. 20) to generate nonvolatile logic voltages that control device ON/OFF states and control logic block functions. NCLB 2160 logic function is determined by NT SEL based on inputs X1, X2, and Y as described further above with respect to FIG. 11B, FIG. 12A, and FIG. 13 for example.

In this logic configuration setting operation example, NCLB 2120 logic function includes NLUT 2122 with NRAM1 corresponding to FIG. 20 with NLUT 2122 programmed such that a logic function such as $(A \cdot B)_C$ (the complement of A logically ANDed with B) for example is outputted to wire 2123 and NPSM 2140-1 NRAM2 is programmed such that output 2141 is at a high voltage which turns FET 2142 to an ON state so that the wire 2123 signal is transmitted to wire 2145. NPSM 2140-2 NRAM3 is programmed such that output 2143 is at a high voltage which turns FET 2144 to an ON state so that the wire 2145 signal is transmitted to wire 2149. NCLB 2150 NRAM4 is programmed such that output 2158 activates MUX 2155 which is connected to wire 2149 and transmits the signal on wire 2149 to wire 2162.

NCLB 2160 corresponds to NanoLogic™ circuit 1250 illustrated in FIG. 12D and flip flops and multiplexers (not shown) such as illustrated in FIG. 7. Three input NOR gate 2165 has a first input controlled by the select node 2167 output of NT SEL. Input I corresponds to the signal on wire 2162 and is applied to a second input of NOR gate 2165. Input C is applied to a third input of NOR gate 2165. In this example, select node 2167 output voltage is selected to be zero so that NOR gate 2165 transmits $(C+I)_C$ to output OUT of NCLB 2160. With FPGA 2100 NRAM™ and NV NT select circuits programmed as described in this example, $(A \cdot B)_C$ appears on wire 2123 and since both FET 2142 and 2144 are in an ON state, then $(A \cdot B)_C$ is propagated to wire 2145 and then to wire 2149; wire 2149 is also an input to multiplexer 2155 which is activated because NRAM4 has output 2158 at a high voltage such as 2.5 volts. Therefore, $(A \cdot B)_C$ propagates along wire 2162 to NOR gate 2165 input I. Because select node 2167 voltage is ground, NOR gate 2165 propagates $((A \cdot B)_C + C)_C$ to NCLB 2160 output node OUT.

NCLB Function and Operation Using NRAM™s

Figure 22A:
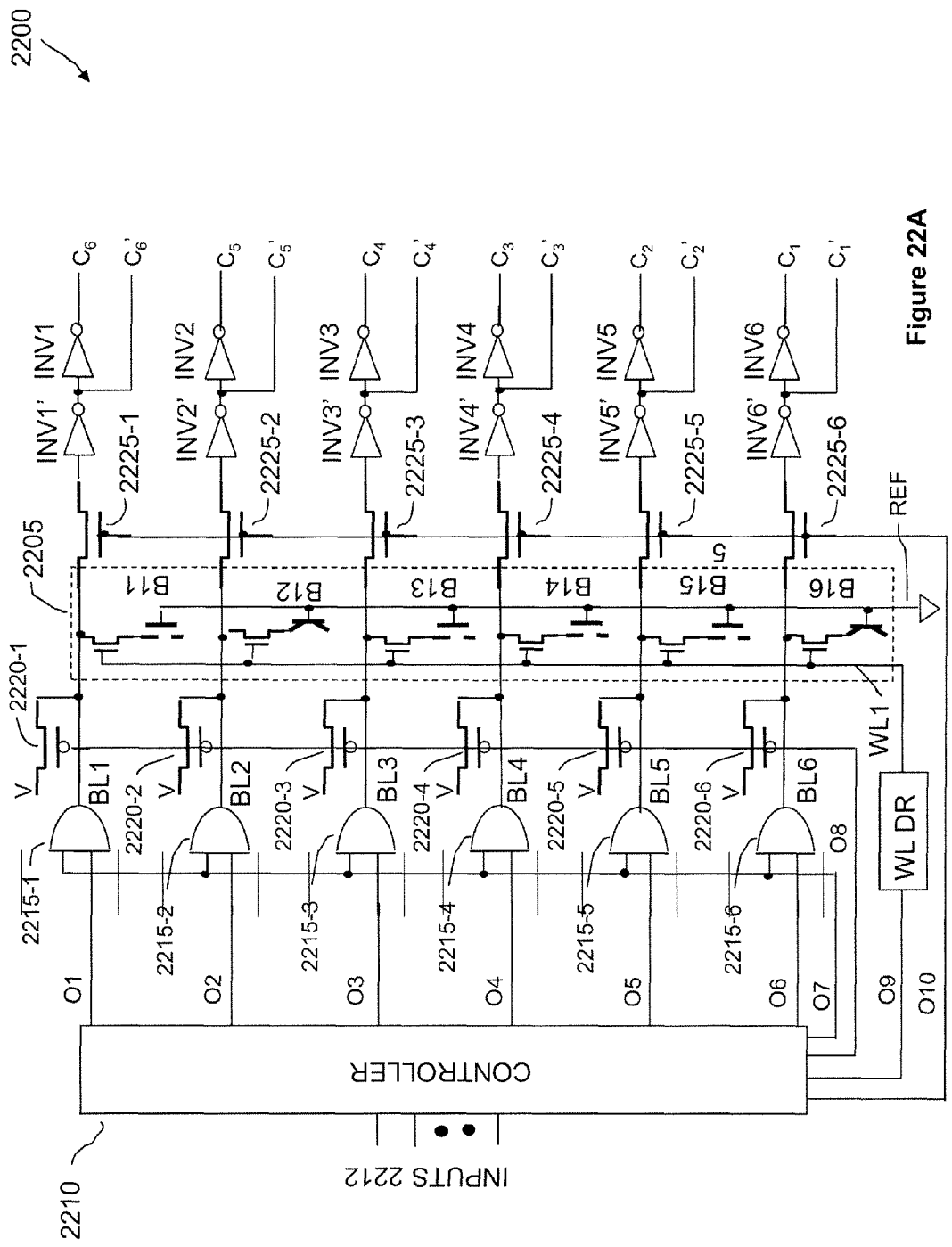
FIG. 22A shows a 1×6 nonvolatile NRAM™ memory architecture used as an NRAM™-based nonvolatile control bit generator that provides true and complement control bit outputs.
Figure 22B:
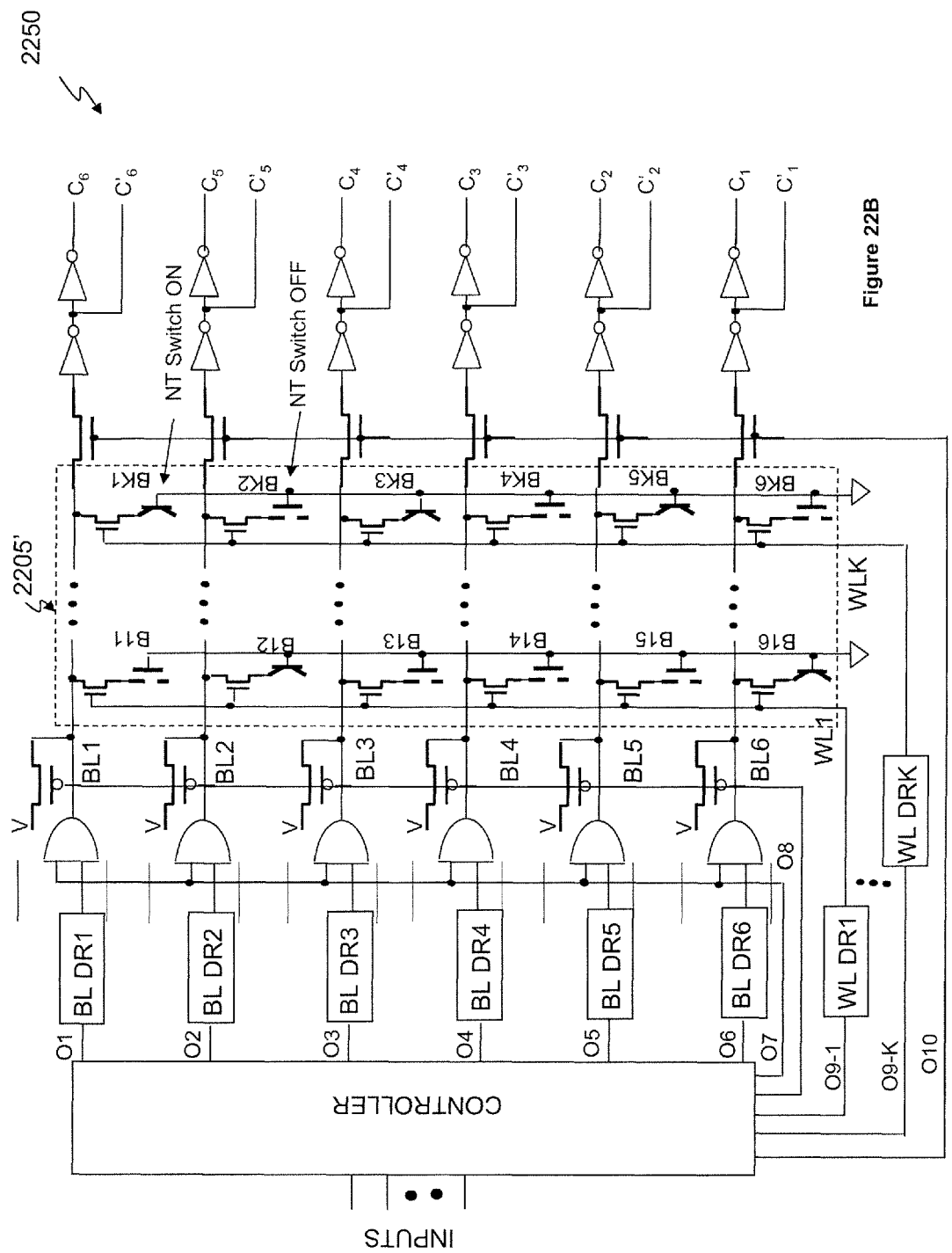
FIG. 22B shows a K×6 nonvolatile NRAM™ memory architecture used as an NRAM™-based nonvolatile control bit generator that provides true and complement control bit outputs.

NFPGA 2100 illustrated in FIG. 21 illustrates nonvolatile configurable logic blocks and nonvolatile programmable switch matrices using relatively simple examples based on NRAM™s illustrated in FIGS. 19 and 20. One nonvolatile configurable logic block based on a nonvolatile nanotube select circuit as described further above with respect to FIG. 12D is also included to illustrate the ability to mix NRAM™-based and NV NT select circuit-based approaches to nonvolatile configurable logic blocks in the same NFPGA design. Since nonvolatile configurable logic blocks have been described further above with respect to FIGS. 13 and 14, the emphasis is on NRAM™-controlled programmable logic functions. FIGS. 22A and 22B described further below illustrate NRAM™ architectures that provide NRAM™-generated configurable control bits (corresponding to configurable control logic states) based on bit configurations stored in NRAM™ arrays similar to NRAM™ array schematic 1900 in FIG. 19.

NRAM™ architectures may be similar to the NRAM™ architecture described with respect to NCLB 2000. NCLB 2000 is illustrated further above with respect to FIG. 20 and includes an NRAM™ memory used to realize nonvolatile look up table (NLUT) 2010 which provides configuration control logic states (or configuration controlled bits) as part nonvolatile programmable logic block (NCLB) 2000 function. NRAM™ architectures may also be designed to provide multi-bit outputs in parallel and may use fewer on-pitch circuits to implement NCLB functions in a smaller physical area for example as illustrated further below by NRAM™ 2200 in FIG. 22, and configured to provide nonvolatile configuration control bits.

FIG. 22A illustrates an embodiment of NRAM™ 2200 architecture shown in schematic form that may be used as an NRAM™-based nonvolatile control bit generator that provides true and complement control bit outputs. NRAM™ 2200 includes NV memory array 2205 shown in schematic form which corresponds to nonvolatile NRAM™ array schematic 1900 illustrated in FIG. 19, but with only one word line and six parallel bit lines. Controller 2210 accepts inputs 2212 and generates outputs O1-O10. Outputs O1-O6 drive a first input of two terminal tristate AND gates 2215-1 to 2215-6, respectively. Output O7 drives second input gates of two terminal tristate AND gates 2215-1 to 2215-6 to enable or disable bit line selection for program or erase operations. Outputs of two terminal tristate AND gates 2215-1 to 2215-6 drive bit lines BL1-BL6, respectively. Bit lines BL1-BL6 are also connected to the drain of corresponding NFET select transistors shown in NV memory array 2205. A word line WL1 is connected to the output of word line driver WL DR which is driven by output 09 of controller 2210. Word line driver WL DR drives array word line WL1 which is connected to gates of FET select devices shown in NV memory array 2205 for cells B11, B12, . . . , B16. Storage nodes may be formed using NV NT switches or NV NT blocks as described further above with respect to FIGS. 10B, 10C and FIG. 10D, respectively. Each first terminal of a NV NT switch or a NV NT block is connected to a source of a corresponding select FET and a second terminal is connected to a common reference line such as reference line REF which may be connected to ground. PFETs 2220-1 to 2220-6 have first terminals connected to a voltage source V. Each second terminal of PFETs 2220-1 to 2220-6 is connected to bit lines BL1-BL6, respectively, and gate terminals are connected to a common control line which is connected to controller 2210 output O8 which enables or disables read operations. Bit lines BL1-BL6 are also connected to a first terminal of each transfer NFET 2225-1 to NFET 2225-6 transfer devices, respectively. A second terminal of each transfer device NFET 2225-1 to NFET 2225-6 drives an input of inverters INV1'-INV6', respectively, and the gates of transfer devices NFET 2225-1 to NFET 2225-6 are connected to a common control line which is driven by output O10. The outputs of inverters INV1'-INV6' provide complement configuration control bits $C_1'$-$C_6'$. The outputs of inverters INV1'-INV6' also drive inputs of inverters INV1-INV6, respectively, whose outputs generate configuration control bits $C_1$-$C_6$, respectively. Note that the complement of a logic (or bit) variable may be indicated as C' or $C_C$ for example. Both forms are used interchangeably throughout the specification. NRAM™ 2200 configuration control bits $C_1$-$C_6$ and complement configuration control bits C1'-C6' may be used as part of NCLB 2300 illustrated further below in FIG. 23 and may also be used as part of NPSM 2400 illustrated further below with respect to FIG. 24.

FIG. 22B illustrates an embodiment of NRAM™ 2250 in schematic form which corresponds to NRAM™ 2200 but with a larger 6×K nonvolatile memory array 2205' compared with 1×6 nonvolatile memory array 2205. Additional word drivers, word driver input, and output lines have been added to NRAM™ 2200 to accommodate the larger memory array. Word line driver WL DR with input O9 driving word line WL1 has been replaced with word line drivers WL DR1 to WL DRK with corresponding inputs O9-1 to O9-K and corresponding outputs driving word lines WL1-WLK, respectively. Word line WL1 drives gates of select FET transistors in cells B11-B16; other word lines (not shown) drive corresponding gates of select FET transistors in other cells; and word line WLK drives gates of select FET transistors in cells BK1-BK6. All other functions are unchanged and are as described with respect to FIG. 22A.

Referring to FIG. 22A, in erase and program operations, controller output O8 is held at a high voltage such as 2.5 volts and PFETs 2220-1 to 2220-6 are OFF. Transfer NFETs 2225-1 to 2225-6 gates are held at ground (zero volts) by O10 and are in an OFF state. Two input tristating AND gates 2215-1 to 2215-6 are activated by 07 at a high voltage such as 2.5 volts which disables tristate and enables two input AND gate operation. At this time, erase and/or program NRAM™ operations may be performed as described further above with respect to FIG. 19. Once NV NT switches (or NV NT blocks) in NV memory array 2205 cells have been switched to ON or OFF states, erase and program operations are terminated and a nonvolatile high resistance state (OFF) or a nonvolatile low resistance state (ON) is stored. A high resistance state may correspond to a logic "0" state and a low resistance state may correspond to a logic "1" state for example. NV memory array 2205 cells are in the following states as illustrated in FIG. 22A. B11 is in a high resistance state; B12 is in a low resistance state; B13, B14, and B15 are in high resistance states, and B16 is in a low resistance state.

Referring to FIG. 22A, in a read operation, controller output O7 is at ground and two input tristate AND gates 2215-1 to 2215-6 are inactive and tristated. Controller output O8 is at ground and PFETs 2220-1 to 2220-6 are ON. PFETs are designed for a high ON channel resistance values using minimum widths and greater than minimum lengths. Therefore voltage V is applied through a channel resistance of 1 M Ohm for example. A read voltage is applied by WL DR to word line WL1 and all select FETs are turned ON. In cells with NV NT switches (or NV NT blocks) are in a high resistance state, typically 1 G Ohm and higher, the output voltage on the corresponding bit lines is V. If however, the series combination of select FET ON resistance and NV NT switch ON resistance is 100 k Ohms or less, then the voltage on the corresponding bit lines will be at a low voltage at V/10 or less. With transfer NFETs 2225-1 to 2225-6 held in an ON state by controller output O10 at a high voltage such as 2.5 volts, bit line BL1-BL6 voltages are applied to inverters INV1'-INV6', respectively, generating complement configuration control bits C1'-C6'; and INV1'-INV6' outputs drive corresponding inverters INV1-INV6 generating configuration control bits C1-C6, respectively. In the NRAM™ 2200 example with NV memory array 2205 cells programmed as illustrated in FIG. 22A configuration control bit (true and complement) outputs during a read operation are as follows: C1', C2, C3, C4, C5' and C6 are at a high voltage such as 2.5 volts for example; C1, C2', C3', C4', C5, and C6' are at a low voltage such as ground.

Referring to FIG. 22B, erase and program operations are as described with respect to FIG. 22A for each of the word lines WL1 . . . WLK. Also, read operations are as described with respect to FIG. 22A for each of the word lines WL1 . . . WLK. Bits B11, B12, . . . , B16 in FIG. 22B are in the same state as bits B1-B6 in FIG. 22A. However, bits BK1-BK6 states are not all the same. Therefore, in the NRAM™ 2250 example illustrated in FIG. 22B, NV memory array 2205' word line WLK configuration control bit (true and complement) outputs during a read operation are as follows: C1, C2', C3, C4', C5 and C6' are at a high voltage such as 2.5 volts for example; C1', C2, C3', C4, C5', and C6 are at a low voltage such as ground.

In read operations, the logic state (logic "1" or logic "0") of configuration control bits illustrated in FIG. 22B may be rapidly changed between multiple pre-programmed states stored in NRAM™ 2205' to reconfigure programmable logic functions for reconfigurable computing operation. In order to maximize reconfigurable computing speed, a pipelined memory operating mode architecture such as used in high speed memory cache operations may be used in which a new set of configuration control bits may be generated during each clock cycle after an initial latency (read access time) delay of multiple clock cycles. If the logic function or routing matrix to be programmed has the required configuration stored in NRAM™ arrays, then for relatively small NRAM™ arrays, configuration control bits (true and complement) may be changed in cycle times of 150 ps corresponding to clock frequencies of 6.7 GHz for example for a 90 nm technology node when corresponding NRAM™ arrays are operated in a pipelined architecture.

Nonvolatile nanotube configurable logic block (NCLB) 2300 illustrates an embodiment of a larger nanotube-based logic function corresponding to combinatorial logic function 710 illustrated in FIG. 7 except that flip flop function and multiplexer are not shown in this example. NCLB 2300 is a nanotube configurable (programmable) two input (inputs A and B) one output (output F) logic block (function) formed using a cascade of FET transfer devices and other logic functions such as NAND, NOR, and a tristate output and is similar to the logic function illustrated in FIG. 14A. The ON or OFF state of each transfer gate and logic operation of some NAND and NOR circuits is controlled by a configuration control bit (which may also be referred to as a configuration control logic state) supplied by NRAM™ output bits. NRAM™ 2310 is used to generate true and complement configuration control bits C0, C0', C1, C1', . . . C6, and C6'. NRAM™ 2310 corresponds to NRAM™ 2200 shown in FIG. 22A or NRAM™ 2250 shown in FIG. 22B.

NCLB 2300 includes input A to one terminal of FET 2330-1 and input $A_C$ formed by inverter 2330-2 is applied to one terminal of FET 2330-3, with the second terminal of each of FETs 2330-1 and 2330-3 dotted and connected to wire 2330-4 which drives one input of two input NOR gate 2340. Inputs A and $A_C$ are also connected to one terminal of FET 2330-5 and one terminal of FET 2330-6, respectively, with the second terminal of each of FETs 2330-5 and 2330-6 dotted and connected to wire 2330-7 which is connected to one input of three input NAND gate 2350. NRAM™ 2310 provides configuration control bits C0 to the gate of FET 2330-1 and C0' to the gate of FET 2330-3. NRAM™ 2310 provides configuration control bits C1 to the gate of FET 2330-5 and C1' to the gate of FET 2330-6.

NCLB 2300 also includes input B to one terminal of FET 2330-8 and input $B_C$ formed by inverter 2330-9 and applied to one terminal of FET 2330-10, with the second terminal of each of FETs 2330-8 and 2330-10 dotted and connected to wire 2330-11 which drives the second input of two input NOR gate 2340. Inputs B and $B_C$ are also connected to one terminal of FET 2330-12 and one terminal of FET 2330-13, respectively, with the second terminal of each of FETs 2330-12 and 2330-13 dotted and connected to wire 2330-14 which is connected to a second input of three input NAND gate 2350. NRAM™ 2310 provides configuration control bits C2 to the gate of FET 2330-8 and C2' to the gate of FET 2330-10.

NRAM™ 2310 provides configuration control logic bits C3 to the gate of FET 2330-12 and C3' to the gate of FET 2330-13.

NCLB 2300 also includes NRAM™ 2310 providing output C4 to one input of two input NAND gate 2345. The second input to NAND gate 2345 is supplied by the output of NOR gate 2340. NRAM™ 2310 output C5 is connected to the third input of three input NAND gate 2350. The outputs of two input NAND 2345 and three input NAND 2350 drive the two inputs to NOR gate 2355. The output of two input NOR gate 2355 drives the input of tristate inverter 2360. The state of tristate inverter F is determined by configuration control bits C6 and C6' which are provided by NRAM™ 2310.

FIG. 14B described further above illustrates eight nonvolatile circuit configurations (CKT CONFIG. #s 1-8) and the corresponding values of C0, C0', . . . , C5 used to generate CKT CONFIG. #s 1-8 for NCLB 2300. FIG. 14B gives an output F function based on inputs A and B and the configuration control logic states. Output F outputs logic values if the C6 state is a logic 1 and C6' is a logic 0. However, if the C6 state is a logic 0 state and C6' is a logic 1, then output F remains in tristate with no defined value. FIG. 15 illustrates equivalent circuits 1500 corresponding to CKT CONFIG. 1-8.

NPSM Function and Operation Using NRAM™s

Figure 24:
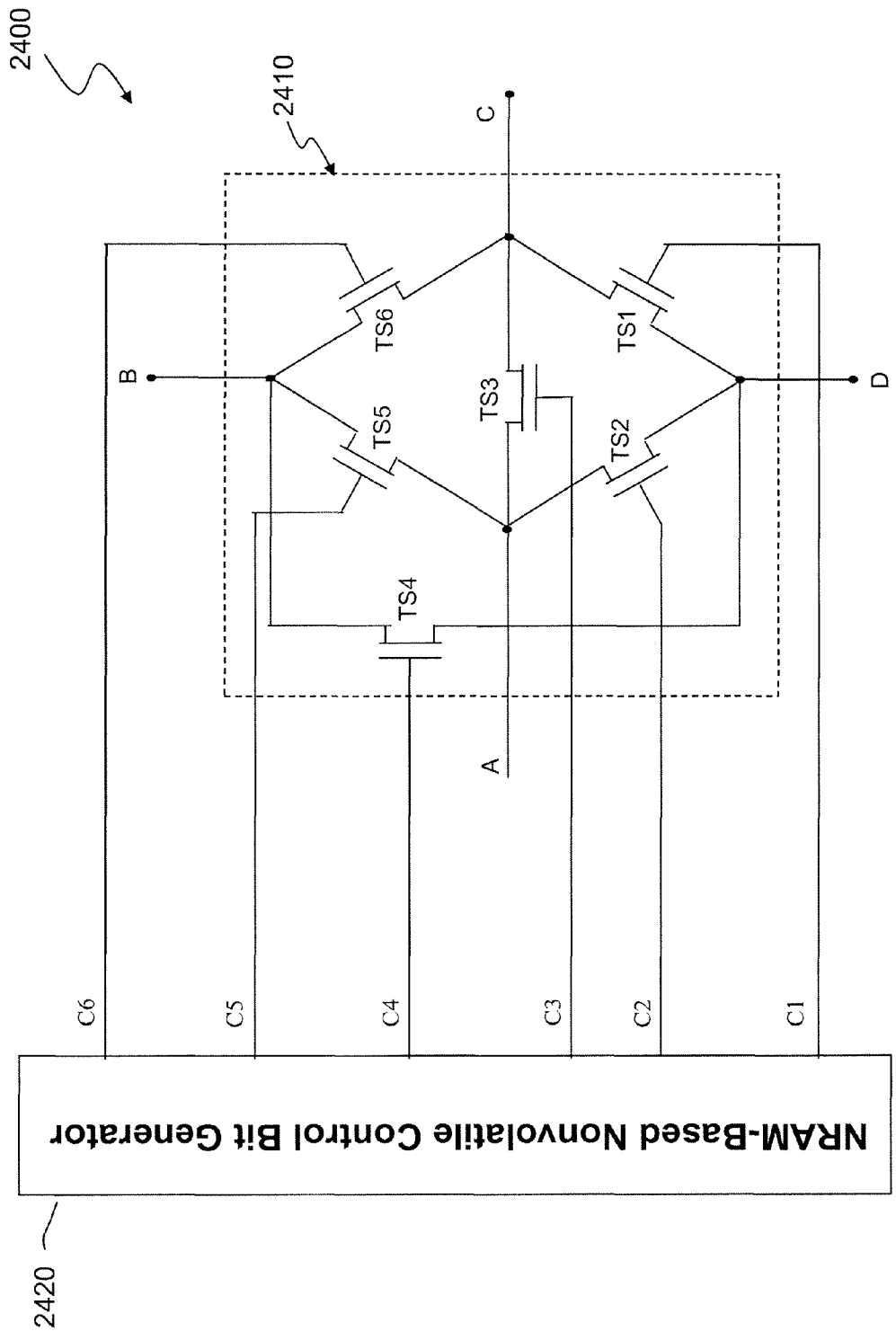
FIG. 24 shows a nonvolatile nanotube programmable switch matrix with various signal routing configurations controlled by nonvolatile true and complement control bits generated by a nonvolatile NRAM™ memory such as described with respect to FIG. 22A or FIG. 22B.

An embodiment of nonvolatile nanotube programmable switch matrix NPSM 2400 illustrated in FIG. 24 shows programmable switch matrix (PSM) 2410 configured by nonvolatile NRAM™ 2420 outputs that provide configuration control bits. Programmable switch matrix (PSM) 2410 is the same as PSM 1610 described further above with respect to FIG. 16. NRAM™ 2420 may correspond to NRAM™ 2200 shown further above in FIG. 22A, NRAM™ 2250 shown further above in FIG. 22B, or other NRAM™ configurations (not shown). Nonvolatile configuration control bits C1-C6 control the configuration of PSM 2410 as described above with respect PSM 1610 shown in FIG. 16. Configuration control bits C1-C6 drive the gates of FETs TS1, TS2, . . . , TS6, respectively, and determine the ON or OFF states these FETs.

As described further above with respect to FIG. 16, configuration control bits (also referred to as configuration control logic states) programmed in NPSM 2400 may be used to form various routings between terminals A, B, C, and D. Exemplary interconnections achievable with NPSM 1600 are listed in Table 3 below.

TABLE 3

| Number of FETs in ON State | Possible Terminal Combinations | Comments |
| --- | --- | --- |
| One | AB, AC, AD, BC, BD, CD | Independent paths |
| Two | AB & CD, AD & BC, AC & BD | Independent paths |
| Three | ABC, ABD, ACD, BCD | Shared paths |
| Four | ABCD | Shared paths |

In a read operation, if NRAM™ 2420 corresponds to NRAM™ 2200 (FIG. 22A), then one set of configuration control bits is C1-C6 is provided to PSM 2410 until the NRAM™ is reprogrammed. However, if NRAM™ 2420 corresponds to NRAM™ 2250 (FIG. 22B) then up to K different programmed configuration control bit sets corresponding to C1-C6 may be read out and PSM 2410 may assume multiple switch configuration by switching between multiple pre-programmed sets of bit states. The ability to rapidly change PSM 2210 signal routing configurations as often as once per clock cycle, enables reconfigurable computing for example. If the logic function or routing matrix to be programmed has the required configuration stored in NRAM™ arrays, then for relatively small NRAM™ arrays, configuration control bits (true and complement) may be changed in cycle times of 150 ps corresponding to clock frequencies of 6.7 GHz for example for a 90 nm technology node as described further above with respect to FIGS. 22A and 22B. If the clock is stopped and power is removed, the NPSM 2400 routing configuration remains unchanged.

NFPGA Enabled Reconfigurable Computing Using NSRAMs

FPGA architectures are dominated by interconnects. FPGAs are therefore much more flexible in terms of the range of designs that can be implemented and logic functions in the hundreds of thousands to millions and tens-of-millions of equivalent logic gates may be realized. In addition, the added flexibility enables inclusion of higher-level embedded functions such adders, multipliers, CPUs, and memory. The added interconnect (routing) flexibility of FPGAs also enables partial reconfiguration such that one portion of an FPGA chip may be reprogrammed while other portions are running FPGAs that can be reprogrammed while running may enable reconfigurable computing (reconfigurable systems) that reconfigure chip architecture to better implement logic tasks. The idea of reconfigurable computing is not new; however, implementation is limited by hardware capability and architecture and software. NRAM™s combined with FET switches and logic circuits to form NFPGAs enable the hardware portion of reconfigurable computing by providing nonvolatile configuration control bits (also referred to as nonvolatile configurable control logic states) that can change logic functions and signal routing in real time during chip operation and maintain such configurations in the absence of power as needed resulting in nonvolatile globally adaptive and reconfigurable capabilities in real time. Reconfigurable computing concepts are described by G. G. Yen, "Autonomous Neural Control in Flexible Space Structures," Chapter 93, pp. 1199-1202 in "The Industrial Electronics Handbook" edited by J. David Irwin, CRC Press LLC, 1997.

Reconfigurable computing involves both spatial and temporal partitions. NRAM™ 2250 as described further above with respect to FIG. 22B is designed to store K programmed combinations of configurable control bits (configurable control logic states) that can be read out at speeds as fast as 150 ps corresponding to 6.7 GHz for a 90 nm technology node for example so NRAM™ 2250 may be used to reconfigure programmable logic blocks and programmable switch matrices in real time providing both spatial and temporal partitions. In this example, NRAM™ 2250 enables the nonvolatile nanotube configurable logic block (NCLB) 2300 to be changed in as little time as one clock cycle (in pipeline mode) to support up to K logic configurations preprogrammed into NRAM™ 2250. Also, NRAM™ 2250 enables the nonvolatile nanotube programmable switch matrix (NPSM) 2400 to be reconfigured in as little time as one clock cycle (in pipeline mode) thereby rerouting signals in real time each cycle if needed. Nanotube bidirectional buffers described further above with respect to FIGS. 17A and 17B may also use NRAM™ configuration control bits (not shown) to redirect signal flow and change signal polarity, for example, in one cycle if needed. Hence, nonvolatile nanotube field programmable gate array (NFPGA) 2100 which is formed using various interconnected NCLBs and NPSMs may be configured spatially and temporally within one clock cycle when in a pipeline mode and over several cycles in non-pipelined operating mode.

Typically in reconfigurable computing, the number of spatial and temporal changes needed is relatively small. Reprogramming NRAM™s may only be needed less than a few thousand times for example. In some cases, small NRAM™ memories are all that is needed so a small number of configuration control bits may be preprogrammed. In the case of NCLB 2300, K=8 (eight word lines) can accommodate the various configurations illustrated in corresponding FIG. 14B. For NPSM 2400 various combinations of independent and shared routing configurations can be programmed as illustrated further above with respect to FIG. 24. If some NFPGA functions are not needed for certain computations for example, then power may be removed from these nonvolatile functions thereby eliminating standby power. Other NFPGA functions, embedded CPUs, memories, etc. May leverage these power savings by running faster at higher levels of power.

Embedded NRAM™ memories may be combined with FPGAs, CPUs and other functions. In applications requiring fast cache operation, read and write times are essentially the same and may require cycle times of 150 ps to support a 6.7 GHz clock rate for example. It may also be desirable to modify logic function and signal routing in one clock cycle without using preprogrammed functions that may not cover all configuration control bit requirements. In present generation NRAM™s write (erase/program) operations are significantly slower than read operations. Hence, nanotube-based SRAM nonvolatile memories (NSRAMs) may be desirable because high speed SRAM operation at read and write cycle times of 150 ps (90 nm technology node) is enabled which supports a clock cycle of 6.7 GHz with the ability to save SRAM states in a nonvolatile mode using nanotube-based nonvolatile switches as needed.

Figure 25:
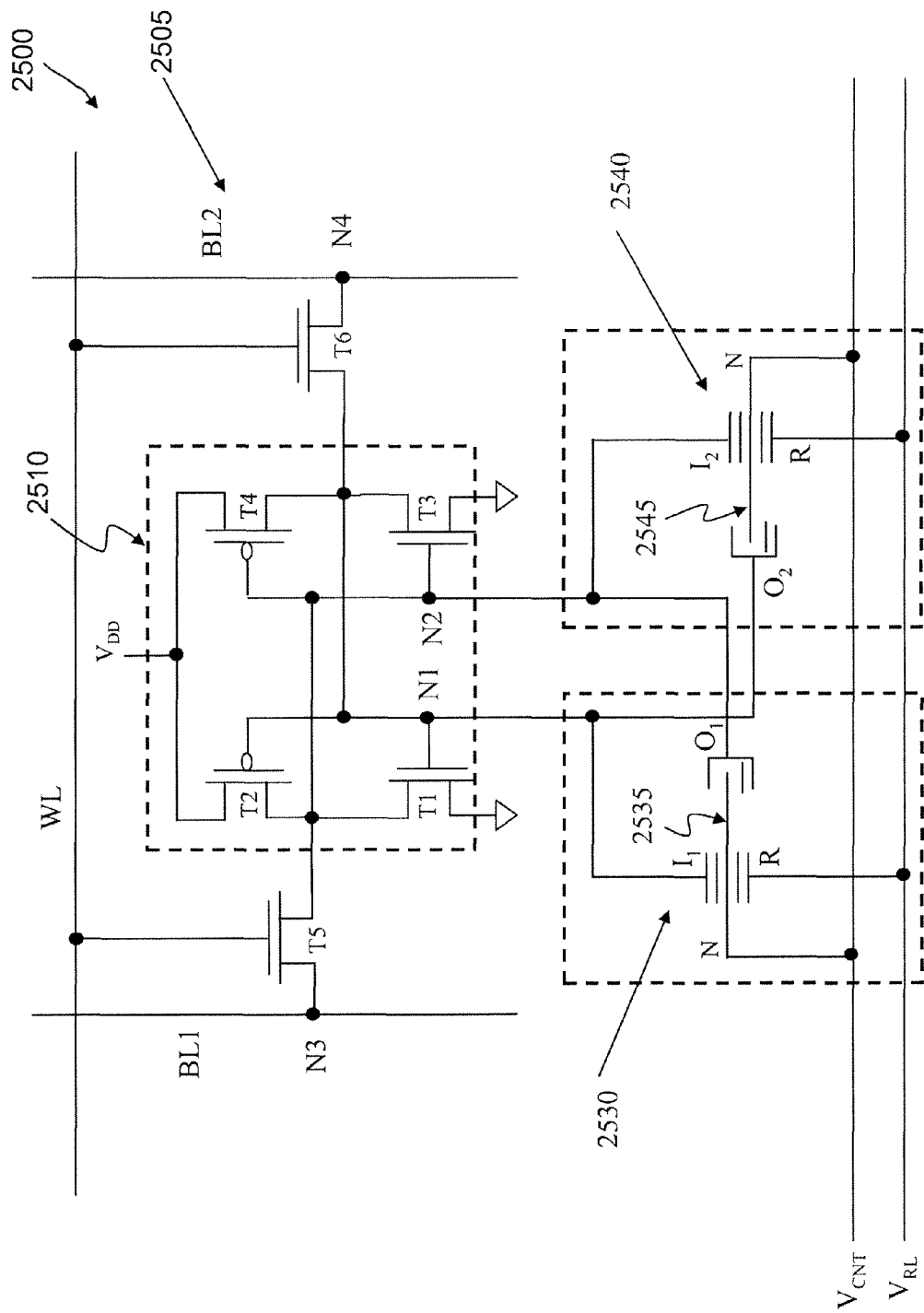
FIG. 25 shows a nonvolatile nanotube static random access memory (NSRAM) cell formed by combining an SRAM cell and a pair of nonvolatile nanotube switching elements.

U.S. Pat. No. 7,245,520 to Bertin et al., incorporated herein by reference, illustrates NSRAM memory cell 2500 that may be used to form high speed (actually any speed range from low to high speed) NSRAM memory by combining SRAM cell 2505 and a pair of nonvolatile nanotube switching elements 2530 and 2540. NSRAM memory cell 2500 includes a conventional SRAM cell formed by flip flop 2510 connected to word line WL and bit lines BL1 and BL2 by select transistors FET T5 and FET T6, respectively, as described in more detail in U.S. Pat. No. 7,245,520 which is hereby incorporated by reference. NSRAM memory cell 2500 also includes nonvolatile nanotube switching elements 2530 and 2540 used as nonvolatile nanotube shadow devices that can store NSRAM memory cell 2500 bit states in a nonvolatile mode prior to turn-off or loss of power and also recall (restore) flip flop 2510 bit states when NSRAM cell 2500 is reactivated (powered-up). Control wires $V_{CNT}$ and $V_{RL}$ are used to control the switching of nonvolatile nanotube switching elements 2530 and 2540 coupled to flip flop 2510 as shown in FIG. 25. A detailed description of NSRAM memory cell 2500 and its operation is described in the incorporated U.S. Pat. No. 7,245,520 reference. The structure and operation of nonvolatile nanotube switching elements 2530 and 2540 is described in detail in U.S. Pat. Nos. 6,990,009, 7,339,401 and U.S. patent application Ser. No. 11/971,476, filed on Jan. 9, 2008, each entitled "Nanotube-Based Switching Elements with Multiple Controls," and U.S. Pat. No. 7,071,023 and U.S. patent application Ser. No. 11/449,969, filed on Jun. 9, 2006, each entitled "Nanotube Device Structure and Methods of Fabrication," which are both hereby incorporated by reference.

Figure 26:
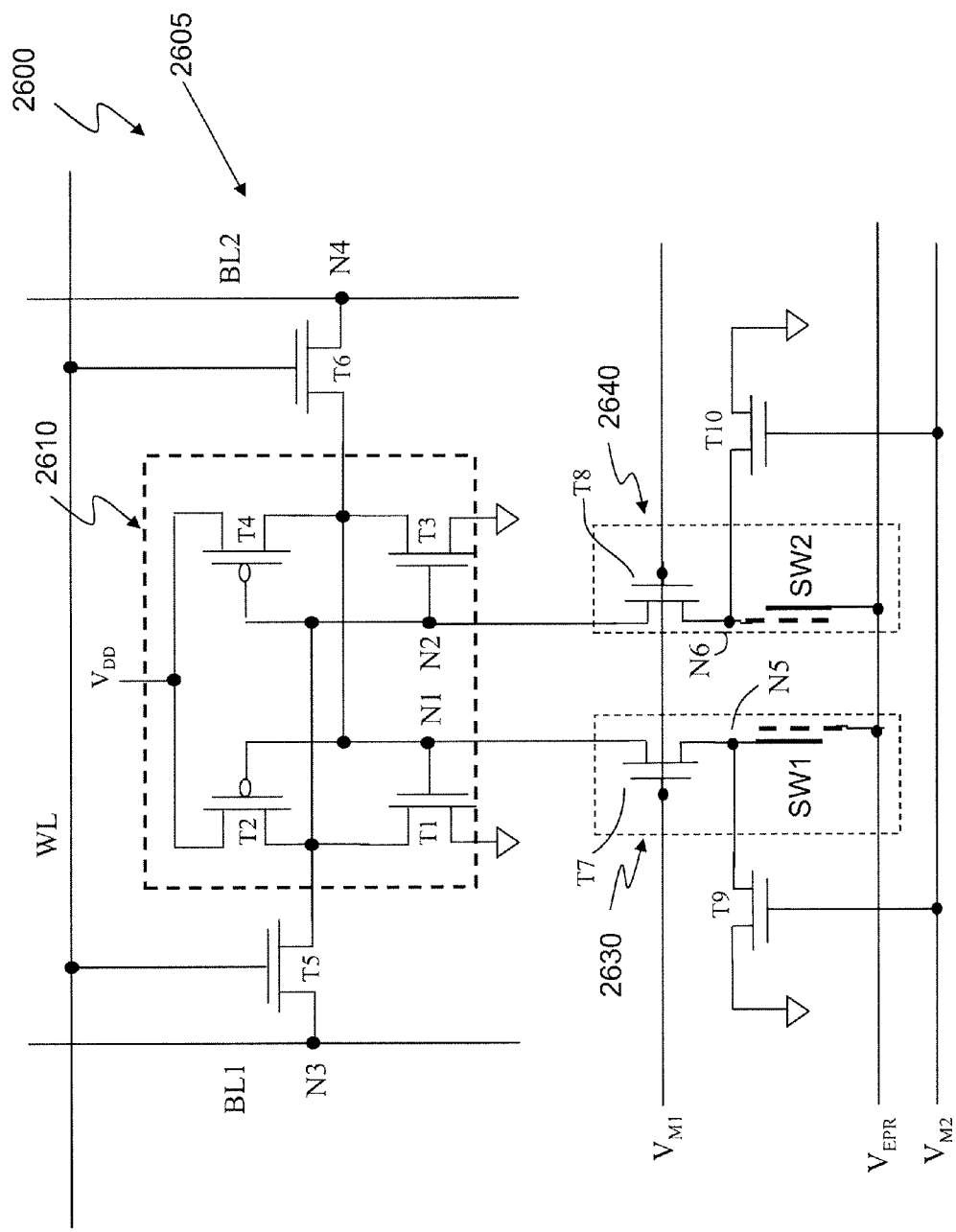
FIG. 26 shows another nonvolatile nanotube static random access memory (NSRAM) cell in which the pair of nonvolatile nanotube switching elements used in FIG. 25 are replaced by a pair of NRAM™ cells with mode control transistors.

An NSRAM memory may also be formed by replacing nonvolatile nanotube switching elements 2530 and 2540 in FIG. 25 with NRAM™ cells. Referring now to FIG. 26, NRAM™ cells 2630 and 2640 (corresponding to nonvolatile nanotube switching elements 2530 and 2540 in FIG. 25) act as shadow nonvolatile storage devices. Mode control transistors are added to support program and erase operations. NRAM™ cells 2630 and 2640 correspond to NRAM™ cell 1100 shown in FIG. 11A. Flip flop 2610 shown in FIG. 26 corresponds to flip flop 2510 shown in FIG. 25.

One embodiment NSRAM cells 2600 may be combined in rows and columns to form NSRAM memories. NSRAM cells 2600 includes a conventional SRAM cell formed by flip flop 2610 connected to word line WL and bit lines BL1 and BL2 by select transistors FET T5 and FET T6, respectively. A first terminal of NRAM™ cell 2630 select FET T7 is connected to a first terminal of NV NT switch (or NV NT block) SW1 at common node N5. A first terminal of mode select FET T9 is connected to common node N5. A second terminal of FET T7 is connected to node N1 of flip flop 2610 shown in FIG. 26 which corresponds to flip flop 2510 in FIG. 25. Mode select line $V_{M1}$ is connected to the gate of FET T7 and controls the ON/OFF state of FET T7. A second terminal of FET T9 is connected to a reference such as ground (zero volts) and mode select line $V_{M2}$ is connected to the gate of FET T9 and controls the ON/OFF state of FET T9. A second terminal of NV NT switch SW1 is connected to erase/program/read select line $V_{EPR}$.

A first terminal of NRAM™ cell 2640 select FET T8 is connected to a first terminal of NV NT switch (or NV NT block) SW2 at common node N6. A first terminal of mode select FET T10 is connected to common node N6. A second terminal of FET T8 is connected to node N2 of flip flop 2610 shown in FIG. 26 which corresponds to flip flop 2510 in FIG. 25. Mode select line $V_{M1}$ is connected to the gate of FET T8 and controls the ON/OFF state of FET T8. A second terminal of FET T10 is connected to a reference such as ground (zero volts) and mode select line $V_{M2}$ is connected to the gate of FET T10 and controls the ON/OFF state of FET T10. A second terminal of NV NT switch SW2 is connected to erase/program/read select line $V_{EPR}$.

An NSRAM memory (not shown) is formed in a conventional manner by a combination of rows and columns of NSRAM cells 2600 interconnected by shared approximately orthogonal word and bit lines. In operation, mode select line $V_{M1}$ is held at a low voltage such as ground and FET T7 and FET T8 are in an OFF state and shadow devices pairs formed by NRAM™ cell 2630 and 2640 are decoupled from flip flop 2610. Typically mode select line $V_{M2}$ is also held at ground turning FETs T9 and T10 OFF and program/erase/read line $V_{EPR}$ is at a low voltage such as ground. SRAM cells such as cell 2605 operate in a volatile mode with memory cycle times as fast as 150 ps for a CMOS technology at a 90 nm node. If SRAM power is to be removed or if power is about to be lost, then a store operation is performed in which FETs T7 and T8 are turned ON and the logic state of flip flop 2610 is transferred and stored in NRAM™ cell 2630 on NV NT switch (NV NT block) SW1 and a complementary state is stored in NRAM™ cell 2640 on NV NT switch (NV NT block) SW2. Power may then be removed. The stored logic state may be recalled (restored) during power up in the following way. $V_{EPR}$ may be held at ground or may be ramped to a voltage such as $V_{DD}$; SRAM cell 2605 voltage source is ramped to $V_{DD}$. Flip flop 2610 assumes a state corresponding to the true and complement logic states stored in NRAM™ cells 2630 and 2640 and the logic state of SRAM cell 2605 prior to power shutdown is restored and SRAM memory operation resumes. Store and recall (restore) operations are described in more detail in U.S. Pat. No. 7,245,520.

The integration of nanotube-based logic and memory functions as described further above results in what may be referred to as instant-OFF and instant-ON operations. The store operation that precedes power shut down may be performed in microseconds or milliseconds, for example, resulting in what may be referred to as an instant-OFF operation in which logic states and operating data are preserved in by nonvolatile nanotube switches or blocks. The recall (restore) operation may be performed as part of a power-ON operation typically requiring microseconds or milliseconds, for example. Since logic states and data are restored within a power-ON time interval and operational with the system initialized to pre-power-OFF logic states and data, such recall (restore) operations may be referred to as instant-ON.

An erase operation may be performed just prior to a store operation or at any time when FETs T7 and T8 are in an OFF state. During an erase operation, mode select line $V_{M2}$ is set at a high voltage such as 2.5 volts for example and FETs T9 and T10 are turned on grounding nodes N5 and N6, respectively. Then, $V_{EPR}$ applies one or more erase pulses with an amplitude in the range of 5 to 7 volts and rise times in the nanosecond range for example to a second terminal of NV NT switches SW1 and SW2 and switches SW1 and SW2 are switched to high resistance states such as 1 G Ohm or higher.

A program operation may be used store the logic content of flip flop 2610 on switches SW1 and SW2 in a nonvolatile mode prior to the removal of power. FETs T9 and T10 are in an OFF state and NRAM™ cell 2630 select FET T7 and NRAM™ cell 2640 select FET T8 are activated to an ON state. In this example, NV NT switches SW1 and SW2 are in a high resistance (OFF) state. Then, $V_{EPR}$ applies one or more program pulses with an amplitude in the range of 3 to 5 volts and rise times in the microsecond range for example to a second terminal of NV NT switches SW1 and SW2. If flip flop 2610 node N1 is at a low voltage and node N2 is at a high voltage, then SW1 is programmed to a low resistance value such as 100 k Ohms for example and SW2 remains in a high resistance state such as 1 G Ohm. However, if flip flop 2610 node N1 is at a high voltage and node N2 is at a low voltage, then SW1 is programmed remains at a resistance state such as 1 G Ohms for example and SW2 switches to a low resistance state such as 1 k Ohm.

In a program operation to store the state of flip flop 2610, flip flops in some (or all) rows may transfer logic states to corresponding nonvolatile NRAM™ cells. However, program pulses may disturb some flip flops during the store operation. In order to minimize the risk of disturbing the state of flip flop 2610, transfer may be carried out one word line at a time for a word line within a subset of word lines corresponding to a subset of latches. In this case, the logic state of flip flop 2610 is read out and bit line BL1 and BL2 are held at true and complement high/low or low/high values by corresponding sense amplifier/latches for each bit line pair such as bit lines BL1 and BL2. Select transistors FETs T5 and T6 are in an ON state, bit line BL2 connected to node N4 holds node N1 at a low (or high) voltage and bit line BL1 connected to node N3 holds node N2 at a high (or low) voltage. In this way, program currents flow to bit lines BL1 or BL2 (whichever is at a low voltage) without disturbing the state of flip flop 2610. For unselected rows, select transistors corresponding to select transistor FETs T5 and T6 are in an OFF state so that corresponding flip flops are not disturbed.

In addition to fast programmable logic reconfiguration, NSRAMs may also be used to form high speed embedded nonvolatile caches used in conjunction with NFPGAs, CPUs, ASICs, analog, and other functions all integrated on the same chip.

Nanotube Configurable Logic Blocks (NCLB) & Nanotube Programmable Switch Matrix (NPSM) Using Nonvolatile NS/R-Controlled Select Circuit to form Nonvolatile Nanotube Configuration Control Register (NCCR)

Various nonvolatile nanotube configuration control registers (NCCRs) are combined with CLB and PSM functions to form NCLB and NPSM building blocks that may be integrated to form NFPGA logic as described with respect to FIGS. 19-26 illustrated further below. Nonvolatile nanotube configuration control registers (NCCRs) are form using nonvolatile nanotube shift register (N-S/R) stages.

NFPGA Function and Operation using Nonvolatile Nanotube Configuration Control Registers (NCCRs)

Since FPGA architectures are dominated by interconnects, it may be advantageous to use configuration control registers to provide configuration control bits, typically one control bit per shift register stage (also referred to as a shift register cell). This is because the number of shift register stages and therefore the number of configuration control bits may be increased to any size while keeping the number of inputs the same. In the case of NRAM™s for example, as array size increases to provide more configuration control bits, decoder size increases requiring a larger number of inputs such as inputs illustrated in FIGS. 22A and 22B. Configuration control registers may also be used instead of nonvolatile nanotube select circuits illustrated in FIGS. 11B and 12A for example. Configuration control registers formed using typical shift register (S/R) stages are volatile in operation; that is the logic states of the shift register stages are lost when power is lost or removed. In order to replace nonvolatile NRAM™s and nonvolatile nanotube select circuits described further above in various NFPGA architectures, configuration control registers need to be nonvolatile as well. U.S. Pat. No. 7,394,687 and U.S. patent application Ser. No. 12/165,007, filed on Jun. 30, 2008, entitled "Non-Volatile Shadow Latch Using a Nanotube Switch," herein incorporated by reference teaches the addition of NV NT switches to shift register stages (cells), typically one NV NT switch per stage, to form nonvolatile nanotube shift registers (NS/Rs) that are used to form nonvolatile nanotube configuration control registers (NCCRs) which operate in a high speed volatile mode at clock rates of 6.7 GHz at 2.5 volts for a CMOS 90 nm technology node for example, or at slower speeds but lower power at a lower voltages such as 1 volt for example. Nonvolatile NCCRs can store information in NV NT switches in the absence of power. When power is restored, the high resistance or low resistance states of each NV NT switch is used to restore individual corresponding NS/R stages to the logic states prior to power shut-down or loss. The NS/R registers described in U.S. Pat. No. 7,394,687 and U.S. patent application Ser. No. 12/165,007, filed on Jun. 30, 2008, entitled "Non-Volatile Shadow Latch Using a Nanotube Switch," may provide nonvolatile configuration control bits, one per stage, by connecting a wire directly to the output of each output stage. Alternatively, an FET may be used as a transfer gate to provide configuration control bits when the FET is in an ON state.

Figure 27:
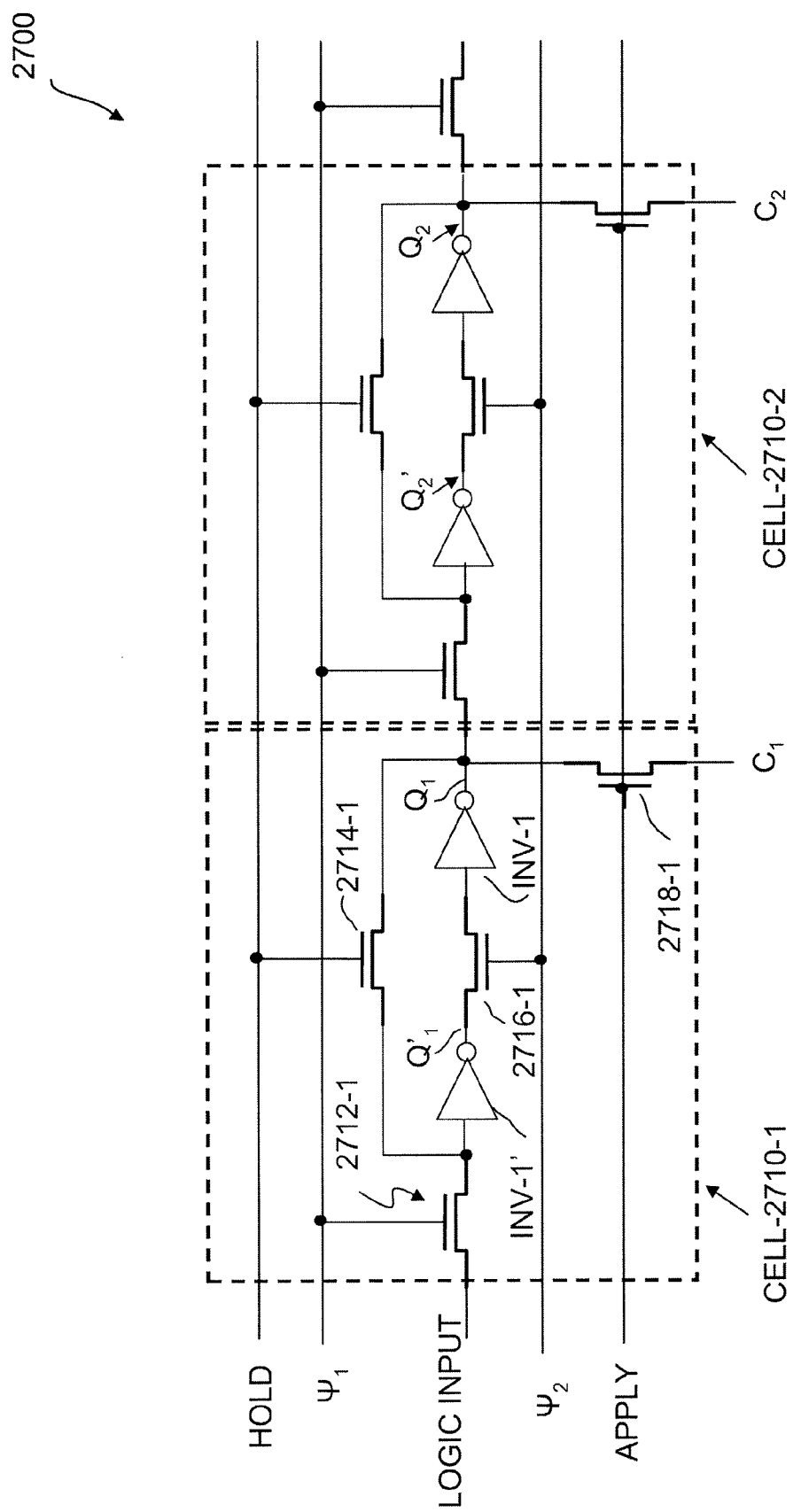
FIG. 27 shows two stages of a configuration control register that provides configuration control bits.

It is desirable for individual NS/R stages to be as small as possible for greater layout density. A configuration control register of greater density involving fewer numbers of FETs and interconnections per stage than those described in U.S. Pat. No. 7,394,687 and U.S. patent application Ser. No. 12/165,007, filed on Jun. 30, 2008, entitled "Non-Volatile Shadow Latch Using a Nanotube Switch," is shown in U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," which is herein incorporated by reference and illustrated in FIG. 27. FIG. 27 corresponds to similar configuration control registers described in U.S. Pat. Re. 34,363.

Figure 23:
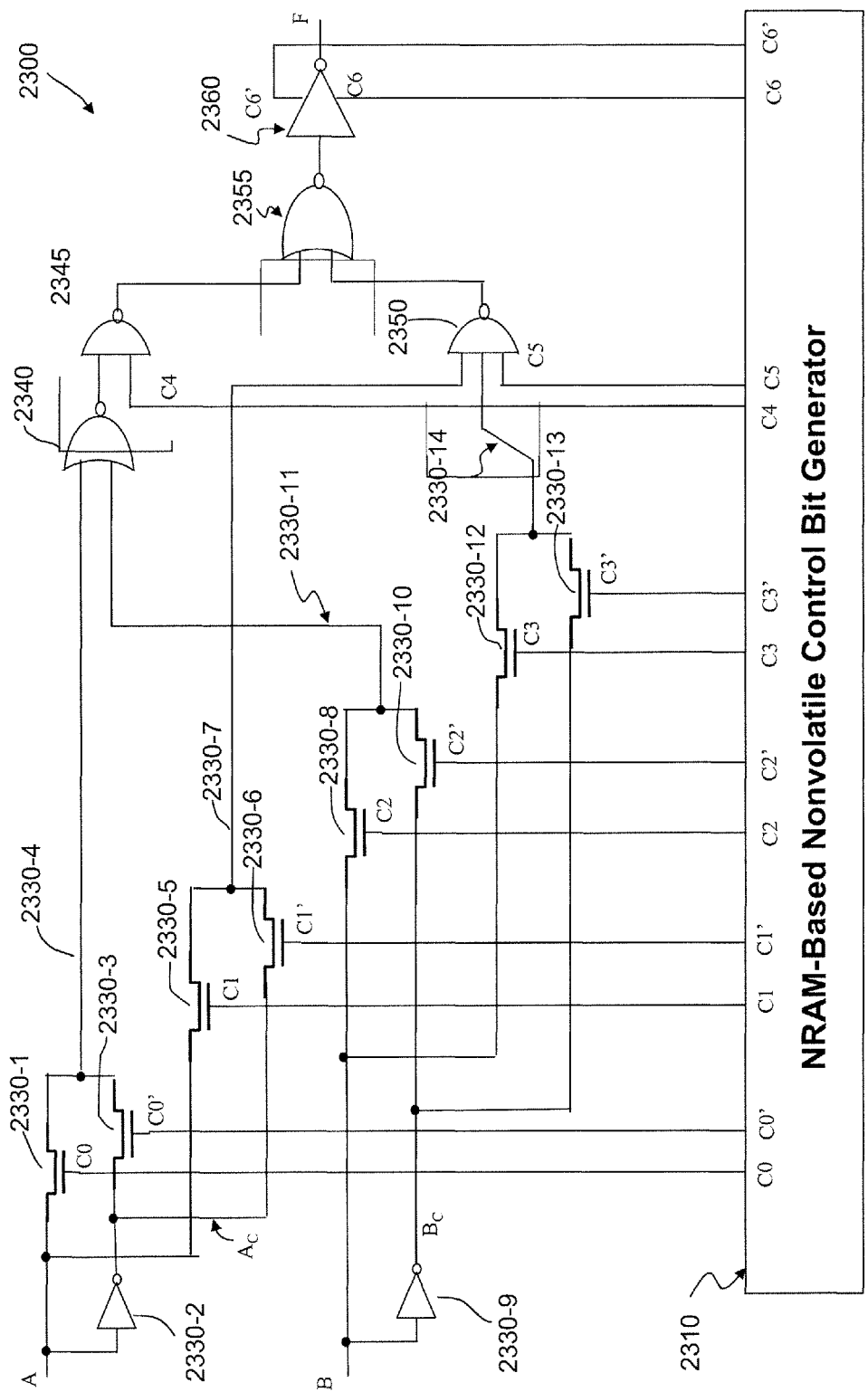
FIG. 23 shows a nonvolatile nanotube configurable logic block (NCLB) formed using transfer gates, NAND, NOR, and tristate circuits whose logic function is determined by nonvolatile true and complement control bits generated by a nonvolatile NRAM™ memory such as described with respect to FIG. 22A or FIG. 22B.

FIG. 27 illustrates a schematic representation of a configuration control register 2700 showing two stages of a multi-stage shift register. Although configuration control register 2700 shows two shift register cells, a configuration control register contains as many cells as required to configure the logic element. For example, if seven configuration control bits (logic states) are required as illustrated in FIG. 23, then a seven stage configuration control register is used; if six configuration control bits (logical states) are required as illustrated in FIG. 24, then a six stage configuration control register is used. A basic shift register cell includes transfer device 2712-1 in series with inverter INV-1', in series with transfer device 2716-1 which is in series with inverter INV-1. The output Q1 of inverter INV-1 is fed back to the input of inverter INV-1' through transfer device 2714-1 enabling shift register CELL-2710-1 (shift register stage 1) to store a logic state as long as a power source is maintained (volatile shift register operation) to configuration control register 2700 and the HOLD voltage is held high. The output Q1 of inverter INV-1 also connects to the input of shift register CELL-2710-2, which is identical to shift register cell 1, and also connects to one terminal of transfer device 2718-1. The output Q1' of inverter INV-1' connects to the input of transfer device 2716-1. Two non-overlapping clocks Ψ1 and Ψ2 connect to control gates of transfer devices 2712-1 and 2716-1, respectively, and to corresponding transfer devices in other shift register cells. Transfer device 2714-1 and corresponding devices in other cells enable or disable the feedback path between INV-1 output and INV-1' input depending on the state of the HOLD input. Desired configuration control bit (logic state) data is transmitted to configuration control register 2700 by a LOGIC INPUT signal until each shift register cell (or stage) such as shift register CELL-2710-1 and CELL-2710-2 store the desired bit (logic state). Then APPLY control input is activated, and outputs Q1 and Q2 supply outputs configuration control bits such as C1 and C2 that may be applied to reconfigurable logic functions such as illustrated in FIG. 23 and programmable switch matrices such as illustrated in FIG. 24. Outputs Q2 and Q2' in shift register CELL-2710-2 corresponds to outputs Q1 and Q1' in shift register CELL-2710-1, respectively, described further above.

In operation, the entire configuration control register 2700 may be set to a high or low voltage by setting Ψ1 and Ψ2 voltage high and HOLD voltage low. Alternatively, with HOLD set at a high voltage, clocks Ψ1 and Ψ2 may be used to transfer a logic pattern of 1's and 0's into the shift register to store desired bit (logic states) in each of the shift register stages. Enough time must be allowed for the input signal LOGIC INPUT to propagate the entire length of configuration control register 2700. At that point in time, APPLY may transition to a positive voltage and outputs Q1 and Q2 supply configuration control bits (logic states) C1 and C2 that may be applied to reconfigurable logic functions such as illustrated in FIG. 23 and programmable switch matrices such as illustrated in FIG. 24.

It is desirable to have nonvolatile configuration control registers for NFPGA applications. One approach is to use the nonvolatile shift registers described in U.S. Pat. No. 7,394,687 and U.S. patent application Ser. No. 12/165,007, filed on Jun. 30, 2008, entitled "Non-Volatile Shadow Latch Using a Nanotube Switch." Such nonvolatile shift registers are compatible with high speed operation and may also be used to hold logic states when power is removed or lost and then logic states recalled (restored) when power is restored as described in U.S. Pat. No. 7,394,687 and U.S. patent application Ser. No. 12/165,007, filed on Jun. 30, 2008, entitled "Non-Volatile Shadow Latch Using a Nanotube Switch." However, since in some NFPGA architectures it is desirable for individual NS/R stages to be as small as possible for greater layout density, adding a coupling circuit and one NV NT switch (or NV NT block) to each stage of a configuration control register that uses a fewer number of FETs and interconnections per stage than those described in U.S. Pat. No. 7,394,687 and U.S. patent application Ser. No. 12/165,007, filed on Jun. 30, 2008, entitled "Non-Volatile Shadow Latch Using a Nanotube Switch" is desirable. FIG. 28 illustrates nonvolatile nanotube configuration control register (NCCR) 2800 formed using two NS/R stages in which one coupling circuit per stage and one NV NT switch (or NV NT block) per stage is added to configuration control register 2700 illustrated in FIG. 27.

Figure 28A:
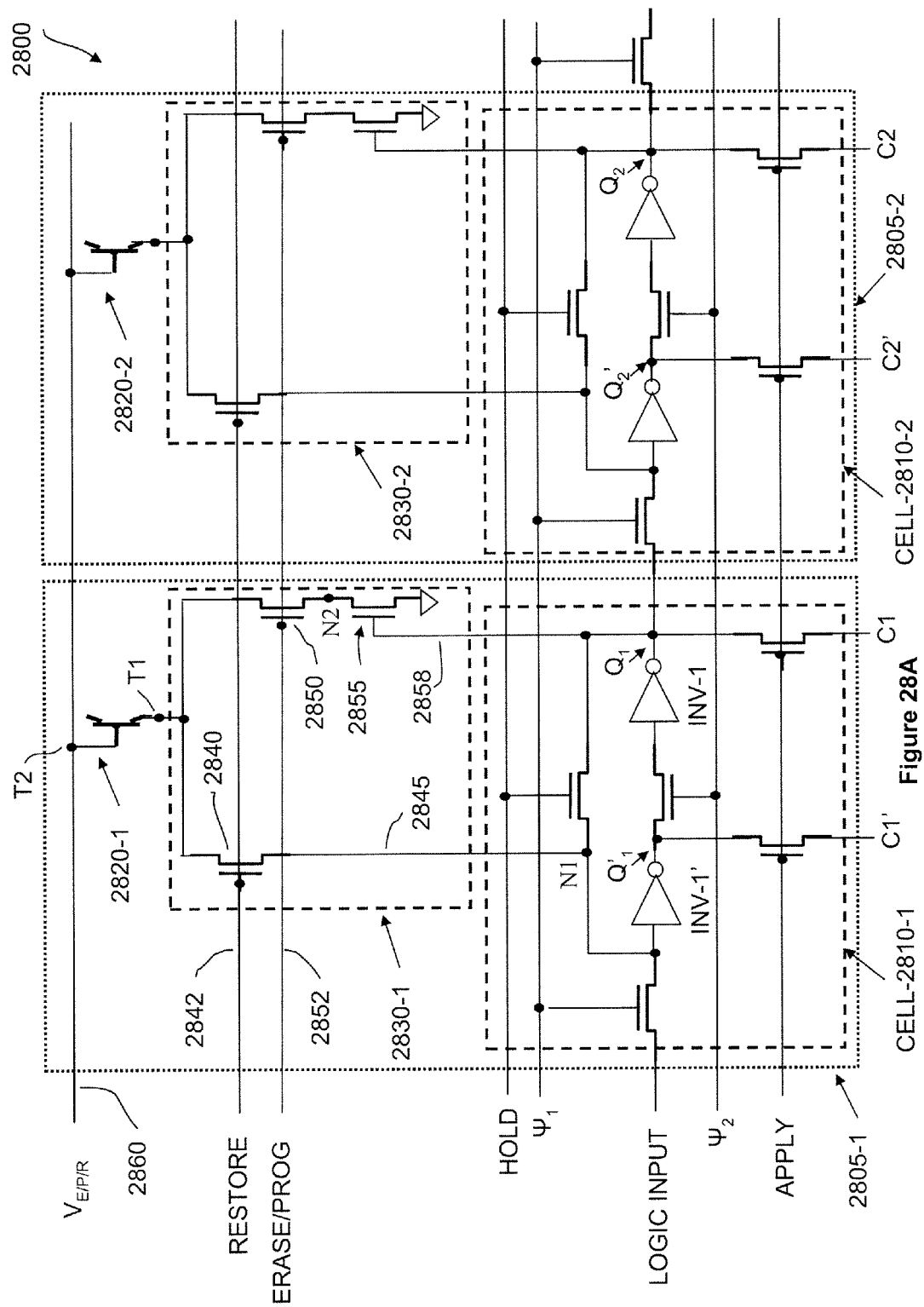
FIG. 28A shows two stages of a nonvolatile nanotube configuration control register that provides nonvolatile configuration control bits. The logic state of the nanotube configuration control register (NCCR) may be stored in, and recalled from, nonvolatile high or low resistance states in nonvolatile nanotube switches. Both nonvolatile nanotube switches (one per register stage) are shown in a low resistance (ON) state.
Figure 28B:
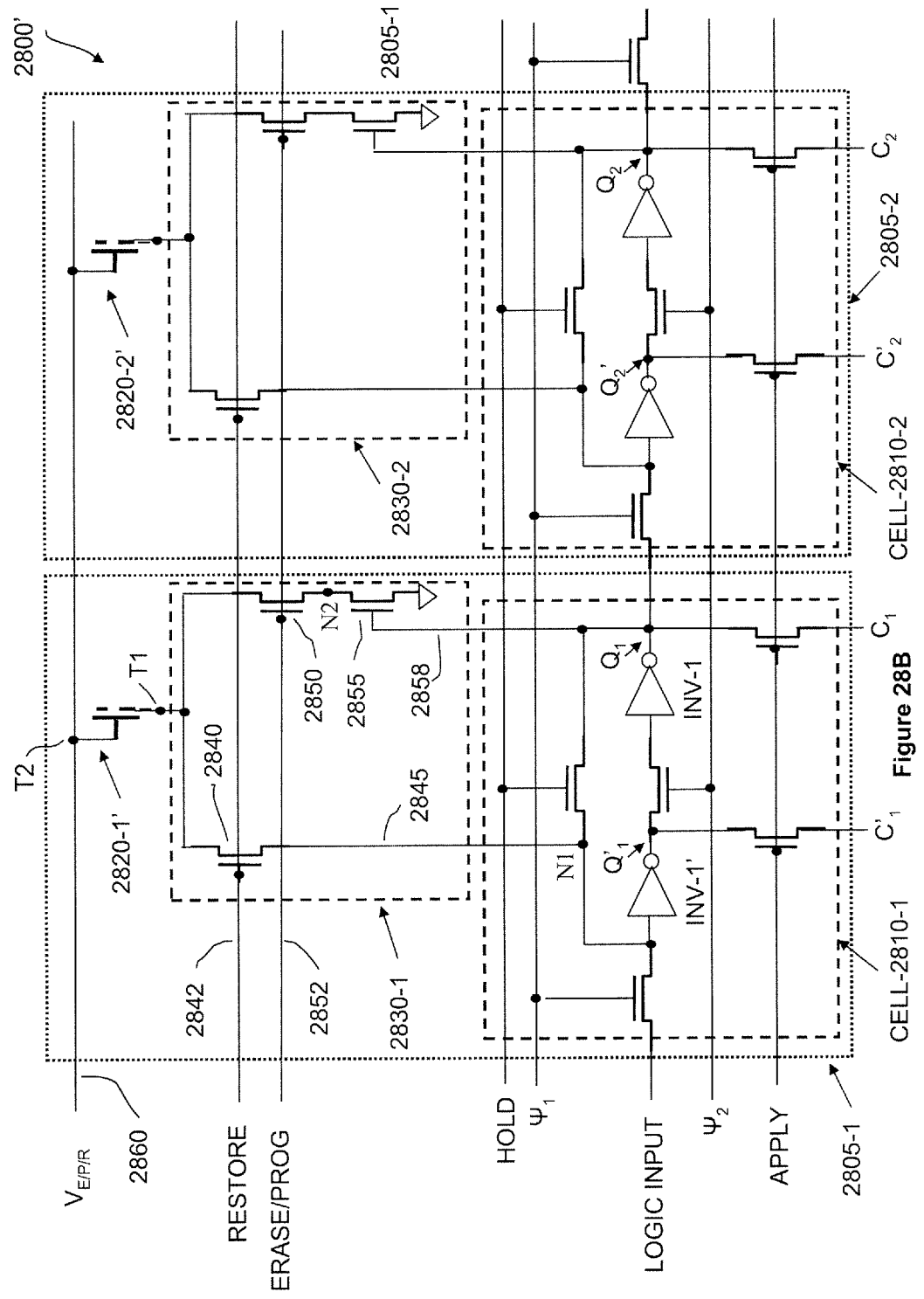
FIG. 28B shows the nonvolatile nanotube configuration control register of FIG. 28A with both nonvolatile nanotube switches set in a high resistance (OFF) state.
Figure 28C:
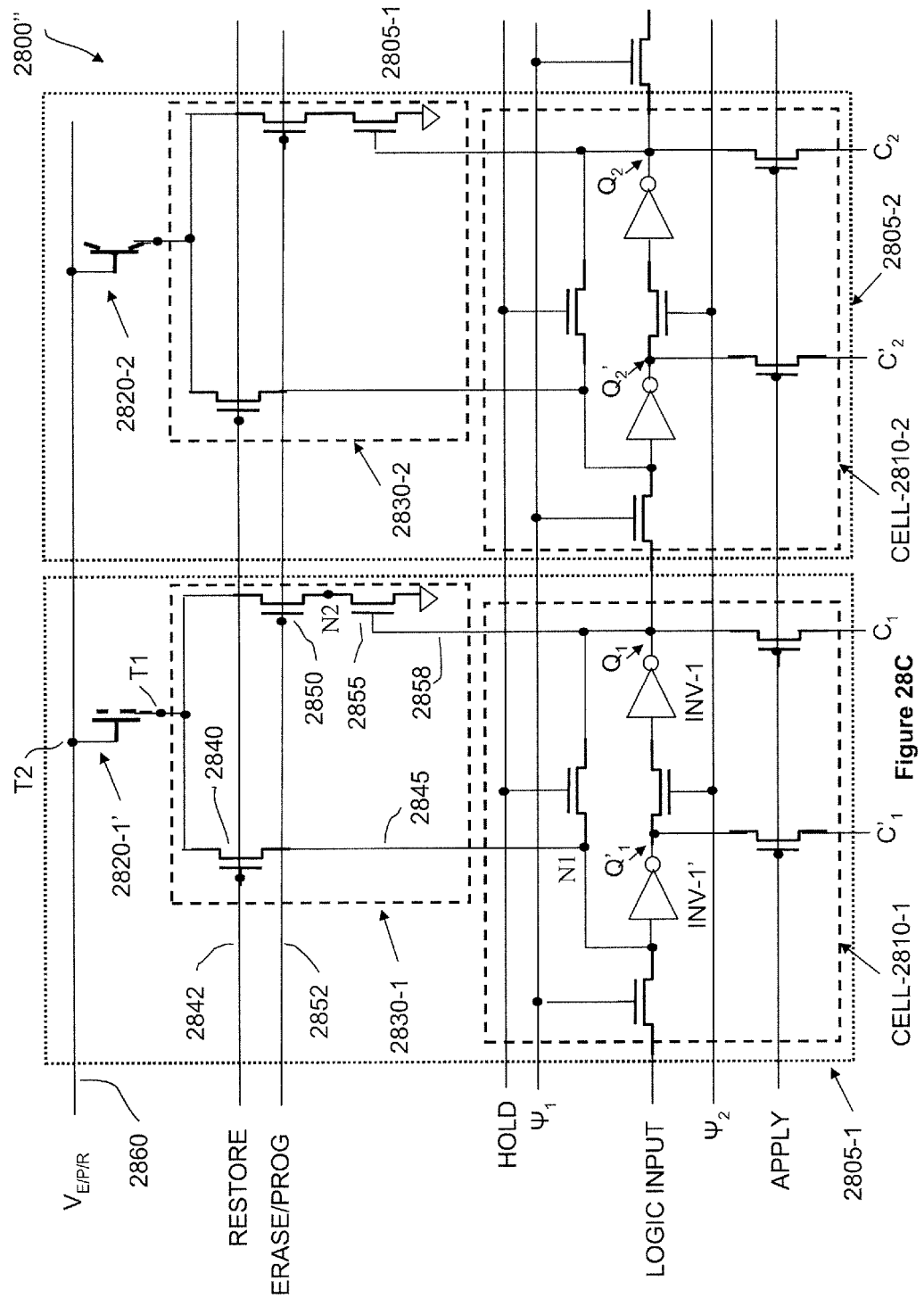
FIG. 28C shows the nonvolatile nanotube configuration control register of FIG. 28A with one nonvolatile nanotube switch is in a high resistance (OFF) state and another nonvolatile nanotube switch is in a low resistance (ON) state.

FIGS. 28A-28C illustrate an embodiment of a two stage nonvolatile nanotube configuration control register (NCCR) 2800 formed using nonvolatile nanotube shift register (NS/R) stages 2805-1 and 2805-2. NS/R stage 2805-1 includes CELL-2810-1 which corresponds to CELL-2710-1 in FIG. 27 with NV NT switch (or NV NT block) 2820-1 coupled to CELL-2810-1 by coupling circuit 2830-1. Optional complementary outputs C1' and C2' are included since the outputs of inverters INV-1 and INV-1' are complementary. However, complementary outputs may instead be generated from a single output such as C1 by adding an inverter to the output C1 as illustrated in FIG. 22A for example. NS/R stage 2805-2, with input driven by the output of NS/R stage 2805-1, includes CELL-2810-2 which corresponds to CELL-2710-2 in FIG. 27 with NV NT switch (or NV NT block) 2820-2 coupled to CELL-2810-2 by coupling circuit 2830-2. NS\R stages 2805-1 and 2805-2 are identical so the NS\R stage 2805-1 description applied to NS\R stage 2805-2 as well or to any additional stages (not shown) that may be added. NV NT switch 2820-1 operation corresponds to the operation of NV NT switch 1110 illustrated in FIG. 11A or NV NT switch NT00 illustrated in FIG. 19.

The CELL-2810-1 schematic and operation correspond to CELL-2710-1 schematic and operation described further above with respect to FIG. 27. Restore FET 28400N and OFF states are controlled by a restore voltage (pulse) applied to the gate of restore FET 2840 by wire 2842 which also controls other restore FET devices. A first terminal of restore FET 2840 is connected to node N1 of CELL-2810-1 by wire 2845. Restore FET 2840 is activated (turned ON) during a recall (restore operation) and is used to transfer the stored high or low resistance state corresponding to a bit (logic) state to CELL-2810-1. A second terminal of restore FET 2840 is connected to terminal T1 of NV NT switch 2820-1. Terminal T2 of NV NT switch 2820-1 is connected to common wire 2860 which supplies erase, program, or read pulses VE/P/R to NV NT switch 2820-1 and other NV NT switches. Erase/program FET 2850 ON and OFF states are controlled by an erase/program voltage (pulse) applied to the gate of erase/program FET 2850 by wire 2852 which also controls other erase/program FET devices. Erase/program FET 2850 has a first terminal connected to NV NT switch terminal T1 and a second terminal to common node N2 which is also connected to a first terminal of FET 2855. A second terminal of FET 2855 is connected to a reference voltage such as ground. The gate of FET 2855 is connected to output Q1 of CELL-2810-1 by wire 2858. If Q1 is at a high voltage such as 2.5 volts for example, then FET 2855 is ON and node N2 is at ground. However, if Q1 is a low voltage such as ground (zero volts) then FET 2855 is OFF and there is no continuous path between node N2 and ground. The ON or OFF state of FET 2855 determines whether NV NT switch 2820-1 is programmed to a high or low resistance state which is then stored in a nonvolatile mode.

In operation, NV NT switches such as NV NT switch 2820-1 are in ON or low resistance state as fabricated although some process methods may be used that result in normally OFF states after fabrication as described with respect to U.S. Patent Application No. 61/074,241, filed on Jun. 20, 2008, entitled "NRAM Arrays with Nanotube Blocks, Nanotube Traces, and Nanotube Planes and Methods of Making Same." NV NT switch 2820-1 acts as a shadow nonvolatile storage device which is only activated in a store (save) operation or in a recall (restore) operation. The operation of nonvolatile nanotube configuration control register (NCCR) 2800 is similar to operation of nonvolatile nanotube registers described with respect to U.S. Pat. No. 7,394,687 and U.S. patent application Ser. No. 12/165,007, filed on Jun. 30, 2008, entitled "Non-Volatile Shadow Latch Using a Nanotube Switch," and corresponding NV NT switches described in U.S. patent application Ser. No. 11/280,786, filed on Nov. 15, 2005, entitled "Two-Terminal Nanotube Devices and Systems and Methods of Making," U.S. patent application Ser. No. 11/274,967, filed on Nov. 15, 2005, entitled "Memory Arrays Using Nanotube Articles with Reprogrammable Resistance" U.S. patent application Ser. No. 11/835,583, filed on Aug. 8, 2007, entitled "Latch Circuits and Operation Circuits Having Scalable Nonvolatile Nanotube Switches as Electronic Fuse Replacement Elements," U.S. patent application Ser. No. 11/835,612, filed on Aug. 8, 2007, entitled "Nonvolatile Resistive Memories Having Scalable Two-Terminal Nanotube Switches," U.S. patent application Ser. Nos. 11/835,651, 11/835,759, 11/835,845, 11/835,852, 11/835,856, 11/835,865, each filed on Aug. 8, 2007, entitled "Nonvolatile Nanotube Diodes and Nonvolatile Nanotube Blocks and Systems Using Same and Methods of Making Same",and U.S. patent application Ser. No. 11/835,613, filed on Aug. 8, 2007, entitled "Memory Elements and Cross Point Switches and Arrays of Same Using Nonvolatile Nanotube Blocks," as well as the operation of switch 1110 in FIG. 11A, switches 1155 and 1160 illustrated in FIG. 11B and switch NT00 illustrated in FIG. 19 for example.

Various operating modes may be used. In this example, NV NT switches such as NV NT switch 2820-1 are assumed to be ON as fabricated. So first, an erase operation is performed on NV NT switches such as NV NT switch 2820-1 resulting in a transition from an ON low resistance state such as 100 k Ohms for example to an OFF high resistance state of 1 G Ohm or higher. In an erase operation, the HOLD voltage is set to a low voltage such as ground and $\Psi 1$ and $\Psi 2$ voltages are set to a high voltage such as 2.5 volts for example. With LOGIC INPUT held at a high voltage such as 2.5 volts Q1 is held at 2.5 volts and turns erase/program FET 2855 ON. ERASE/PROGRAM voltage is set to a high voltage such as 2.5 volts for example and erase/program FET 2850 is turned ON establishing a conductive path between NV NT switch terminal T1 and ground. RESTORE voltage is held at a low voltage such as ground so that restore FET 2840 is OFF. Then, VE/P/R provides erase pulses to node T2 of NV NT switch 2820-1. One or more pulses with voltages in the 5 to 7 volt range and rise times in the nanosecond range may be used for example. NV NT switch 2820-1 transitions from an ON state to an OFF state (low to high resistance state). Corresponding NV NT switch 2820-2 also transitions to an OFF state as illustrated by nonvolatile nanotube configuration control register (NCCR) 2800' in FIG. 28B.

Alternatively, another FET (not shown) may have a first terminal connected to node N2, a second terminal connected to a voltage source which may be pulsed or may be at ground, and a gate controlled by a second erase/program line. In this way, an erase operation for example, may be performed independently of CELL-2810-1. Various coupling circuit examples are described in U.S. Pat. No. 7,394,687 and U.S. patent application Ser. No. 12/165,007, filed on Jun. 30, 2008, entitled "Non-Volatile Shadow Latch Using a Nanotube Switch."

NCCR 2800' is the same circuit as NCCR 2800 except that NV NT switches 2820-1 and 2820-2 are in OFF or high resistance states. CELL-2810-1 and CELL-2810-2 and other stages (not shown) may operate in a volatile mode whenever coupling circuits 2830-1 and 2830-2 decouple corresponding NV NT switches 2820-1 and 2820-2 from CELL-2810-1 and CELL-2810-2, respectively, regardless of the low or high resistance states of NV NT switches. Coupling circuit 2830-1, which is the same as coupling circuit 2830-2, maintains an OFF state by keeping restore FET 2840 and erase/program FET 2850 each in an OFF state with low RESTORE and ERASE/PROGRAM voltages, respectively. Nonvolatile nanotube configuration control registers are operated in a volatile mode with high voltages such as 2.5 volts supplied to inverters INV-1 and INV-1' for example.

In a store (save) operation, NV NT switches are programmed from a high resistance state to a low resistance state or left in a high resistance state. With restore FET 2840 in an OFF state, erase/program FET 2850 is turned ON. If FET 2855 is an ON state because Q1 is at a high voltage such 2.5 volts, then a continuous path exists between NV NT switch 2820-1 terminal T1 and ground. If one or more programming pulses VE/P/R of 3-5 volts and microsecond rise times are applied to terminal T2 of NV NT switch 2820-1, then NV NT switch 2820-1 transitions from a high resistance state such as 1 G Ohm to a low resistance state such as 100 k Ohms for example. However, if FET 2855 is OFF because Q1 is at a low voltage such as ground, then there is no path between NV NT 2820-1 terminal T1 and ground and NV NT switch 2820-1 remains in a high resistance state. After the state of NV NT switch 2820-1 and other NV NT switches such as NV NT switch 2820-1 have been programmed, then power may be removed and the logic state of CELL-2810-1 and CELL-2810-2 are preserved in a nonvolatile mode as corresponding high or low resistance states. In this example, nonvolatile nanotube configuration control register 2800'' shows NV NT switch 2820-1 in a high resistance state and NV NT switch 2820-2 programmed to a low resistance state as illustrated in FIG. 28C. Note that NCCR 2800, NCCR 2800', and NCCR 2800'' all correspond to the same circuit with NV NT switches in various combinations of low (ON) and high (OFF) resistance states.

In a recall (restore) operation, erase/program FET 2850 is held in OFF state. A voltage is applied to CELL-2810-1 (typically, a voltage source is ramped to 2.5 volts for example). With HOLD, $\Psi 1$ and $\Psi 2$ at high voltages such as 2.5 volts and a LOGIC INPUT of zero volts, node N1 is held at ground by output Q1 of INV-1. Then $\Psi 1$ voltage transitions to a low voltage state and decouples all individual register stages such as CELL-2810-1 from one another and voltage. With VE/P/R having transitioned to a recall (restore) voltage value applied to wire 2860 and to node T2, restore FET 2840 is turned ON and a conductive path is established between NV NT switch 2820-1 terminal T1 and CELL 2810-1 node N1. If NV NT switch 2820-1 is in a low resistance (ON) state, then node N1 is forced to a high voltage state such as 2.5 volts as does the output Q1 of INV-1. However, if NV NT switch 2820-1 is in a high resistance (OFF) state, then N1 remains at a low voltage. Restore FET 2840 is turned OFF and the recall (restore) operation is finished. U.S. Pat. No. 7,394,687 and U.S. patent application Ser. No. 12/165,007, filed on Jun. 30, 2008, entitled "Non-Volatile Shadow Latch Using a Nanotube Switch" provides various store (save) and recall (restore) examples.

NCLB Function and Operation Using Nonvolatile Nanotube Configuration Control Registers (NCCRs)

Nonvolatile nanotube configuration control registers (NC-CBs) may be used to generate nonvolatile configuration control bits (logic states) for NCLB functions. For example, a NCCB may be used instead of nonvolatile nanotube select circuits illustrated by NCLB 1400 shown in FIG. 14A. Also, a NCCB may used instead of NRAM™-based nonvolatile configuration control bits (logic states) illustrated by NCLB 2300 shown in FIG. 23.

Figure 29:
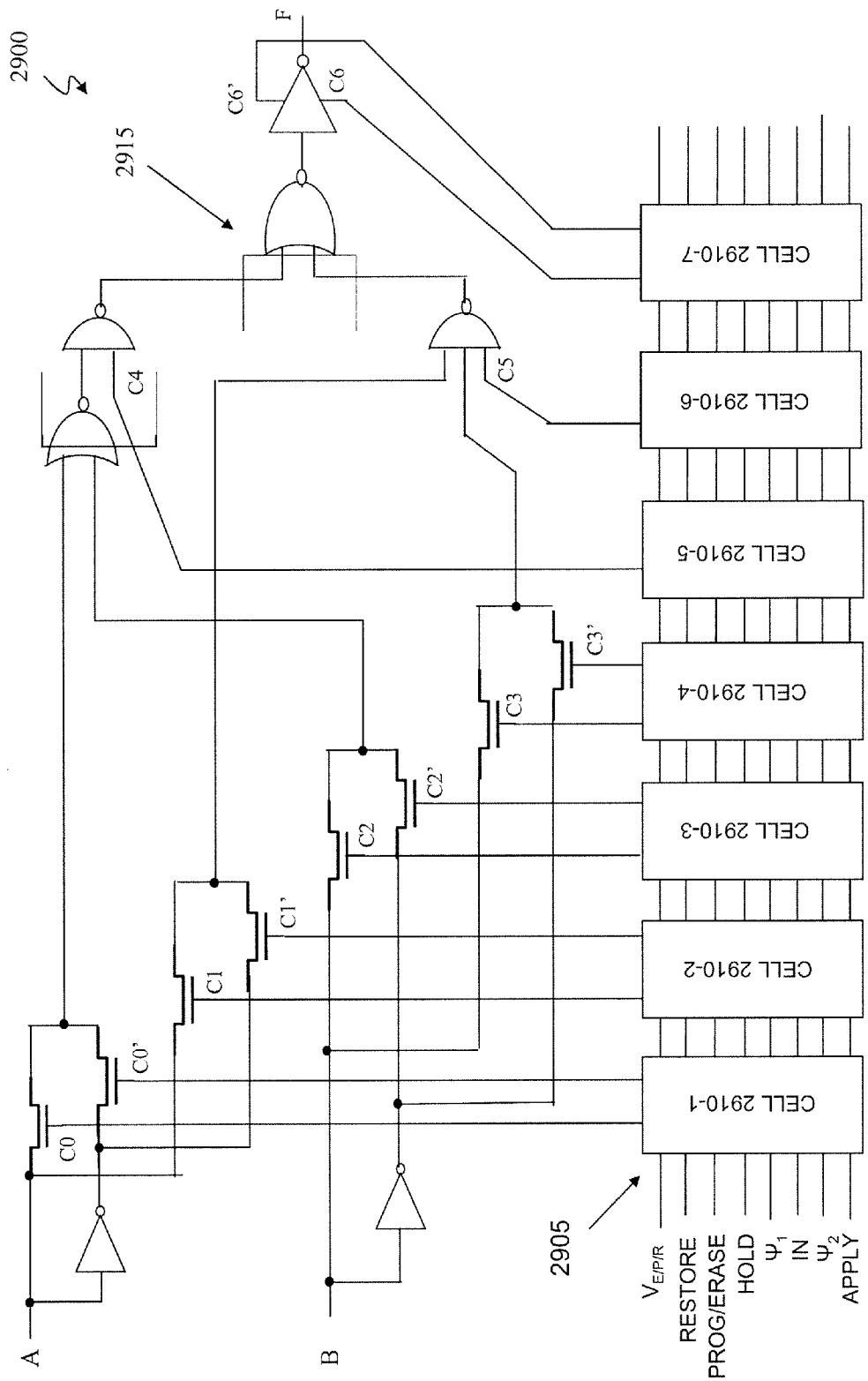
FIG. 29 shows a nonvolatile nanotube configurable logic block (NCLB) formed using transfer gates, NAND, NOR, and tristate circuits whose logic function is determined by nonvolatile true and complement configuration control bits provided by the nonvolatile nanotube configuration control register shown in FIG. 28.

FIG. 29 illustrates an embodiment NCLB 2900 with nonvolatile nanotube configuration control register (NCCB) 2905 generating nonvolatile configuration control bits (logic states) C0, C0', ..., C6 and C6'). NCLB 2900 uses seven NS/R stages CELL 2910-1, CELL 2910-2, ..., CELL 2910-7 to provide the required configuration control bits. The operation of NCCR 2900 corresponds to the operation described with respect to NCCR 2800, 2800', and 2800" in FIGS. 28A-28C. Reconfigurable logic 2915 is the same as shown in FIGS. 14 and 23 and described in detail further above with respect to these figures. FIG. 14B shows logic configurations corresponding to various configuration control bit combinations; and FIG. 15 illustrates equivalent circuits as described further above.

NPSM Function and Operation Using Nonvolatile Nanotube Configuration Control Registers (NCCRs)

Nonvolatile nanotube configuration control registers (NC-CBs) may be used to generate nonvolatile configuration control bits (logic states) for NPSM functions. For example, a NCCB may be used instead of nonvolatile nanotube select circuits illustrated by NPSM 1600 shown in FIG. 16. Also, a NCCB may used instead of NRAM™-based nonvolatile configuration control bits (logic states) illustrated by NPSM 2400 shown in FIG. 24.

Figure 30:
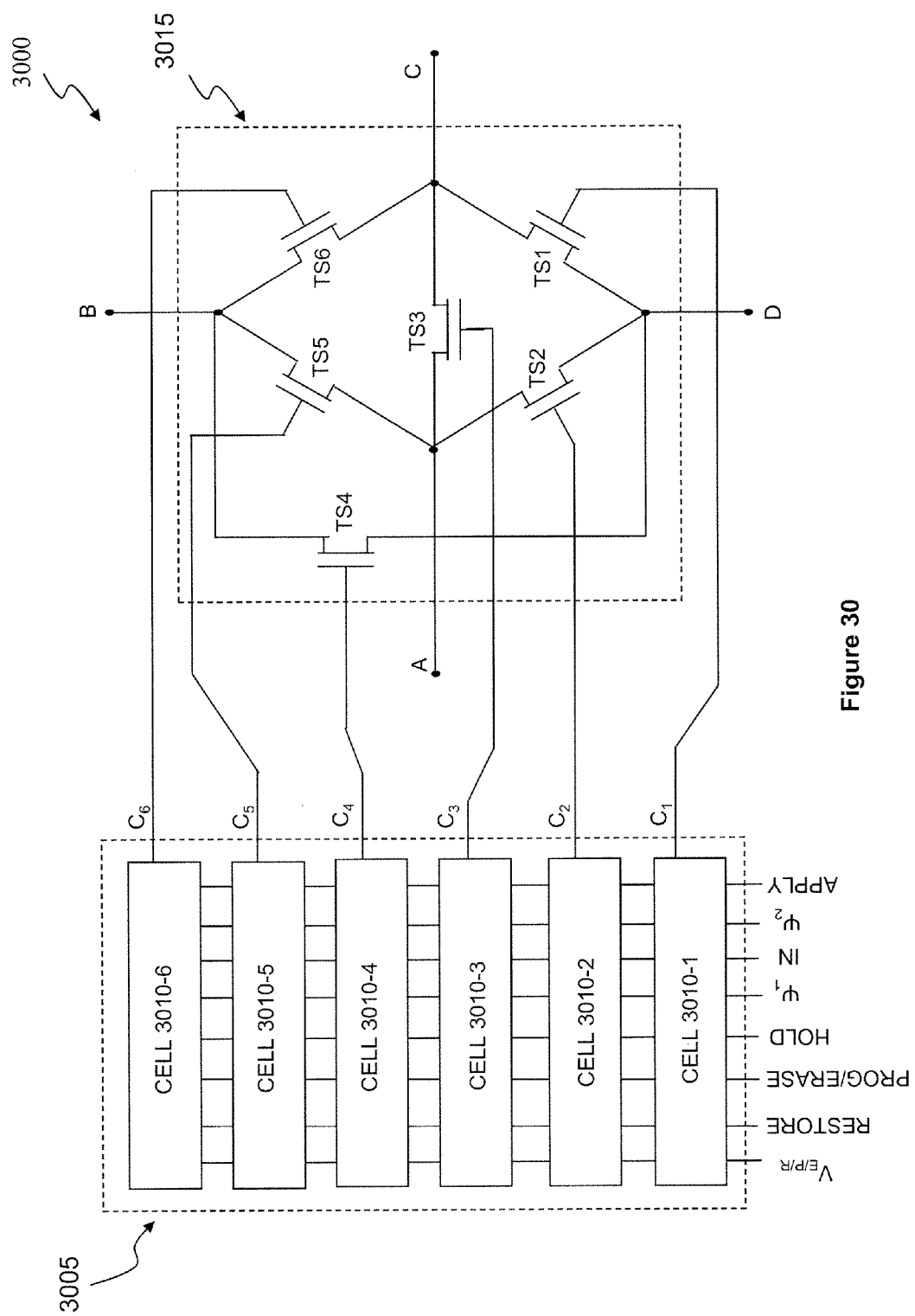
FIG. 30 shows a nonvolatile nanotube programmable switch matrix with various signal routing configurations controlled by nonvolatile true and complement control bits provided by the nonvolatile nanotube configuration control register shown in FIG. 28.

FIG. 30 illustrates an embodiment NPSM 3000 with nonvolatile nanotube configuration control register (NCCB) 3005 generating nonvolatile configuration control bits (logic states) C1, C2, ..., C6). NPSM 3000 uses six NS/R stages CELL 3010-1, CELL 3010-2, ..., CELL 3910-6 to provide the required configuration control bits. The operation of NCCR 3000 corresponds to the operation described with respect to NCCR 2800, 2800', and 2800" in FIGS. 28A-28C. Programmable switch matrix 3015 is the same as shown in FIGS. 16 and 24 and described in detail further above with respect to these Figures.

NFPGA circuit density and performance can be further enhanced by using programmable wiring over the logic gate (cell) regions. Interconnect wires and three-dimensional NV NT block switches may be placed over logic gate (cell) arrays as illustrated further below with respect to FIGS. 31-34. Also, enhanced nanotube-based programmable/reprogrammable implementations of SPLD functions such as PALs illustrated in prior art FIG. 3, PLAs illustrated in prior art FIG. 2, and CPLD function illustrated in prior art FIG. 4 may be designed to form NPALs, NPLAs, and NCPLDs of enhanced functionality as described further below with respect to FIGS. 35-37. A nanotube-based combined function programmable logic array which may operate as an NPLA or as an NRAM® depending on the need for more logic or more memory function is described in FIG. 38. Shared array bits enable an NRAM® operation to update the shared nonvolatile array that uses NRAM®-type cells prior to subsequent NPLA logic operations.

High performance systems require precision timing functions to control the performance and power dissipation of various processors and other circuits. Also, data between processors and subsystem functions, such as a fast cache for example, require precision timing for accurate data capture. Nanotube-based self-adjusting (calibrating) precision timing circuits are described further below with respect to FIGS. 39-48. These timing circuits use programmable/reprogrammable variable resistor-capacitor networks formed with series/parallel combinations of NV NT switches in series and capacitors in parallel and other methods described further below for example. Precision timing functions based on nanotube-based circuits may be positioned between a processor and a subsystem at the processor end or at the subsystem end as described further below with respect to FIG. 39-48. Such nanotube-based self-adjusting (calibrating) timing circuits enable dense system integration by managing and optimizing performance, power dissipation, and timing.

NV NT switches may be switches with capacitive loads as described further below with respect to FIG. 49 or may be switched by discharging a capacitive source as described further below with respect to FIG. 50. NV NT switches may be fabricated with a gate capacitively coupled to the NV NT switch nanotube fabric region thereby forming a three terminal gated NV NT switch. Such gated NV NT switches enable a capacitively coupled SET function option in addition to NV NT switch SET functions where current flows between the NV NT switch contacts through nanotube fabric. In a capacitively coupled SET (CC SET) operating mode, the NV NT switch nanotube fabric switches from a nonvolatile high resistance RESET state to a nonvolatile low resistance SET state using capacitively coupled SET voltage pulses with no current flowing between the terminals of the NV NT switch and through the nanotube fabric as described further below with respect to FIGS. 51-55. The capacitively coupled gate cannot change the state of a three-terminal NV NT switch in a SET state. Therefore, a RESET operation requires current flowing through the nanotube fabric. Gated NV NT switches may be used to reduce power dissipation during SET operations. Examples of gated NV NT switches used in NRAM®s, NanoLogic®, and precision timing circuits are described further below with respect to FIGS. 56-58.

Carbon nanotube FETs (CNFETs) may be fabricated on insulators, for example, and therefore may be fabricated without semiconductor substrates. These CNFET-based memory, logic, and analog circuits may be placed anywhere in a vertically integrated structure. For example, they may be embedded-in or located close to wiring and contact levels enabling three dimensional layouts of greater density and performance with lower power dissipation. CNFET devices include, n-type devices referred to as nCNFET devices and p-type devices referred to as pCNFET devices. They may also include ambipolar FET devices as well. CNFET devices are described further below with respect to FIGS. 59, 60, 68, and 69. These devices illustrated further below vary from relatively simple CNFET devices to more complex CNFET devices with self-aligned gates for high speed performance.

NRAM® arrays may formed of interconnected CNFET select devices and NV NT switches in series and may be integrated at any vertical location (level) in an integrated structure. NRAM® array support circuits may also formed on the same level so the entire NRAM® memory may be formed at any level of an integrated structure. Such NRAM® memories may be stacked for higher densities and placed in proximity to processors to maximize performance and minimize power dissipation as described further below with respect to FIGS. 61-63. CNFET devices may be further optimized to operate as nonvolatile carbon nanotube FET (NV-CNFET) devices. A NV-CNFET device is a three-terminal CNFET device that operates as a CNFET device and also as NV NT switches; in other words both functions are integrated in one device for greater density. Examples of these devices and applications in NRAM® and NanoLogic® circuits are described with respect to FIGS. 64-64.

Optimized high performance CNFET-based digital and analog circuits may be positioned at any level in the integrated circuit. Integrated complementary carbon nanotube circuits (CCN-circuits), such as a CCN-inverter and a CCN-NAND circuits are described further below with respect to FIGS. 70 and 71. An integrated CNFET differential amplifier analog circuit is described further below with respect to FIG. 72.

In addition to individual carbon nanotube analog circuits, a nanotube-based field programmable analog array (NFPAA) using CNFET differential amplifiers and other components with programmable interconnects is described further below with respect to FIG. 73.

At this point, many and varied NRAM® memories, NanoLogic® circuits including NFPGA, NSPLD, and NCPLD, as well as processors, controllers and other functions designed with CNFETs and NV NT switches may be integrated in a three-dimensional system using various combinations of these functions as described further below with respect to FIG. 74. Self-timed circuits enable the optimization of function, performance, and power dissipation. The function of this three-dimensional system may be modified remotely in an application, even in space for example, because of the NRAM® memory and NanoLogic® circuit functions such as NFPGAs.

Densification of Nanotube Nonvolatile NFPGA Logic

Figure 9:
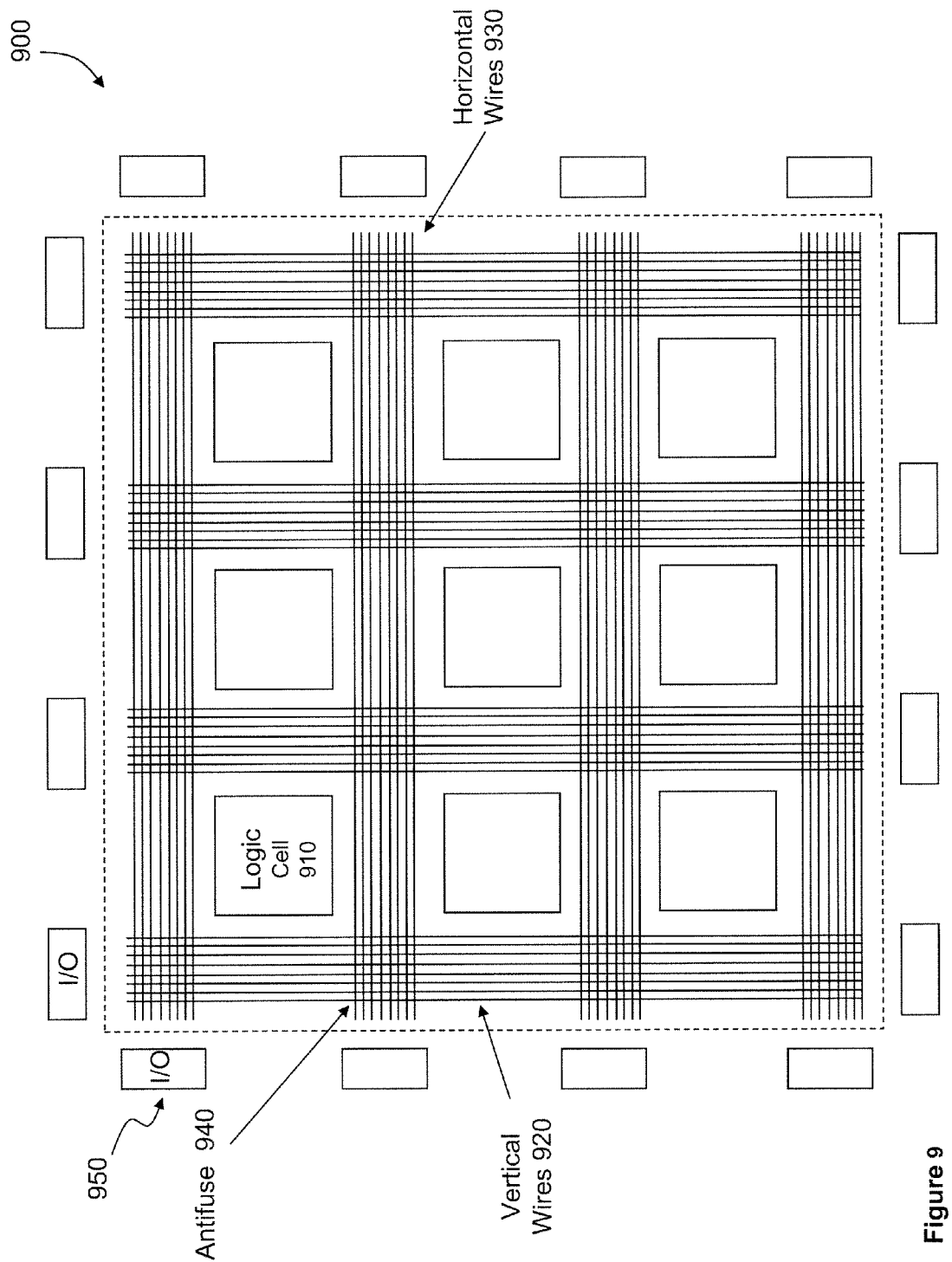
FIG. 9 is a block diagram of a field programmable gate array (FPGA) including antifuse-based programmable wiring.

NFPGA with Programmable/Reprogrammable Logic Functions Using Dense Programmable/Re-Programmable Wiring Over Logic Gates (Cells) and Nonvolatile Nanotube Cross Point Switches The density of NFPGA circuits using layouts with horizontal and vertical wires adjacent to logic gate cells similar to vertical wires 920 and horizontal wires 930 shown further above in FIG. 9, with one-time programmable antifuses 940 replaced with programmable/reprogrammable NV NT block switches, may be increased by placing horizontal and vertical wires and programmable/reprogrammable NV NT block switches above logic gates (cells) as described further below.

Logic Gates (Cells)

Figure 31:
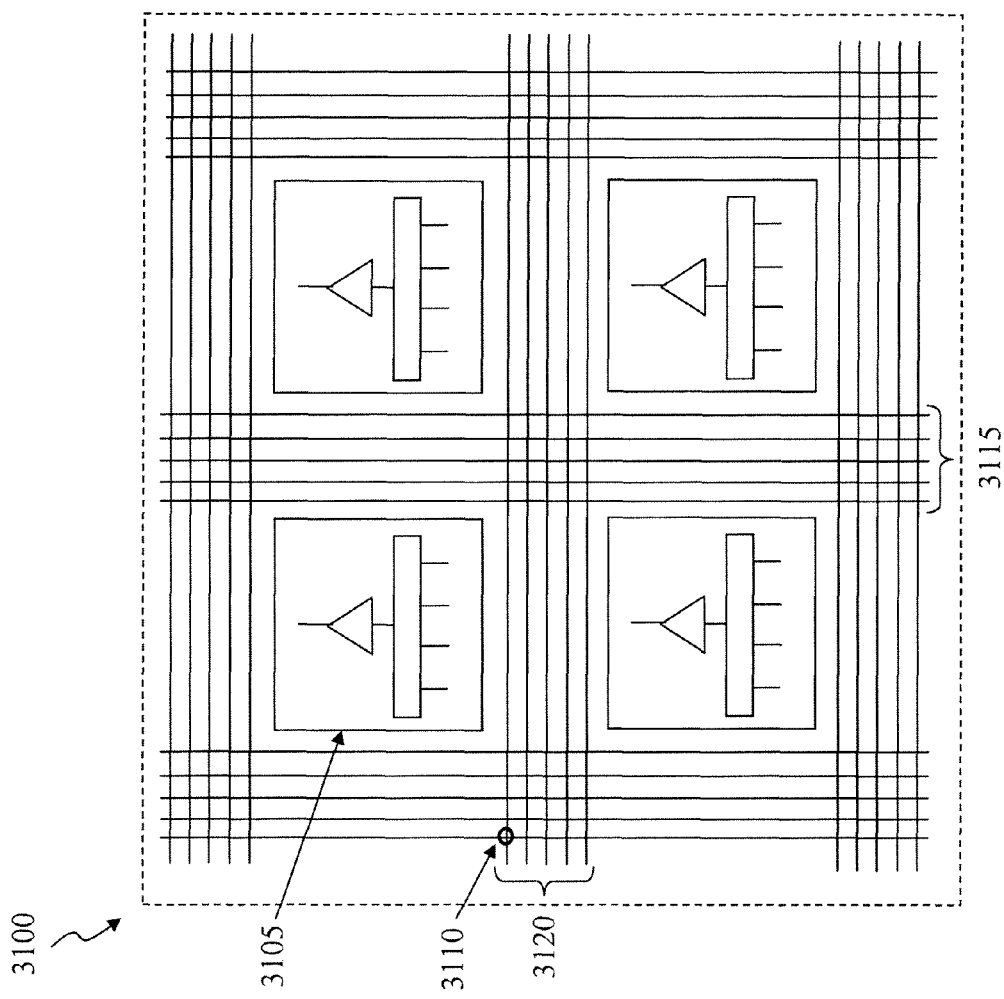
FIG. 31 is a plan view of an NFPGA with programmable wiring.

FIG. 31 illustrates a plan view of the NFPGA 3100 which is a combination of FIG. 9 and NV NT block switches illustrated in FIGS. 10D and 10E and described further above. Logic gates (cells) 3105 are interconnected by a combination of horizontal lines 3120 and vertical lines 3115 which may be interconnected in overlap regions by using nonvolatile cross point electrical switches such as NV NT block 3110 which may be electrically programmed (or erased) multiple times. NV NT block 3110 corresponds to NV NT block 1020 illustrated in FIG. 10D and any one of NV NT block 1030-1, 1030-2, 1030-3, and 1030-4 switches as illustrated in FIG. 10E. NV NT block switches may be switched between low and high resistance states and to form and unform connections multiple times as described further above.

Figure 32:
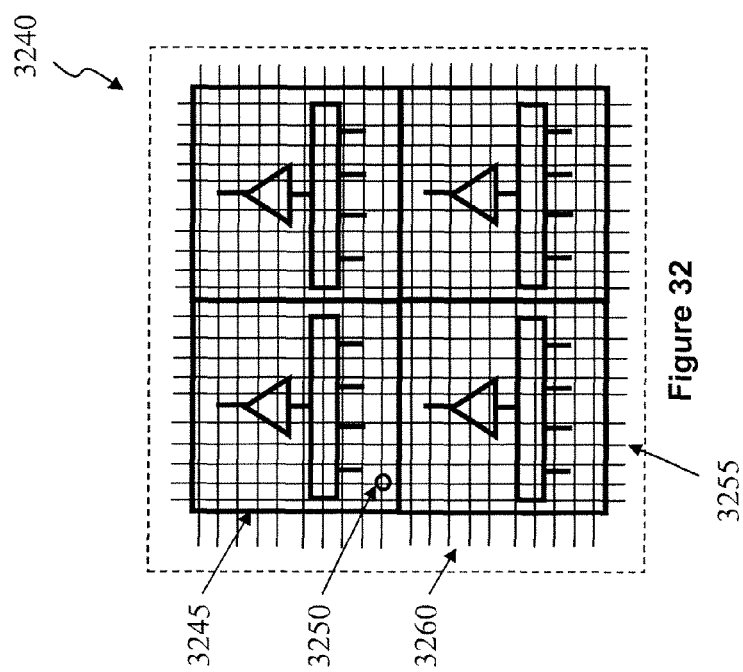
FIG. 32 is a plan view of an NFPGA with denser programmable wiring.

Gate arrays in which logic gates (cells) are permanently interconnected by dense wiring over logic gates (cells) typically achieve greater density than FPGA-type programmable logic function. There is a tradeoff between programming to rapidly form a logic function for an application and denser permanent wiring with long turnaround times but greater density. FIG. 32 illustrates NFPGA 3240 in which programmable wiring is used over logic gate (cells) to substantially increase the amount of logic per unit area relative to that of FIG. 31 while maintaining programmability, that is, the ability to rewire the logic. Logic cells (gates) 3245 are interconnected by a combination of horizontal lines 3260 and vertical lines 3255 which may be interconnected in overlap regions by using electrical switches such as NV NT block 3250 which may be electrically programmed (or erased) multiple times. Programmable interconnections are described further below with respect to FIGS. 32-34.

Figures 33A, 33B:
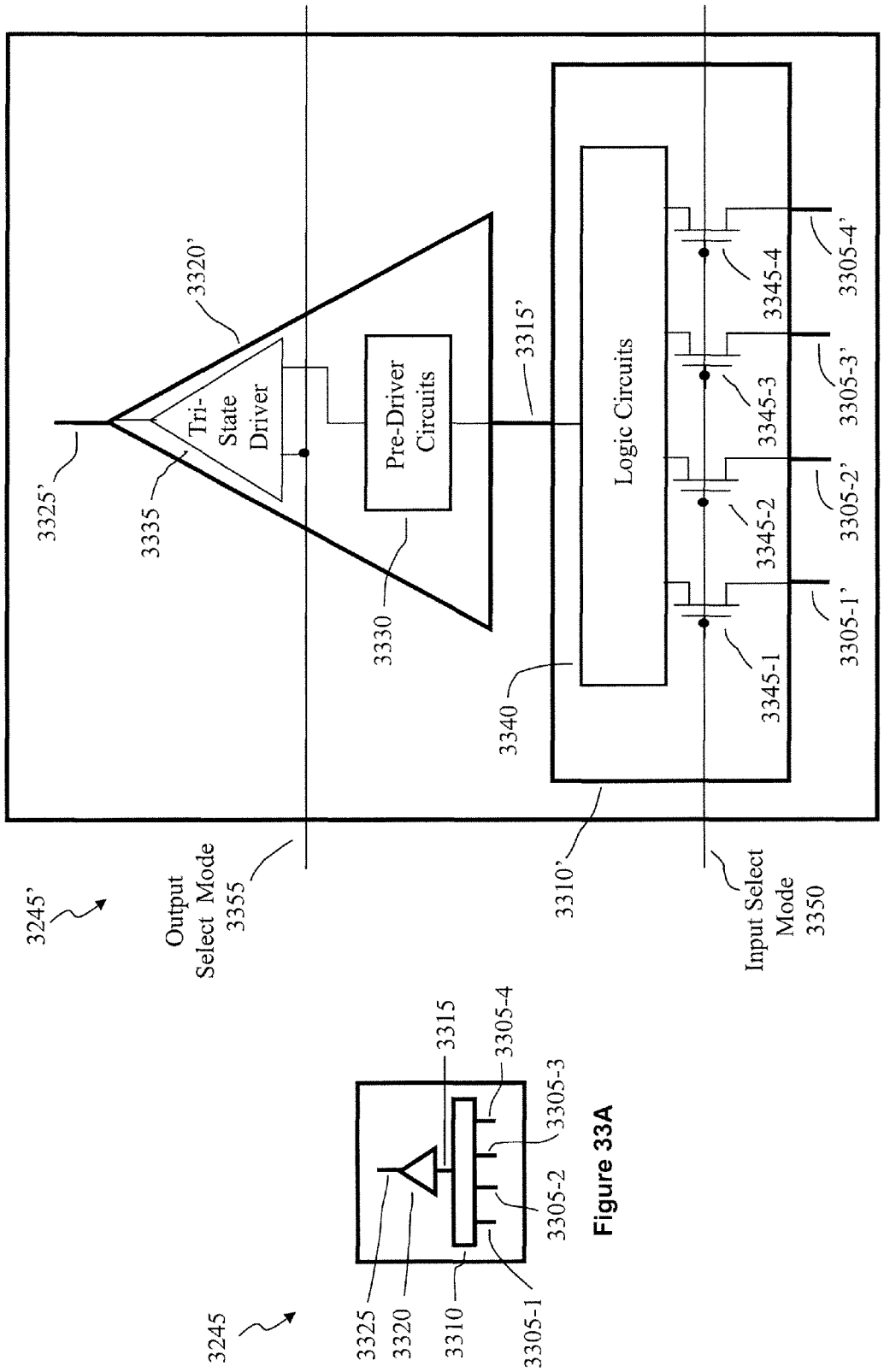
FIG. 33A shows a schematic view of a logic gate (cell)
FIG. 33B shows a schematic view of another logic gate (cell)

FIG. 33A illustrates logic gate (cell) 3245 which includes inputs 3305-1, 3305-2, 3305-3, and 3305-4 to logic function 3310 whose output line 3315 drives the input of output driver 3320 with output 3325. Logic function 3310 may be formed using well known NAND, NOR, NOT, Registers, etc. logic circuits. Logic function 3310 may also include programmable circuits as described further above with respect to FIGS. 12A-12D and FIGS. 14A, 14B, and 15 for example. In the example illustrated in FIG. 33A, there are four inputs; however, there may be more or less inputs.

Inputs 3305-1, 3305-2, 3305-3, and 3305-4 and output 3325 may be exposed to voltages larger than circuit operating voltage while programming, erasing, and reprogramming, etc. NV NT block 3250 switches to low, high, and low, etc. resistance states, respectively, by applying switching voltages to horizontal lines 3260 and vertical lines 3255. The power supply voltage to logic gates (cells) 3245 may be turned OFF during switching (programming or erase) operations.

FIG. 33B illustrates modified logic gate (cell) 3245' in which inputs and outputs are decoupled from input and output circuits, respectively. Inputs 3305-1', 3305-2', 3305-3', and 3305-4' correspond to inputs 3305-1, 3305-2, 3305-3, and 3305-4 shown in FIG. 33A, respectively, and output 3325' corresponds to output 3325 shown in FIG. 33A, respectively. Logic function 3310 shown in FIG. 33A is modified as shown in FIG. 33B by logic function 3310' such that logic circuits 3340 may be isolated from the inputs. For example, input 3305-1' is coupled to logic circuits 3340 through FET transfer device 3345-1 where the FET ON or OFF state is controlled by a gate voltage provided by input select mode 3350. Similarly, the remaining three inputs in this example are also coupled to logic circuits 3340 as follows. Input 3305-2' is coupled through FET transfer device 3345-2 where the FET ON or OFF state is controlled by a gate voltage provided by input select mode 3350; input 3305-3' is coupled through FET transfer device 3345-3 where the FET ON or OFF state is controlled by a gate voltage provided by input select mode 3350; input 3305-4' is coupled through FET transfer device 3345-4 where the FET ON or OFF state is controlled by a gate voltage provided by input select mode 3350. Note that while NFET-type transfer devices are shown, PFET-type transfer devices, or CMOS transfer devices using both NFET and PFET transfer devices may be used instead.

Output driver 3320 with output 3325 shown in FIG. 33A is modified as illustrated by output driver 3320' with output 3325' shown in FIG. 33B. Output driver 3320' includes pre-driver circuits 3330 whose input is connected to logic circuits 3340 by line 3315' and whose output drives tri-state driver 3335. Tristate driver 3335 has an additional input controlled by output select mode 3355 which can force tri-state driver 3335 into a tri-state mode in which output 3325' is isolated from power supply and ground circuits. Note that input select mode 3350 and output select mode 3355 may be activated at the same time requiring only one common select input.

Logic gate (cell) 3245' is designed such that even with voltage (power) applied to the circuits of various logic gates (cells) 3245' in NFPGA 3240, inputs 3305-1', 3305-2', 3305-3', and 3305-4' and output 3325' may be electrically isolated from the programmable interconnect wiring when the wiring is configured by switching various NV NT block 3250 switches between low and high resistance states. This facilitates the programming/reprogramming of NV NT block 3250 switch interconnections between inputs and outputs of the various logic gates (cells) 3245' in NFPGA 3240 because the application of switching voltages to horizontal lines 3260 and vertical lines 3255 illustrated in FIG. 32 is decoupled electrically from output driver 3320' and logic circuits 3340 in logic function 3310'.

Programmable/Reprogrammable (Rewireable) Logic Interconnect Options

In order to achieve a dense NFPGA 3240 (FIG. 32) sea of gates layout density, three-dimensional nonvolatile switches on-pitch compatible with the minimum pitch of horizontal lines 3260 and vertical lines 3255 are required. Presently, well known one-time-programmable (OTP) antifuses may be used. Such antifuses have the advantage of somewhat difficult to reverse engineer, and are more radiation hard than other presently available options. However, there are significant disadvantages such as programming currents of at least 5 or 10 milli-Amperes, inability to reprogram switches that may lead to less than 100% programming yield and rejection of parts due to programming errors. Some FPGAs with OTP antifuse programming options are available in the industry. Unlike one-time-programmable (OTP) cross point electrical switches that cannot be tested after fabrication, nanotube-based cross point electrical switches such as NV NT block 3110 switch can be tested after fabrication to ensure 100% functionality and can be cycled between ON and OFF states multiple times as part of operability tests prior to shipping from a fabricator. The ON and OFF states of nanotube-based cross point switches may also be changed in system in the field for example.

Nonvolatile nanotube block 3250 switch illustrated schematically in FIG. 32 and in perspective drawings illustrated in FIGS. 10D and 10E further above provide a nanotube-based nonvolatile programmable, erasable, reprogrammable, etc. switch that addresses the disadvantages of OTP antifuses, is as dense, is radiation hard, cannot be reverse engineered, may be programmed using less than 50 uA of current, can be tested after fabrication to 100% yield, and can operate at voltages of no more than 5 volts for typical switches. U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, and U.S. patent application Ser. No. 12/356,447, entitled "Nonvolatile Nanotube Diodes and Nonvolatile Nanotube Blocks and Systems Using Same and Methods of Making Same," filed on Jan. 20, 2009, describe various structural and electrical properties of NV NT block switches the entire contents of which are incorporated herein by reference.

Figure 34A:
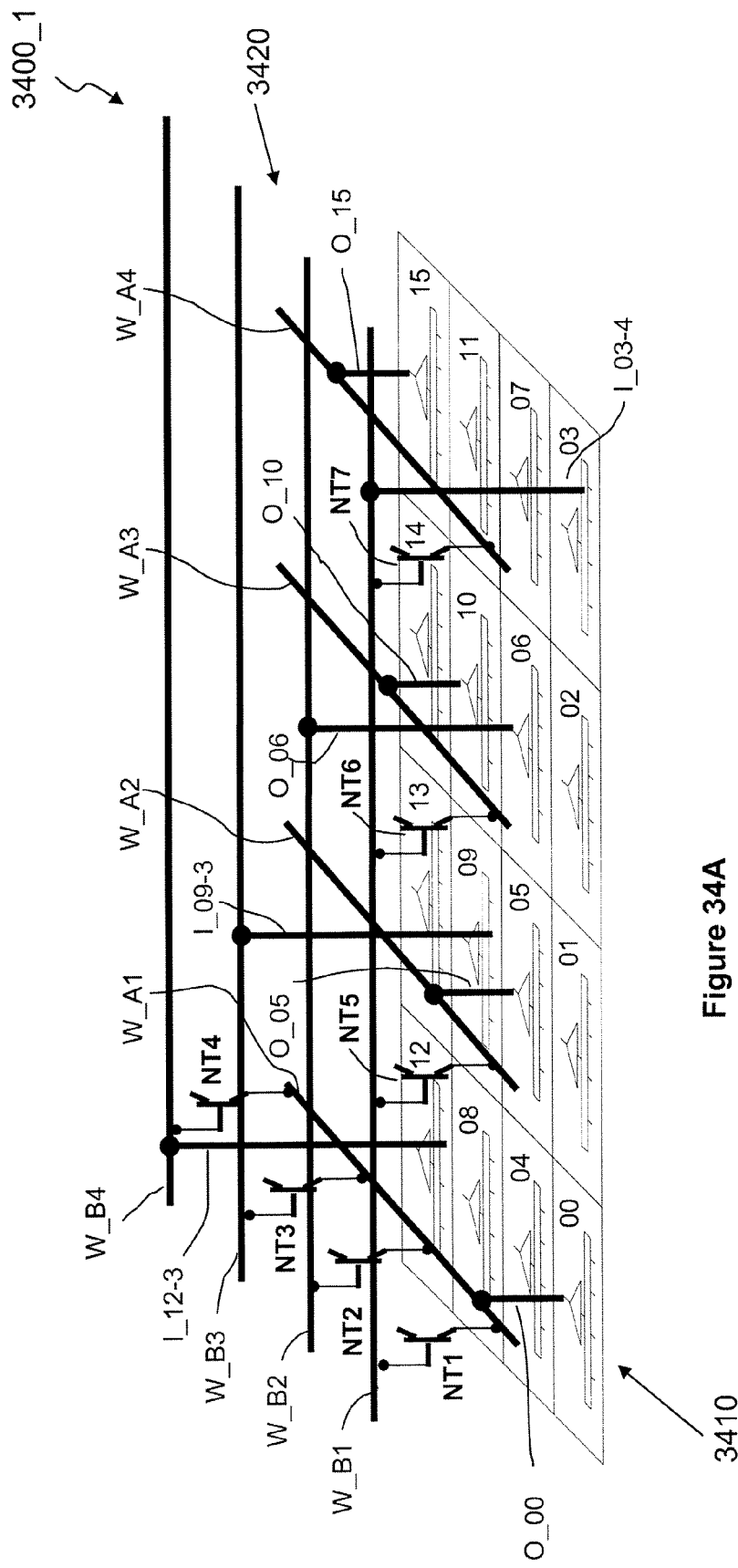
FIG. 34A shows a perspective view of an NFPGA with an array of logic gates (cells) and programmable wiring using NV NT block switches. The NV NT block switches are all in a SET low resistance state.

FIG. 34A illustrates a perspective drawing of NFPGA 3400-1 which shows logic gate (cell) configuration 3410 with sixteen logic gates (cells) 00, 01, 02, 03, 04, 05, 06, 07, 08, 09, 10, 11, 12, 13, 14, and 15 in a 4×4 arrangement. Programmable/reprogrammable (rewireable) interconnect wiring 3420 placed above logic gate (cell) configuration 3410 includes NV NT block switches at selected intersections of horizontal wires and vertical wires. Note that since NV NT block switches fit on wiring pitches, every intersection may include a NV NT block switch between horizontal and vertical wires. Horizontal wires W_B1, W_B2, W_B3, and W_B4 shown in FIG. 34A correspond to horizontal wires 3260 illustrated in FIG. 32 and vertical wires W_A1, W_A2, W_A3, and W_A4 correspond to vertical wires 3255. Interconnect wiring 3420 may be formed by a combination of hard-wired (non-programmable) connections and programmable/reprogrammable (rewireable) interconnections or may all be programmable/reprogrammable interconnections. In the example shown in FIGS. 34A-C only reprogrammable/reprogrammable interconnections are shown. Each horizontal and vertical wire is connected to at least one input or output in the examples shown in FIGS. 34A-34C. However, some wires may cross over the logic gate (cell) configuration 3410 without any contacts to inputs or outputs (not shown in this example).

Figure 34B:
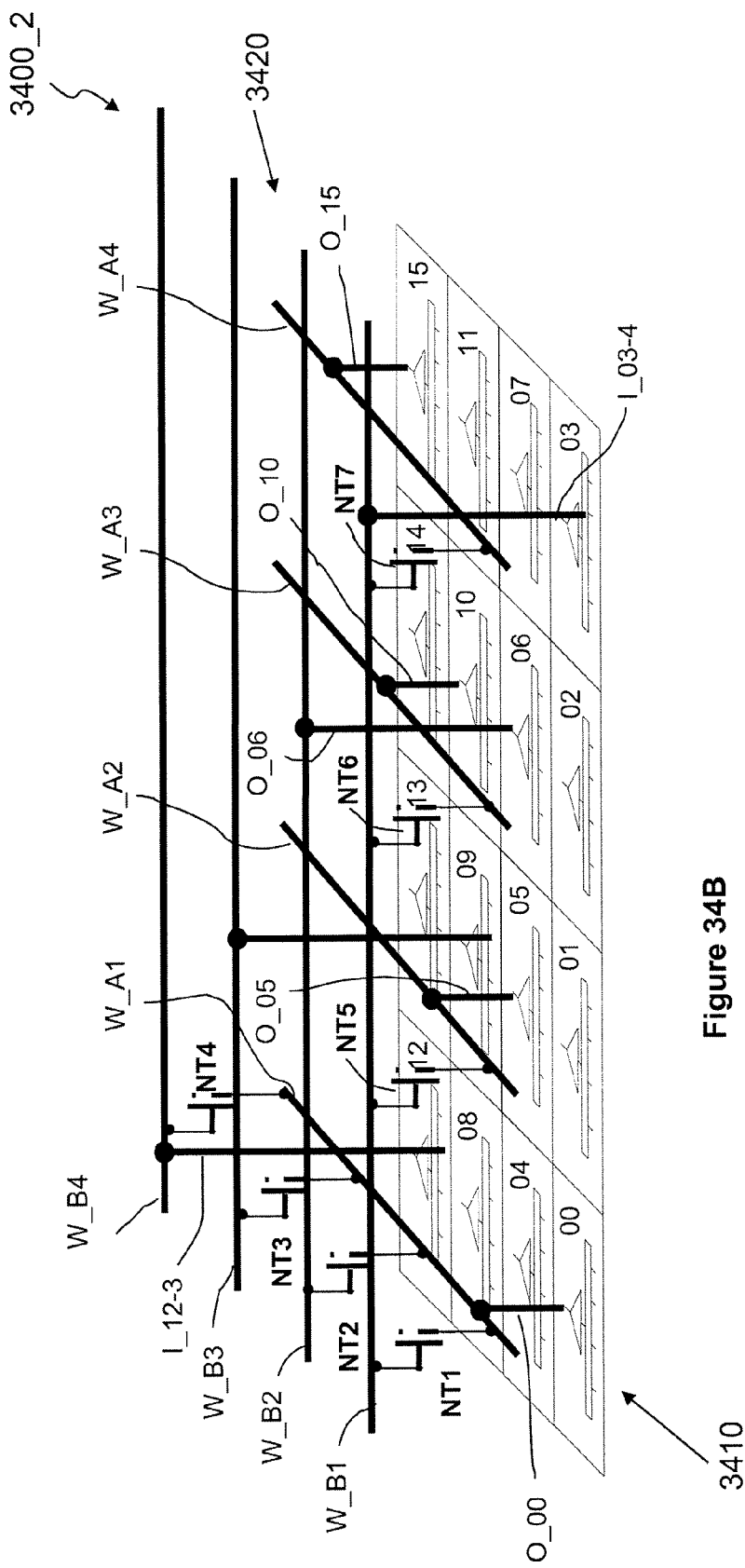
FIG. 34B shows a perspective view of an NFPGA with an array of logic gates (cells) and programmable wiring using NV NT block switches. The NV NT block switches are all in a RESET high resistance state.
Figure 34C:
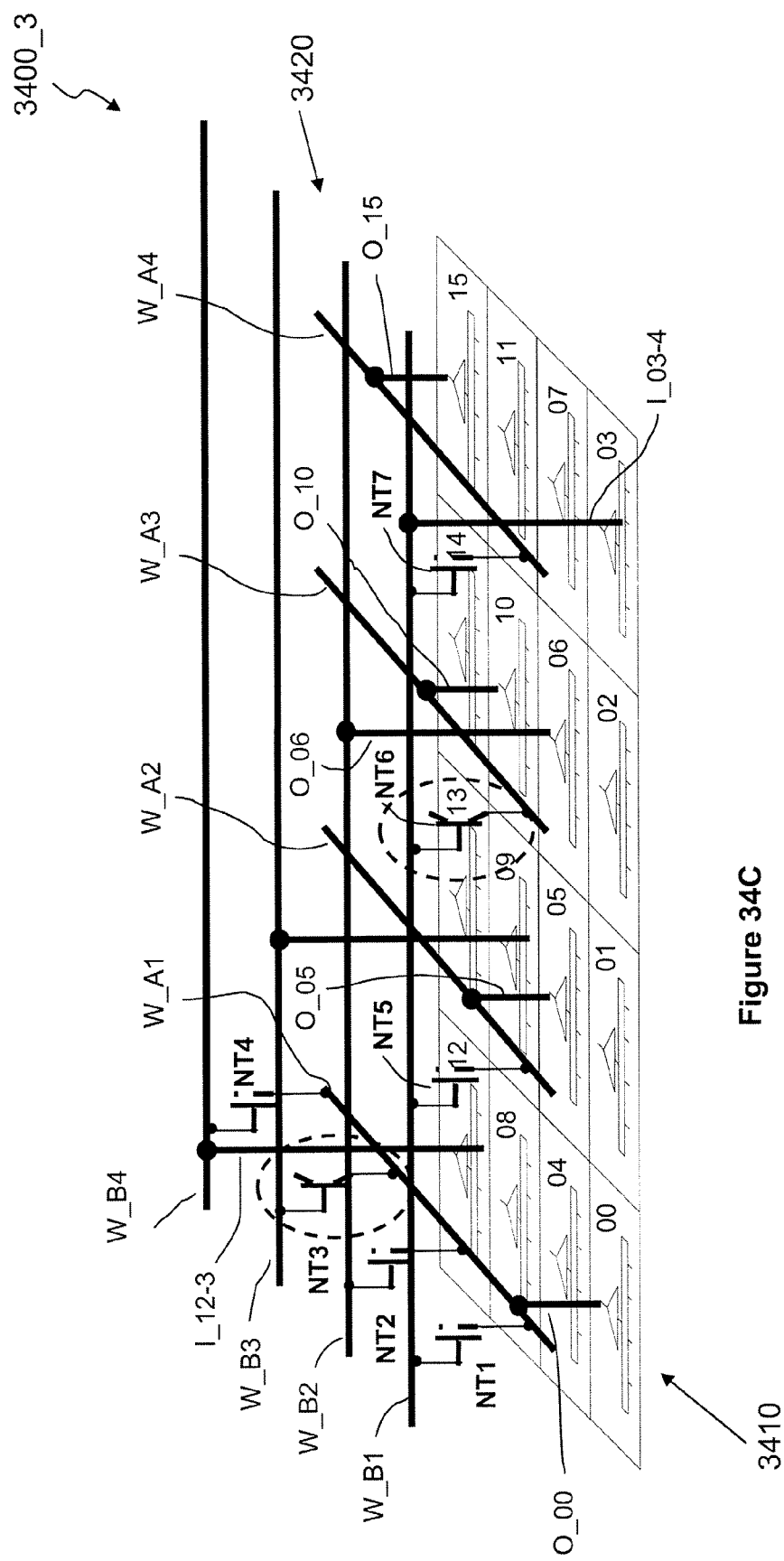
FIG. 34C shows a perspective view of an NFPGA with an array of logic gates (cells) and programmable wiring using NV NT block switches. A logic function is programmed by selected NV NT block switches in a SET low resistance state and all others in a RESET high resistance state.

The various horizontal and vertical wires in programmable/reprogrammable interconnect wiring 3420 illustrated in FIGS. 34A-34C include selected connections to inputs and outputs of underlying gates of logic gate (cell) configuration 3410. For example, horizontal wire W_B1 is wired to an input number 4 (counting left-to-right) of logic gate (cell) 03 by input wire I_03-4; horizontal wire W_B2 is wired to an output of logic gate (cell) 06 by output wire O_06; horizontal wire W_B3 is wired to an input number 3 of logic gate (cell) 09 by input wire I_09-3; and horizontal wire W_B4 is wired to an input number 3 of logic gate (cell) 12 by input wire I_12-3. Vertical wire W_A1 is wired to the output of logic gate (cell) 00 by output wire O_00; vertical wire W_A2 is wired to the output of logic gate (cell) 05 by output wire O_05; vertical wire W_A3 is wired to the output of logic gate (cell) 10 by output wire O_10; and vertical wire W_A4 is wired to the output of logic gate (cell) 15 by output wire O_15.

In this example, there are seven NV NT block switches illustrated in schematic form in FIGS. 34A-34C referred to as NT1, NT2, NT3, NT4, NT5, NT6, and NT7 which correspond to NV NT block 3250 in FIG. 32 and to three-dimensional two-terminal NV NT block switch perspective drawings illustrated in FIGS. 10D and 10E further above. In FIG. 34A, all switches in perspective drawing of NFPGA 3400-1 are shown in a low resistance state, also referred to as ON, programmed, or SET. Switches may be in a low resistance state as-fabricated as described in U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, and U.S. patent application Ser. No. 12/356,447, entitled "Nonvolatile Nanotube Diodes and Nonvolatile Nanotube Blocks and Systems Using Same and Methods of Making Same," filed on Jan. 20, 2009 or may be switched to an ON state after fabrication. In FIG. 34B, perspective drawing 3400_2, which corresponds to perspective drawing NFPGA 3400-1, shows the NV NT block switches are in a high resistance state also referred to as OFF, erased, or RESET and may in a high resistance state as fabricated as described in U.S. patent application Ser. No. 12/356,447, entitled "Nonvolatile Nanotube Diodes and Nonvolatile Nanotube Blocks and Systems Using Same and Methods of Making Same," filed on Jan. 20, 2009 or may be switched to a high resistance state after fabrication. In FIG. 34C, perspective drawing 3400_3, which corresponds to perspective drawings NFPGA 3400-1 and NFPGA 3400-2, show some NV NT block switches are in a low resistance state and others are in a high resistance state depending on how programmable/reprogrammable interconnect wiring 3420 was programmed. Switching conditions such as program (SET) and erase (RESET) as well as operating conditions are described further above with respect to FIG. 11B. In the NV NT select circuit configuration described in FIG. 11B and in FIG. 12, it is desirable that switch ON resistance be relatively high to minimize dc current flow, typically at least 100 kΩ is desirable. In the case of the three-dimensional cross point switches, a low ON resistance less than 100 Ohms is desirable so NV NT block switch thickness, structure, contact metallurgy, nanotube fabric density, methods of fabrication, and other factors may be used to lower the ON resistance to less than 100 ohms. U.S. patent application Ser. No. 12/356,447, entitled "Nonvolatile Nanotube Diodes and Nonvolatile Nanotube Blocks and Systems Using Same and Methods of Making Same," filed on Jan. 20, 2009 gives examples of fabrication methods and structures to achieve high, intermediate, or low resistance states depending on the requirements of the application.

Referring to the programmed interconnect wiring 3420 illustrated in FIG. 34C, NV NT block switches NT3 and NT6 are in a low resistance (ON) state and all other NV NT block switches are in an OFF state. NV NT block switch NT3 in an ON state connects the output O_00 of logic gate (cell) configuration 00 with input I_09-3 of logic gate (cell) configuration 09. NV NT block switch NT6 in an ON state connects the output O_10 of logic gate (cell) configuration 10 with input I_03-4 of logic gate (cell) configuration 03. The FIG. 33C configuration may be reprogrammed millions of times, for example, to form various other logic functions. The NV NT block switches in a high resistance or OFF state may be at high resistance values in the range of 100 MΩ to 1 GΩ or higher range. The capacitance of these minimum sized NV NT block cross point switches is low, 1 fF for example, thus minimizing the risk of noise coupling between unselected lines.

Each of the logic gates (cells) 00 to 15 in logic gate (cell) configuration 3410 may be formed using logic gate (cell) 3245 illustrated in FIG. 33A, logic gate (cell) 3245' illustrated in FIG. 33B, or other logic gate (cell) configurations (not shown). If logic gates (cells) 00 to 15 corresponding to logic gate (cell) 3245 are selected, then programming and erase of NV NT block 3250 switches is typically carried out with no applied voltage to logic gates (cells) 00 to 15 as described further above. However, if logic gates (cells) 00 to 15 corresponding to logic gate (cell) are selected, then programming and erase of NV NT block 3250 switches may be carried out with applied voltages to logic gates (cells) 00 to 15 because inputs 3305-1', 3305-2', 3305-3', and 3305-4' and output 3325' may be decoupled from active circuits. Because of the ability to decouple inputs and outputs from active circuits when using logic gate (cell) 3245', it is possible to partially reconfigure regions of NFPGA 3240 while other regions are still operating.

Nanotube Nonvolatile SPLD and CPLD Logic

In some applications, array logic functions such SPLD and CPLD discussed further above may be more efficient than FPGA-type functions described in more detail further above.

NSPLD NanoLogic® Using Reprogrammable NPAL Logic Arrays

Figure 35:
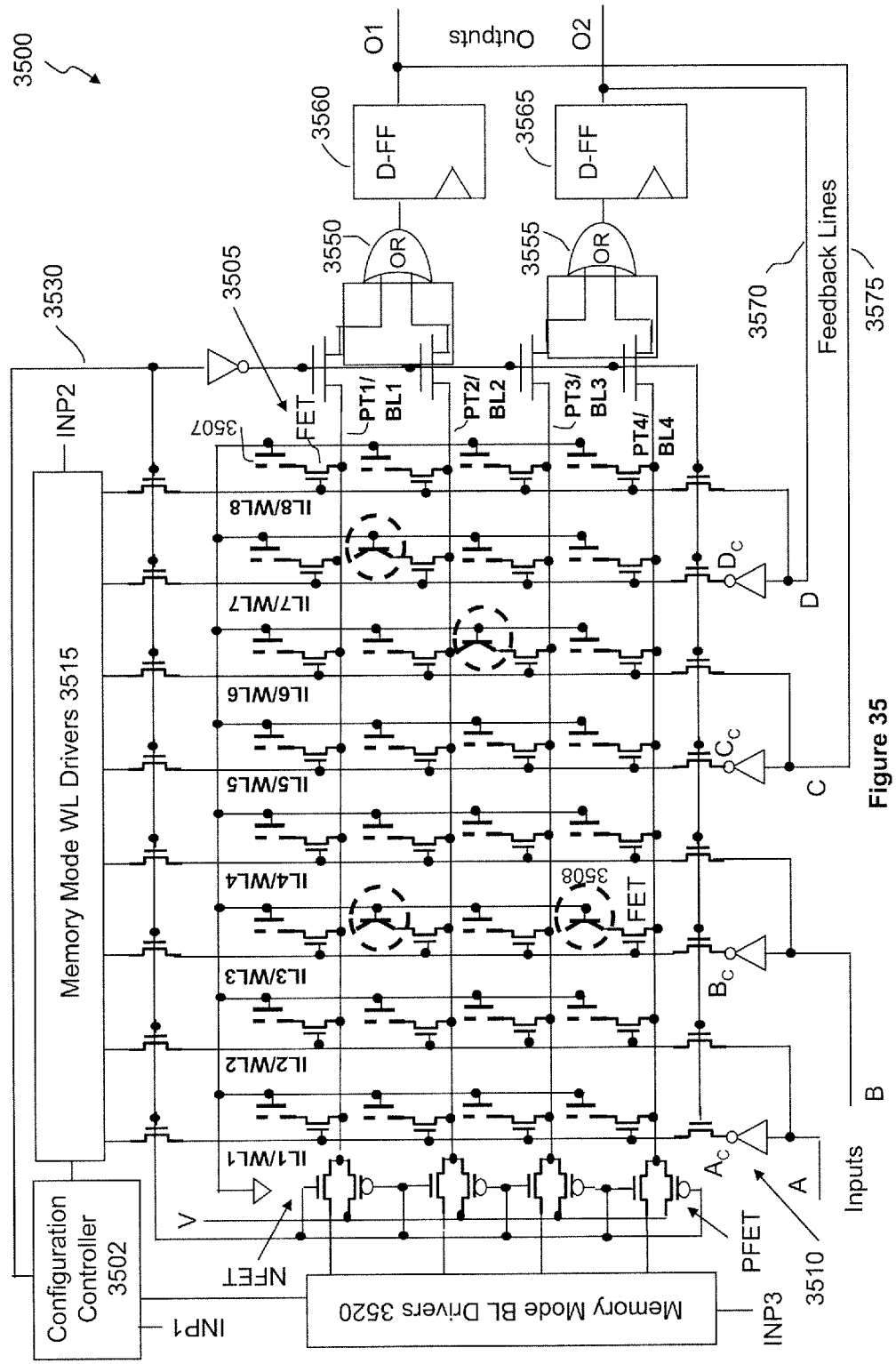
FIG. 35 shows a schematic representation of a programmable/reprogrammable NanoLogic® nanotube-based NPAL.

FIG. 35 is a schematic representation of a nanotube-based logic function that may be reprogrammed; that is, programmed, erased, and programmed, etc. multiple times, thereby forming a programmable/reprogrammable NanoLogic® nanotube-based SPLD, referred to as an NSPLD or simply NPLD, that may be implemented in the form of a nanotube-based PAL such as NPAL 3500. The prior art one-time-programmable (OTP) PAL 300 described further above and illustrated in FIG. 3 has been has been modified by replacing OTP array bits with NV NT switches. Architecture and operation of OTP PAL 300 has been described with respect to prior art FIG. 3 further above. The NPAL 3500 description that follows describes changes to OTP programmable AND array 310 to form programmable/reprogrammable AND array 3500 and corresponding support circuits illustrated in FIG. 35 by replacing OTP devices in prior art FIG. 3 such as EPROM devices for example, with three-dimensional NV NT block switches which can be programmed and erased (referred to as programmable/reprogrammable) millions of times. While programmable/reprogrammable three-dimensional NV NT block switches are used to describe programmable/reprogrammable AND array 3505 features illustrated in FIG. 35, two-dimensional NV NT switches may also be used. Programmable/reprogrammable AND array 3505 is similar to NRAM® memory array described in U.S. Pat. No. 7,479,654, entitled "MEMORY ARRAYS USING NANOTUBE ARTICLES WITH REPROGRAMMABLE RESISTANCE," filed on Nov. 15, 2005, the entire contents of which are incorporated herein by reference.

Programmable/reprogrammable AND array 3505 is formed using NV NT block switches such as NV NT block 3507 switch shown schematically in a high resistance OFF state. By way of illustrating programmed bits, several cells in programmable/reprogrammable AND array 3505 such as the NV NT block 3508 switch have been programmed (SET) to a low resistance ON state. As in U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, the entire contents of which are incorporated herein by reference, cells are formed using a select FET in series with a NV NT block switch, although a steering diode in series with a NV NT block switch may be used as well (not shown). NPAL 3500 uses a configuration controller 3502 with input INP1 to activate an NPAL logic mode of operation after programmable/reprogrammable AND array 3505 bits have been programmed or to activate a memory mode used to program or reprogram cells (as is done in an NRAM®) to implement new logic functions. Horizontal array lines each form a single product term such as PT1 when NPAL 3500 operates in a NanoLogic® mode or a bit line such as BL1 when operating in a memory mode. Vertical array lines may form a single logic input in a logic mode such as input logic IL1 or form a word line such as word line WL1 when operating in a memory mode. Logic or memory modes of operation are controlled by configuration controller 3502 by providing a low voltage (near ground) mode select signal 3530 for NPAL NanoLogic® operation or by providing a high voltage (at or near $V_{DD}$) for memory program (SET) or erase (RESET) operations.

In a NanoLogic® operating mode, NPAL 3500 logic input circuits 3510 drive vertical array lines corresponding to logic variables A, A', B, and B', while feedback lines 3570 and 3575 provide logic output O1 that provides logic variable C and logic output O2 that provides logic variable D, respectively, as inputs. True and complement logic variables may be represented as A, $A_C$ or A'; B, $B_C$ or B'; C, and $C_C$ or C', and D, and $D_C$ or D' with the notations used interchangeably. The combination of logic input circuits 3510 and logic outputs O1 and O2 drive gates of cell select FET devices as shown in FIG. 35. NPAL NanoLogic® operating voltage swings are kept below switching voltage level, less than or equal to 2 volts for example, with switching voltages typically 3 volts or higher. The drains of cell select FETs are connected to horizontal array lines corresponding to product terms such as PT1, PT2, PT3, and PT4. In a NanoLogic® operating mode, each of the product terms is connected to a pull up PFET device connected to a power supply voltage V. Product term lines such as PT1 is in a high voltage state prior to the activation of input logic signals. In this example, PT1 remains in a high voltage state for any combination of inputs A, A', B, B', C, C', D, and D' because all NV NT block switches, such as NV NT block 3507 switches are in OFF state so no currents flows even if cell select FETs are turned ON.

In the case of product term PT4, the PT4 voltage level is V prior to input logic activation. However, if the select FET of NV NT block 3508 receives a high voltage such as 2 volts, for example from logic input B' ($B_C$), then current flows through the corresponding cell and the corresponding pull up PFET and PT4 voltage drops to a low voltage. However, if logic input B' is at a low voltage such as ground, the corresponding cell select FET remains OFF, no current flows, and product term PT4 remains at voltage V. Product term PT3 high or low voltage value depends on the state of the NV NT block switch at the intersection of PT3 and logic input C and corresponds to the behavior of PT4 as described further above.

Product term PT2 may be activated depending on the state of two NV NT block switches and corresponding logic input levels. Product term PT2 is also at voltage V prior to logic input circuit 3510. In the case of product term PT2, NV NT block switches at two cell locations, a first cell at the intersection of PT2 and B' and a second cell at the intersection of PT2 and D'. If either the first cell is selected or the second cell is selected, PT2 transitions from voltage V to a low voltage such as a reference voltage at or near ground; of course, if both the first and second cells are selected PT2 is also at a low voltage near ground.

Each of the product terms PT1, PT2, PT3, and PT4 in programmable AND array 3505 carries the NOR combination of all input signals that lead to the select gates of the transistors (FETs) connected to it and the ON or OFF states of the corresponding NV NT block switches in series. Product terms PT1 and PT2 pass through mode select FETs and form inputs to two-terminal OR circuit 3550 whose output drives D-flip flop 3560. The output of D-flip flop 3560 is logic output O1. Product terms PT3 and PT4 pass through mode select FETs and form inputs to two-terminal OR circuit 3555 whose output drives D-flip flop 3565. The output of D-flip flop 3565 is logic output O2. Logic outputs O1 and O2 are fed back as logic inputs to programmable/reprogrammable AND array 3505 as described further above.

When configuring or reconfiguring the cells in programmable/reprogrammable AND array 3505, configuration controller 3502 mode select 3530 output transitions to a high voltage ($V_{DD}$ for example) and turns OFF corresponding FETs that enable/disable product terms PT1 and PT2 to the inputs of two terminal OR gate 3550 and product terms PT3 and PT4 to the inputs of two terminal OR gate 3565. FET transfer devices that enable/disable connections between memory mode WL drivers 3515 with inputs INP2 and dual function input lines/word lines such as IL1/WL1, IL2/WL2, IL3/WL3, IL4/WL4, IL5/WL5, IL6/WL6, IL7/WL7, and IL8/WL8 are turned ON. Also, PFET pull up devices connected to dual function product term line/bit lines such as PT1/BL1, PT2/BL2, PT3/BL3, and PT4/BL4 are turned OFF and FET transfer devices that enable/disable connections between memory mode BL driver 3520 with input INP3 and dual function product terms/bit lines such as PT1/BL1, PT2/BL2, PT3/BL3, and PT4/BL4 are turned ON. While FET transfer devices illustrated in FIG. 35 have shown NFET transfer devices, PFET transfer devices may be used instead, as well as CMOS transfer devices using both NFET and PFET.

When switching NV NT block switches in programmable/reprogrammable AND array 3505, word line and bit line signals used in NRAM® memory arrays may be used. NRAM® operation is described further above with respect to FIG. 19.

Programming/reprogramming of programmable/reprogrammable AND array 3505 cells has been described in terms of an NRAM® operating modes. This approach uses some additional circuits such as memory mode WL drivers 3515 and memory mode BL drivers 3520 for example to simplify cell programming/reprogramming. However, it is possible to program/reprogram cells using only the NPAL 3500 NanoLogic® logic input, output, and timing control circuits. Such an alternative approach requires more complex programming/programming methods.

NSPLD NanoLogic® Using Reprogrammable NPLA Logic Arrays

Figure 36A:
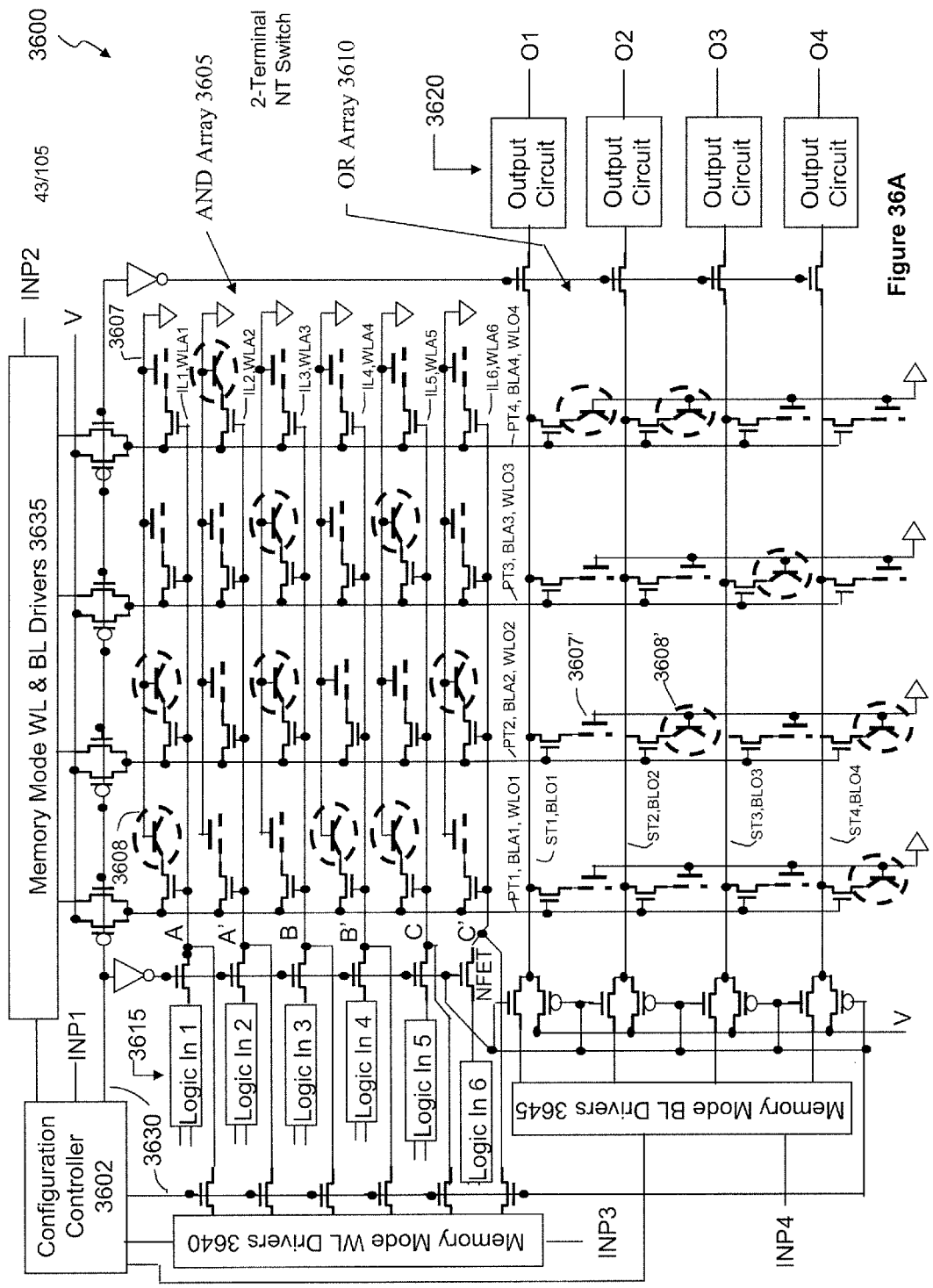
FIG. 36A shows a schematic representation of a programmable/reprogrammable NanoLogic® nanotube PLA (NPLA)

FIG. 36A is a schematic representation of a nanotube-based logic function that may be reprogrammed; that is, programmed, erased, and programmed, etc. multiple times, thereby forming a programmable/reprogrammable NanoLogic® nanotube-based SPLD, referred to as an NSPLD or simply NPLD, that may be implemented in the form of a nanotube-based PLA such as NPLA 3600. The prior art one-time-programmable (OTP) PLA 200 described further above and illustrated in prior art FIG. 2 has been modified by replacing OTP array bits with NV NT switches. Architecture and operation of OTP PLA 200 has been described with respect to prior art FIG. 2 further above. OTP PLA operation is described in more detail in the reference C. Mead and L. Conway, "Introduction to VLSI Systems," Addison-Wesley Publishing Co., 1980, pp. 79-82. The NPLA 3600 description that follows describes changes to OTP programmable AND array 210 to form AND array 3605 and changes to OTP programmable OR array 220 to form OR array 3010 and corresponding support circuit changes shown in FIG. 36A by replacing OTP devices such as EPROM devices for example, with three-dimensional NV NT block switches which can be programmed and erased (referred to as programmable/reprogrammable) millions of times. While programmable/reprogrammable three-dimensional NV NT block switches are used to describe AND array 3605 and OR array 3610 features illustrated in FIG. 36A, two-dimensional NV NT switches may also be used. Programmable AND array 3605 is similar to NRAM® memory array described in incorporated U.S. Pat. No. 7,479,654, entitled "MEMORY ARRAYS USING NANOTUBE ARTICLES WITH REPROGRAMMABLE RESISTANCE," filed on Nov. 15, 2005, for example.

Programmable/reprogrammable AND array 3605 and programmable/reprogrammable OR array 3610 are formed using NV NT block switches such as NV NT block 3607 and 3607' switches shown schematically in a high resistance OFF state. By way of illustrating programmed bits, several cells in programmable/reprogrammable AND array 3605 and programmable/reprogrammable OR array 3610 such as the NV NT block 3608 and 3608' switches have been programmed (SET) to a low resistance ON state. As in NRAM® arrays illustrated in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, and NanoLogic® NPAL 3500 illustrated in FIG. 35, cells are formed using a select FET in series with a NV NT block switch, although a steering diode in series with a NV NT block switch may be used as well (not shown). NPAL 3600 uses a configuration controller 3602 with inputs INP1 to activate an NPAL logic mode of operation after programmable/reprogrammable AND array and OR array bits have been programmed or a memory mode used to program or reprogram cells (as is done in an NRAM®) to implement new logic functions. Vertical array lines each form a single product term such as PT1 when NPLA 3600 operates in a NanoLogic® mode or a bit line such as BLA1 in programmable/reprogrammable AND array 3605 and word line such as WLO1 in programmable/reprogrammable OR array 3610 when operating in a memory mode. Horizontal array lines in programmable/reprogrammable AND array 3605 may form a single logic input in a logic mode such as input logic (input line) IL1 or form a word line such as word line WLA1 when operating in a memory mode. Logic input circuits 3615 may be formed using simple logic input circuits such as logic input circuits 3510 in FIG. 35 or relatively complex logic input driver functions with two or more inputs as illustrated in figures further below in FIGS. 36B and 36C.

Figure 36B:
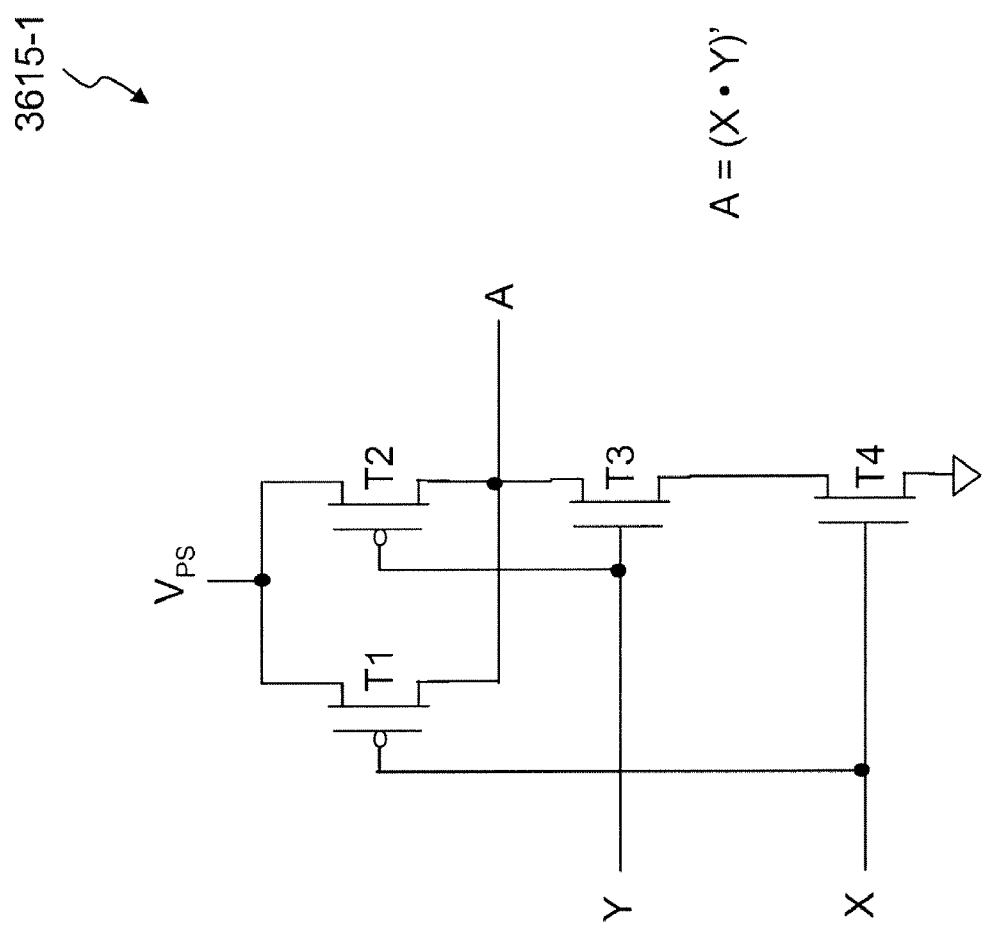
FIG. 36B shows a schematic of a two-input CMOS NAND circuit that may be used as an input logic circuit in the NPLA of FIG. 36A.

FIG. 36B illustrates a schematic of a well known CMOS NAND circuit 3615-1 which corresponds to a two-input logic input circuit such as logic-In-1 circuit of logic input circuits 3615 shown in FIG. 36A. PFETs T1 and T2 are connected in parallel with sources connected to power supply $V_{PS}$ and drains connected to output A and to a drain of NFET T3 in series with NFET T4 whose source is connected to ground GND. Input X drives the gates of NFET T4 and PFET T1 and input Y drives the gates of NFET T3 and PFET T2. Logic inputs X and Y result in a CMOS NAND circuit 3615-1 output A in which A=(X.Y)'. More complex logic input circuit functions enable a greater range of logic responses for NPLA 3600.

Figure 36C:
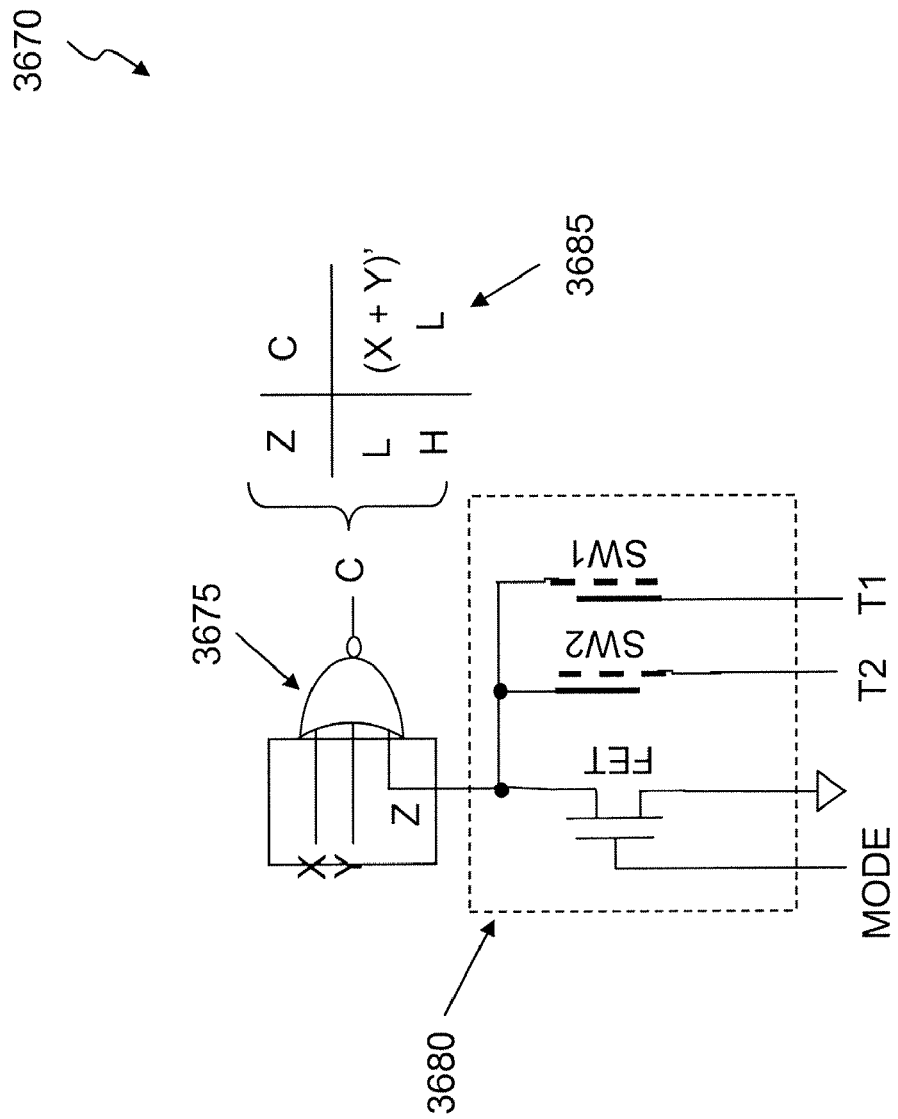
FIG. 36C shows a schematic of a programmable NanoLogic® circuit with a three-input NOR gate that may be used as an input logic circuit in the NPLA of FIG. 36A.

CMOS NAND circuit 3615-1 is a conventional volatile circuit that operates only when power is applied. For example, logic In 1 circuit may use NAND circuit 3615-1 with output A connected to input logic (input line) IL1 illustrated in FIG. 36A. However, logic input circuits 3615 may include nonvolatile NanoLogic® circuits as well. FIG. 36C illustrates a programmable NanoLogic® circuit 3670 that includes three-input NOR gate 3675 with logic inputs X, Y, and Z, and an output C that corresponds to a logic input circuit such logic In 5 whose output C is connected to as input line IL5 shown in FIG. 36A, for example. Input Z to NOR gate 3675 is controlled by the output of nonvolatile nanotube select circuit 3680 such as described further above with respect to FIG. 12D. Switching voltages applied to terminals T1 and T2 and a mode control voltage applied to the gate of the FET control the resistance values of NV NT switches SW1 and SW2, respectively. When in a logic operating mode, the ratio of the resistance values SW1 and SW2 determine whether the input Z is a high or a low value. As illustrated in FIG. 36C, if Z is set to a nonvolatile high voltage H, the NOR gate 3675 output C is at a low voltage L regardless of the high or low state of inputs X and Y. As long as input Z remains at a high voltage state forcing output C to a low voltage, none of the corresponding programmable/reprogrammable AND array 3605 logic array cells connected to input logic (input line), such as input logic (input line) IL5 shown in FIG. 36A, can conduct current regardless of the state of the NV NT switches and regardless of the high or low values of logic inputs X and Y (inputs X and Y become "don't care" values). However, if input Z is set to a nonvolatile low voltage value L, then output C connected to IL5 equals (X+Y)' and IL5 may be in a high or low voltage state as a function of inputs X and Y. In this example, as described above, programmable NanoLogic® circuit 3670 corresponds to logic In 5 circuit with output C connected to input logic (input line) IL5 illustrated in FIG. 36A.

In this example, switching of NPLA 3600 logic cells to program (SET) of erase (RESET) NV NT switches may be carried out using NRAM®-based driver circuits and NPLA NanoLogic® operation may be carried out using logic circuits. Logic or memory modes of operation may be controlled by configuration controller 3602 with input INP1 by providing a low voltage (near ground) mode select signal 3630 for NPLA NanoLogic® operation or by providing a high voltage (at or near $V_{DD}$) for memory switching operations. However, while a memory mode may be useful when switching NPLA 3600 NV NT switches, that is performing a programming (SET) operation or an erase (RESET) operation on programmable/reprogrammable AND arrays or OR arrays to modify the NPLA 3600 NanoLogic® function, NPLA 3600 switching operations do not require the addition of memory functions as described further below.

In a NanoLogic® operating mode, NPLA 3600 logic input circuits 3615 drive horizontal array lines corresponding to logic variables A, A', B, B', C, and C'. Logic input circuits 3615 drive gates of cell select FET devices in programmable/reprogrammable AND array 3605 as shown in FIG. 36A. Six logic input circuits 3615, logic input circuit 1, . . . logic input circuit 6, provide logic outputs A, A', B, B', C, and C', respectively, to input lines IL1 . . . IL6, respectively, as shown in FIG. 36A. NPLA 3600 NanoLogic® operating voltage swings are kept below switching voltage levels, less than or equal to 2 volts for example, with switching voltages typically 3 volts or higher. The drains of cell select FETs in programmable/reprogrammable AND array 3605 are connected to vertical array lines corresponding to product terms such as PT1, PT2, PT3, and PT4. In a NanoLogic® operating mode, each of the product terms is connected to a pull up PFET device connected to a power supply voltage V. Product term lines such as PT1 may be in high voltage state prior to the activation of input logic signals. In this example, PT1 and PT2 transition to a low voltage if the output A of logic input circuit 1 is at a high voltage because cells at the intersection of array lines IL1 and PT1 and IL1 and PT2, respectively, are both in low resistance (ON) states.

In a NanoLogic® operating mode, the high or low voltage level of NPLA 3600 logic product terms PT1, PT2, PT3, and PT4 are determined by the low (ON) or high (OFF) resistance states of NV NT block switches and the logic states of logic input circuits 3615 of programmable/reprogrammable array 3605. Product terms PT1-PT4 act as vertical inputs to gates of select FETs of cells in programmable/reprogrammable OR array 3610. The drains of select FETs in programmable/reprogrammable OR array 3610 are connected to horizontal array lines corresponding to sum terms ST1, ST2, ST3, and ST4. Sum terms such as ST3 may be in at high or low voltage for example. For ST3, the NV NT block switch at the intersection of PT3 and ST3 is the only switch in a low resistance ON state. If PT3 is at a low voltage, then ST3 is at a high voltage because pull up PFET connected to voltage V holds ST3 at voltage V. Other cells along sum term ST3 at the intersection of ST3 and PT1, PT2, and PT4 in programmable/reprogrammable OR array 3610 are all in a high resistance (OFF) state and no current may flow whether PT1, PT2, and PT4 are at high or low voltage values. However, because the cell at the intersection of ST3 and PT3 has a NV NT switch in a low resistance (ON) state, ST3 change to a low voltage value if PT3 is a high voltage. In a NanoLogic® operating mode, PFET pull up devices and NFET transfer devices corresponding to logic input circuits 3515 and output circuits 3620 are ON; all other NFET devices are OFF. The ON and OFF states of PFET and NFET devices are determined by mode select signal 3630 which is held at low voltage by configuration controller 3602 during NanoLogic® operation. Configuration controller 3602 may be a volatile circuit. Alternatively, configuration controller 3602 may include nonvolatile circuits such as illustrated by various nonvolatile circuit configurations described further above with respect to FIG. 12, for example, such that configuration controller 3602 configures NPLA 3600 in a NanoLogic® operating mode when voltage (power) is activated. Note that NPLA 3600 may be in OFF state when not required in order to save power. During power-up, NPLA 3600 NanoLogic® returns to the same NPLA 3600 NanoLogic® function as used prior to power shut-down.

Nonvolatile NanoLogic® functions such as NV NT select circuit-based logic described further above with respect to FIG. 12 and NPAL and NPLA logic described further above with respect to FIGS. 35 and 36, respectively, result in overall low operating power because nonvolatile NanoLogic® functions can be turned OFF when not in use. This is because unused logic functions can be quickly powered-down to zero power and near-instantly powered-up to full power without loss of logic function in what may be referred to as NanoPower Management enabled by nonvolatile NanoLogic® functions.

Sum terms ST1 . . . ST4 drive output circuits 3620 which generate outputs O1, O2, 03, and O4 respectively. Output circuits 3620 may be latches, other logic functions, etc. Some of the outputs O1 . . . O4 may be fed back as an input to logic input circuits 3615 (not shown in FIG. 36A) as shown in the NPAL 3500 example illustrated in FIG. 35.

Table 3700 illustrated in FIG. 37 illustrates outputs as a function of inputs for NPLA 3600 programmed as shown in FIG. 36A with simple logic variables A, B, C and their complements applied to input lines IL1 . . . IL6. In this example, we assume output circuits 3620 are simple inverter drivers such that outputs O1, O2, O3, and O4 correspond to the complement of sum terms ST1, ST2, ST3, and ST4 respectively. Each product term output running vertically carries the NOR combination of all input signals that lead to gates of transistors with corresponding drains attached to it. For example, PT2 has cells with three NV NT switches in a low resistance (ON) state in programmable/reprogrammable AND array 3605 with one select FET gate connected to logic function A, a second select FET gate connected to logic function B, and a third select FET gate connected to logic function C'. Therefore, product term PT2=(A+B+C')'=A'B'C which corresponds to the NOR of A,B,C', that is, PT2=NOR (A,B,C') as illustrated in table 3700. By the same reasoning, PT1=NOR(A,B',C)=(A+B'+C)'=A'BC'.

The programmable/reprogrammable OR array 3610 is the same kind of nonvolatile nanotube-based array as programmable/reprogrammable AND array 3605 except that OR array 3610 is rotated by 90 degrees. As in the case of AND array 3610, each of the sum term outputs is the NOR of the product terms signals connected to the select gates of all transistors with corresponding select FET drains attached to it. For example, sum term ST4 has two cells with NV NT switches in a low resistance (ON) state. ST4=NOR(PT1, PT2)=(A'BC'+A'B'C)'. In this example, because the output circuit associated with ST4 is an inverter, O4=ST4'=[NOR (PT1, PT2)]'=A'BC'+A'B'C as shown in table 3700 illustrated in FIG. 37. In general, NPLA 3600 implements the NOR-NOR canonical form of the Boolean function of its inputs as illustrated in table 3700.

As discussed further above, it is possible to switch NV NT switches in NPLA 3600 using logic input circuits 3615 switching at higher voltage levels compatible with NV NT switching voltages and by increasing voltage V from 2 volts during logic operation to 3 or more volts for switching, that is program (SET) or erase (RESET) operation. Such pulse requirements correspond to those described with respect to NRAM® operations described in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007.

In this example, configuration controller 3602 is used to change NPLA 3600 operating modes between NanoLogic® operation at low voltages such as 2 volts or less and memory operation corresponding to NRAM® switching at 3 volts of greater so as to program (SET) of erase (RESET) NV NT switches in programmable/reprogrammable AND array 3605 and OR array 3610 cells between low resistance (ON) and high resistance (OFF) states to change the logic configuration.

In a memory operating mode, configuration controller 3602 controlled by INP1 drives mode select signal 3630 to a high voltage state which results in turning OFF all PFET pullup devices as well as turning OFF all NFETs corresponding to logic input circuits 3515 and output circuits 3620. All other NFET devices are associated with memory functions and are turned ON and memory circuits such as memory mode WL & BL drivers 3635 controlled by inputs INP2 and configuration controller 3602, memory mode WL drivers 3640 controlled by inputs INP3 and configuration controller 3602, and memory mode BL drivers 3645 controlled by inputs INP4 and configuration controller 3602 are turned ON and enable memory switching operations.

In a memory mode switching operation corresponding to an NRAM® operation, applied drive voltages, currents, and timing are described in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, and also further above with respect to nonvolatile NRAM® array schematic 1900 illustrated in FIG. 19. Programmable/reprogrammable AND array 3605 when switched as an NRAM® has horizontal word lines WLA1 . . . WLA6 and vertical bit lines BLA1 . . . BLA4 as illustrated in FIG. 36A. Programmable/reprogrammable OR array 3610 has vertical word lines WLO1 . . . WLO4 and horizontal bit lines BLO1 . . . BLO4 also illustrated in FIG. 36B.

Nonvolatile Nanotube Arrays Configurable as NRAM® Memory or NSPDL NanoLogic® Using Reprogrammable NPLA Logic Arrays Nonvolatile nanotube arrays configurable as NRAM® memory or NSPLD NanoLogic® enable functional flexibility between requirements for more memory or more logic. Also, in operation, rapidly switching between NRAM® and NSPLD logic modes enables real-time reconfiguration of shared array bits based on results of logic operations.

Figure 38A:
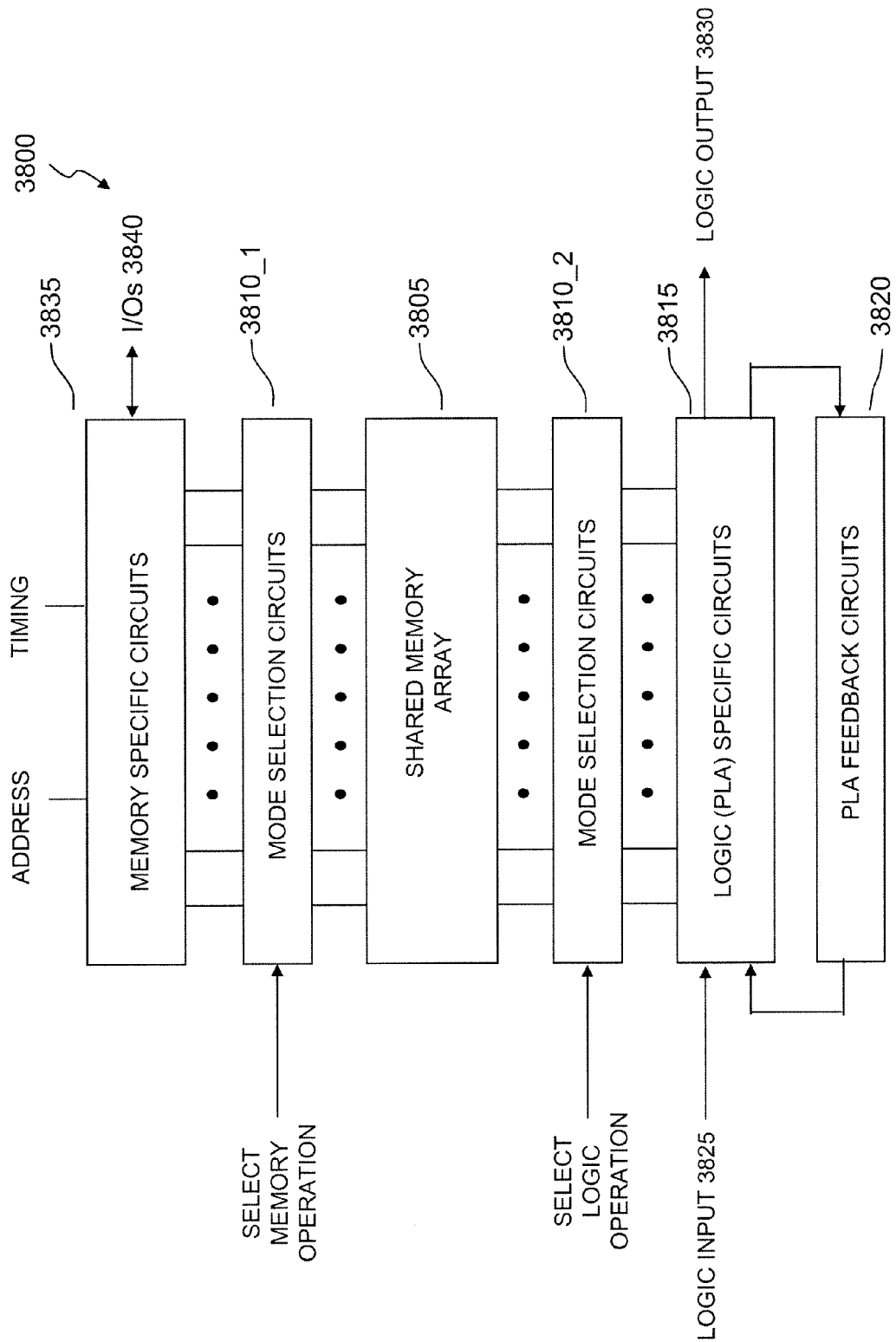
FIG. 38A is a prior art block diagram of a combined function programmable logic array which combines memory and logic functions.

Prior art FIG. 38A illustrates programmable logic array 3800 which combines memory and logic functions as described in Bertin et al. U.S. Pat. No. 5,781,031 Jul. 14, 1998 patent; the entire contents of which are incorporated herein by reference. Programmable logic array 3800 includes shared memory array 3805 which is configured to operate either as a memory or as a logic array and switches between these two modes of operation based mode selection circuit 3810_1 and mode selection circuit 3810_2. Shared memory array 3805 array lines may operate as logic input, product terms, and sum terms or as word lines and bit lines as described further above with respect to FIG. 36A. Logic (PLA) specific circuits 3815 receive logic inputs 3825 and generate logic output 3830 which depends on the ON or OFF states of bits (cells) in shared memory array 3805. PLA feedback circuit 3820 may be used to provide output-to-input feedback. Memory specific circuits 3835 may include word line drivers, bit line drivers, sense amplifier-I/O buffers, input/output terminals such as I/Os 3840, and other well known memory circuits that respond to address, data, and timing inputs.

Figure 38B:
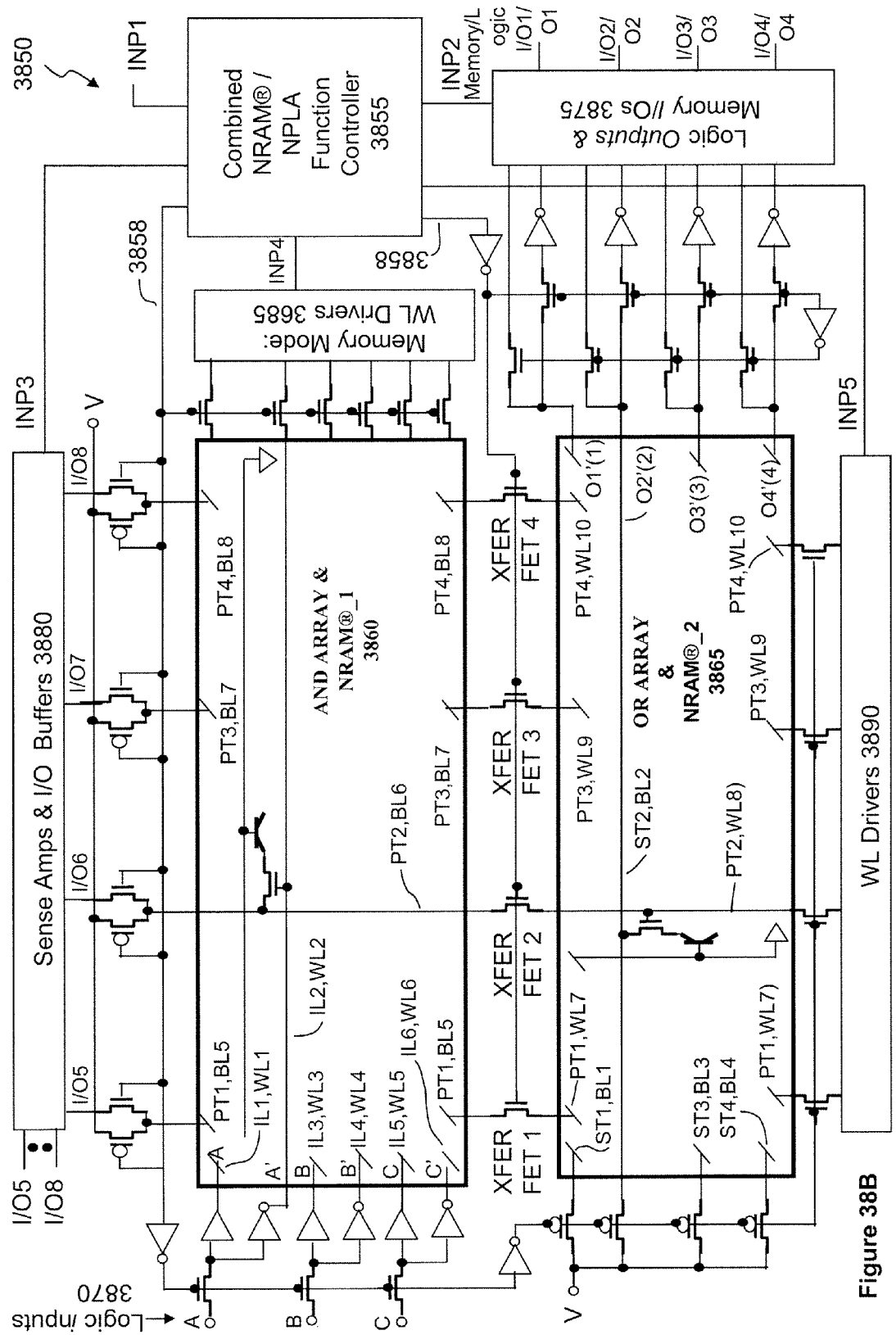
FIG. 38B illustrates a nanotube-based implementation of the combined function programmable logic array of FIG. 38A which may operate as an NPLA NanoLogic® function or as an NRAM® memory function.

FIG. 38B illustrates combined function 3850, which is a nanotube-based implementation of programmable logic array 3805, which may operate as an NPLA NanoLogic® function or as an NRAM® memory function. NRAM® memories are described further above with respect to FIG. 19 as well as described in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007. The NRAM® memory function of combined function 3850 may also include multi-resistance states for multi-bit store per cell as described in incorporated U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, the entire contents of which are incorporated herein by reference, as well as NRAM® on-pitch and peripheral circuits. NPLA NanoLogic® function is described further above with respect to FIG. 36A. Combined function 3850 is designed for ease of transition between NPLA NanoLogic® and NRAM® memory modes of operation. Combined NRAM®/NPLA function controller 3855 selects the mode of operation based on inputs INP1. If mode set 3858 is at a low voltage, combined function 3850 operates as an NPLA NanoLogic® function similar to NPLA 3600 described further above with respect to FIG. 3600A. If mode set 3858 is at a high voltage, function 3850 operates as an NRAM® memory similar to NRAM® 1900 described further above with respect to FIG. 19 and may include multi-level storage states as described in incorporated U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007.

AND array & NRAM®_1 3860 and OR array & NRAM®_2 illustrated in FIG. 38B correspond to shared memory array 3805 in FIG. 38A. In this example, for additional clarity, AND array & NRAM®_1 3860 was formed to correspond to programmable/reprogrammable AND array 3605 and OR array & NRAM®_2 3865 was formed to correspond to programmable/reprogrammable OR array 3610. When combined function 3850 operates as an NPLA, logic input 3870 variables A, B and C and their complement drive AND array & NRAM®_1 3860 horizontal array lines corresponding to logic inputs such as IL1. So for example, horizontal input line IL2 (one of six array input lines) carries logic function A' in FIG. 38B and drives FET select gates. Product terms run vertically and are connected to corresponding FET drain contacts. In this example, product term PT2 in the AND array is connected to transfer device XFER FET 2. When combined function 3850 is in an NPLA mode, XFER FET 2 is in an ON state and PT2 in the AND array is connected to a segment of PT2 in the OR array to form a complete PT2 product term connected to a PFET pullup device in an ON state and corresponds to product term PT2 in NPLA 3600 shown in FIG. 36A. Product term PT2 drives gates of select FETs in OR array & NRAM®_2 3865. Sum terms run horizontally and are connected to corresponding FET drain contacts. Horizontal sum terms such as ST2 which is connected to a PFET pullup device in an ON state corresponds to sum term ST2 in NPLA 3600 shown in FIG. 36A. Sum terms are fed through an inverter as illustrated by ST2 and corresponding outputs appear on a shared memory/logic terminal as I/O-2/O2 shown in FIG. 38B. In this example, when combined function 3850 operates in an NPLA NanoLogic® mode and NV NT switches are programmed to correspond to cell locations in NPLA 3600 AND array 3605 and OR array 3610 logic outputs I/O-1/O1, I/O-2/O2, I/O-3/O3, and I/O-4/O4 correspond to the outputs O1, O2, O3, and O4, respectively, shown table 3700 in FIG. 37.

Now when combined function 3850 operates as an NRAM®, logic inputs A, B and C are disconnected, XFER FET1, XFER FET2, XFER FET3, and XFER FET 4 are turned OFF, and AND array & NRAM®_1 3860 and OR array & NRAM®_2 and corresponding support circuits operate as one NRAM® memory as illustrated in FIG. 38B. WL drivers 3685 with inputs INP4 drive AND array & NRAM®_1 3860 horizontal array lines such as WL2 for example. In this example, AND array & NRAM®-1 3860 has six horizontal word lines WL1-WL6. Bit lines such as bit line BL6 run vertically and are connected to corresponding FET drain contacts. Bit lines such as BL6 run (are oriented) vertically and are connected to sense amps & I/O buffers 3880 with inputs INP3 by transfer FETs selected by combined NRAM®/NPLA function controller 3855 and input and output data flows from and to I/O-5, I/O-6, I/O-7, and I/O-8. BL6 is one of 4 bit lines BL5, BL6, BL7, and BL8 in AND array & NRAM 1 3860. WL drivers 3690 with inputs INP5 drive OR array & NRAM®_2 3865 vertical array lines such as WL8 for example drive gates of select FETs. WL8 is one of 4 word lines WL7, WL8, WL9, and WL10 in OR array & NRAM®_2 3865. Bit lines such as bit line BL2 run (are oriented) horizontally and are connected to corresponding FET drain contacts. In this example, bit line BL2 in the OR array is connected to memory I/O & logic output circuit 3875 with inputs INP2. Bit lines such as BL2 are connected to & memory I/O & logic output circuit 3875 by transfer FETs selected by combined NRAM®/NPLA function controller 3855. There are four bit lines, BL1, BL2, B13, and BL4 in OR array & NRAM®_2 3865. Input and output data flows from and to I/O-1, I/O-2, I/O-3, and I/O-4.

Combined function 3850 is designed to change rapidly between an NPLA NanoLogic® function and an NRAM® memory function. For example, a logic function may be carried out and the results stored in a register, for example. Then, the results may be analyzed by another logic function such a processor unit which changes the desired programming of the NPLA. The changes may be carried out using the NRAM® mode. Then the NPLA performs another logic operation based on the updated personalization.

NCPLD NanoLogic® Using Combinations of NSPLD NanoLogic® Functions

Figure 4:
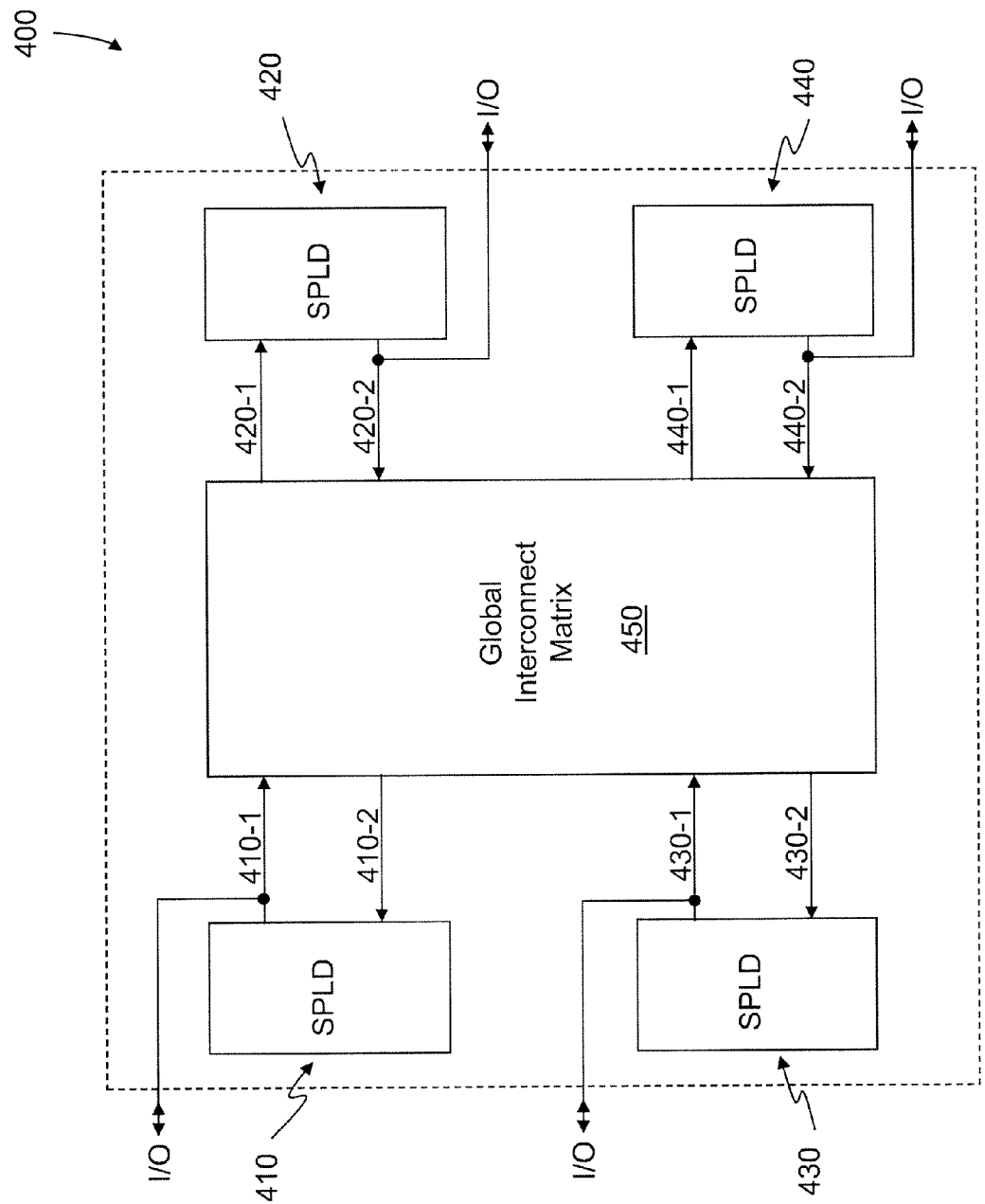
FIG. 4 is a block diagram of a complex programmable logic device.
Figure 5:
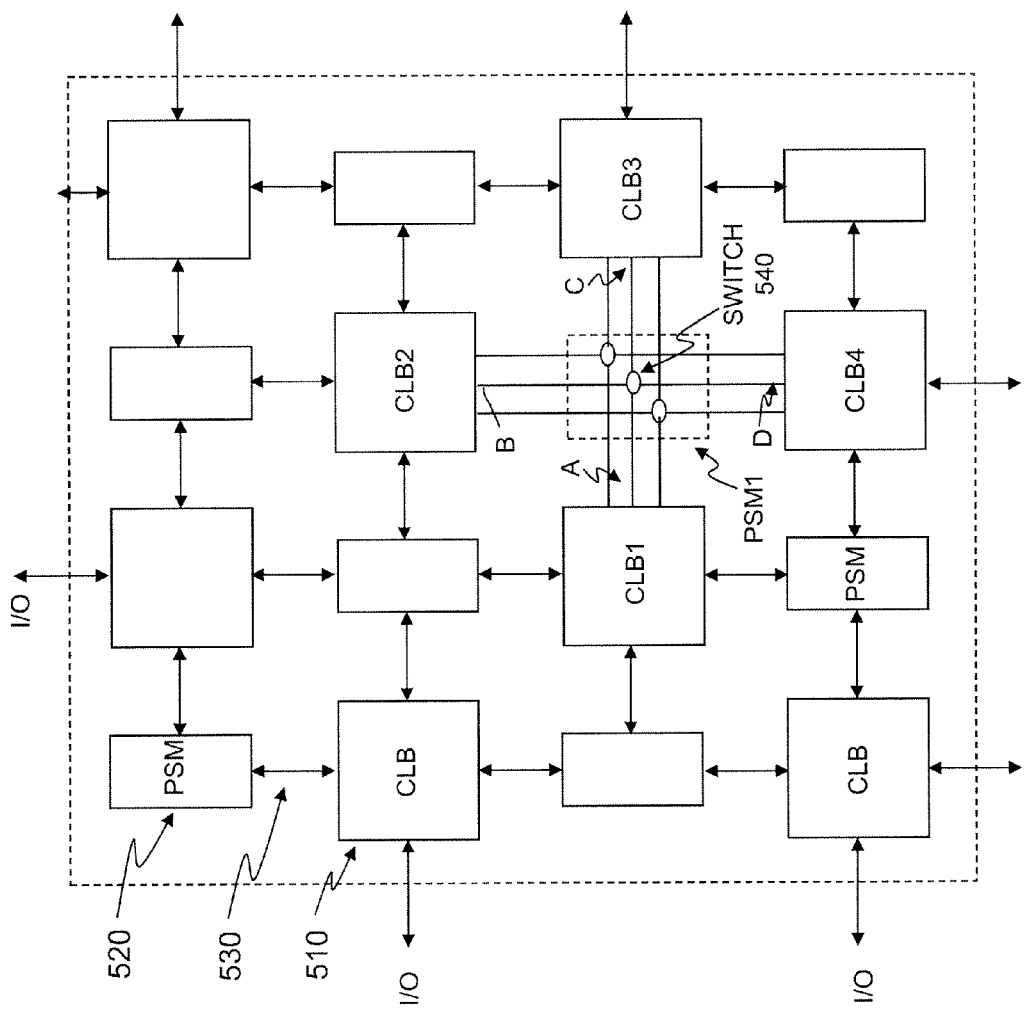
FIG. 5 is a block diagram of a field programmable gate array (FPGA) including a plurality of configurable logic blocks (CLBs)

Prior art FIG. 4 illustrates a schematic of CPLD 400 architecture formed using four SPLD functions, SPLD 410, SPLD 420, SPLD 430, and SPLD 440. All connections between SPLDs, are routed (wired) through global interconnect matrix 450. CPLD architecture and operation is described further above with respect to FIG. 4. The SPLD functions illustrated in FIG. 4 may use one or combinations of NSPLD (NPLD) functions described further above such as NPAL 3500 illustrated in FIG. 35, NPLA 3600 architecture and function illustrated in FIG. 36A-37, 36, 37, and 38B that may operate as an NPLA NanoLogic® function or as an NRAM® memory function as illustrated in FIG. 38 for example to form a nanotube-based NCPLD function.

In operation, all communication between SPLDs are routed through global interconnect matrix (GIM) 450 as described further above with respect to FIG. 4. Global interconnect matrix 450 may be formed using various programmable nonvolatile nanotube-based wiring (routing) functions. Nonvolatile programmable switch matrix (NPSM) 1600 illustrated further above in FIG. 16 shows a NanoLogic® embodiment of a programmable nanotube-based routing function that may be used to form a nanotube global interconnect matrix (NGIM), a nanotube-based global interconnect version of matrix 450. Various other NanoLogic®-based programmable nonvolatile switch matrices may be used to form global interconnect matrix 450 as described further above. For example: nanotube-controlled bidirectional buffer circuit NT BiDi Buffer 1700 described further above with respect to FIG. 17A; NT enhanced bidirectional buffer circuit NT_E-BiDi Buffer described further above with respect to 1740; nanotube programmable switch matrix (NPSM) 2400 described further above with respect to FIG. 24; NPSM 3000 described further above with respect to FIG. 30; programmable/reprogrammable (rewireable) interconnect wiring 3420 described further above with respect to FIGS. 34A-34C. Other NanoLogic® examples (not shown) may also be used.

Programmable Performance (Speed), Power Dissipation, and Timing Control (Management)

Programmable control of performance and power dissipation to levels required to execute functions enables power savings and therefore greater density. Nonvolatile nanotube-based circuits may be used to optimize power/performance as a function of application requirements as described further below.

Processor Operating Performance (Speed) and Power Dissipation Control Using a Precision Timing Function Precision Timing Function Control Concepts Various NanoLogic® and NRAM®-based field programmable logic functions and routing switches have been described further above. There functions, and other functions such as processors and other subsystems, may be combined in various ways to form nanotube-based field programmable system on-a-chip (NFPSoC) functions. These NFPSoC functions may be capable of operating over a range of speeds in the relatively slow kilohertz range, higher speeds in the megahertz range, and high speeds such as 10's or 100's of GHz for example and dissipate high levels of power. In addition, at higher speeds of operation, timing (delay) control (management) becomes even more important.

Precision Timing Function Implementation Details Using a Nanotube-Based Programmable Analog Continuously Variable Delay Line Power/performance (speed) optimized subsystem 3900-1 illustrated in prior art FIG. 39A uses precision timing function 3920 to control the performance and power dissipation of processor 3930 as described in detail in Bertin et al. U.S. Pat. No. 6,177,807 issued Jan. 23, 2001 the entire contents of which are incorporated herein by reference. An input 3905 drives buffer 3910 which drives inputs 3915 of precision timing function 3920 connected to power supply $V_{PS}$ whose output 3925 drives a first input of comparator 3940. Buffer 3910 also drives at least one input of processor 3930. An output 3935 of processor 3930 is connected to a second input of comparator 3940 by connection 3927. A timing-critical path through processor 3930 is selected to provide a representative delay time between inputs and outputs of processor 3930. Comparator 3940 compares pulses from output 3945 of precision timing function 3920 and output 3935 of processor 3930 and provides a difference voltage ΔV on output 3945 which is fed as an input to voltage regulator 3950. Voltage regulator 3950 is also connected to power supply $V_{PS}$ and provides a regulated voltage $V_{PROC}$ on output 3955 to processor 3930 which controls the operating speed of processor 3930 as described in the incorporated U.S. Pat. No. 6,177, 807. Regulated voltage $V_{PROC}$ is also fed back to an input of voltage regulator 3950 by connection 3940. While in this example processor output 3935 is provided to comparator 3940 by connection 3927, connection 3927 may instead be used to provide a representative delay signal that is independent of a processor 3930 output such as output 3935. Processor 3930 output 3935 may include multiple output lines (not shown).

In operation, the performance (speed) and power dissipation of processor 3930 may be controlled by the voltage $V_{PROC}$ supplied by voltage regulator 3950 output 3955. CMOS circuit voltage swings are rail-to-rail, that is, between an applied voltage such as $V_{PROC}$ and ground. The voltage range $V_{PROC}$ may vary over a wide range from $V_{PS}=V_{DD}$ to lower voltages that are just above the threshold voltages of the NFET and PFET devices in CMOS circuits. Operating speed and power dissipation are a function of applied voltage so power supply (power source) $V_{PS}=V_{DD}$ results in the highest performance but also the highest power dissipation. $V_{PROC}$ may be varied from 2.5 volts to 0.5 volts for example. Dynamic power dissipation $P_{DYN}$ is proportional to the capacitance being switched times the square of the applied voltage V times the clock frequency f ($P_{DYN} \sim CV^2 f$) as described in the reference R. J. Baker et al. "CMOS Circuit Design, Layout, and Simulation", IEEE Press, 1998, pps 210-211, the entire contents of which are incorporated herein by reference. In this example, $V=V_{PROC}$ so the power dissipation is proportional to $(V_{PROC})^2$ and may be varied over a broad range. If $V_{PROC}$ is varied over a range of 0.5 to 2.5 volts, then power dissipation may be modulated over a 25/1 range for example. A nanotube-based precision timing function is described further below with respect to FIGS. 40A and 40B.

It may be desirable to have processor 3930 restored to the same operating voltage $V_{PROC}$, and therefore the same power dissipation and performance (speed) operating point (operating conditions), when power is restored to a portion of a chip or to the entire chip. Precision timing function 3920 stores the precision timing delay as described further below with respect to FIG. 40. Optimized subsystem 3900-1 generates processor 3930 voltage $V_{PROC}$ which results in the same performance (speed)/power level after power restoration as was present before power shut down. Using precision timing function 3920 and comparator 3940 with feedback as described further above with respect to FIG. 39A, voltage regulator 3950 is forced to same voltage output $V_{PROC}$. However, in the some applications, it may be desirable to have near-instant power ON when restoring processor 3930 voltage $V_{PROC}$ to the same voltage as the pre-power OFF voltage level.

Figure 39B:
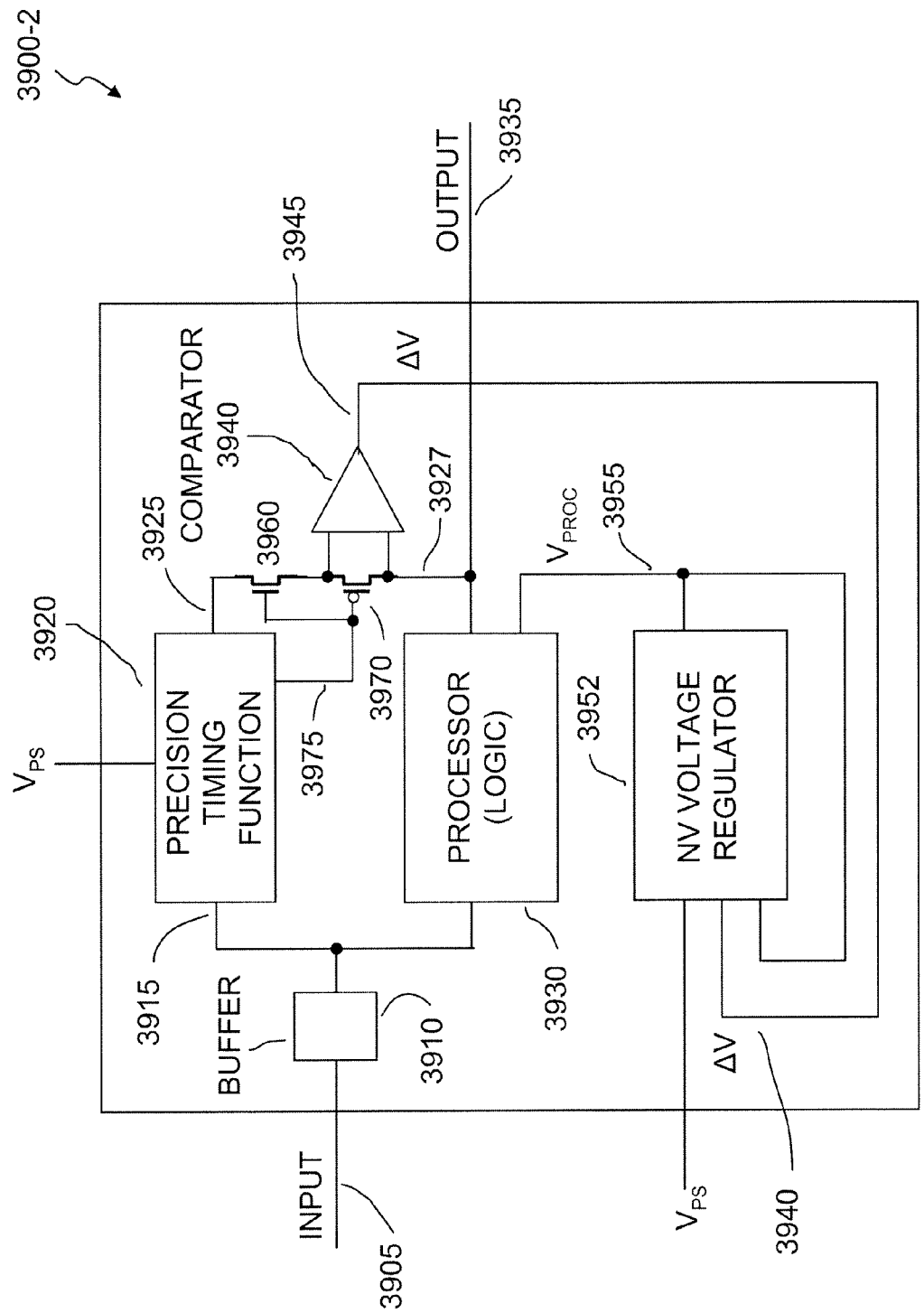
FIG. 39B shows the precision timing function of FIG. 39A with the voltage regulator replaced by a NanoLogic®-based NV voltage regulator.

In order to achieve near-instant restoration of processor 3930 voltage $V_{PROC}$, voltage regulator 3950 shown in FIG. 39A has been replaced by NanoLogic®-based NV voltage regulator 3952 shown in FIG. 39B in power/performance optimized subsystem 3900-2. NV voltage regulator 3952 may be formed using NanoLogic®-based NV NT programmable voltage generator 1800 described further above with respect to FIG. 18 for example. An advantage of NV voltage regulator 3952 is that at power-up time, NV voltage 3952 output 3955 provides the stored pre-power OFF voltage $V_{PROC}$ to processor 3930 thereby realizing near-instant restoration of performance (speed)/power operating conditions.

Since power/performance optimized subsystem 3900-2 retains processor 3930 voltage $V_{PROC}$ information during power ON and power OFF times, precision timing function 3920 is only required when changing to the performance (speed)/power operating point (operating condition) of processor 3930 by changing processor voltage $V_{PROC}$ stored by NV voltage regulator 3952. Therefore, NFET 3960 and PFET 3970 and output 3975 between precision timing function 3920 and the gates of NFET 3960 and PFET 3970 have been added to decouple precision timing function 3920 from comparator 3940 and to connect both first and second comparator 3940 together and to output 3935 via connection 3927.

In operation, if precision timing function 3920 output 3975 is at a low voltage such as a reference voltage at or near ground, then PFET 3970 is ON and NFET 3960 is OFF which decouples output 3925 from the first input of comparator 3940 and processor voltage $V_{PROC}$ is left unchanged. However, if output 3975 is at a high voltage such as $V_{PS}=V_{DD}$ for example, then NFET 3960 is ON and output 3925 is connected to the first input of comparator 3940. Also, PFET 3970 is OFF and first and second inputs of comparator 3940 are disconnected. A different power/delay operating point may result if precision timing function 3920 and comparator 3940 force NV voltage regulator 3952 output 3955 to a different value of processor 3930 operating voltage $V_{PROC}$.

Power/performance optimized subsystem 3900-2 enables precision timing function 3920 to be changed as described further below with respect to FIG. 40 without impacting the power/delay operating point determined by output 3955 of $V_{PROC}$ which is maintained by NV voltage regulator 3952 as described further above with respect to FIG. 39B. Therefore, transition to a new power/delay operating point may be achieved more quickly when using optimized subsystem 3900-2. Alternatively, precision timing function 3920 may be shared with one or more other optimized subsystems (not shown). In this way, multiple optimized subsystems may be more precisely set to the same power/delay operating point.

Figures 40A, 40B:
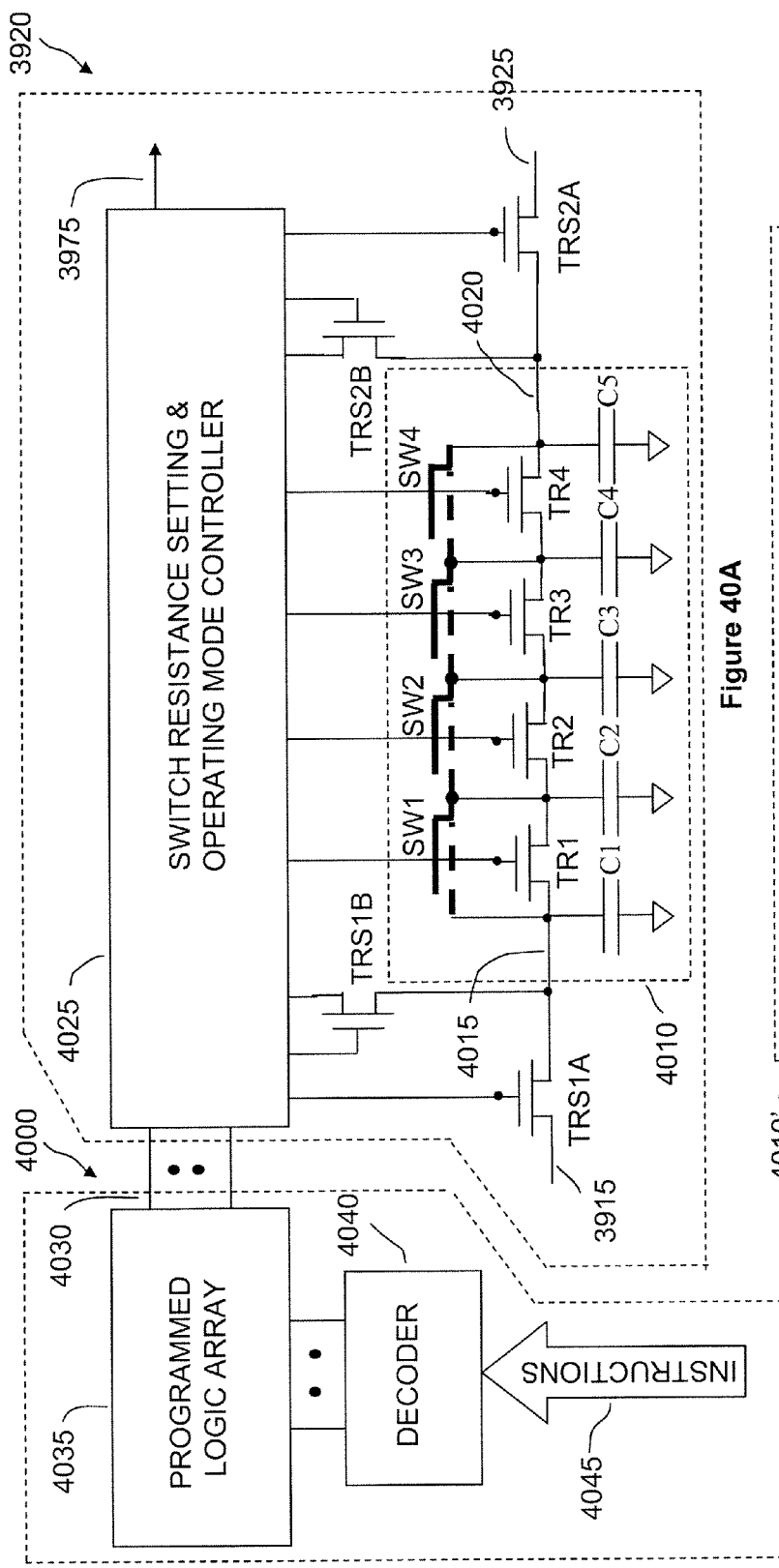
FIG. 40A shows details of an implementation of the precision timing function of FIGS. 39A and 39B with a programmable variable delay resistor-capacitor (RC) delay line (network) formed using a series/parallel combination of NV NT switches in series forming continuously variable resistors and capacitors in parallel.
FIG. 40B shows an equivalent circuit of the RC delay line (network) of FIG. 40A.

FIG. 40A shows details of precision timing function 3920 implemented using an adaptation of an electronically controlled resistor (NV NT switch resistance values are continuously variable), capacitor network of nanotube-based circuits described in incorporated U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, including resistor setting and operating mode controller 4025; individual NV NT switches in series/parallel resistor/capacitor network 4010 connected to nodes 4015 and 4020; and FETs TRS1B and TRS2B that supply voltage pulses to program (SET) and erase (RESET) NV NT switches SW1, SW2, SW3, and SW4 for various time delay values for signals traveling between nodes 4015 and 4020. FETs TRS1A and TRS2A are isolating transistors whose ON/OFF states are controlled by gates connected to resistor setting and operating mode controller 4025. FET TRS1A connects or disconnects node 3915 (also shown in FIGS. 39A and 39B) from node 4015 and FET TRS2A connects or disconnects node 3925 (also shown in FIGS. 39A and 39B) from node 4020. FETs TRS1A and TRS2A are OFF during program (SET) and erase (RESET) operations and are ON when operating as a nonvolatile controlled signal delay line such as precision timing function 3920 shown in power/performance optimized subsystem 3900-1 or 3900-2.

Using a combination of program (SET) and erase (RESET) operations, the nonvolatile resistance values NV NT switches $R_{SW1}=R_{SW2}=R_{SW3}=R_{SW4}$ are programmed to a nonvolatile resistance value of $R_{SW}$. Each of the switches SW1, SW2, SW3, and SW4 is programmed individually to a desired resistance value as described to meet a performance with all FETs TR1, TR2, TR3, and TR4 in an ON state except TR1 which is OFF when programming SW1; TR2 which is OFF when programming SW2; TR3 which is OFF when programming SW3; and TR4 when programming SW4 as described in more detail in incorporated U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007. The capacitance values C1=C2=C3=C4=C5 may be chosen as C, for example. The distributed π model of equivalent RC delay circuit 4010, which corresponds to RC network 4010' illustrated in FIG. 40B and described further below, is described in detail in the reference H. B. Bakoglu, "Circuits, Interconnections, and Packaging for VLSI", Addison-Wesley Publishing Company, 1990, pp. 198-202, the entire contents of which are incorporated herein by reference. As explained in the Bakoglu reference, the time elapsed for an RC network between the time an input waveform reaches 10% of its value to the time the corresponding output value reaches 90% of its output value is 0.9RC which is the delay metric used in this example. However, other metrics such as the time delay between the 0 to 50% points of input and output waveforms may also be used. By way of example, assume $R_{SW}$ is programmed to a value of 50 kΩ for example and that C=2 fF. Then RC=100 ps and 0.9RC=90 ps. Next assume that the critical delay 0.9RC=90 ps programmed for precision timing function 3920 is equal to two waveform cycles (such as clock cycles for example) of processor 3930 shown in FIGS. 39A and 39B. Then each waveform cycle has a periodicity of 45 ps and the corresponding waveform frequency (such as a clock frequency for example) is 22.2 GHz. If $R_{SW}$ is reduced to a value of 20 kΩ for example, then the corresponding waveform frequency is 55.5 GHz. If $R_{SW}$ is increased to a value of 100 kΩ the corresponding waveform frequency is 11.1 GHz.

The optimized power/performance optimized subsystem 3900-1 illustrated in FIG. 39A is determined by precision timing function 3920 and voltage regulator 3950 with feedback based on comparator 3940 output ΔV as explained further above. The performance (speed) of processor 3930 is controlled by the power supply voltage $V_{PROC}$ supplied by voltage regulator 3950 also explained further above. In the example above, processor 3930 can sustain waveform frequencies of operation in a range of 55.5 GHz to 11.2 GHz in this example. The operating range of processor 3930 may be greater than the range described further above in this example; that is operating frequencies less than 11.2 GHz and greater than 55.5 GHz.

The optimized power/performance optimized subsystem 3900-2 illustrated in FIG. 39B is determined by precision timing function 3920 as in FIG. 39A, however, NV voltage regulator 3952 is used instead as described further above to enable restart to the previous operating voltage $V_{PROC}$ without requiring the use of precision timing function 3920 if desired. Switch resistance setting & operating mode controller 4025 provides output 3975 to the gates of NFET 3960 and PFET 3970 as illustrated in FIG. 39B.

FIG. 40B illustrates the equivalent circuit RC network 4010' corresponding to series/parallel resistor/capacitor network 4010. Equivalent circuit RC network 4010' is shown after switches SW1, SW2, SW3, and SW4 have been programmed to resistance values $R_{SW1}$, $R_{SW2}$, $R_{SW3}$, and $R_{SW4}$, respectively, with transistors TR1, TR2, TR3, TR4, TRS1B, and TRS2B in an OFF state, and transistors TRS1A and TRS2A in an ON state. The capacitance values C1-C5 are the same in FIGS. 40A and 40B. Terminal 4015' corresponds to terminal 4015 and terminal 4020' corresponds to terminal 4020. Signals in series/parallel resistor/capacitor network 4010 and corresponding equivalent circuit RC network 4010' may travel from left-to-right or from right-to-left.

Performance/power/timing function 4000 illustrated in FIG. 40A is used to provide inputs 4030 to switch resistance setting & operating mode controller 4025. In this example, instructions 4045 are provided to decoder 4040 by discrete operation (OP) code in a stream of instructions (data). The output of decoder 4040 drives inputs to programmed logic array 4035 which provides inputs 4030 that control programming of switch resistance setting & operating mode controller 4025 as described in Bertin et al. U.S. Pat. No. 5,986,962 issued Nov. 16, 1999 the entire contents of which are incorporated herein by reference. Programmed logic array 4035 may be formed using a NanoLogic® NPLA such as NPLA 3600 described further above with respect to FIG. 36A. Instructions (logic inputs) may also be provided by an on-chip controller. Alternatively, the logic state of a particular pin, such a low power interrupt pin is detected to signal a transition to a low power mode or to a nonvolatile power-off mode for example. Also, thermal on-chip and/or off-chip detectors may signal that a transition to low power mode or to a nonvolatile power-off mode is required. Also, in a harsh environment such as a high radiation environment, an error detect circuit may produce an error signal in data flowing between a processor such as processor 3930 and a memory as described in Bertin et al, U.S. Pat. No. 5,604,755 issued Feb. 18, 1997 the entire contents of which are incorporated herein by reference. Such an error detect signal to decoder 4040 results in decoder output signals to programmed logic array 4035 (in this example, an NPLA corresponding to NPLA 3600) which results in selective error detection and correction that may be followed by system power shutdown. An example of processor and memory data capture and timing control is described further below with respect to FIGS. 41-43.

Nanotube Field Programmable System-on-Chip (NFPSoC) Self-Optimization Using Nanotube-Based Control Precision control of processor performance and power is required as part of power management strategies for very dense two-dimensional and three-dimensional NRAM and NanoLogic functions such as nanotube-based field programmable system-on-chip (NFPSoC) functions described further below. Also, precise timing adjustments between processors and other logic functions with respect to subfunctions such as logic or memory as a function of placement is also required as described further below.

Figure 41:
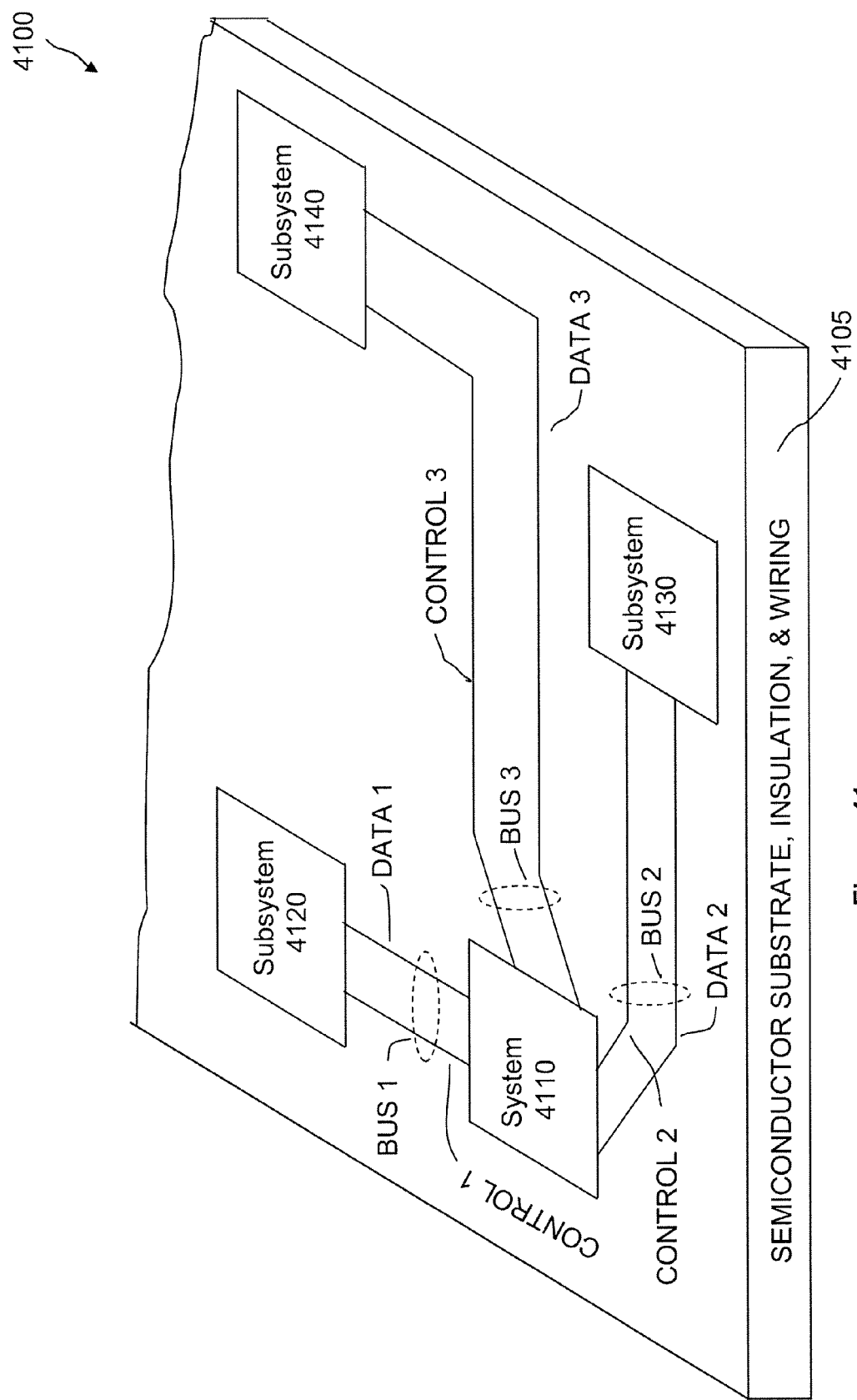
FIG. 41 shows a nanotube field programmable system-on-chip (NFPSoC) that includes a system function and several subsystem functions placed at various distance from the system functions with point-to-point BUS connections.

NFPSoC Self-Optimization as a Function of Placement, Performance (Speed), Power Dissipation, and Critical Timing Using Nanotube-Based Precision Timing Functions NFPSoC 4100 illustrated in FIG. 41 includes a system 4110 and subsystems 4120, 4130, and 4140 which may be placed at various distances from system 4110 on semiconductor substrate, insulation, and wiring 4105. This variation in distance as a function of relative placement results in different delay times for signals propagating between system 4110 and subsystems 4120, 4130, and 4140 on buses such BUS 1, BUS 2, and BUS 3, respectively. Buses include multiple connections and connection types including control pulses for timing, instructions, data, and other functions. In the NFPSoC 4100 example, control and data lines are shown as single lines. For example, BUS 1 includes control 1 and data 1 (and other lines not shown explicitly); BUS 2 includes control 2 and data 2 (and other lines not shown explicitly); and BUS 3 includes control 3 and data 3 (and other lines not shown explicitly). Multiple control and data lines (not shown) may be used. In addition to delay variations as a function of distance, subsystem performance may also vary as a function of electrical parameter variations, and operating temperature changes for example.

NFPSoC 4100 may be operated at high speeds such as 10's and 100's of GHz and higher for example which results in critical timing requirements. An example of critical timing requirements for a clocked system is illustrated in FIG. 42 in which system 4110 corresponds to CPU 4205 and one of the subsystems 4120, 4130, or 4140 corresponds to Cache 4210. However, timing control concepts may also be applied to systems with asynchronous timing. Critical timing in clocked systems is described in more detail in incorporated U.S. patent application Ser. No. 11/835,612, entitled "NON-VOLATILE RESISTIVE MEMORIES HAVING SCALABLE TWO-TERMINAL NANOTUBE SWITCHES", filed on Aug. 8, 2007.

FIG. 42A illustrates a synchronous CPU and Cache system 4200-1 including CPU 4205 and Cache 4210, with CPU and Cache synchronized to clock signal CLK. Memory address locations and control signals are provided to cache 4210 by CPU 4205, and data may be stored by CPU 4205 in Cache 4210 using a write operation, or data may transferred from Cache 4210 to CPU 4205 using a read operation. FIG. 42B illustrates a timing diagram 4200-2 for a high performance cache read operation in which cache data is available to CPU 4205 two clock cycles after data request. Clock 4215 transitions from low to high voltage at a data request time. At the time of the data request clock transition 4220, control signals identify the desired operation, in this illustration a read operation. Also, addresses 4235 are valid. Cache 4210 completes the read operation in two clock cycles and makes data output $V_{DATA-OUT}$ available in valid data window 4240 sometimes referred to as the "data eye". Clock 4215 data capture clock transition 4225 for CPU 4205, two cycles after clock 4215 data request transition 4220, is timed to occur in the center of data window 4240 and data is captured by CPU 4205 at clock transition 4225. FIG. 42A is adapted from the reference K. Itoh, "VLSI Memory Chip Design", Springer, 2001, pp. 358-363, the entire contents of which are incorporated herein by reference.

In operation, placement distance between CPU 4205 and cache 4210 and variations in cache 4210 access time due to variations in transistor parameters due to fabrication, as well as parameter drift during operation over time in the field, can result in variability in the location of valid data window 4240. FIG. 42C illustrates clock transition 4225 relative to valid data window 4240A for a fast data path in which output data $V_{DATA-OUT}$ is available too early in the clock 4215 cycle. Clock 4215 read data clock transition 4225 occurs at the trailing edge of valid data window 4240A where data may be faulty as illustrated in FIG. 42C. Alternatively, FIG. 42C also illustrates a slow data path valid data window 4240B in which output data $V_{DATA-OUT}$ is available late in the clock 4215 cycle. Clock 4215 read data clock transition 4225 occurs at the leading edge of valid data window 4240B where data may be faulty as illustrated in FIG. 42C. What is needed is a way to minimized valid data window variations to optimize system performance, yield, and reliability.

A programmable precision timing function may be introduced to minimize delay variations described further above. An example of a nanotube-based programmable precision timing function is illustrated further above with respect to precision timing function 3920 based on a programmable RC delay line as described with respect to FIGS. 40A and 40B. Another example of a programmable precision timing function is described further below with respect to FIGS. 43-48 in which near-lossless delay lines (transmission lines) are used and are formed using chip wiring to propagate signals at a constant velocity based on the delay line dielectric constant and independent of delay line geometries and operating temperatures, and which do not degrade in the field as a function of time. Such precision delay lines may be particularly suitable for high speed operation such at 10 GHz to 100 GHz and higher frequencies for example. By placing transistors (FETs) that short circuit a delay line at known distances along the delay line, round trip propagation times between delay line inputs and shorts are precisely timed. FETs may be selected and turned ON and OFF using a nonvolatile programmable function such as nonvolatile nanotube PLA (NPLA) 3600 shown in FIG. 36A further above and may be added to NFPSoC 4100 illustrated in FIG. 41 as described further below with respect to FIGS. 43-48. By way of example, such a programmable precision timing function may be used to ensure that valid data window 4240C coincides with data sampling by CPU 4205 at clock transition 4225 as shown in FIG. 42C. Methods and corresponding circuits for programmable precision timing functions are described further below with respect to FIGS. 43-48.

Figure 43:
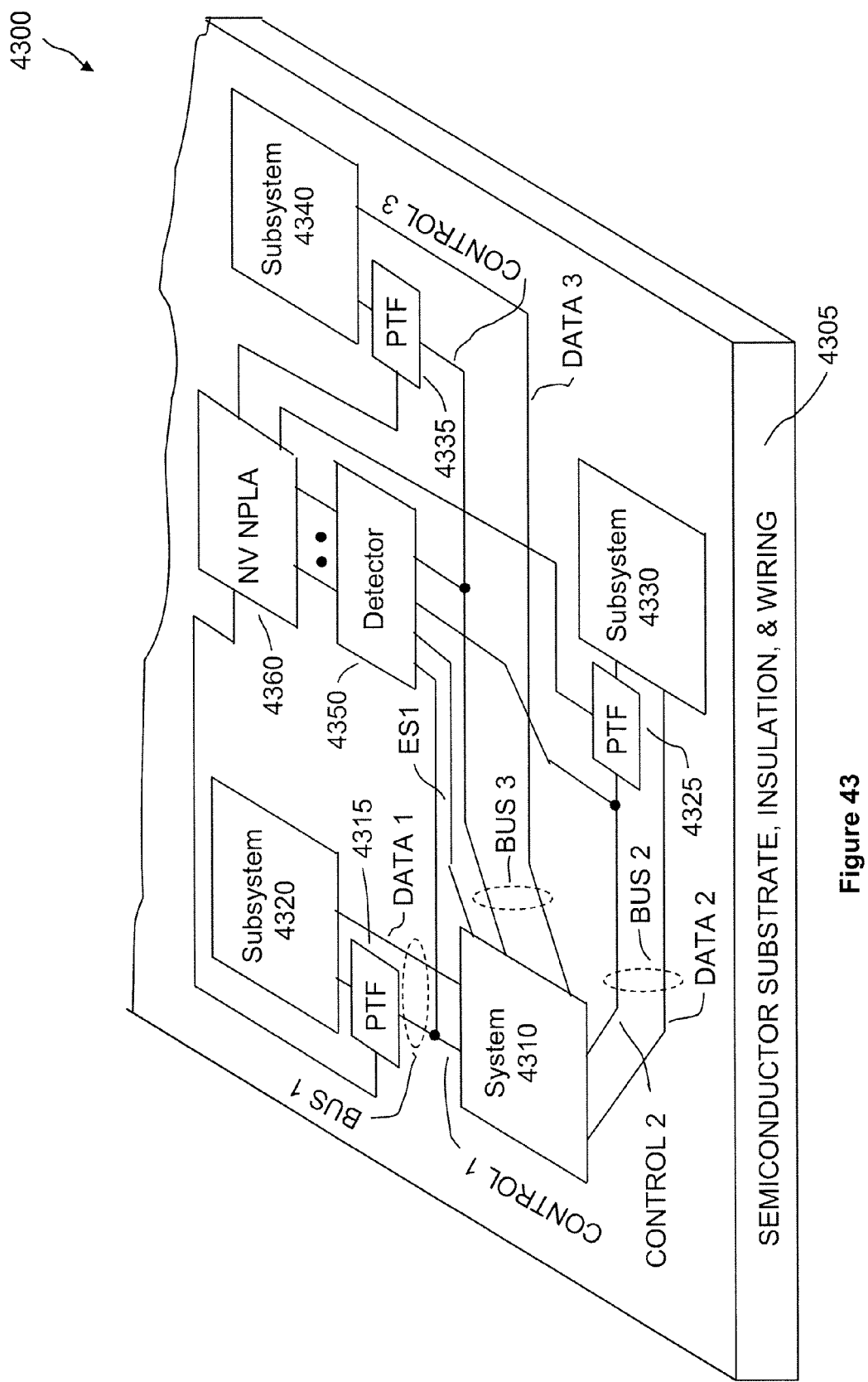
FIG. 43 shows a self-optimized NFPSoC in which the NFPSoC illustrated in FIG. 41 has been modified to include precision timing functions (PTF) in each of the BUS connections.

Self-optimized NFPSoC 4300 illustrated in FIG. 43 includes system 4310 and subsystems 4320, 4330, and 4340 which may be placed at various distances from system 4310 on semiconductor substrate, insulation, and wiring 4305. System 4310 and subsystems 4320, 4330, and 4340 correspond to system 4110 and subsystems 4120, 4130, and 4140, respectively, illustrated in FIG. 41. This variation in distance as a function of relative placement results in different delay times for signals propagating between system 4110 and subsystems 4120, 4130, and 4140 on buses such BUS 1, BUS 2, and BUS 3, respectively. Buses include multiple connections and connection types including control pulses for timing, instructions, data, and other functions. In this example, in order to compensate for variations in distance between system 4310 and various subsystems 4320, 4330, and 4340, and also differences in subsystem size, function type, and parameter variations, precision timing functions (PTFs) are added to control lines between system 4310 and corresponding subsystem functions. Precision timing functions (PTFs) are not added to data lines in this example. However, PTFs may be added to data lines as well. So for example, BUS 1 has been modified as illustrated in FIG. 43 by adding PTF 4315 to control 1 between system 4310 and subsystem 4320; BUS 2 has been modified by adding PTF 4325 to control 2 between system 4310 and subsystem 4330; and BUS 3 has been modified by adding PTF 4335 to control 3 between system 4310 and subsystem 4340. In the self-optimized NFPSoC 4300 example illustrated in FIG. 43, control and data lines are shown as single lines; however, multiple lines may be used. For example, BUS 1 includes control 1 and data 1 (and other lines not shown explicitly); BUS 2 includes control 2 and data 2 (and other lines not shown explicitly); and BUS 3 includes control 3 and data 3 (and other lines not shown explicitly). Possible system & subsystem functions may include processor (CPU), controller, NPFGA, NCPFD, NSPFD, signal processors, custom logic, analog, and other functions.

Self-optimized NFPSoC 4300 also includes detector 4350 with connections to control 1, control 2, and control 3 of BUS 1, BUS 2, and BUS 3, respectively and to error signal ES1 output from system 4310. Detector 4350 outputs are connected to NV NPLA 4360 which corresponds to NPLA 3600 illustrated further above in FIG. 36. Detector 4350 monitors discrete operation (OP) codes in a stream of instructions such as instructions 4045 described further above with respect to FIG. 40A and detects streams of instructions related to timing synchronization. NV NPLA 4360 is programmed based on timing requirements and outputs of NV NPLA 4360 set precision delay times in corresponding PTFs. For example, outputs 4365 determine the delay signal associated with precision timing function 4315; outputs 4370 determine the delay signal associated with precision timing function 4325; and outputs 4375 determine the delay signal associated with precision timing function 4335 as illustrated with respect to FIG. 44 described further below.

Figure 44:
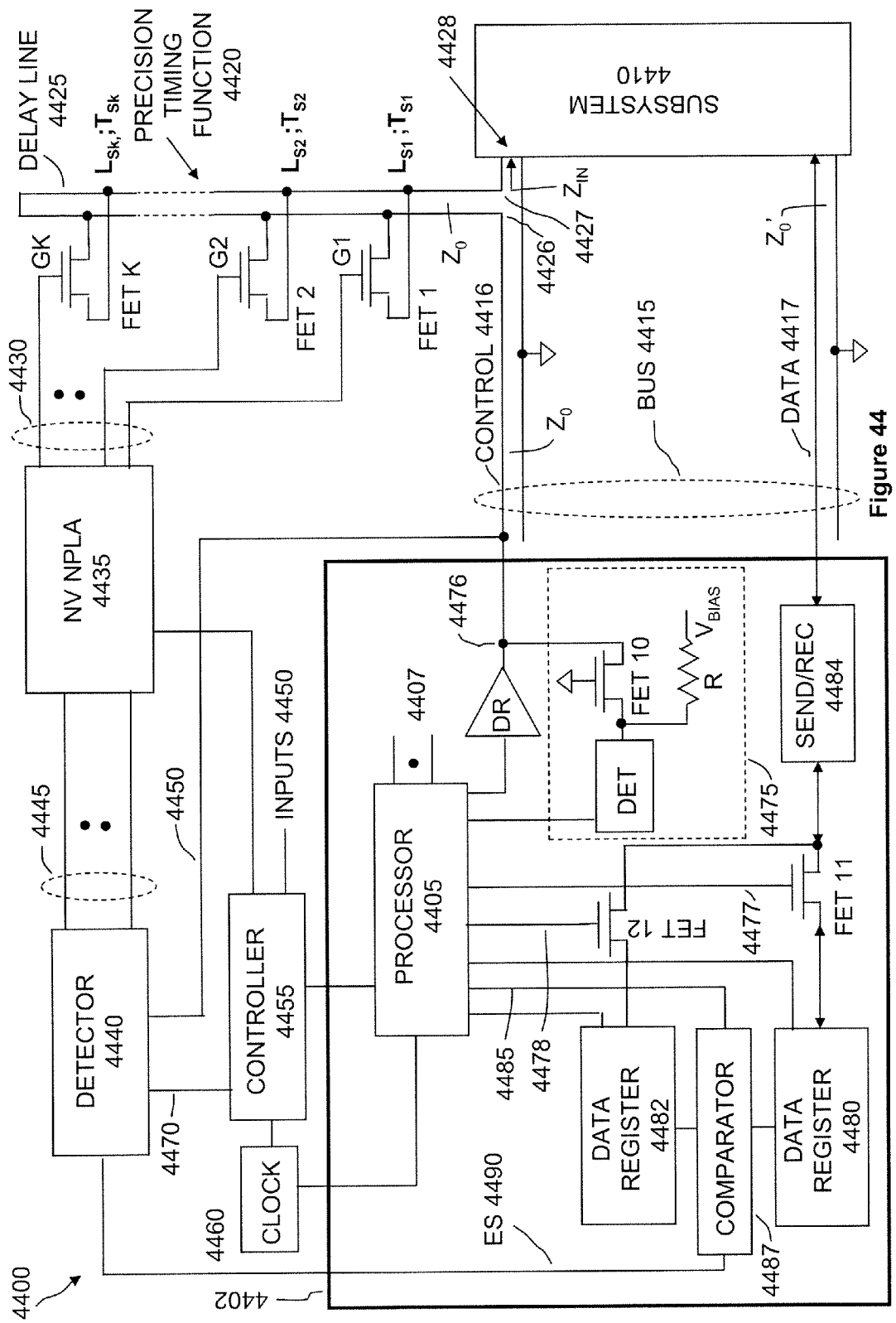
FIG. 44 shows a self-optimized NFPSoC in which FIG. 43 has been modified to include a precision timing function placed at the input of a subsystem function. The precision timing function uses a variable delay formed using a delay line with taps at various distances that may be activated or deactivated by a nonvolatile nanotube-based control circuit.

FIG. 44 shows self-optimized NFPSoC 4400, a subset of self-optimized NFPSoC 4300, in which a self-optimized subfunction 4402 of system 4310 shown in FIG. 43 includes processor 4405 with inputs and outputs 4407 that is connected to subsystem 4410 by BUS 4415. BUS 4415 includes control 4416 and data 4417 lines, and other lines and functions (not shown). In this example, control 4416 and data 4417 lines are near-zero loss transmission lines of characteristic impedance $Z_0$ designed for high speed operation. Receiving-end precision timing function 4420 is illustrated in FIG. 44. Precision timing function 4420 includes delay line 4425 whose two terminals 4426 and 4427 are connected to control 4416 line and subsystem 4410 input 4428 respectively. Precision timing function 4420 also includes FET 1, FET 2, ..., FET K connected to opposite sides of delay line 4425 at distance $L_{S1}$ from terminals 4426 and 4427 with time delay $T_{S1}$; distance $L_{S2}$ from terminals 4426 and 4427 with time delay $T_{S2}$; and distance $L_{SK}$ from terminals 4426 and 4427 with time delay $T_{SK}$, respectively. Gates G1, G2, and GK of FET1, FET2, ..., FETK, respectively, are controlled by outputs 4430 of NV NPLA 4435. If FET 1 is turned ON by gate G1, then the round trip delay between delay line 4425 terminals 4426 and 4427 and ON FET 1 located at distance $L_{S1}$ is $2T_{S1}$; if FET 2 is turned ON by gate G2 (FET 1 is OFF), then the round trip delay between delay line 4425 terminals 4426 and 4427 and ON FET 2 located at distance $L_{S2}$ is $2T_{S2}$; and if FET K is turned ON by gate GK (FET 1 and FET 2 are OFF), then the round trip delay between delay line 4425 terminals 4426 and 4427 and ON FET K located at distance $L_{SK}$ is $2T_{SK}$. In this example, FETs 1, 2, and K are in parallel with delay line 4425 and result in a reflected pulse of inverted polarity. However, a precision timing function may also be formed (not shown) with FETs in series with one side of a delay line resulting in an open circuit pulse reflection of the same polarity.

Detector 4440 provides outputs and received inputs using I/O lines 4445 between detector 4440 and NV NPLA 4435 which is also connected to controller 4455. Detector 4440 is connected to control 4416 line by wire 4450. As described further above with respect to detector 4350, detector 4440 monitors discrete operation (OP) codes in a stream of instructions and detects streams of instructions related to timing synchronization. Detector 4440 then activates NV NPLA 4435 which in turn activates FET 1, or FET 2, ..., or FET K to provide a reflected timing pulse that enables processor 4405 to sample data from data 4417 line during a valid data window as described above with respect to FIG. 42 for example. Detector 4440 is connected to controller 4455 by wire 4470 and also receives an error signal ES 4490 from comparator 4487 when processor 4405 sampled data from data 4417 line is incorrect. This self-optimized method applied to self-optimized NFPSoC 4400 is described further below.

Precision synchronization function (circuit) 4475 detects a timed inverted pulse reflection from delay line 4425 of precision timing function 4420 traveling on control 4416 line as described further below. Corresponding waveforms are illustrated by precision timing waveforms 4500 illustrated in FIG. 45. In the precision timing example of FIG. 45, subsystem 4410 is assumed to be a high speed cache memory subsystem, although this precision timing example may be used for various different subsystems, and the waveforms are idealized in the sense that rise and fall times are not shown and not needed to illustrate self-optimized NFPSoC 4400 operation. Self-optimized NFPSoC 4400 operation is based on an adaptation of timing control techniques described in Bertin et al. U.S. Pat. No. 6,177,807 issued Jan. 23, 2001, the entire contents of which are incorporated herein by reference. Precision timing waveforms 4500 illustrate clock waveform 4510, corresponding to clock 4460 illustrated in FIG. 44, highlights clock transitions 4510A and 4510B; timing control waveform 4520 on control 4416 line at processor 4405 shows sending pulse 4520A and reflected pulse 4520B; valid data strobe (data capture) pulse 4530A of waveform 4530 at processor 4405; timing control waveform 4540 on control 4416 line at input 4428 of memory subsystem 4410 includes receiving pulse 4540A that corresponds to sending pulse 4520A with a BUS 4415 delay of $T_{BUS}$ and reflected receiving pulse 4540B that corresponds to receiving pulse 4540A with a round trip delay of $2T_{SK}$ on delay line 4425 between terminals 4426 and 4427 and FET K in an ON state. Round trip delay $2T_{SK}$ corresponds to memory subsystem 4410 access time delay to first data out pulse 4550A on data 4417 line shown by waveform 4550 at memory subsystem 4410; first data in pulse 4560A on data 4417 line shown by waveform 4560 at processor 4405 corresponds to first data out pulse 4550A delayed by BUS 4415 delay $T_{BUS}$. The elapsed time between clock transition 4510A and clock transition 4510B, centered on data pulse 4560A, corresponds to system access time. System access time in a synchronized system may be expressed in terms of number of clock cycles from data request to data acquisition. For example, one, two, three, or more clock cycles of delay.

In this high speed example, control 4416 and data 4417 lines, and delay line 4425 may be formed using on-chip transmission lines formed with high conductivity conductors such as silver, copper, gold, or aluminum. These on-chip transmission lines may be parallel conductor strip lines or, for very high frequencies, may use enclosed on-chip transmission line conductor structures similar to those described in Bertin et al., U.S. Pat. No. 6,388,198 issued May 14, 2002, the entire contents of which are incorporated herein by reference. Control 4416 line and delay line 4425 are formed using a transmission line of characteristic impedance $Z_0$. Data 4417 line is also formed using a transmission line of characteristic impedance $Z_0'$. $Z_0'$ may have a different value or the same value as $Z_0$. Memory subsystem 4410 has an input characteristic impedance $Z_{IN} \ll Z_0$ to minimize reflections at input 4428. However, the input circuit at input 4428 may be designed to receive a reduced signal level and still trigger the data access function of memory subsystem 4410 upon the arrival of pulse 4540A. Pulse 4540A also propagates along delay line 4425. Values of $Z_0$ and $Z_0'$ may be in the range of 10 to 200 ohms for example. In this example, $Z_0$ and $Z_0'$ are typically in the range of 50 to 100 ohms. If $Z_0$ is 80 ohms, for example, then $Z_{IN}$ may be 15 ohms, for example without causing a significant impedance mismatch at input 4428 while enabling a sufficiently large signal to trigger a memory subsystem 4410 operation.

In operation, precision synchronization function 4475 is designed to detect reflected inverted pulse 4520B. Driver DR applies timing pulse 4520A to node 4476 attached to control 4416 line and then is switched to a tristate mode, for example. Pulse 4520A arrives at input 4428 to trigger, in this example, a memory subsystem 4410 data access memory cycle as illustrated further above with respect to FIG. 45. Pulse 4540A continues on delay line 4425 and is reflected and inverted at position $L_{SK}$ and propagates on control 4416 line and arrives at node 4476. FET 10 with a grounded gate is in an OFF state when node 4476 is at a positive voltage. Negative voltage 4520B pulse turns FET 100N for the duration of pulse 4520B. Detector DET detects a drop in voltage below $V_{BIAS}$ as a current pulse flows through resistor R. The resistor R value is chosen such that R plus the FET 10 ON channel resistance is approximately equal to $Z_O$, 80 ohms in this example, to prevent a reflection of pulse 4520B at node 4476. A detector output signal to processor 4405 results in a positive voltage applied by processor 4405 to wire 4477 to activate FET 11 if data pulse 4560A (and subsequent data pulses) are to be stored in data register 4480; or a positive voltage to wire 4478 to activate to FET 12 if data pulse 4560A (and subsequent data pulses) is to be stored in data register 4482. The same data may be stored in both data registers 4480 and 4482 if both FET 11 and FET 12 are activated. Data pulse 4560A (and subsequent data pulses) pass through send/receive circuit SEND/REC 4484.

Figure 45:
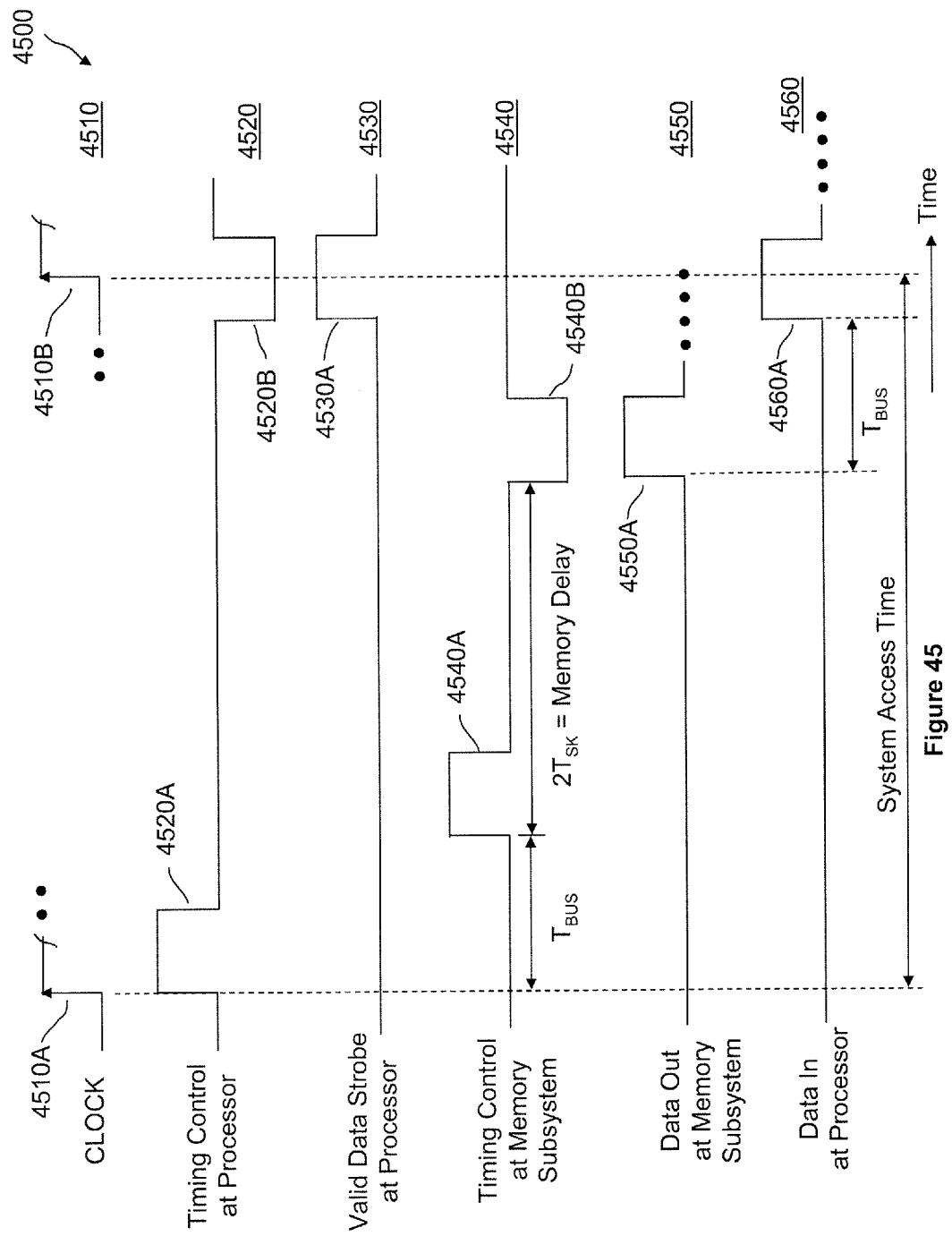
FIG. 45 shows an example of timing waveforms for the self-optimized NFPSoC function of FIG. 44.

In operation, self-optimized NFPSoC 4400 optimizes pulse timing for various processor operating speeds, subsystem types and speed of operation, subsystem placement with respect to the processor, and other variables in such a way that data such as data pulse 4560A illustrated in FIG. 45 arrive at node 4476 when a valid data strobe (data capture) pulse such as strobe pulse 4530A is generated by processor 4405. Strobe pulse 4530A may coincide with a clock transition such as clock transition 4510B after one, two, three, or more clock cycles.

Controller 4455 initiates a self-optimized programming mode which optimizes self-optimized NFPSoC 4400 operation for a configuration such as illustrated in FIG. 44, FIG. 43, or other configurations (not shown), with various power/performance (speed) operating points and associated timing requirements. Self-optimization may be accomplished as follows for self-optimized NFPSoC 4400 illustrated in FIG. 44. Controller 4455 selects a clock speed and system access time for a particular operation such as fetch data from memory subsystem 4410 and selects a system access time of two clock cycles for example. Controller 4455 assigns a discrete operation (OP) code (bit set) to form a discrete instruction (bit set) which is sent to detector 4440. Detector 4440 may store the bit set on a nonvolatile NRAM® (not shown) or in NV NPLA 4435 for example. Next, controller 4455 provides a set of test data bits that are stored in data register 4482 and then transmitted through FET 12 and send/receive circuit SEND/REC 4484 to data 4417 line to memory subsystem 4410 and stored. Then, controller 4455 instructs processor 4405 to execute a data retrieve operation as described above with respect to FIG. 45 to retrieve the same data. Controller 4455 also programs NV NPLA 4435 to recognize the corresponding bit set and to apply an output voltage on one of outputs 4430 lines to a gate such as gate G1, G2, or GK thereby activating corresponding FETs 1, 2, or K used to set valid data strobe pulse 4530A timing as illustrated in FIG. 45. Data pulse 4560A and subsequent data pulses are stored in data register 4480 as described further above. At this point in the timing cycle, processor 4405 is instructed to activate comparator 4487 using wire 4485. If the data in data registers 4482 and 4480 match, then no error signal is sent to detector 4440. However, if the data do not match, then controller 4455 changes the timing by reprogramming NV NPLA 4435 and repeating the self-optimization cycle. NV NPLA 4435 may be programmed and reprogrammed multiple times. When error signal 4490 goes away, then the optimization cycle for this operation at this clock speed is complete. Controller 4455 then goes on to define the next discrete instruction (bit set) for another operation. When controller 4455 has optimized all instructions (bit sets) for all desired operations at various clock speeds and power/performance operating points, then controller 4455 switches from the self-optimized programming mode described further above to the self-optimized NFPSoC 4400 operating mode.

FIG. 46 illustrates table 4600 which gives propagation velocity in cm/ns for various materials with various electric constants $\in_R$ as described in the reference H. B Bakoglu, "Circuits, Interconnections, and Packaging for VLSI," Addison-Wesley Publishing Company, 1990, pp. 230-234 the entire contents of which are incorporated herein by reference. Transmission line lengths $L_S$ correspond to $L_{S1}$, $L_{S2}$, and $L_{SK}$ used for precision timing control in delay line 4425 illustrated in FIG. 44. Table 4600 gives $L_S$ values for various time delay increments such as 1 ps, 0.1 ps, and 0.01 ps as a function of dielectric constant. Even for the smallest time increment of 0.01 ps (10 femto seconds) and the highest dielectric constant, the line length $L_S$ is 0.65 um. Delay line length control is precise because geometric control is precise which results in precise timing control even at very high frequencies (data rates).

In operation, self-optimized NFPSoC 4400 timing is adjusted by a combination of detector 4440 and NV NPLA 4435. Detector 4440 monitors control 4416 line and detects pre-programmed discrete operation (OP) code (bit sets) and activates pre-programmed timing setting outputted by NV NPLA 4435 as described further above with respect to FIGS. 44 and 45 thereby optimizing power/performance for the various operations performed by the self-optimized NFPSoC 4400 system.

Self-optimized NFPSoC 4300 illustrated in FIG. 43 may apply the self-optimized programming and operating methods described with respect to FIG. 44. System 4310 includes a controller function corresponding to controller 4455 and various other functions to enable self-optimized programming and operation as described with respect to FIG. 44. Table 4700 illustrated in FIG. 47 is an example of self-optimized NFPSoC 4300 illustrated in FIG. 43 in which subsystem 4320 is a memory subsystem with system access time for valid data to system 4310 of one clock cycle; subsystem 4330 is a memory subsystem with system access time for valid data to system 4310 in two clock cycles; subsystem 4340 is a memory subsystem with system access time for valid data to system 4310 in three clock cycles. The clock operating speed in this example is 100 MHs. Corresponding delay line lengths corresponding to delay line 4425 illustrated in FIG. 44 are given as well as round trip delay times such as 2TS1, 2TS2, and 2TS3 corresponding to memory subsystem data access times as described further above with respect to FIGS. 44 and 45.

Figure 48:
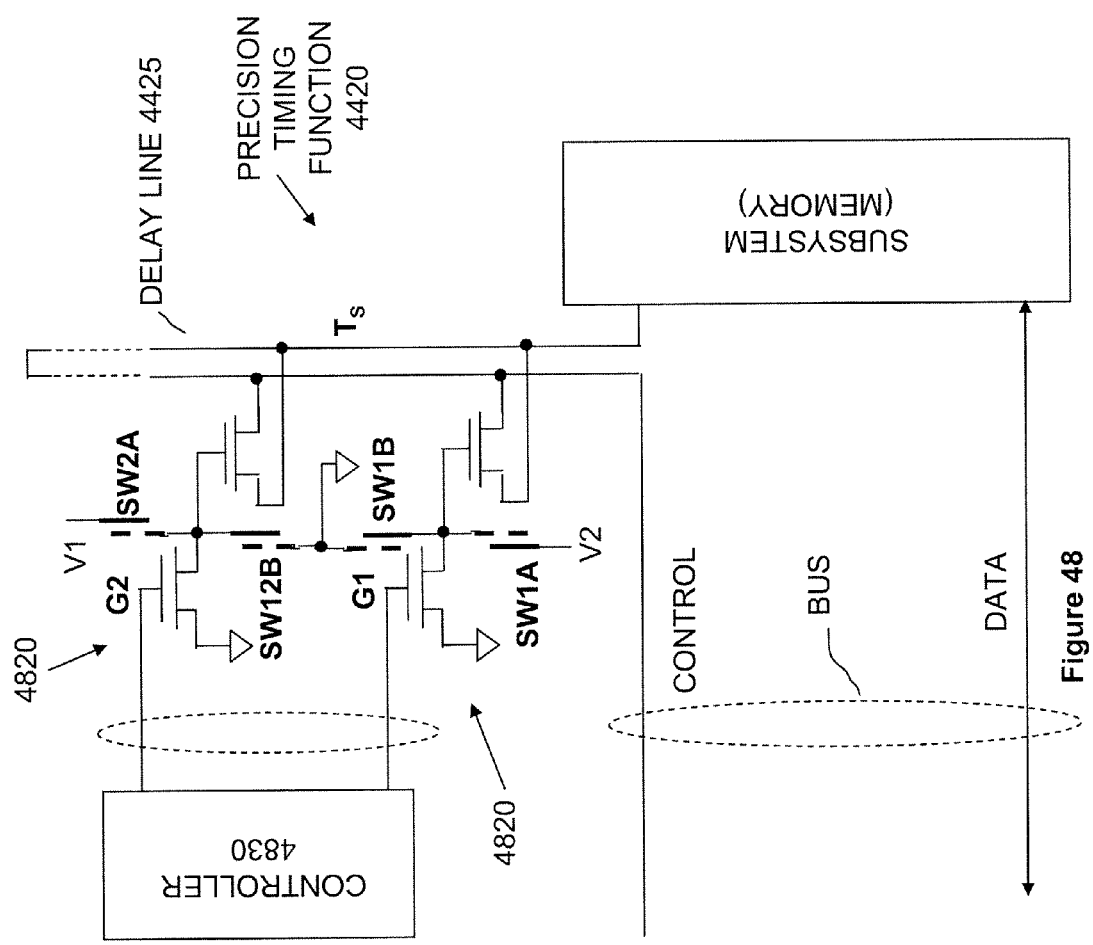
FIG. 48 shows a precision timing function in which a timing selection is programmed into NanoLogic® nonvolatile nanotube (NV NT) select circuits.

FIG. 48 illustrates precision timing function 4420 details in which timing selection is programmed into NV NT select circuits 4810 and 4820 by controller 4830. NV NT select circuits 4810 and 4820 correspond to NanoLogic® 1240 illustrated further above in FIG. 12B.

Power Reduction Using Capacitance to Control SET and/or RESET Operations

Capacitive loads in series with NV NT switches may be used to limit SET current flow through NV NT switches. A gate added to NV NT switches that electrostatically couples to the patterned nanotube fabric of the two-terminal nanotube fabric enables a SET operation with no SET current flowing through the switch. These structures enable power reduction and also may be used to enhance security as described further below. Nanotube fabric is formed with metallic and semiconducting nanotubes. However, similar switching behavior would occur with metallic-only nanotube fabric or semiconducting-only nanotube fabric.

Capacitive Loads & Sources in 2-Terminal NV NT Switch SET and RESET Operations

Capacitive Loads

Figure 49A:
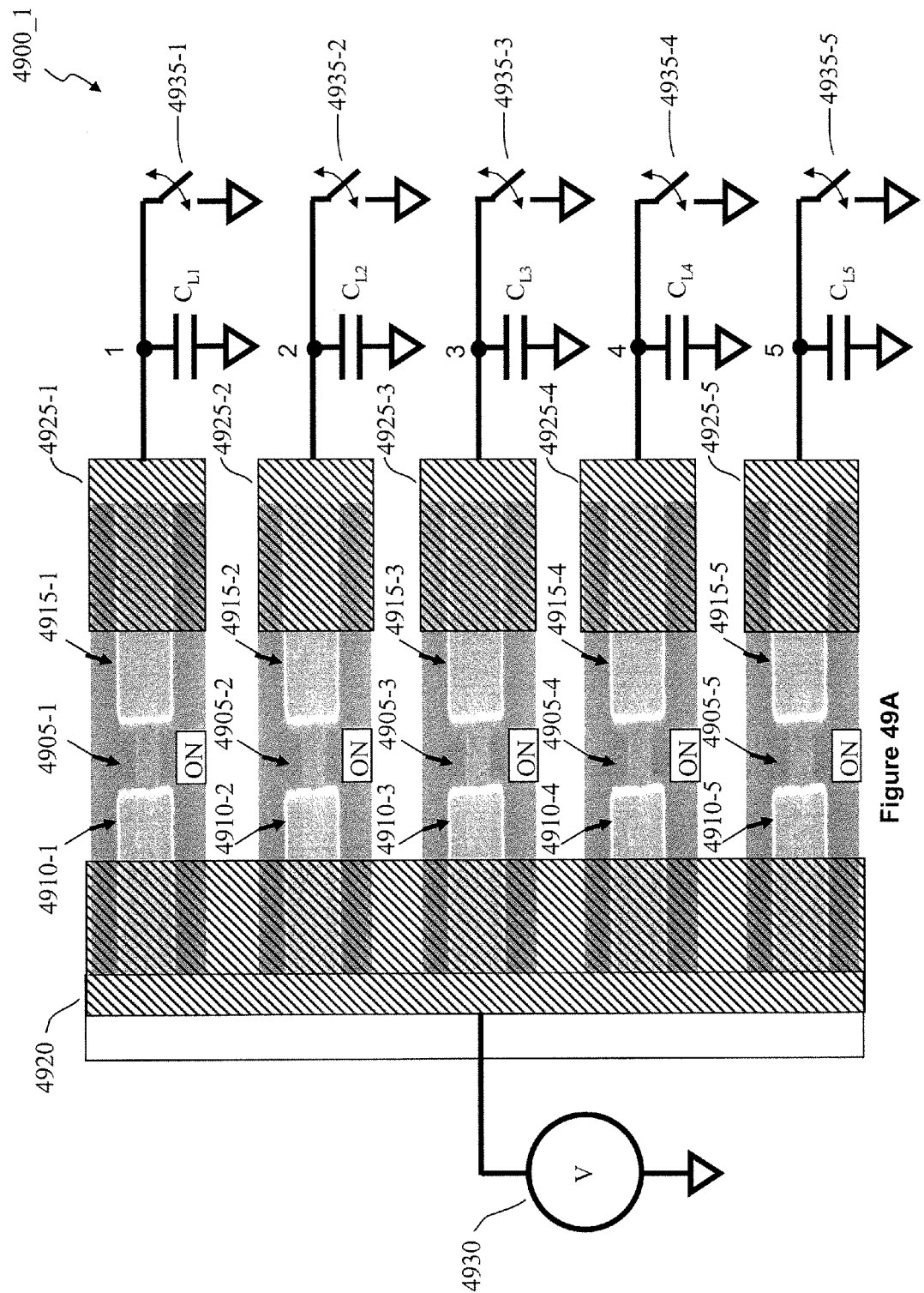
FIG. 49A shows a plan view of several NV NT switches, each in an ON low resistance state with a capacitive load.
Figure 49C:
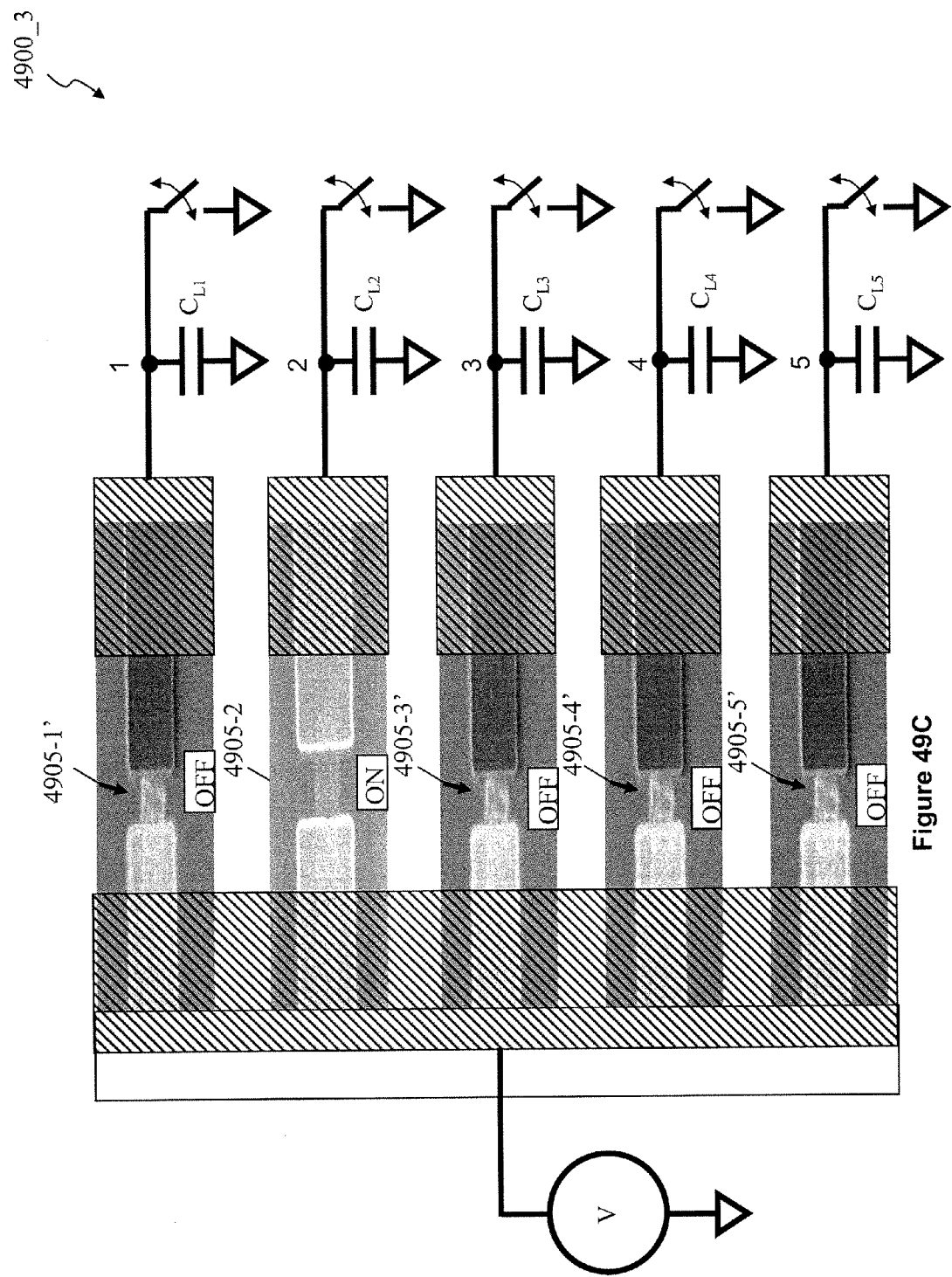
FIG. 49C shows a plan view of the NV NT switches shown in FIG. 49B with all but one of the NV NT switches with capacitive loads in an OFF high resistance state. One NV NT switch with capacitive loads is in an ON low resistance state.

FIGS. 49A, 49B, and 49C illustrate NV NT switch configurations 4900_1, 4900_2, and 4900_3, respectively, illustrating five two-terminal NV NT switches on a test site with patterned nanotube fabric 4905-1 in contact with terminal 4910-1 and terminal 4915-1; patterned nanotube fabric 4905-2 in contact with terminal 4910-2 and terminal 4915-2; patterned nanotube fabric 4905-3 in contact with terminal 4910-3 and terminal 4915-3; patterned nanotube fabric 4905-4 in contact with terminal 4910-4 and terminal 4915-4; and patterned nanotube fabric 4905-5 in contact with terminal 4910-5 and terminal 4915-5. Contact 4920 contacts and electrically connects NV NT switch terminals 4910-1, 4910-2, 4910-3, 4910-4, and 4910-5 in parallel and contact 4925-1 contacts NV NT switch terminal 4915-1; contact 4925-2 contacts NV NT switch terminal 4915-2; contact 4925-3 contacts NV NT switch terminal 4915-3; contact 4925-4 contacts NV NT switch terminal 4915-4; and contact 4925-5 contacts NV NT switch terminal 4915-5. Contact 4920 is electrically connected to voltage source 4930 that applies a voltage to contact 4920 relative to a common reference such as ground. Contact 4925-1 is electrically connected to a first terminal of a capacitive load $C_{L1}$ and a second terminal of capacitive load $C_{L1}$ is connected to a common reference such as ground. Contact 4925-1 is also connected to a first terminal of switch 4935-1 and the second terminal of switch 4935-1 is connected to a common reference such as ground. Switch 4935-1 and capacitive load $C_{L1}$ are electrically connected in parallel. Contact 4925-2 is electrically connected to a first terminal of a capacitive load $C_{L2}$ and a second terminal of capacitive load $C_{L2}$ is connected to a common reference such as ground. Contact 4925-2 is also connected to a first terminal of switch 4935-2 and the second terminal of switch 4935-2 is connected to a common reference such as ground. Switch 4935-2 and capacitive load $C_{L2}$ are electrically connected in parallel. Contact 4925-3 is electrically connected to a first terminal of a capacitive load $C_{L3}$ and a second terminal of capacitive load $C_{L3}$ is connected to a common reference such as ground. Contact 4925-3 is also connected to a first terminal of switch 4935-3 and the second terminal of switch 4935-3 is connected to a common reference such as ground. Switch 4935-3 and capacitive load $C_{L3}$ are electrically connected in parallel. Contact 4925-4 is electrically connected to a first terminal of a capacitive load $C_{L4}$ and a second terminal of capacitive load $C_{L4}$ is connected to a common reference such as ground. Contact 4925-4 is also connected to a first terminal of switch 4935-4 and the second terminal of switch 4935-4 is connected to a common reference such as ground. Switch 4935-4 and capacitive load $C_{L4}$ are electrically connected in parallel. Contact 4925-5 is electrically connected to a first terminal of a capacitive load $C_{L5}$ and a second terminal of capacitive load $C_{L5}$ is connected to a common reference such as ground. Contact 4925-5 is also connected to a first terminal of switch 4935-5 and the second terminal of switch 4935-5 is connected to a common reference such as ground. Switch 4935-5 and capacitive load $C_{L5}$ are electrically connected in parallel. The operation of individual NV NT switches has been explained in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NON-VOLATILE NANOTUBE DIODES AND NONVOLATILE NANOTUBE BLOCKS AND SYSTEMS USING SAME AND METHODS OF MAKING SAME," filed on Aug. 8, 2007, U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007, U.S. patent application Ser. No. 12/273,807, entitled "NON-VOLATILE NANOTUBE DIODES AND NONVOLATILE NANOTUBE BLOCKS AND SYSTEMS USING SAME AND METHODS OF MAKING SAME," filed on Nov. 19, 2008, and U.S. patent application Ser. No. 12/356,447, entitled "Nonvolatile Nanotube Diodes and Nonvolatile Nanotube Blocks and Systems Using Same and Methods of Making Same," filed on Jan. 20, 2009.

Programming (SET) voltages are typically in the range of 3 to 6 volts and erase (RESET) voltages are typically in the 4 to 10 volts range. Capacitive loads $C_{L1}$-$C_{L5}$ may be varied between a relatively high value of 40 fF by adding an external capacitance to each of the nodes 1, 2, 3, 4, and 5 and a relatively low value of 10 fF with the test site wiring as-is (no additional external capacitance).

FIG. 49A illustrates NV NT switch configuration 4900-1 in which all switches are in an ON state. In the ON state, the resistance between corresponding terminals of NV NT switches in this example is typically in the range of 200 kΩ-2 MΩ. FIG. 49B illustrates NV NT switch configuration 4900-2 in which all switches are in an OFF state. In the OFF state, the resistance between corresponding terminals of NV NT switches is typically at least 1 GΩ, and 10 GΩ or higher for most of the NV NT switches. FIG. 49C illustrates NV NT switch configuration 4900-3 in which all switches are in an OFF state except for one switch in an ON state. For the NV NT switch in an ON state, the resistance between corresponding terminals of NV NT switches is typically in the range of 200 kΩ-2 MΩ. The other four NV NT switches in OFF states have resistances of at least 1 GΩ and 10 GΩ or higher for most of the NV NT switches.

In operation, switches 4935-1 to 4935-5 are closed and nodes 1-5, respectively, are held a common voltage such as ground. The five switches corresponding to nodes 1-5 are cycled between low and high resistance states by program (SET) and erase (RESET) operations, respectively, multiple times to verify switch operation. The NV NT switches are left in an ON state. NV NT switch operations are independent of voltage polarity and the direction of current flow.

Next, switches 4935-1 to 4935-5 are opened and external capacitance values are added to nodes 1-5 such that $C_{L1}$-$C_{L5}$ are each equal to approximately 40 fF and the ability of NV NT switches to RESET, that is, transition from a low resistance ON state to a high resistance OFF state each with a 40 fF capacitive load is evaluated (tested). A RESET (erase) operation is performed when voltage source 4930 applies an approximately −10 volt pulse to contact 4920 (measurements using positive applied voltages also demonstrate RESET from low to high resistance). Current flows through each of the NV NT switches in an ON state charging capacitors $C_{L1}$-$C_{L5}$ and thereby limiting the current flow to a charge pulse. The amount of current flow is limited by charging capacitive loads $C_{L1}$-$C_{L5}$ and by the transition from low resistance ON states to high resistance OFF states. All five two-terminal NV NT switches transition from low resistance ON states illustrated in FIG. 49A to high resistance OFF states illustrated in FIG. 49B. The electrically continuous low resistance ON state of patterned nanotube fabric 4905-1 illustrated in FIG. 49A transitions to the electrically near-discontinuous high resistance OFF state of patterned fabric 4905-1' illustrated in FIG. 49B. The electrically continuous low resistance ON state of patterned nanotube fabric 4905-2 illustrated in FIG. 49A transitions to the electrically near-discontinuous high resistance OFF state of patterned fabric 4905-2' illustrated in FIG. 49B. The electrically continuous low resistance ON state of patterned nanotube fabric 4905-3 illustrated in FIG. 49A transitions to the electrically near-discontinuous high resistance OFF state of patterned fabric 4905-3' illustrated in FIG. 49B. The electrically continuous low resistance ON state of patterned nanotube fabric 4905-4 illustrated in FIG. 49A transitions to the electrically near-discontinuous high resistance OFF state of patterned fabric 4905-4' illustrated in FIG. 49B. The electrically continuous low resistance ON state of patterned nanotube fabric 4905-5 illustrated in FIG. 49A transitions to the electrically near-discontinuous high resistance OFF state of patterned fabric 4905-5' illustrated in FIG. 49B. The measured resistance value between NV NT switch terminal pairs includes the resistance of the patterned nanotube fabric and the contact resistance between each terminal and the patterned nanotube fabric.

Then, the external capacitance is removed from nodes 1-5 such that each of the capacitive loads $C_{L1}$-$C_{L5}$ are each equal to approximately 10 fF and the test described further above is repeated. The same RESET (erase) transition for the same applied voltage described further above for 40 fF capacitive loads occurs with approximately 10 fF capacitive load and the two-terminal NV NT switches illustrated in ON states in FIG. 49A transition to OFF states illustrated in FIG. 49B.

Next, switches 4935-1 to 4935-5 remain opened and an external capacitance value is added to node 2 such that $C_{L1}$ is equal to approximately 40 fF while nodes 1, 3, 4, and 5 remain at a capacitive load of 10 fF. The ability of NV NT switches to SET, that is, transition from a high resistance OFF state to a low resistance ON state is evaluated (tested) when voltage source 4930 applies a 6 volt SET (program) voltage to contact 4920. In this case, the NV NT switch connected to node 2 with a capacitive load $C_{L2}$ approximately equal to 40 fF switches to a low resistance ON state with continuous patterned nanotube fabric 4905-2 while the other four switches each connected to a capacitive load of 10 fF do not switch and remain in a high resistance OFF state.

In order to perform both SET and RESET operations with a capacitive load, the value of the load capacitance needs to be approximately 40 fF (or higher).

Capacitive Sources

Figure 50:
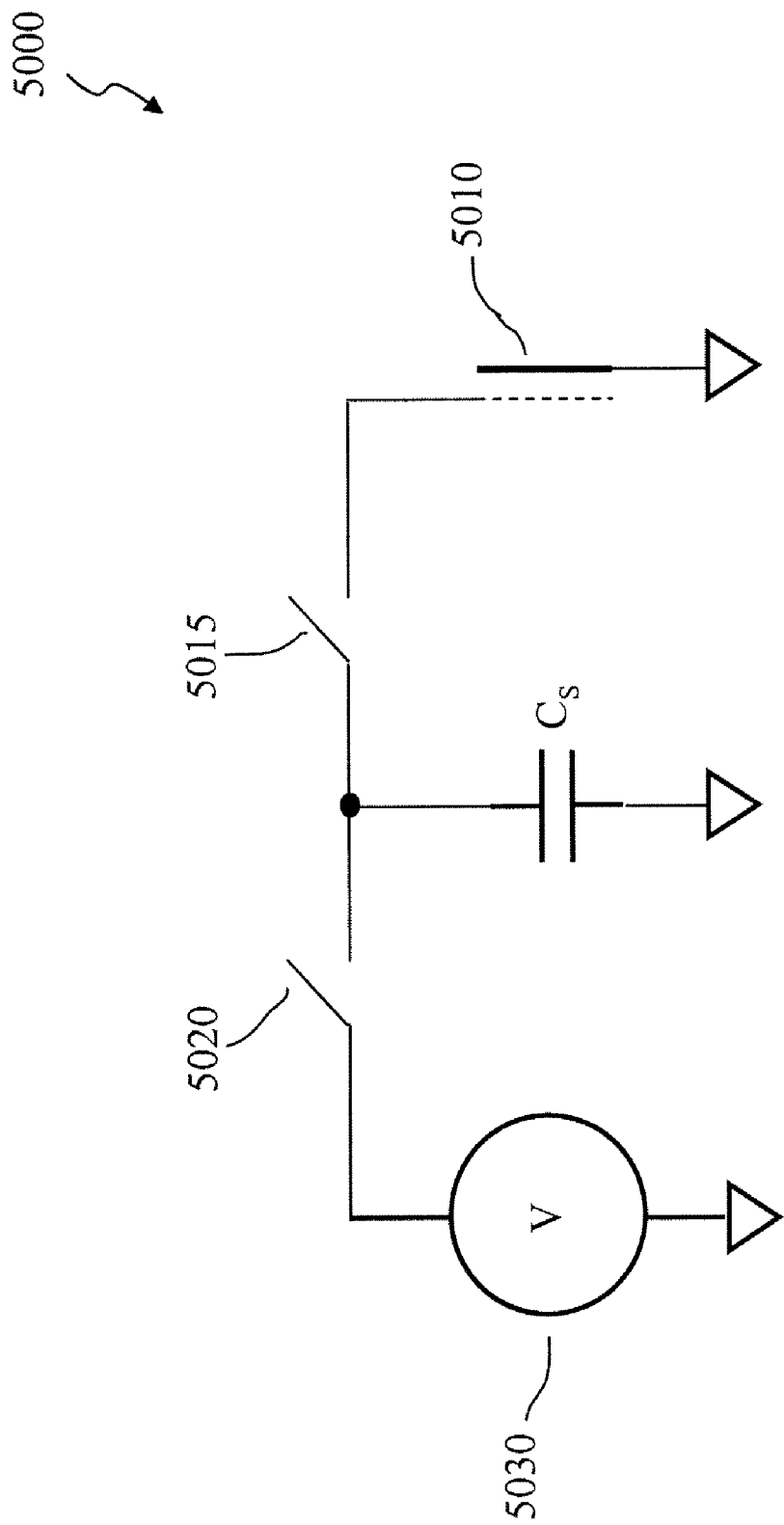
FIG. 50 is a schematic representation of a NV NT switch with a pre-charged capacitive voltage source.

FIG. 50 illustrates a schematic representation of a capacitive source drive circuit 5000 in which NV NT switch 5010, shown schematically, is connected to switch 5015 which is, in turn, connected to capacitive source $C_S$. Voltage source 5030 is connected to switch 5020 which is also connected to capacitive source $C_S$. Capacitive source $C_S$ delivers a predetermined amount of charge to NV NT switch 5010. One or more charge packets may be delivered to NV NT switch 5010 to achieve a desired resistance state. Using charge packets may reduce power dissipation and may result in better control over resistance changes.

A first node of NV NT switch 5010 is connected to a first node of switch 5015 and a second node of NV NT switch 5010 is connected to a reference voltage such as ground. A second node of switch 5015 is connected to a first node of capacitive source $C_S$ and also to a first node of switch 5020. A second node of capacitive source $C_S$ is connected to a reference voltage such as ground. A second node of switch 5020 is connected to voltage source 5030 which delivers a voltage V to the second node of switch 5020 with respect to a reference voltage such as ground.

In operation, switch 5015 is open and NV NT switch 5010 is disconnected from capacitive source $C_S$; switch 5020 is closed and voltage source 5030 charges capacitive source $C_S$ to voltage V thereby storing a charge $Q=C_S V$ on capacitor $C_S$.

Next, switch 5020 is opened and then switch 5015 is closed and applies charge $Q=C_S V$ to NV NT switch 5010. NV NT switch may switch from an ON state to an OFF state; or from an OFF state to an ON state; or may change resistance value by an amount $\Delta R$ corresponding to applied charge $Q=C_S V$. The amount of charge Q required to produce various changes in NV NT switch 5010 resistance $\Delta R$ may be determined experimentally using methods similar to those used to determine $\Delta R$ as a function of current as described in incorporated U.S. patent application Ser. No. 11/835,612, entitled "NON-VOLATILE RESISTIVE MEMORIES HAVING SCALABLE TWO-TERMINAL NANOTUBE SWITCHES", filed on Aug. 8, 2007.

In one example, $C_S$ may be the bit line capacitance of a bit line in an NRAM® array such as nonvolatile NRAM® array schematic 1900 illustrated further above in FIG. 19, and voltage source 5030 and switch 5020 may represent a bit line pre-charge circuit. Switch 5015 may represent a select FET of a cell with NV NT switch 5010 as a nonvolatile storage node. In another example, $C_S$ may be used to change the value of NV NT switches used in NV NT select circuits such as NV NT select circuit 1150 illustrated in FIG. 11B. In still another example, $C_S$ may be used to change the value of NV NT switches used in series/parallel resistor/capacitor network 4010 illustrated further above in FIGS. 40A and 40B.

Gated Two-Terminal NV NT Switches Forming a Three-Terminal Gated NV NT Switch with the Gate Capacitively Coupled to the Nanotube Fabric Region Three-Terminal Gated NV NT Switch Electrical Test Results It is desirable to add a gate to form a gated nonvolatile nanotube switch for use in NRAM® and NanoLogic® applications. FIG. 51A illustrates three-terminal NV NT switch 5100 in a low resistance ON or SET state and FIG. 51B illustrates three-terminal NV NT switch 5100' in a high resistance OFF or RESET state. NV NT switch 5100 and 5100' represent the same switch in low and high resistance states respectively. Nanotube fabric 5120 is in a low resistance ON state; an X is used to designate the high resistance state of nanotube fabric 5120'. Nanotube fabric 5120 and 5120' represent the same nanotube fabric in low and high resistance states, respectively. This nanotube fabric includes both metallic and semiconducting nanotubes. FIG. 51A illustrating a low resistance ON state corresponds to FIG. 10B and FIG. 51B illustrating a high resistance state corresponds to FIG. 10C.

In this example, nanotube fabric 5120 has been deposited and patterned on insulator 5115 which is in contact with silicon (Si) substrate 5110. Terminals 5125 and 5130 are in contact the two ends of nanotube fabric 5120 and are separated by a switch length $L_{SW-CH}$. Silicon substrate 5110 is degeneratively doped (n++) and insulator 5115 is a $SiO_2$ film of approximately 20 nm (200 Ang.) thickness. In this example, the low resistance ON state between terminals 5125 and 5130 is typically in the range of 100 kΩ to 1 MΩ and the high resistance state is approximately 900 MΩ as illustrated further below with respect to FIG. 52. In this example, substrate 5110 is used as a gate that is capacitively coupled to nanofabric 5120 (and 5120').

Figure 52:
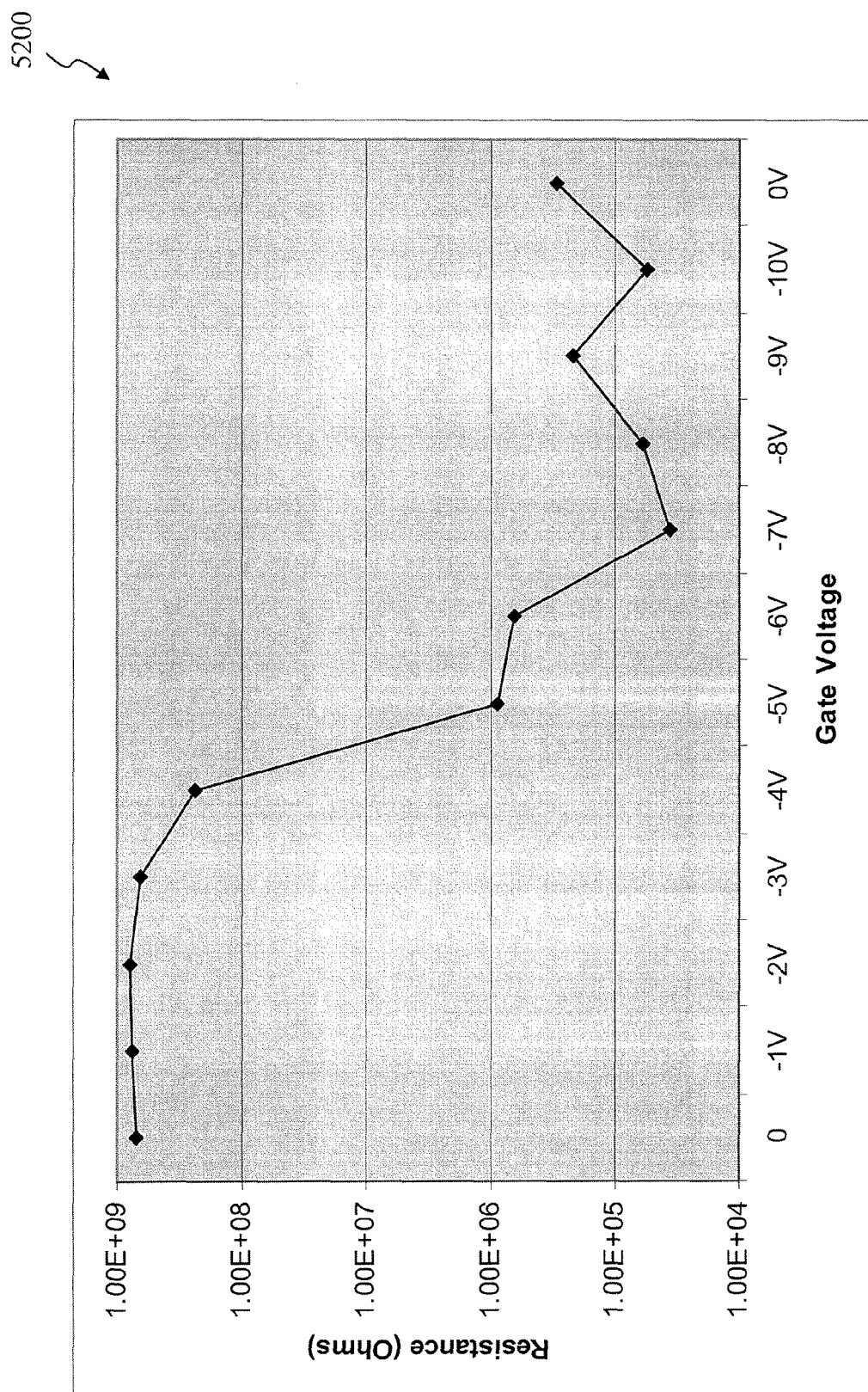
FIG. 52 shows the substrate-gated NV NT switch of FIG. 51B as it transitions from a high resistance OFF or RESET state to a low resistance ON or SET shown in FIG. 51A state as a function of an applied voltage pulses between the substrate and NV NT switch terminals.

In operation, NV NT switch 5100 may be switched between low and high resistance states and back to low resistance states as a two-terminal nonvolatile nanotube switch with current flowing between terminals 5125 and 5130 during SET and RESET operations as described in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007, without the use of substrate 5110 as a gate. FIG. 52 illustrates NV NT switch resistance 5200 as a function of gate voltage (substrate 5110 voltage) as a third terminal and applied with respect to terminals 5125 and 5130 and represents a capacitively coupled SET (CC SET) operation with no SET current flowing between terminals 5125 and 5130. NV NT switch 5100' is in a high resistance state of approximately 900 MΩ prior to transitioning to a low resistance state of 100 kΩ to 1 MΩ corresponding to NV NT switch 5100 when the gate voltage reaches approximately −5 to −6 volts with no current flowing between terminals 5125 and 5130. The three-terminal NV NT switch was also pulsed with positive gate voltage with similar results demonstrating no sensitivity to gate voltage polarity, therefore positive gate voltages may be used instead. FIG. 52 illustrates the NV NT switch resistance value measured between terminals 5125 and 5130 after each pulse of voltage applied to the gate (substrate 5110 voltage) relative to terminals 5125 and 5130 in a capacitively coupled SET operation in which no SET current flows in the nanotube fabric between terminals 5125 and 5130 during switching.

Capacitively coupled SET operations have also been tested in which a gate (substrate 5110 gate) voltage is applied with respect to one of the terminals such as terminal 5125 which held at a reference voltage such as ground. The other terminal such as terminal 5130 was held at a relatively high voltage such as 3-6 volts higher for example. The NV NT switch is in a high resistance state such as NV NT switch 5100' prior to the CC SET operation. When a capacitively coupled SET operation voltage is applied, switch NV NT switch 5100' transitions to a low resistance state NV NT switch 5100. The capacitively coupled SET operation voltage may be lower than 6 volts in this example because of the voltage applied to terminal 5130.

Capacitively coupled SET operations result in a transition from a high resistance state to a low resistance state if both terminals 5125 and 5130 are at the same reference voltage such as ground or if one of the terminals such as terminal 5125 is at a reference voltage such as ground and the other terminal such as terminal 5130 is at a relatively high voltage. SET operations in three-terminal gated NV NT switches can be performed using the capacitively coupled gate or by applying voltage directly across the two terminals connected directly to the nanotube fabric.

A three-terminal gated NV NT switch in a low resistance ON (SET) state remains in the low resistance ON state regardless of the voltage applied to the gate. In other words, the gate voltage cannot be used to force a transition from a low to a high resistance state (a RESET) for three-terminal gated NV NT switches. A RESET operation must be performed by applying RESET voltage and current directly to the pair of terminals in contact with the nanotube fabric such as terminals 5125 and 5130 in this example as described in incorporated U.S. patent application Ser. No. 11/280,786, entitled "Two-terminal nanotube devices and systems and methods of making same," filed on Nov. 15, 2005, U.S. Pat. No. 7,479,654, entitled "MEMORY ARRAYS USING NANOTUBE ARTICLES WITH REPROGRAMMABLE RESISTANCE," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007.

Power Dissipation for Capacitively Coupled Set Operations with No Current Flow Compared with SET Operations with Current Flow Power dissipation for a capacitively coupled SET operation is much lower than the power dissipation when current flows through the film in a typical 2-T switch SET operation. SET operations and capacitively coupled SET operations may use one or more pulses. The following assumptions are used in this example corresponding to the structure illustrated in FIG. 51:

NV NT switch 5100 has a nanotube fabric length $L_{SW-CH}$=100 nm and a width W=100 nm. Terminals 5125 and 5130 are each 100×100 nm;

Insulator 5115 is 20 nm thick (200 Ang.) and is $SiO_2$;

Several 6 volts SET pulses of periodicity 20 us and 50% duty cycle may be used. For capacitively coupled SET operations (no SET current flows during switching) and for SET operations (SET current flows during switching). The current flowing during switching may be 10 uA for example.

Capacitively coupled SET (CC SET) operation power dissipation: In a capacitively coupled SET operation the set voltage is capacitively coupled to the NV NT switch and no current flows through the switch. The power dissipation during a capacitively coupled SET operation may be estimated by $P_{CC-SET}=(1/\tau)C_{OX}V^2$ where τ is a pulse periodicity of 20 us in this example; $C_{OX}=[\epsilon_{OX}(L_{SW-CW}+L_{TERM1}+L_{TERM2})W]/T_{OX}$ where $L_{TERM1}$ refers to the length of terminal 5125 and $L_{TERM2}$ refers to the length of terminal 5130. $L_{SW-CH}$, $L_{TERM1}$, and $L_{TERM2}$ all have the same width W. $T_{OX}$ refers to the thickness of insulator 5115, in this example the insulator is $SiO_2$ and $\epsilon_{OX}$ is the dielectric constant of $SiO_2$. The calculation of capacitance $C_{OX}$ is described in the reference R. J. Baker et al., "CMOS Circuit Design, Layout, and Simulation," IEEE Press, 1998, p. 84. For $SiO_2$, $\epsilon_{OX}$=3.97×8.85 aF/um=35.1 aF/um. Based on the dimensions of the gated NV NT switch described further above, the gate oxide capacitance $C_{OX}$=52.7 aF=52.7×10$^{-18}$ F. For V=6 volts, $C_{OX}$=52.7 aF and a pulse periodicity τ=20 us, the power dissipation during a capacitively coupled SET operation is approximately $P_{CC-SET}=94.9$ pW (pico-Watts).

SET operation power dissipation: In a SET operation the SET voltage is applied between terminals 5125 and 5130 and a SET current flows through the switch. In this example, the current is approximately 10 uA. For a 50% duty cycle, the SET power dissipation is approximately equal to $P_{SET}=(\frac{1}{2})$ IV. For an applied voltage of approximately 6 volts and a current of approximately 10 uA, the SET operation power dissipation is approximately $P_{SET}=30$ uW (micro Watt) which is much larger than $P_{CC-SET}$ which is approximately equal to 94.5 pW as described further above.

Examples of Various Three-Terminal Gated NV NT Switch Structures for Use as Capacitively Coupled SET Switches FIG. 53 illustrates a structural example of three-terminal gated NV NT switch (3-T G NV NT switch) 5300 which may also be referred to as three-terminal capacitively coupled NV NT switch (3-T CC NV NT switch) 5300. These terms may be used interchangeably. 3-T G NV NT switch 5300 is similar to NV NT switch 5100 illustrated in FIG. 51 except that gate 5310 replaces substrate 5110 as the gating element.

In this example, nanotube fabric 5320 has been deposited and patterned on insulator 5315. Insulator 5315 includes embedded gate 5310 such that the separation between the top of embedded gate 5410 and the bottom of nanotube fabric 5320 is relatively thin (2 to 20 nm for example) in the $L_{SW-CH}$ region. Insulator 5315 may be formed of $SiO_2$, SiN, alumina, polyimide, or other dielectric material. Terminals 5325 and 5330 are in contact the two ends of nanotube fabric 5320 and are separated by a switch length $L_{SW-CH}$. In this example, the low resistance ON state between terminals 5125 and 5130 is typically in the range of 100 kΩ to 2 MΩ and the high resistance state is typically 100 MΩ and higher. (1 GΩ and above for example). The operation of 3-T G NV NT switch 5300 corresponds to the operation described further above with respect to gated NV NT switch 5100 illustrated in FIG. 51.

FIG. 5400 illustrates another structural example of 3-terminal gated NV NT switch (3-T G NV NT switch) 5400. In this example, gate 5410 has been deposited on the top surface of insulator 5415 which is formed on the top surface of nanotube fabric 5420. Insulator 5415 may be relatively thin (2 to 20 nm for example). Insulator 5315 may be formed of SiO2, SiN, alumina, polyimide, or other dielectric material. Terminals 5425 and 5430 are in contact the two ends of nanotube fabric 5420 and separated by a switch length $L_{SW-CH}$. In this example, terminals 5425 and 5430 are embedded in insulator 5422. Insulator 5422 may be formed of $SiO_2$, SiN, alumina, polyimide, or other dielectric material. Patterned nanotube fabric 5420 has been deposited and patterned in contact with the top surface of embedded terminals 5425, 5430, and insulator 5422. The low resistance ON state between terminals 5425 and 5430 is typically in the range of 100 kΩ to 2 MΩ and the high resistance state is typically 100 MΩ and higher. (1 GΩ and above for example). The operation of 3-T G NV NT switch 5400 corresponds to the operation described further above with respect to gated NV NT switch 5100 illustrated in FIG. 51.

Figure 55:
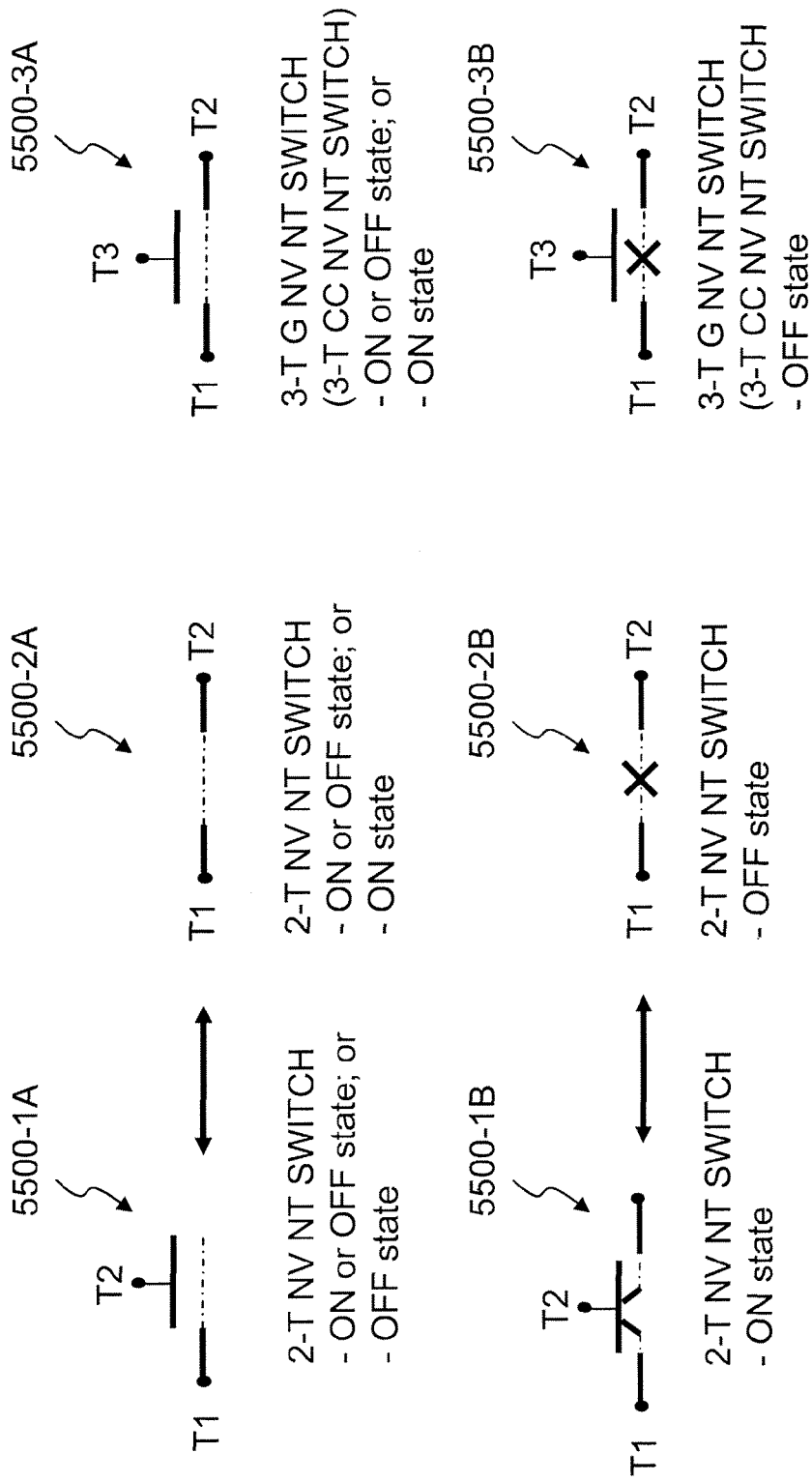
FIG. 55 is a schematic illustration of various symbols used for two-terminal NV NT switches and three-terminal gated NV NT switches.

FIG. 55 illustrates various schematic representations of 2-T NV NT switches and 3-T G NV NT switches corresponding to various 2-T NV NT switch and 3-T G NV NT switch structures described further above. 2-T NV NT switch 5500-1A is a schematic representation of a 2-T NV NT switch that may be in a nonvolatile ON state including multiresistance (two or more) ON states, or in a nonvolatile OFF state as described further above and in various incorporated references. Alternatively, 2-T NV NT switch 5500-1A may also be used to indicate only a high resistance OFF (or RESET) state. The interpretation of NV NT switch 5500-1A can be determined by its use in the respective figures as well as the corresponding text description. For example, in FIG. 19, NT00 is a generic representation of a NV NT switch that may be in ON, OFF, or multiresistance ON states. However, in FIG. 35, NV NT switches such as NV NT switch 3507 is in OFF state and NV NT switch 3508 is in an ON state. 2-T NV NT switch 5500-1B is a schematic representation of a 2-T NV NT switch in a low resistance (or SET) ON state or multiresistance (two or more) ON states. The schematic representations described above are used in FIGS. 10, 11, 12, 14, 15, 17, 18, 19, 22, 26, 28, 34, 35, 36, 38, 40, 50, and other figures, for example.

2-T NV NT switch 5500-2A is also a schematic representation of a 2-T NV NT switch that may be in an ON, OFF, or one of several (two or more) multi-resistance ON states. 2-T NV NT switch 5500-2A corresponds to 2-T NV NT switch 5500-1A but is changed to facilitate the addition of a third gate in schematic representation 55003A described further below. 2-T NV NT switch 5500-2B is a schematic representation of a 2-T NV NT switch 55002B that corresponds to 2-T NV NT switch 5500-2A in an OFF state.

Figure 51:
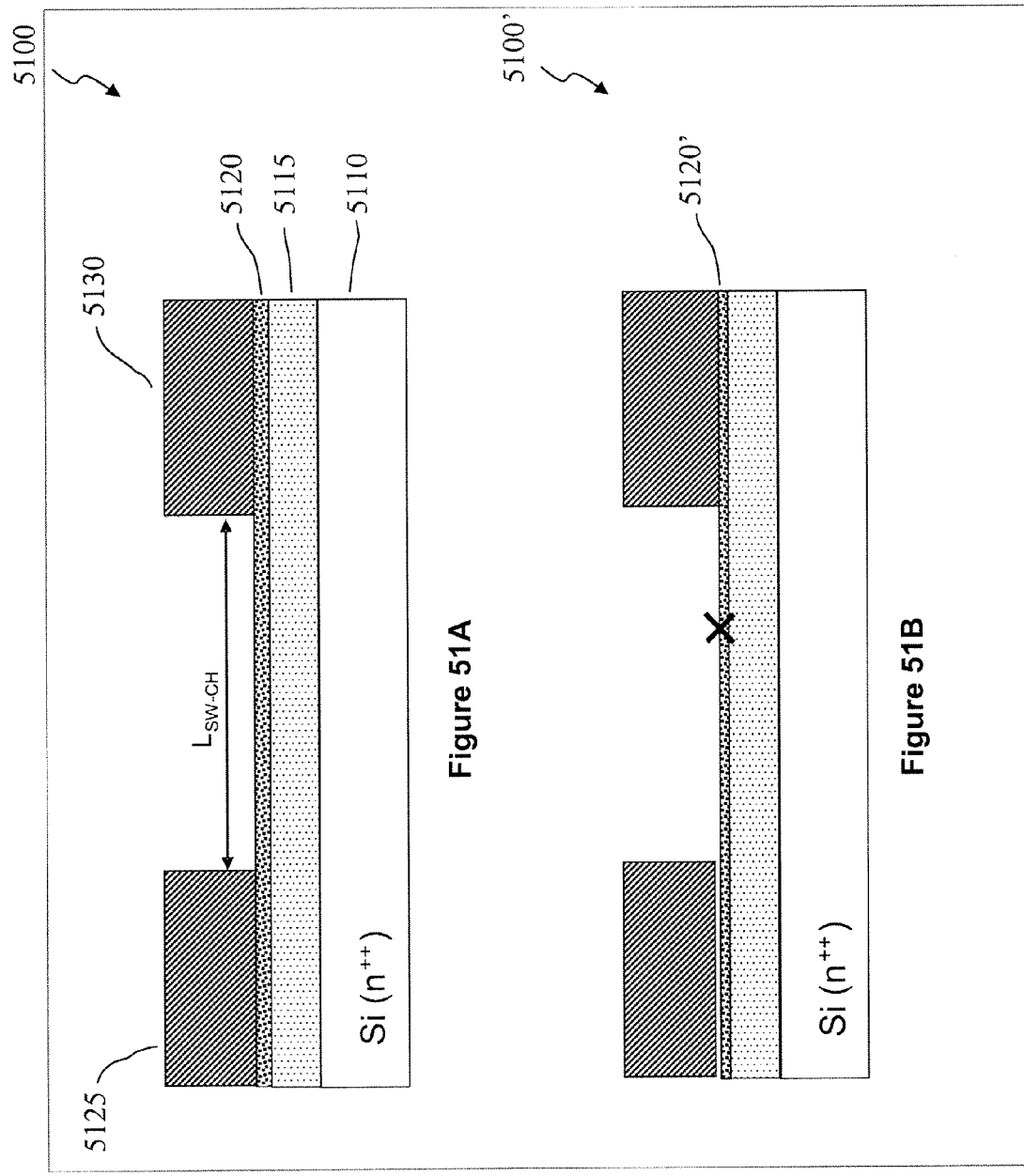
FIG. 51A shows a substrate-gated nonvolatile nanotube (NV NT) switch in a low resistance ON or SET state.
FIG. 51B shows the substrate-gated NV NT switch of FIG. 51A in a high resistance OFF or RESET state.

3-T G NV NT switch 5500-3A is a schematic representation of 3-T G NV NT switch structures 5100 and 5100", 5300, and 5400 illustrated in FIGS. 51, 53, and 54 further above that may be in an ON, OFF, or one of several (two or more) multiresistance ON states. As described further above with respect to FIG. 52, a capacitively coupled SET (CC SET) operation with no SET current flow between terminals T1 and T2 may be used with gated NV NT switches in which a gate such as gate T3 is capacitively coupled to a patterned nanofabric region as illustrated schematically in FIG. 55 to switch from a high resistance RESET state to a low resistance SET state. Hence, 3-T G NV NT switch 5500-3A may be SET using a CC SET operation with no SET current flow between terminals T1 and T2. Alternatively, 3-T G NV NT switch 5500-3A may be SET using a SET operation with SET current flow between terminals T1 and T2 corresponding to SET operations applied to 2-T NV NT switches 5500-1A and 5500-2A shown schematically in FIG. 55. However, gate T3 may not be used to perform a RESET operation to switch from a low resistance ON SET state to a high resistance OFF state. That is, voltages applied to gate T3 cannot use capacitive coupling to RESET the switch. A RESET operation with RESET current flow between terminals T1 and T2 corresponding to RESET operations for 2-T NV NT switches 5500-1A and 5500-2A is used instead to switch 3-T G NV NT switch 5500-3A from a low resistance ON SET state to a high resistance OFF RESET state illustrated by 3-T G NV NT switch 5500-3B.

Examples of 3-Terminal Gated NV NT Switch Structures Used in Various Applications CC SET-Enabled NRAM®

Figure 56:
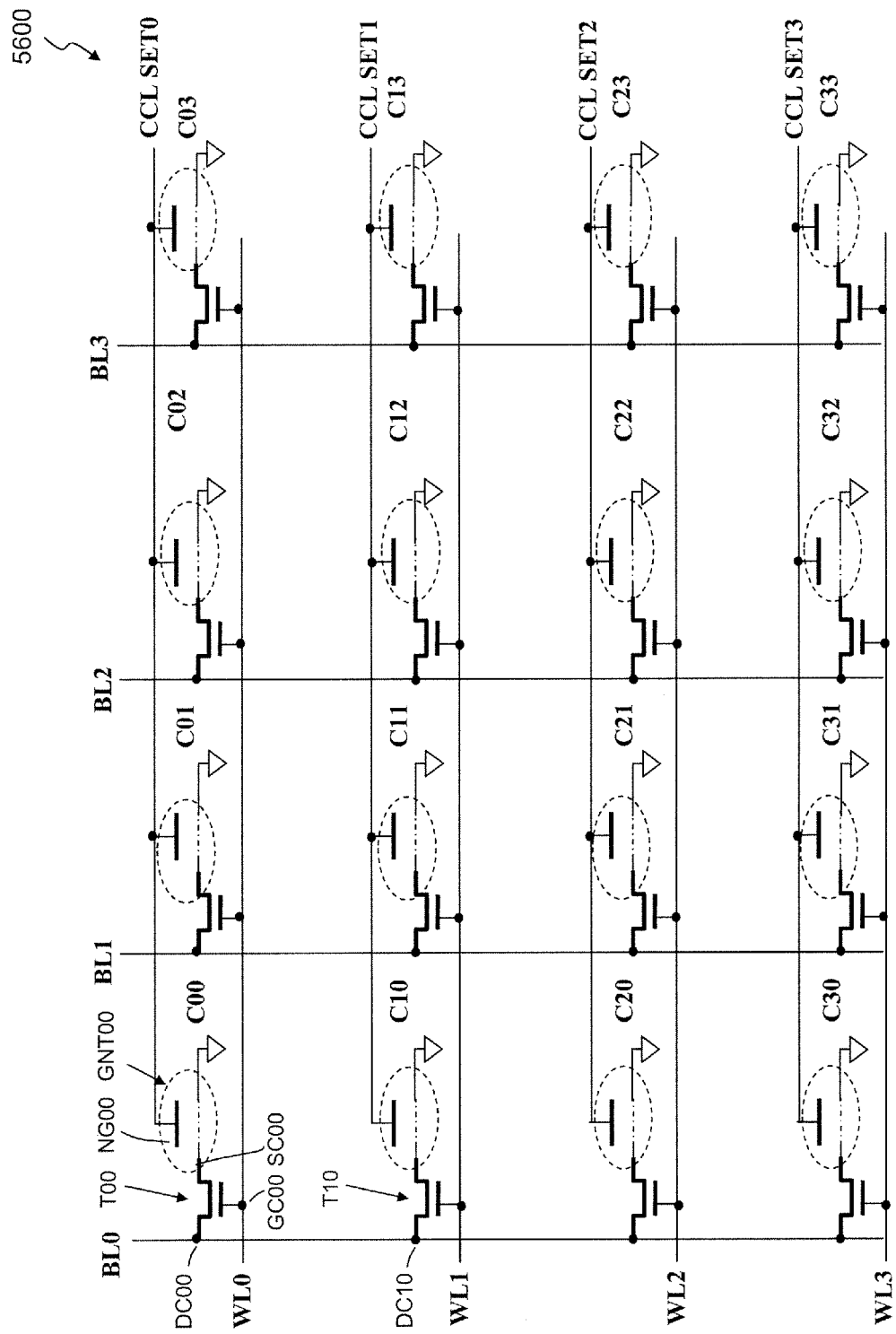
FIG. 56 is a schematic representation of three-terminal gated NV NT switches used as storage nodes in a capacitively coupled SET (CC SET)-enabled NRAM®.

FIG. 56 is a schematic illustration of a CC SET-enabled NRAM® 5600. CC SET-enabled NRAM® 5600 may be formed by replacing 2-T NV NT switches NT00 corresponding to 2-T NV NT switch 5500-1A in FIG. 55 in NRAM® array schematic 1900 illustrated in FIG. 19 with 3-T G NV NT switches GNT00 corresponding to 3-T G NV NT switch 5500-3A illustrated in FIG. 55 and by replacing secondary word line with CC-SET line CCL SET0. Referring to cell C00, terminal T2 is connected to source SC00 of FET T00, terminal T1 is connected to bit line BL0, and terminal T3 corresponding to nanotube gate NG00, is connected to capacitively coupled SET line CC SET0. Secondary word lines WWL1, WWL2, and WWL3 in FIG. 19 may also be replaced by capacitively coupled SET lines (CCL SET lines) CCL SET1, CCL SET2, and CCL SET3 as shown in FIG. 56, and other 3-T G NV NT switches corresponding to GNT00 in cell C00 replace the remaining 2-T NV NT switches in cells C01, C02, C03, C10, C11, C12, C13, C20, C21, C22, C23, C30, C31, C32, and C33 to complete the formation of CC SET-enabled NRAM 5600 illustrated in FIG. 56.

Referring to FIG. 56, SET and RESET switching operations may be performed by selecting combinations of word lines WL0, WL1, WL2, and WL3 and bit lines BL1, BL2, BL3, and BL4 applied voltage to 3-T G NV NT switches selected by FETs such as FET T00 for example. For RESET operations (switching from a low resistance ON state to a high resistance OFF state), the RESET operating conditions may be the same as described further above with respect to NRAM® array schematic 1900 shown in FIG. 19 with RESET current flowing through 3-T G NV NT switches between terminals T1 and T2. However, for SET-enabled NRAM® 5600, CCL SET lines such as CCL SET0 may be held at zero or a read voltage or allowed to float during a RESET switching operation for example.

Two SET operating modes (options) may be used for SET-enabled NRAM® 5600. In a first SET operating mode, SET switching operations may be used which correspond with SET switching operations such as used in NRAM® array schematic 1900 with current flowing between terminals such as T1 and T2 with capacitively coupled CCL SET lines such as CCL SET0 held at zero or a read voltage such as 2 or 3 volts or allowed to float during SET switching operations for example.

In a second SET operating mode, select FET devices such as FET T00 with gates connected to a word line by a contact, such as GC00 connected to WL0, may be held in an OFF state with a reference voltage such as ground applied to gates in contact with a word line such as WL0. Bit lines BL0, BL1, BL2, and BL3 may be at any operating voltage including a reference voltage such as ground. CCL SET lines such as CCL SET0 may be pulsed once or several times with CC SET operating voltages in the 5 to 6 volt range for example. 3-T G NV NT switches are held at or near a reference voltage such as ground by terminals such as terminal T2; gates such as gate T3 illustrated in FIG. 55, connected to CCL SET0, capacitively couple CC SET operating voltages to corresponding patterned nanotube fabric. 3-T G NV NT switches such as GNT00 in a high resistance OFF RESET state transition to a low resistance ON SET state as described above with respect to FIGS. 51-54 with no SET current flowing between terminals T1 and T2. 3-T G NV NT switches such as GNT00 in a low resistance ON SET state remain in a low resistance ON state unaffected by one or more CC SET operation voltage pulses. An advantage of a CC SET operation for CC SET enabled NRAM® 5600 may be lower power dissipation as described above with respect to FIG. 51. Another advantage may be faster SET operating speeds.

After completion of a second SET operating mode as described further above with respect to the CCL SET0 line, all 3-T G NV NT switches (corresponding to nonvolatile storage bits) along CCL SET0 line are in a low resistance ON SET state. Next, selected FET devices may be activated to selectively change corresponding 3-T G NV NT switches from a low resistance ON SET state to a high resistance OFF RESET state by applying a voltage from a corresponding bit line such bit line BL0 through a corresponding select FET such as FET T00 to a corresponding terminal such as terminal T1 with RESET current flowing between terminals T1 and T2. 3-T G NV NT switches that are to remain in a low resistance ON SET are not selected. For example, cells C00 and C02 corresponding to BL0, BL2, and WL0 intersections may be RESET to a high resistance state such as 1 GΩ or higher while cells C01 and C03 corresponding to BL1, BL3, and WL0 intersections may be left in a low resistance ON SET state in a range of 100 kΩ to 2 MΩ for example.

The combination of the second SET operating mode followed by a selective RESET operation described further above may provide for lower power dissipation as described further above. Also, faster switching operations may be possible as well. This is because cells along one or more word lines such as word line WL0 with corresponding CC SET lines such as CC SET0 may be SET. Then, selective RESET operations may be applied to one or more word lines. An increase in speed may be possible because RESET operations on NRAM® are typically faster, in some cases 10× faster, than SET operations that require SET current flowing between terminals T1 and T2.

It may be possible to reduce the required SET operating voltage for the second mode of operation as follows. A reduced voltage second SET operating mode may be used in which a select FET, such as select FET T00 is turned ON, and a voltage is applied to a terminal such as terminal T1 of 3-T G NV NT switch GNT00. In this example, a bit line voltage (1 to 5 volts for example) may be applied to terminal T1 just prior to (or during) the application of CC SET voltage pulses to the CCL SET0 line. As described further above with respect to FIG. 52, this has the effect of reducing CC SET voltages below the CC SET voltage illustrated in FIG. 52. For example, CC SET voltage for the reduced voltage second SET operating mode may be reduced to the 4-to-5 volt range for example.

CC SET-Enabled NanoLogic®

Figure 57:
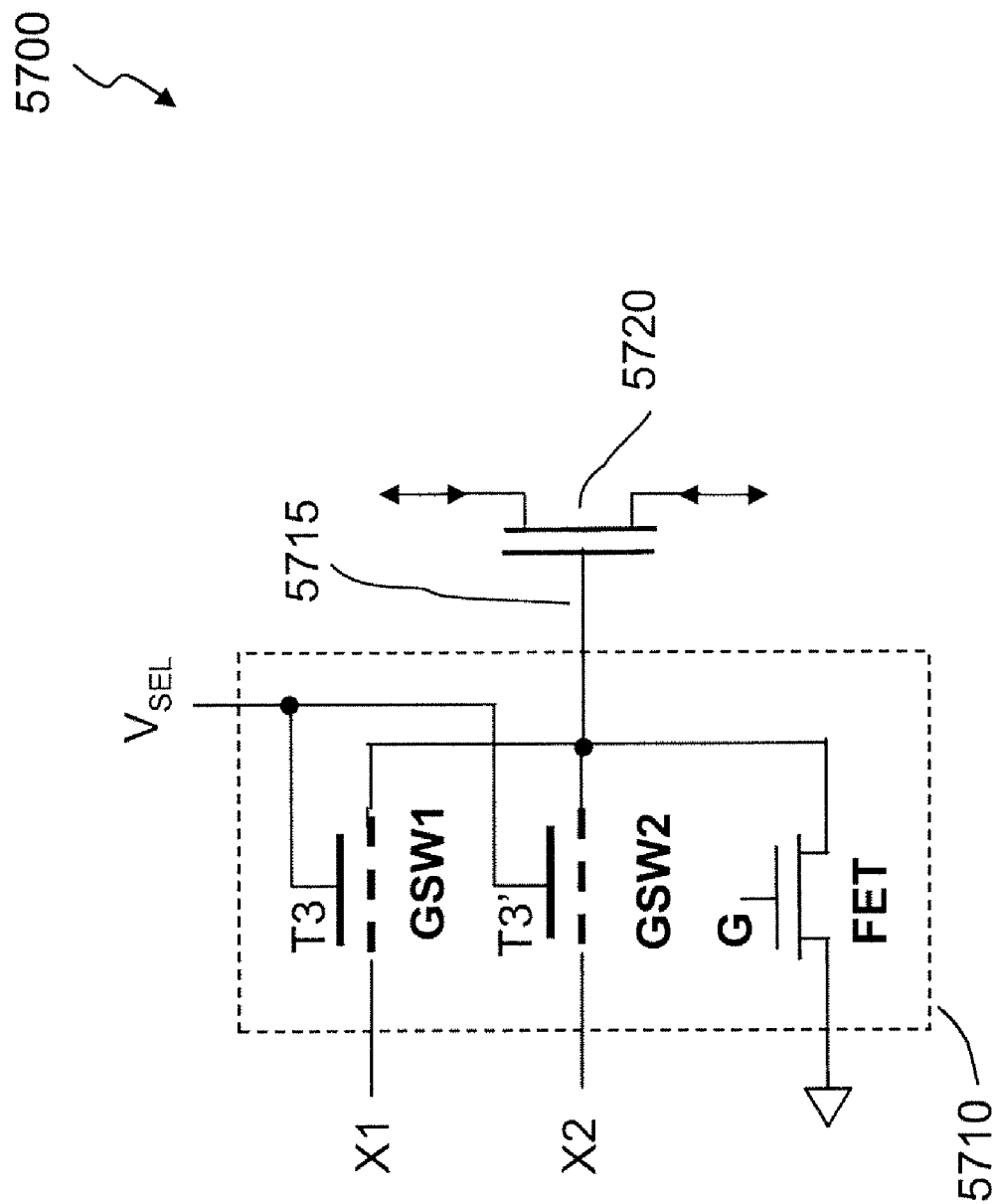
FIG. 57 is a schematic representation of a CC SET-enabled programmable NanoLogic® circuit using three-terminal gated NV NT switches.

FIG. 57 is a schematic illustration of a CC SET-enabled programmable NanoLogic® circuit 5700. CC SET-enabled NanoLogic® circuit 5700 may be formed by replacing 2-T NV NT switches SW1 and SW2 in NV NT select circuit 1150 in FIG. 11B and corresponding NV NT select circuit 1200-1 illustrated in FIG. 12B with 3-T G NV NT switches GSW1 and GSW2, such as 3-T G NV NT switch 5500-3A illustrated in FIG. 55, to form 3-T G NV NT select circuit 5710 with output 5715 corresponding to NV NT select circuit 1225-1 with output 1225-1. Inputs X1 and X2 in FIG. 57 correspond to inputs X1 and X2 in FIG. 12 and output 5715 controls the gate input of FET transfer device 5720 which corresponds to FET transfer device 1230 whose gate input is controlled by output 1225-1 in FIG. 12B. Mode control device FETs illustrated in FIGS. 12B and 57 serve the same function as described further above with respect to FIGS. 11B and 12B. Programmable NanoLogic® circuit 5700 has an additional input terminal $V_{SEL}$ connected to capacitively coupled SET gates T3 and T3' as illustrated in FIG. 57 that enables a CC SET mode of operation using terminal T3 as described further above with respect to the CC SET mode of operation described with respect to FIG. 56.

Referring to FIG. 57, SET and RESET operations corresponding to those described above with respect to FIGS. 11B and 12B may be performed with $V_{SEL}$ at or near a reference voltage such as ground, or at an operating voltage such as 2 or 3 volts, or floating for example. For RESET operations, the RESET operating conditions may be the same as described further above with respect to FIGS. 11B and 12B with RESET current flowing through GSW1 or GSW2 when mode control FET is turned ON. In a NanoLogic® operating mode, FET is in an OFF state as described further above with respect to FIGS. 11B and 12B.

As is the case with CC SET-enabled NRAM® described further above with respect to FIG. 56, two SET operating modes (options) may be used. In a first SET switching operation, SET current flows through GSW1 or GSW2 as with SET operations described with respect to FIGS. 11B and 12B. In this case, $V_{SEL}$ voltage may be held at a low reference voltage such as ground or at an operating voltage such as 2 to 3 volts, or allowed to float for example.

In a second SET operating mode corresponding to the CC SET operating mode described further above with respect to FIG. 56, the mode select FET shown in FIG. 57 may be turned ON and inputs X1 and X2 may be floating for example, with GSW1 and GSW2 held at a reference voltage such as ground. Capacitively coupled gates T3 and T3' may be pulsed by $V_{SEL}$ one or more times with 5 to 6 volt pulses, for example, as described above with respect to FIG. 56 causing 3-T G NV NT switches GSW1 and GSW2 to transition from a RESET to a SET state or to remain in a SET state. An advantage of CC SET-enabled programmable NanoLogic® circuit 5700 may be lower power dissipation during SET switching operations. Another advantage may be faster SET operating speeds. $V_{SEL}$ has no effect on RESET so RESET operations require RESET current flows through GSW1 or GSW2 as described further above with respect to FIGS. 11B and 12B.

SET operating voltages may be reduced to the 4 to 5 volt ranges if X1 and X2 are set to a higher voltage such as 1 to 5 volts prior to or during a CC SET operation as described further above with respect to FIG. 56.

CC SET-Enabled Precision Timing Function

Figure 58:
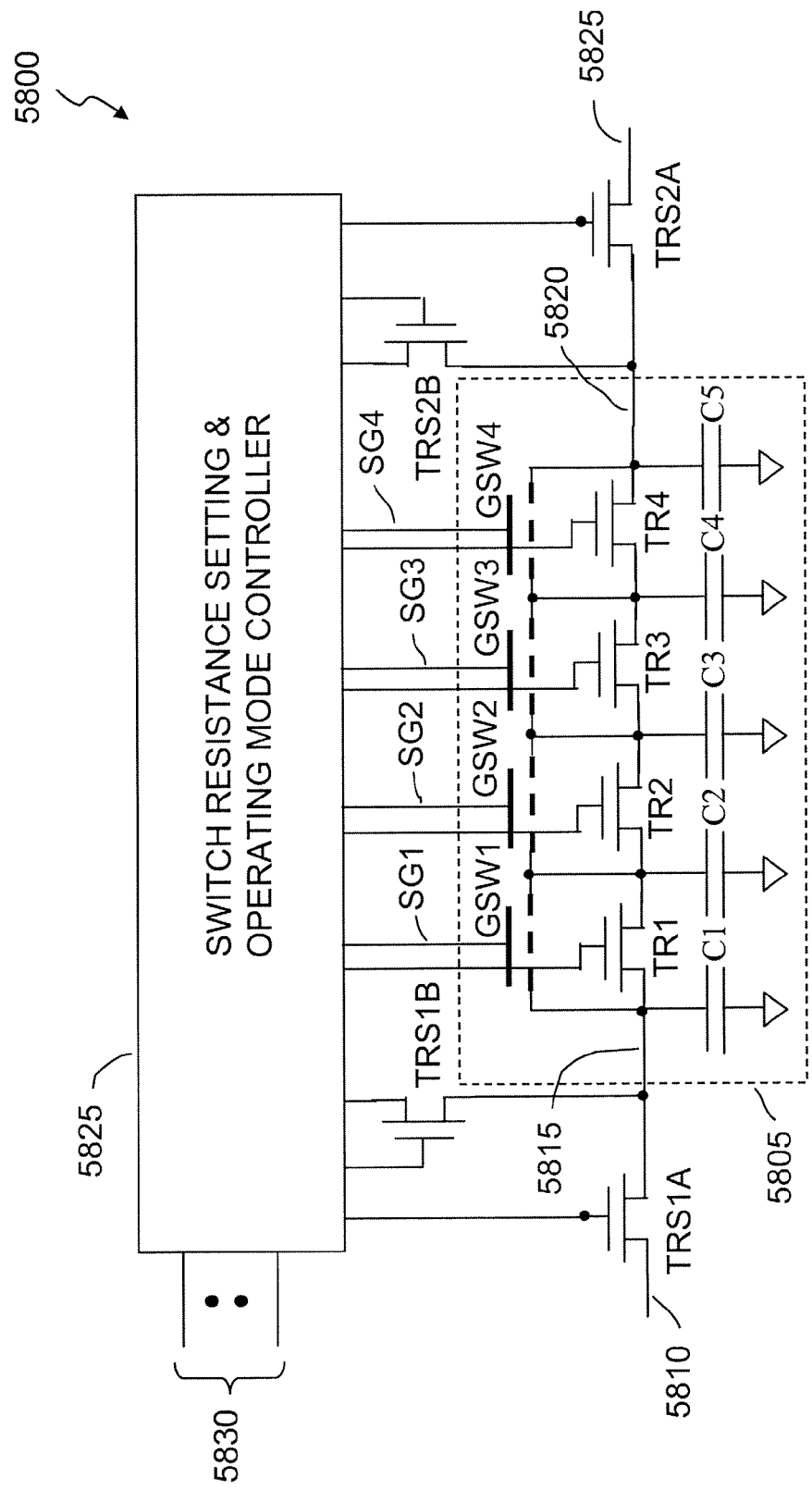
FIG. 58 is a schematic representation of a CC SET-enabled precision timing circuit using three-terminal gated NV NT switches.

FIG. 58 is a schematic illustration of a CC SET-enabled precision timing function 5800. CC SET-enabled precision timing function 5800 may be formed by replacing 2-T NV NT switches SW1, SW2, SW3, and SW4 in series/parallel resistor/capacitor network 4010 in FIG. 40A with 3-T G NV NT switches GSW1, GSW2, GSW3, and GSW4 such as 3-T G NV NT switch 5500-3A illustrated in FIG. 55, to form 3-T G NV NT series/parallel resistor/capacitor network 5805 with nodes 5810, 5815, 5820, and 5825 in FIG. 58 corresponding to nodes 3915, 4015, 4020, and 3925, respectively. Operating mode controller 5825, corresponding to operating mode controller 4025, may be modified to add individual control lines to capacitively coupled gates SG1, SG2, SG3, and SG4 of 3-T G NV NT switches GSW1, GSW2, GSW3, and GSW4, respectively. Inputs 5830 in FIG. 58 correspond to inputs 4030 in FIG. 40B. Connections to FETs TR1, TR2, TR3, and TR4 and other FETs remain unchanged.

Referring to FIG. 58, SET and RESET operations corresponding to those described above with respect to FIG. 40A may be performed control voltages applied to SG1, SG2, SG3, and SG4 held at or near a reference voltage such as ground, or at an operating voltage such as 2 or 3 volts, or floating for example. For RESET operations, the RESET operating conditions may be the same as described further above with respect to FIG. 40A with RESET current flowing through GSW1 or GSW2 or GSW3 or GSW4. For example, when FET TR1 is OFF and FETs TR2, TR3, and TR4 are ON, RESET current flows through 3-T G NV NT switch GSW1 between the terminals connected to the two terminals connected in parallel with FET TR1.

As is the case with CC SET-enabled NRAM® described further above with respect to FIG. 56 and CC SET-enabled programmable NanoLogic® circuit described further above with respect to FIG. 57, two SET operating modes (options) may be used. In a first SET switching operation, SET current flows through GSW1 or GSW2 or GSW3 or GSW4 as with SET operations described with respect to FIG. 40A. In this case, control voltages to SG1, SG2, SG3, and SG4 may be held at a low reference voltage such as ground or at an operating voltage such as 2 to 3 volts, or allowed to float for example.

In a second SET operating mode corresponding to the CC SET operating mode described further above with respect to FIG. 56, FETs TR1, TR2, TR3, and TR4 shown in FIG. 58 may be turned ON and nodes 5815 and 5820 may be held at or near ground for example. Capacitively coupled gates SG1, SG2, SG3, and SG4 may be individually pulsed one or more times with 5-6 volt pulses, for example, as described above with respect to FIG. 56 causing 3-T G NV NT switches GSW1, or GSW2, or GSW3, or GSW4, or various combinations thereof to transition from a RESET to a SET state or to remain in a SET state. An advantage of CC SET-enabled timing function 5800 may be lower power dissipation during SET switching operations. Another advantage may be faster SET operating speeds. Voltages applied to capacitively coupled gates SG1, SG2, SG3, or SG4 have no effect on RESET so RESET operations require RESET current flows through 3-T G NV NT switches GSW1 or GSW2 or GSW3 or GSW4 as described further above with respect to FIG. 56.

CC SET-enabled timing function 5800 enables individual 3-T G NV NT switch capacitively coupled gates to be pulsed one or more times individually to enable small incremental reduction in resistance for more precision control in the precision nonvolatile analog delay function referred to as series/parallel resistor/capacitor network 5805.

CC SET-Enabled Security

The importance of rapid security response functions enabled by programmable/reprogrammable NV NT switches has been described further above with respect to FIGS. 10A-10G. Capacitively coupled SET operations make it possible to disable whole functions or portions of functions with one or more capacitively coupled SET functions without SET current flowing through NV NT switches.

Portions of or all of CC SET-enabled NRAM® arrays, such as NV NT switches along one or more word lines of CC SET-enabled NRAM® 5600, illustrated further above with respect to FIG. 56, may be simultaneously SET to a low resistance ON state by applying one or several pulses to capacitively coupled SET lines (CC SET lines) such as CCL SET0 without SET current flowing through any of the NV NT switches. Reverse engineering of hardware cannot identify previously programmed information, in this case, those NRAM® bits that were in a RESET or OFF state.

Portions of or all of CC SET-enabled NanoLogic® functions, such as NV NT switches GSW1 and GSW2 forming part of CC SET-enabled programmable NanoLogic® function 5700, illustrated further above with respect to FIG. 57, may be simultaneously SET to a low resistance ON state by applying one or several pulses $V_{SEL}$ to capacitively coupled gates T3 and T3' without SET current flowing through NV NT switches GSW1 and GSW2. Reverse engineering of hardware cannot identify previously programmed logic information, in this case, the logic state of CC SET-enabled programmable NanoLogic® circuit 5700.

Portions of or all of CC SET-enabled NanoLogic® functions, such as NV NT switches GSW1, GSW2, GSW3, and GSW4 forming part of CC SET-enabled CC SET-enabled timing function 5800, illustrated further above with respect to FIG. 58, may be simultaneously SET to a low resistance ON state by applying one or several pulses from operating mode controller 5825 without SET current flowing through NV NT switches GSW1, GSW2, GSW3, and GSW4. Reverse engineering of hardware cannot identify previously programmed timing (pulse delay) information, in this case, the timing information of CC SET-enabled programmable NanoLogic® circuit 5800 that enables operation of a subsystem such as optimized subsystem 3900-1 described further above with respect to FIG. 39A. CC SET enabled timing function 5800 illustrated in FIG. 58 is similar to precision timing function 3920 illustrated further above with respect to FIG. 40A.

Carbon Nanotube FET (CNFET)-Based NRAM® Memory Arrays, NanoLogic® Circuits Including CNFET-Based Devices to Form Digital and Analog Circuits Carbon Nanotube FET (CNFET)-based devices may be used as nCNFET or pCNFET select devices in NRAM® cells, CNFET-based NRAM® peripheral circuits such as word and bit line drivers, address select, control, and timing circuits for example, thereby eliminating the need for a semiconductor substrate for FET device and circuit fabrication as illustrated further below with respect to FIGS. 59-63. In other words, an insulating substrate may be used for example. Such an insulating substrate may be an insulating layer placed at any level in an integrated circuit. For example, an insulating layer (substrate) and corresponding CNFET devices formed on and/or within this insulating layer (substrate) may be positioned in close proximity to wiring layers or embedded within such wiring layers at any level of the integrated circuit function. As a result, layers of NRAM® memory arrays with supporting CNFET-based circuits may be stacked in 3-D NRAM® memory architectures with greater density within each memory array layer and enhanced interconnect capability that may result in dense 3-D stacked memory arrays. Also, an NRAM® memory peripheral circuits may be positioned at least partially below or above the corresponding NRAM® array area and interconnected by a combination of vertical and horizontal wiring to reduce the overall area (footprint) of the NRAM® memory function. Note that while semiconductor substrates are not required they may be included as well. For example, an insulating layer may be in contact with a semiconductor substrate.

Carbon Nanotube FET (CNFET)-based devices and corresponding applications are illustrated further below in FIGS. 59, 60, 68 and 69, for example, may be optimized for enhanced power-performance NRAM® memory and NanoLogic® circuits including complementary carbon nanotube-based circuits (CCN-circuits) and used to replace CMOS circuits based on FETs in a semiconductor substrate as described further below. CNFET-based NRAM® and NanoLogic® circuits formed using CNFET devices corresponding to those illustrated further below in FIGS. 59, 60, 68, and 69 may be formed using one type of CNFET device; for example all pCNFET devices or all nCNFET devices. However, complementary carbon nanotube-based circuits (CCN-circuits) may result in better combinations of higher performance at lower power dissipation. These circuits may be digital or analog type or a mixture of both. In the case of analog circuits, stand-alone custom designed circuits of nanotube field programmable analog arrays (NFPAAs) as illustrated in FIG. 73 may be used. NFPAAs enable programmable analog functions using nonvolatile interconnect techniques such as those described further above with respect to FIG. 31 or 32 may be used as stand-alone or embedded NFPAA functions. While semiconductor substrates are not required, semiconductor substrates may be included as well.

Nonvolatile CNFET (NV-CNFET) devices are described further below with respect to FIGS. 64A-64D. NV-CNFET device combine the CNFET and NV NT switch functions in as single three-terminal device. Dense array NRAM® array-type applications are described further below with respect to FIG. 65; dense nonvolatile programmable array logic NanoLogic® applications are described with respect to FIG. 66; and nonvolatile MUX NanoLogic® applications are described further below with respect to FIG. 67.

n-Channel Carbon Nanotube FET (nCNFET) and p-Channel Carbon Nanotube FET (pCNFET) Devices and Application to NRAM® Memory Arrays CNFET device 5900 illustrated in FIG. 59A includes patterned semiconducting nanotube fabric 5905 on an underlying gate insulator 5910, with gate insulator 5910 on an underlying insulator 5920 that includes an embedded gate 5915 below channel region 5912 and in contact with the underside of gate insulator 5910. S/D region 5922 in contact with contact 5925, S/D region 5928 in contact with contact 5930, and gate 5915 electrostatically coupled to channel region 5912 form the three terminals of CNFET device 5900. The device channel length $L_{CH}$ is defined by the separation of S/D regions 5922 and 5928 which is approximately equal to the separation between contacts 5925 and 5930 illustrated in FIG. 59A. Patterned semiconductor nanotube fabric 5905 replaces the semiconductor substrate used for well known industry NFET and PFET devices. For a pCNFET (p-type carbon nanotube FET behavior), a more negative voltage applied to gate 5915 relative to contacts 5925 and 5930 makes channel region 5912 more conductive and a less negative voltage makes channel region 5912 less conductive as illustrated further below with respect to FIG. 60A. For an nCNFET (n-type carbon nanotube FET behavior), a more positive voltage applied to gate 5915 relative to contacts 5925 and 5930 makes channel region 5912 more conductive and a less positive voltage makes channel region 5912 less conductive. More optimized nCNFET and pCNFET devices are described further below with respect to FIGS. 68 and 69.

CNFET device 5940 illustrated in FIG. 59B includes patterned semiconducting nanotube fabric 5945 on an underlying insulator 5968 that includes embedded contacts 5960 and 5965 in contact with the underside of patterned semiconductor nanotube fabric 5945. Gate 5955 is formed on gate insulator 5950 which is in contact with the top surface of patterned semiconductor nanotube fabric 5945. S/D region 5958 in contact with contact 5960, S/D region 5962 in contact with contact 5965, and gate 5955 electrostatically coupled to channel region 5952 form the three terminals of CNFET device 5940. The device channel length $L_{CH}$ is defined by the separation of S/D regions 5958 and 5962 which is approximately equal to the separation between contacts 5960 and 5965 illustrated in FIG. 59B. Patterned semiconductor nanotube fabric 5945 replaces the semiconductor substrate used for well known industry NFET and PFET devices. For a pCNFET (p-type carbon nanotube FET behavior), a more negative voltage applied to gate 5955 relative to contacts 5960 and 5965 makes channel region 5952 more conductive and a less negative voltage on the gate 5955 makes channel region 5952 less conductive as illustrated further below with respect to FIG. 60A.

Figure 60A:
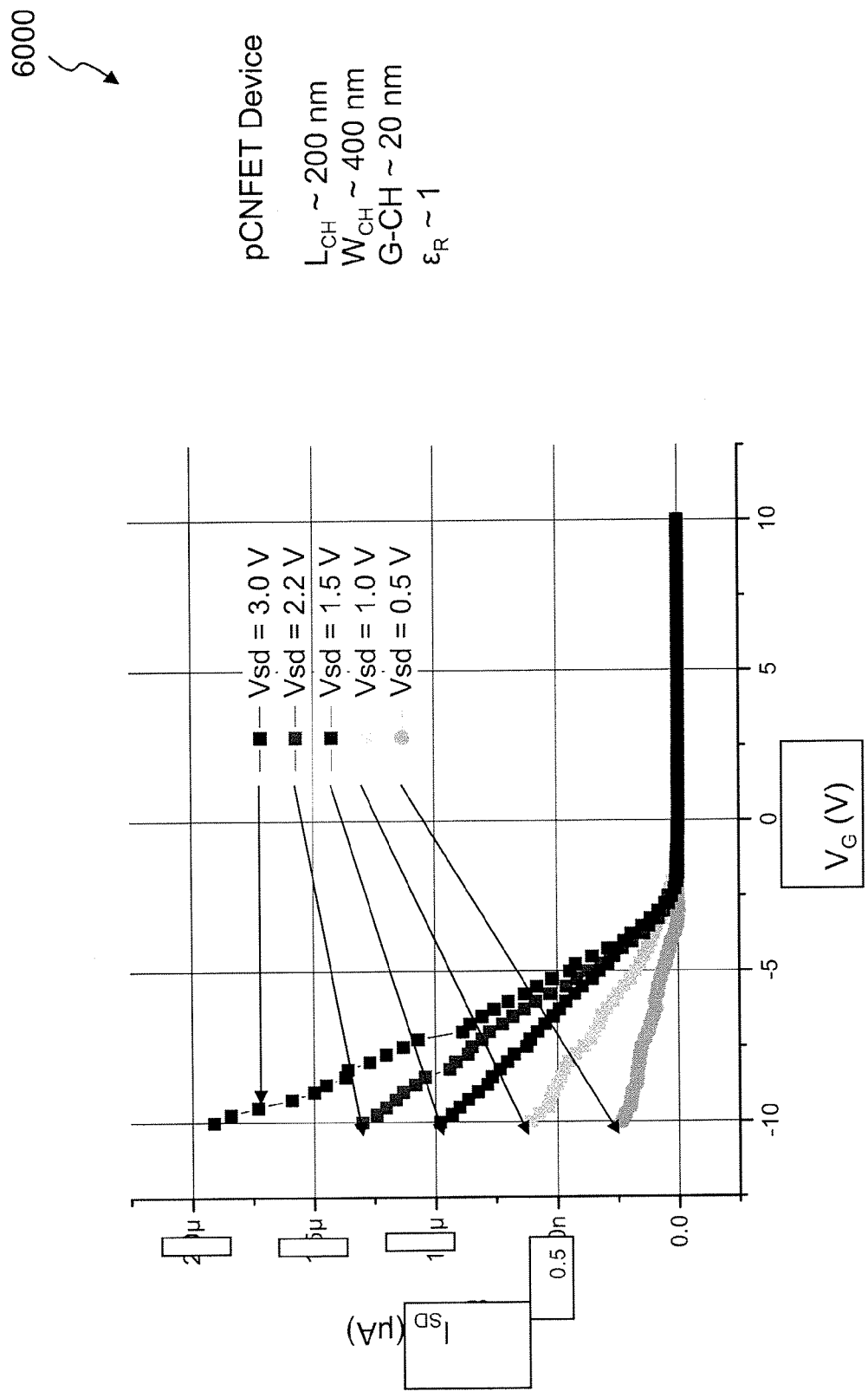
FIG. 60A shows an electrical characteristic of a pCNFET device.

FIG. 60A illustrates patterned semiconducting nanotube fabric-based pCNFET electrical characteristics 6000 showing source/drain current $I_{SD}$ as a function of gate voltage $V_G$ for various source/drain voltage values for a patterned semiconducting nanotube fabric pCNFET device described further in incorporated U.S. patent application Ser. No. 11/332, 529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006. pCNFET electrical characteristics 6000 were obtained by electrical measurements on a pCNFET device with a gate above a patterned semiconductor nanotube fabric (similar to FIG. 59B for example) formed using single wall nanotubes (SWNTs) and electrostatically coupled to a channel region below and metallic contacts to the patterned semiconductor nanotube fabric on either side of the gate. These metallic contacts were formed using Ti/Pd and the gate is metallic formed using tungsten. The pCNFET device corresponding to pCNFET electrical characteristics 6000 shown in FIG. 60A has a channel length $L_{CH}$ of approximately 200 nm and a channel width $W_{CH}$ of approximately 400 nm. A metallic gate is suspended over and electrically coupled to the channel region as described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006 with a gap-to-channel spacing (gap) G-CH of approximately 20 nm and a relative dielectric constant $\in_R=1$. pCNFET electrical characteristic 6000 illustrated in FIG. 60A is representative of pCNFET electrical characteristics and has an ON/OFF current ratio greater than $10^5$. In this example, $\in_R=1$; however, with gate insulators such as silicon dioxide ($SiO_2$) with a relative dielectric constant of approximately 4 or high relative dielectric materials such as tantalum pentoxide ($Ta_2O_5$) or hafnium oxide ($HfO_2$) with relative dielectric constants of approximately 20 and 25, respectively, pCNFET device applied gate voltages may be lower because comparable electrostatically coupled electric fields may be achieved at lower applied voltages.

As also shown in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006, temperature self-annealing by ~1 µW of current passing through the (semiconducting) nanotube fabric-based pCNFET, described further above, having at least one active carbon nanotube (CNT) in a vacuum or inert gas for 5 minutes changes the pCNFET to an ambipolar nanotube fabric-based FET as illustrated by electrical characteristic 6050 illustrated in FIG. 60B. Continued temperature annealing, for example temperature anneal in a vacuum or inert gas for an extended period, can complete the transition from an ambipolar CNFET to an nCNFET. Exposure to air or $O_2$ at elevated temperature can reverse the process and restore the nanotube fabric-based pCNFET operation.

A patterned semiconducting nanotube fabric-based CNFET that is typically pCNFET as-fabricated can be changed to an ambipolar CNFET or an nCNFET by vacuum or inert gas annealing. The ambipolar CNFET or nCNFET can be restored to a pCNFET with annealing in air or $O_2$. Therefore, after fabrication, the electrical characteristics of patterned semiconducting nanotube fabric CNFETs 5900 and 5040 illustrated further above with FIGS. 59A and 59B, respectively, may be modified by annealing at elevated temperatures in a vacuum or inert gas, or exposed to air or $O_2$ at elevated temperature, to exhibit pCNFET electrical characteristics similar to those illustrated in FIG. 60A, ambipolar CNFET electrical characteristics similar to those illustrated in FIG. 60B, or nCNFET electrical characteristics (not shown).

nCNFET 5970 illustrated in FIG. 59C is a symbolic representation of an n-version of CNFET 5900 or CNFET 5940 illustrated in FIGS. 59A and 59B, respectively, that shows gate 5972, corresponding to gate 5915 or gate 5955, S/D 5974 corresponding to S/D region 5922 or S/D region 5958, and S/D 5976 corresponding to S/D region 5928 or 5962 shown in FIGS. 59A and 59B. pCNFET 5980 illustrated in FIG. 59D is a symbolic representation of a p-version of CNFET 5900 or CNFET 5940 illustrated in FIGS. 59A and 59B, respectively, that shows gate 5982, corresponding to gate 5915 or gate 5955, S/D 5984 corresponding to S/D region 5922 or S/D region 5958, and S/D 5986 corresponding to S/D region 5928 or 5962 shown in FIGS. 59A and 59B. A back gate (not shown) on the opposite side of channel region 5912 from gate 5915 may be added to shift the threshold (switching point) of CNFET 5900 or to form a second control gate such that channel region 5912 may be controlled by gate 5915 or a back gate. A back gate (not shown) on the opposite side of channel region 5952 from gate 5955 may be added to shift the threshold (switching point) of CNFET 5940 or to form a second control gate such that channel region 5952 may be controlled by gate 5955 or a back gate. The use of front gates and back gates in CNFET devices is described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006, the entire contents of which are incorporated herein by reference.

At this point in the specification, examples are shown of NRAM® cells in which CNFET devices are used to select 2-dimensional (2-D) NV NT switches or 3-D NV NT switches which may referred to as NV NT blocks or NV NT block switches (terms used interchangeably).

NRAM® cell 6100 illustrated in FIG. 61A includes a FET select transistor 6105 with drain D in substrate SUB connected to bit line BL by STUD 1, word line WL, approximately orthogonal to bit line BL, that forms an array interconnect word line and the gate of FET 6105, and source S in substrate SUB. NRAM® cell 6100 requires a semiconductor substrate such as silicon, for example, for cell select FET 6105. 2-D NV NT switch 6110, with terminal T1 that also forms a contact to source S and terminal T2 which may be in contact with a reference line REF or a portion of reference line REF may form terminal T2. FET 6105 may be an n channel FET (NFET) or a p channel FET (PFET) and are typical of well known FETs used in industry. FIG. 61A-*type* structures and electrical operating modes such as SET, RESET, and READ operations are described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007.

NRAM® cell 6115 illustrated in FIG. 61B includes an FET select transistor 6120 with drain D in substrate SUB connected to bit line BL by STUD 2, word line WL, approximately orthogonal to bit line BL, that forms an array interconnect word line and the gate of FET 6120, and source S in substrate SUB. NRAM® cell 6115 requires a semiconductor substrate such as silicon, for example, for cell select FET 6120. 3-D NV NT block 6125, with terminal T3 that also forms a contact to source S, and terminal T4 which may be in contact with a reference line REF or a portion of reference line REF may form terminal T4. FET 6120 may be an n channel FET (NFET) or a p channel FET (PFET) and are typical of well known FETs used in industry. FIG. 61B-*type* structures and electrical operating modes such as SET, RESET, and READ operations are described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007.

NRAM® memory arrays formed using NRAM® cells 6100 and 6115 described further above are limited in density because cell select FETs 6105 and 6120 are formed in a semiconductor substrate such as silicon, for example. Substantially greater NRAM® memory density may be realized by replacing FET 6105 and 6120 with CNFETs similar to CNFETs 5900 and 5040 illustrated further above with FIGS. 59A and 59B in which patterned semiconductor nanotube fabrics are used to form CNFETs that do not require a semiconductor substrate. This is because NRAM® memory arrays formed with CNFET select transistors may be stacked in layers one above the other to achieve 2×, 4×, 16×, and greater memory density per unit area. Also, since memory circuits may be formed using CNFETs, each NRAM® memory layer may also include peripheral circuits such as word line and bit line drivers, decoders, and other circuits for example. CNFET-based memory circuits may also be placed and shared between stacked NRAM® memory array layers for even greater density by placing peripheral and support memory circuits within the foot print of the NRAM® memory arrays to achieve even greater memory density per unit area.

In addition to increased NRAM® memory density, increased memory performance may also be achieved because memory circuits may drive memory arrays with less bit line and word line capacitance, for example, because bit lines and work lines are connected to CNFETs which have less S/D capacitance because source-drain region diffusion capacitance is eliminated.

CPU memory BUS performance may also be increased by providing more memory (because of increased memory density) in close proximity to the CPU. So for example, NRAM® memories formed using CNFETs may be stacked on (above) one or more CPUs fabricated in a silicon substrate, for example, with very short BUS line between the memory and the CPU. CPU performance as a function of memory placement (distance between CPU and memory) is described further above with respect to FIGS. 41-48. While a CPU may also be formed using CNFETs and, therefore, not require a semiconductor substrate, and may also be stacked in a layer above or below the memory, using proven industry designed optimized tested CPUs in a silicon substrate with one or more stacked NRAM® memory layers may result in lower cost and faster development of application solutions with reduced debug time.

NRAM® cell 6130 illustrated in FIG. 61C includes a CNFET select transistor 6135 with drain region D in the patterned semiconductor nanotube fabric of CNFET 6135 connected to bit line BL by STUD 3, word line WL, approximately orthogonal to bit line BL, that forms an array interconnect word line and the gate of CNFET 6135, and source region S in the patterned semiconductor nanotube fabric of CNFET 6135. CNFET 6135 is similar to CNFETs 5900 and 5940 illustrated further above in FIGS. 59A and 59B. NRAM cell 6130 does not require a semiconductor substrate such as silicon for example. 2-D NV NT switch 6140, with terminal T5 that forms a portion of contact 6137 which also contacts source region S, and terminal T6 that may be in contact with a reference line REF or a portion of reference line REF may form terminal T6. CNFET 6135 may be a n channel CNFET (nCNFET) or a p channel CNFET (pCNFET). FIG. 61C-*type* structure electrical operating modes such as SET, RESET, and READ operations are similar to those described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NON-VOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007.

NRAM® cell 6145, illustrated in FIG. 61D, includes a CNFET select transistor 6150 with drain region D in the patterned semiconductor nanotube fabric of CNFET 6150 connected to bit line BL by STUD 4, word line WL, approximately orthogonal to bit line BL, that forms an array interconnect word line and the gate of CNFET 6150, and source region S in the patterned semiconductor nanotube fabric of CNFET 6150. CNFET 6150 is similar to CNFETs 5900 and 5940 illustrated further above in FIGS. 59A and 59B. NRAM cell 6145 does not require a semiconductor substrate such as silicon, for example. 3-D NV NT block 6155, with terminal T7 that also forms a contact to source region S, and terminal T8 which may be in contact with a reference line REF or a portion of reference line REF may form terminal T8. CNFET 6150 may be a n channel CNFET (nCNFET) or a p channel CNFET (pCNFET). FIG. 61D-*type* structure electrical operating modes such as SET, RESET, and READ operations are described in more detail in U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007.

NRAM® cell 6160 illustrated in FIG. 61E is similar to NRAM® cell 6145 illustrated in FIG. 61D except that the nonvolatile store node NV NT block 6164 is formed earlier in the process flow than select CNFET 6162 instead of later in the process flow after the CNFET select transistor is formed such as illustrated in FIG. 61D. The NRAM® structure is possible because CNFET 6162 is not formed in a semiconductor substrate.

NRAM® cell 6160 illustrated in FIG. 61E includes a CNFET select transistor 6162 with drain region D in the patterned semiconductor nanotube fabric of CNFET 6162 connected to bit line BL by STUD 5, word line WL, approximately orthogonal to bit line BL, that forms an array interconnect word line and the gate of CNFET 6162, and source region S in the patterned semiconductor nanotube fabric of CNFET 6162. CNFET 6162 is similar to CNFETs 5900 and 5940 illustrated further above in FIGS. 59A and 59B. NRAM cell 6160 is enabled because it does not require a semiconductor substrate such as silicon for example. 3-D NV NT block 6164, with terminal T9 that also forms a contact to source region S, and terminal T10 which may be in contact with a reference line REF or a portion of reference line REF may form terminal T10. CNFET 6162 may be a n channel CNFET (nCNFET) or a p channel CNFET (pCNFET). FIG. 61E-*type* structure electrical operating modes such as SET, RESET, and READ operations are described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007.

NRAM® cell 6165 illustrated in FIG. 61F is similar to NRAM® cell 6130 illustrated in FIG. 61C except that word line WL is positioned below the patterned semiconductor nanotube fabric of CNFET 6167. NRAM cell 6165 is enabled because it does not require a semiconductor substrate such as silicon, for example.

NRAM® cell 6165 illustrated in FIG. 61F includes a CNFET select transistor 6167 with drain region D in the patterned semiconductor nanotube fabric of CNFET 6167 connected to bit line BL by STUD 3, word line WL, approximately orthogonal to bit line BL, that forms an array interconnect word line and the gate of CNFET 6167, and source region S in the patterned semiconductor nanotube fabric of CNFET 6167. CNFET 6167 is similar to CNFETs 5900 and 5940 illustrated further above in FIGS. 59A and 59B. NRAM cell 6165 does not require a semiconductor substrate such as silicon for example. 2-D NV NT switch 6169, with terminal T11 that forms a portion of contact 6168 which also contacts source region S, and terminal T12 that may be in contact with a reference line REF or a portion of reference line REF may form terminal T12. CNFET 6167 may be a n channel CNFET (nCNFET) or a p channel CNFET (pCNFET). FIG. 61F-*type* structure electrical operating modes such as SET, RESET, and READ operations are similar to those described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NON-VOLATILE NANOTUBE BLOCKS," filed on Aug. 8, 2007.

NRAM® cell 6170 illustrated in FIG. 61G is similar to NRAM® cell 6145 illustrated in FIG. 61D except that word line WL is positioned below the patterned semiconductor nanotube fabric of CNFET 6172. NRAM cell 6170 is enabled because it does not require a semiconductor substrate such as silicon, for example.

NRAM® cell 6170 illustrated in FIG. 61G includes a CNFET select transistor 6172 with drain region D in the patterned semiconductor nanotube fabric of CNFET 6172 connected to bit line BL by STUD 7, word line WL, approximately orthogonal to bit line BL, that forms an array interconnect word line and the gate of CNFET 6172 and source region S in the patterned semiconductor nanotube fabric of CNFET 6172. CNFET 6172 is similar to CNFETs 5900 and 5940 illustrated further above in FIGS. 59A and 59B. NRAM cell 6172 is enabled because it does not require a semiconductor substrate such as silicon for example. 3-D NV NT block 6174, with terminal T13 that also forms a contact to source region S, and terminal T14 which may be in contact with a reference line REF or a portion of reference line REF may form terminal T14. CNFET 6172 may be an n channel CNFET (nCNFET) or a p channel CNFET (pCNFET). NRAM® memory electrical operating modes such as SET, RESET, and READ operations are described in more detail further above with respect to FIG. 19 and in U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007.

The memory cells illustrated in FIGS. 61C-61G may be use to replace the memory cells such as memory cell C00, for example, illustrated by NRAM® array schematic 1900 in FIG. 19 further above to form a CNFET-based NRAM® memories. Also, select FETs, such as select FET T00 illustrated in CC SET-enabled NRAM® 5600 in FIG. 56, may be replaced with CNFETs such as those described with respect to FIGS. 59 and 60 further above or CNFETs described with respect to FIGS. 68 and 69 further below to form a CNFET-based CC SET-enabled NRAM® memories.

By introducing CNFET select transistors in series with NV NT switches and NV NT blocks, NRAM® memory arrays fabricated with cells illustrated in FIGS. 61A-61G do not require a semiconductor substrate and may placed at any level of integration and stacked to form dense 3-dimensional NRAM® memory.

Figure 1:
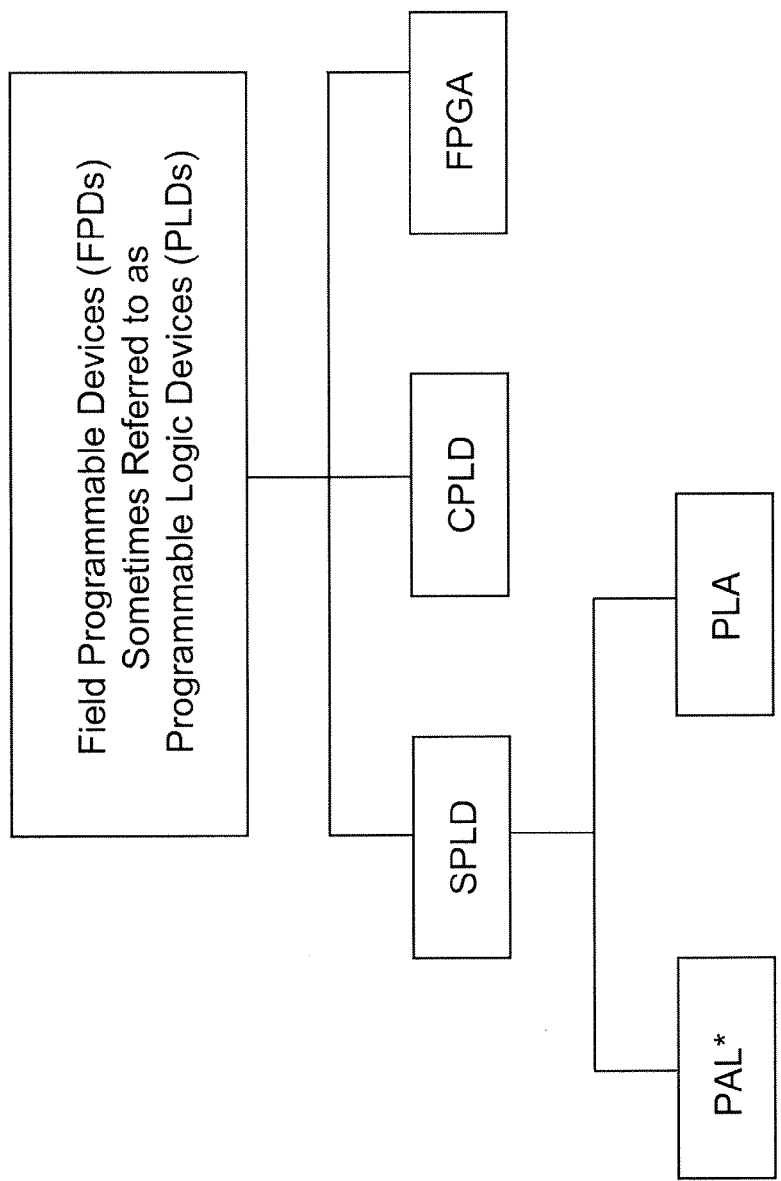
FIG. 1 is an overview of field programmable devices (FPDs), sometimes referred to as programmable logic devices (PLDs)

NRAM® cell schematic 6200-1 illustrated in FIG. 62A-1 shows an nCNFET select transistor in series with a NV NT switch. A first terminal of the nCNFET is connected to bit line BL, a second terminal is connected to a first terminal of the NV NT switch. A third terminal of the nCNFET is connected to word line WL. A second terminal of the NV NT switch is connected to a reference voltage REF. The NV NT switch symbol used in FIG. 62A-1 corresponds to 2-T NV NT switch 5500-1A illustrated in FIG. 55.

Figure 2:
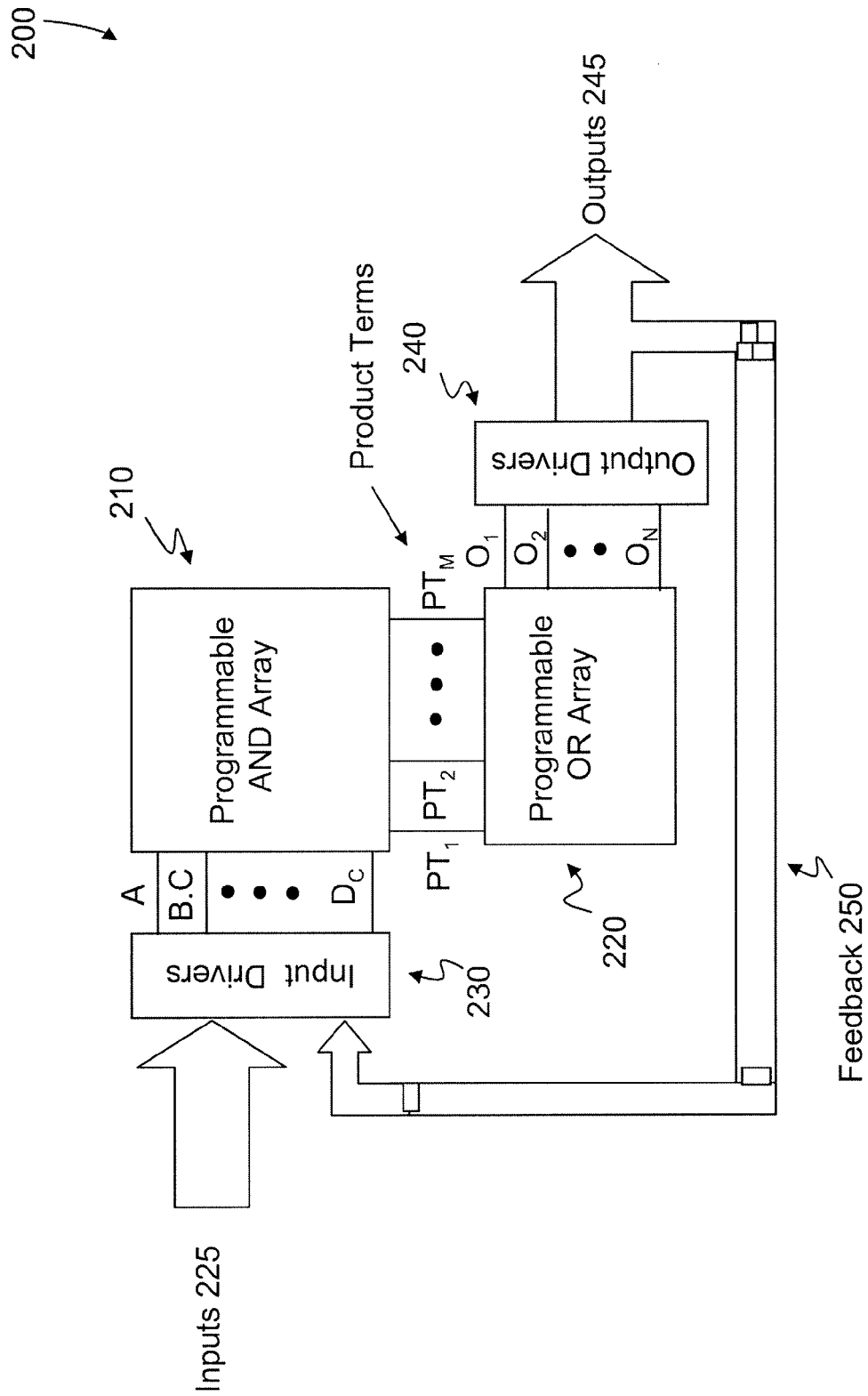
FIG. 2 is a block diagram of a programmable logic array (PLA)
Figure 3:
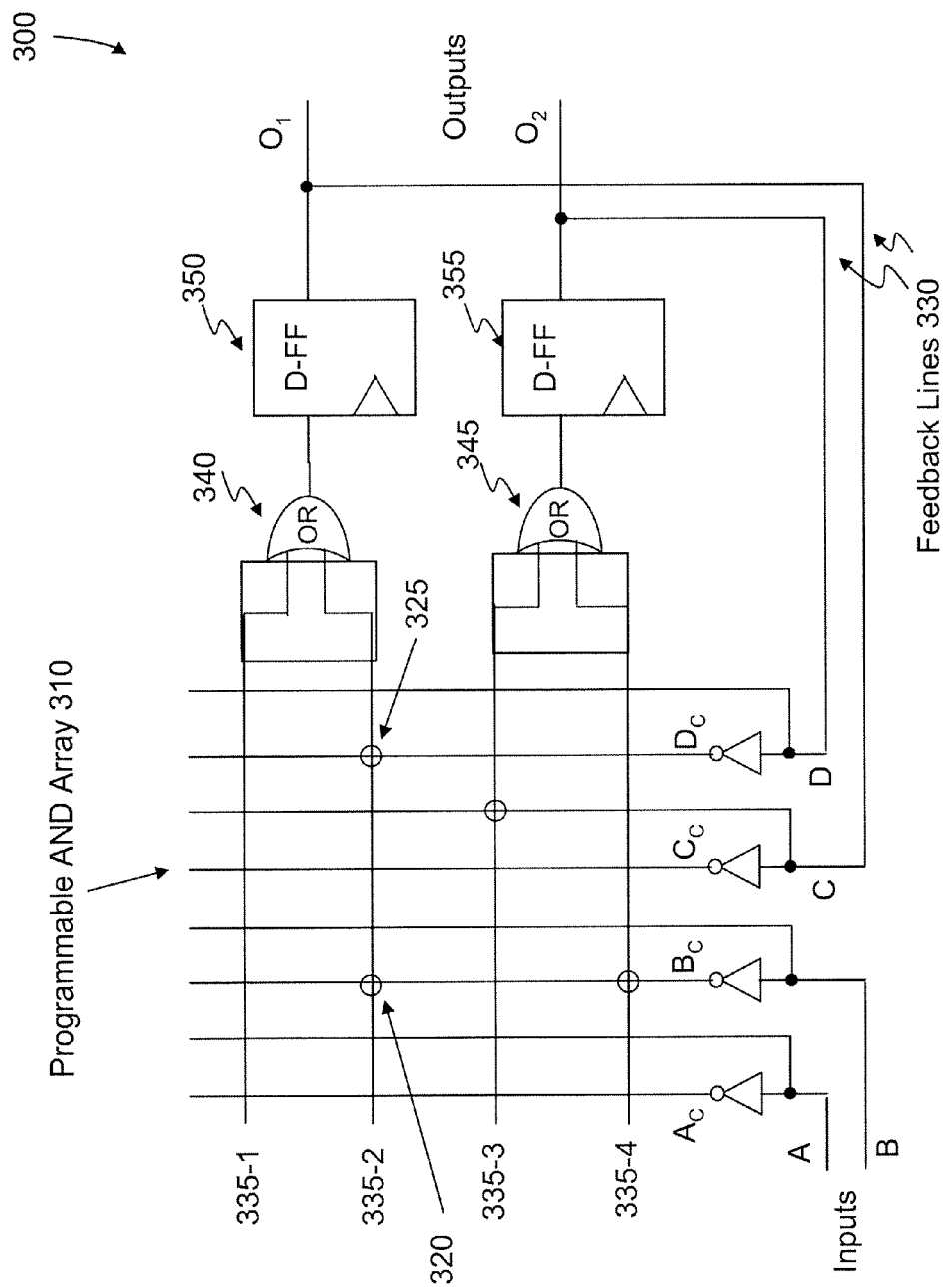
FIG. 3 is a schematic of a programmable array logic (PAL™) device. PAL™ is a trademark of AMD.

NRAM® cell schematic 6200-2 illustrated in FIG. 62A-2 shows an nCNFET select transistor in series with a NV NT switch. NRAM® cell schematic 6200-2 corresponds to NRAM® cell schematic 6200-1 illustrated in FIG. 62A-1. The NV NT switch symbol used in FIG. 62A-2 corresponds to 2-T NV NT switch 5500-2A illustrated in FIG. 55. NRAM® cell schematics 6200-2 and 6200-1 are equivalent with BL, WL, and REF the same for both schematics. The NV NT switches use different but equivalent representations as described in FIG. 55. NRAM® cell schematic 6200-1 uses a NV NT switch corresponding to 2-T NV NT switch 5500-1A illustrated in FIG. 55 while NRAM® cell schematic 6200-2 uses a NV NT switch corresponding to 2-T NV NT switch 5500-2A also illustrated in FIG. 55.

NV NT switches symbols illustrated in FIGS. 62A-1 and 62A-2 may be used to represent 2-D NV NT switches and 3-D NV NT blocks. NRAM® cell schematics 6200-1 and 6200-2 may be used to represent any of the NRAM® cell 6130, 6145, 6160, 6165, and 6170 structures illustrated in FIGS. 61C, 61D, 61E, 61F, and 61G, respectively.

NRAM® cell schematic 6200-3 illustrated in FIG. 62B-1 shows a pCNFET select transistor in series with a NV NT switch. A first terminal of the pCNFET is connected to bit line BL, a second terminal is connected to a first terminal of the NV NT switch. A third terminal of the pCNFET is connected to word line WL. A second terminal of the NV NT switch is connected to a reference voltage REF. The NV NT switch symbol used in FIG. 62B-1 corresponds to 2-T NV NT switch 5500-1A illustrated in FIG. 55.

NRAM® cell schematic 6200-4 illustrated in FIG. 62B-2 shows a pCNFET select transistor in series with a NV NT switch. NRAM® cell schematic 6200-4 corresponds to NRAM® cell schematic 6200-3 illustrated in FIG. 62B-1. The NV NT switch symbol used in FIG. 62B-2 corresponds to 2-T NV NT switch 5500-2A illustrated in FIG. 55. NRAM® cell schematics 6200-4 and 6200-3 are equivalent with BL, WL, and REF the same for both schematics. The NV NT switches use different but equivalent representations as described in FIG. 55. NRAM® cell schematic 6200-3 uses a NV NT switch corresponding to 2-T NV NT switch 5500-1A illustrated in FIG. 55 while NRAM® cell schematic 6200-4 uses a NV NT switch corresponding to 2-T NV NT switch 5500-2A also illustrated in FIG. 55.

NV NT switches symbols illustrated in FIGS. 62B-1 and 62B-2 may be used to represent 2-D NV NT switches and 3-D NV NT blocks. NRAM® cell schematics 6200-3 and 6200-4 may be used to represent any of the NRAM® cell 6130, 6145, 6160, 6165, and 6170 structures illustrated in FIGS. 61C, 61D, 61E, 61F, and 61G, respectively.

Integration of CNFET Devices and NV NT Switches for Smaller NRAM® Cells and Greater NRAM® Density NRAM® cells illustrated in FIGS. 61C-61G include a CNFET select device and a NV NT switch in series. The CNFET select device is formed using a patterned semiconducting nanotube fabric as illustrated in FIGS. 59A and 59B. Patterned semiconducting nanotube fabric is typically formed using multiple SWNTs. NV NT switches may be formed using nanotube fabric formed using multiple single wall nanotubes (SWNTs), multiple double wall nanotubes (DWNTs), multiple multiwall nanotubes (MWNTs), and various combinations of multiple SWNTs, DWNTs, and MWNTs that typically include metallic and semiconducting nanotubes.

NV NT switches may also be formed using multiple semiconducting SWNTs such as those used to fabricate CNFETs such as CNFETs 5900 and 5940 illustrated in FIGS. 59A and 59B, respectively, and select CNFETs used in various NRAM® cells illustrated in FIGS. 61C-61G. When both CNFET select devices and NV NT switches use patterned semiconducting nanotube fabric formed using multiple semiconducting SWNTs, then an NRAM® cell contact such as contact 6137 shown in NRAM® cell 6130 in FIG. 61C may be eliminated and the cell area may be reduced as illustrated by NRAM® cell 6300 illustrated in FIG. 63.

Figure 63:
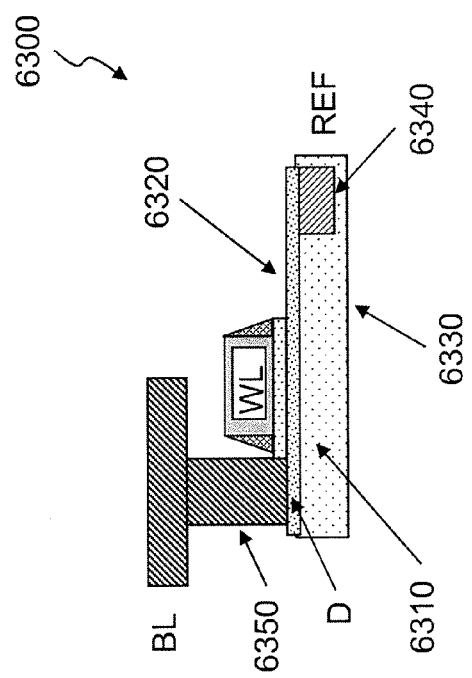
FIG. 63 shows a cross section of an NRAM® cell in both the CNFET select device and the adjacent NV NT switch are formed in the same patterned semiconducting nanotube fabric.

NRAM® cell 6300 illustrated in FIG. 63 includes select transistor CNFET 6310 formed using patterned semiconductor nanotube fabric 6320 formed with multiple semiconducting SWNTs with drain region D connected to bit line BL by stud 6350, word line WL, approximately orthogonal to bit line BL, that forms an array interconnect word line and the gate of CNFET 6310. CNFET 6135 may be an n-channel CNFET (nCNFET) or a p-channel CNFET (pCNFET). 2-D NV NT switch 6330 may also be formed in patterned semiconductor nanotube fabric 6320 and is in contact with terminal 6340 that may be in contact with a reference line REF or a portion of reference line REF may form terminal 6340. That portion of patterned semiconducting nanotube fabric 6300 between terminal 6340 and the edge of word line WL on the source-side of CNFET 6310 forms the switching region of NV NT switch 6330. When word line WL activates (turns ON)CNFET 6310, bit line BL voltage and current are applied by CNFET 6310 to NV NT switch 6330 for READ, SET, and RESET operations. FIG. 63 type structure electrical operating modes such as SET, RESET, and READ operations are similar to those described in more detail in U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007. NRAM® cell 6165 illustrated in FIG. 61F may also be reduced in size by eliminating contact 6168 using similar methods.

Combining CNFET Device and NV NT Switch Functions to Form a New Nonvolatile Nanotube Device for NRAM® and NanoLogic® Applications CNFET devices may be operated as three terminal field effect transistors as described further above with respect to FIGS. 59A, 59B, and FIG. 60, and other figures including figures 68 and 69 further below. These may be nCNFET or pCNFET devices as described further above. However, CNFET devices may also operate as NV NT switches, as well. This combination (overlap) of operating modes enables nonvolatile CNFET (NV-CNFET) device operation as NV-nCNFET or NV-pCNFET devices for example. If the channel region electrostatically coupled to the NV-CNFET gate is in a low resistance ON SET state, then the NV-CNFET device may operate as a CNFET device. For example, a NV-pCNFET device with the channel region in a low resistance ON SET state may have electrical characteristics similar to electrical characteristics 6000 illustrated in FIG. 60. However, if the channel region is in a high resistance state OFF RESET state, then there is no current flow $I_{SD}$ between drain and source terminals and $I_{SD}=0$ over the range of applied values of gate voltage $V_G$.

Figure 64B:
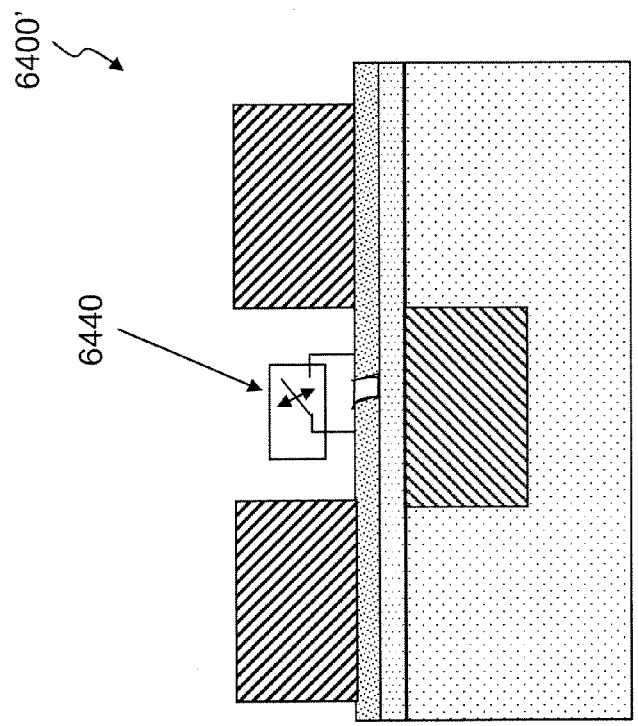
FIG. 64B shows a cross sectional representation of the NV-CNFET device of FIG. 64A in a high resistance state.
Figure 64A:
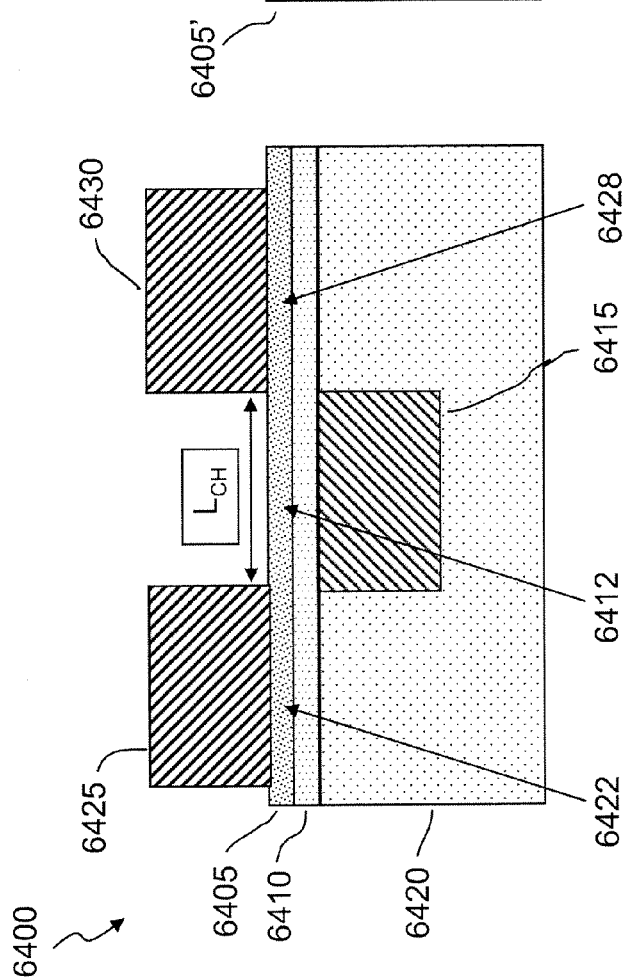
FIG. 64A shows a cross section of a nonvolatile carbon nanotube FET (NV-CNFET) device in which a CNFET device has been optimized to operate as a combined CNFET and NV NT device.

FIG. 64A is an illustration of NV-CNFET 6400. NV-CNFET 6400 is similar to CNFET 5900 illustrated in FIG. 59A except that NV-CNFET 6400 may be optimized for combined CNFET and NV NT switch operating modes as described further above. NV-CNFET device 6400 illustrated in FIG. 64A includes patterned semiconducting nanotube fabric 6405 on an underlying gate insulator 6410, with gate insulator 6410 on an underlying insulator 6420 that includes an embedded gate 6415 below channel region 6412 and in contact with the underside of gate insulator 6410. S/D region 6422 in contact with contact 6425, S/D region 6428 in contact with contact 6430, and gate 6415 electrostatically coupled to channel region 6412 form the three terminals of NV-CNFET device 6400 that combines (overlaps) CNFET and NV NT switch operating modes. The device channel length $L_{CH}$ is defined by the separation of S/D regions 6422 and 6428 which is approximately equal to the separation between contacts 6425 and 6430 illustrated in FIG. 64A. Patterned semiconductor nanotube fabric 6405 formed with multiple SWNTs replaces the semiconductor substrate used for well known industry NFET and PFET devices. For a NV-pCNFET (p-type carbon nanotube FET behavior) device with channel region 6412 in a low resistance ON SET state, a more negative voltage applied to gate 6415 relative to contacts 6425 and 6430 makes channel region 6412 more conductive and a less negative voltage makes channel region 6412 less conductive as illustrated further above with respect to FIG. 60A. However, if channel region 6412 is in a high resistance OFF RESET state, current flow between drain and source terminals is zero independent of voltage applied to gate 6415.

NV-CNFET 6400' illustrated in FIG. 64B is the same device as NV-CNFET 6400 illustrated in FIG. 64A. However, a physical break with a parallel switch 6440 is artificially shown (used) to represent a nonvolatile OFF RESET state in patterned semiconducting nanotube fabric 6405' corresponding to patterned semiconducting nanotube fabric 6405 to illustrated a mode of operation in which NV-CNFET 6400' may have overlapping CNFET and NV NT switch modes of operation. A switch 6440 CLOSED position represents a mode of operation corresponding to a NV NT switch low resistance SET state in which a continuous electrical path is present between contacts 6425 and 6430 if channel region 6412 is activated (turned ON) by gate 6415 in a CNFET mode of operation. However, a switch 6440 OPEN position represents a mode of operation corresponding to a high resistance RESET state in which no continuous electrical path is possible between contacts 6425 and 6430 over a range of gate voltages applied to gate 6415 relative to contacts 6425 and 6430 used for CNFET operation. Switch 6440 may be RESET (OPENED) or SET (CLOSED) by a two terminal NV NT switch operation in which RESET or SET voltages are applied between contacts 6425 and 6430 with corresponding RESET or SET currents flowing between contacts 6425 and 6430 as described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007. Alternatively, in the case of a capacitively coupled SET (CC SET) CLOSE switch operation, gate 6415 may apply a relatively high voltage of positive or negative polarity to activate a capacitively SET mode operation in which no SET current flows between contacts as described further above with respect to FIGS. 51-58.

In operation, NV-CNFET device voltage range is operated at voltages that remain below voltage levels that may trigger a RESET operation or SET or CC SET operations. In this case, ON NV-CNFET device electrical operation occurs with electrical characteristics corresponding to those illustrated in FIG. 60A for NV-pCNFET devices, for example. However, OFF NV-CNFET device operation results in no current flow between contacts 6425 and 6430 as long as applied voltages between contacts 6425, 6430, and gate 6415 remain below levels needed to trigger a RESET operation or SET or CC SET operations.

In operation, if NV-CNFET device voltages are relatively high so as to trigger a RESET or SET operation as described in more detail in incorporated U.S. patent application Ser. No. 11/280,786, entitled "Two-terminal nanotube devices and systems and methods of making same," filed on Nov. 15, 2005, U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007 or to trigger a CC SET operation as described further above with respect to FIGS. 51-58, then switch 6440 OPENs if RESET operating conditions are applied and CLOSEs if SET or CC SET operating conditions are applied representing changes in the state of semiconducting nanotube fabric 6405.

Figure 64D:
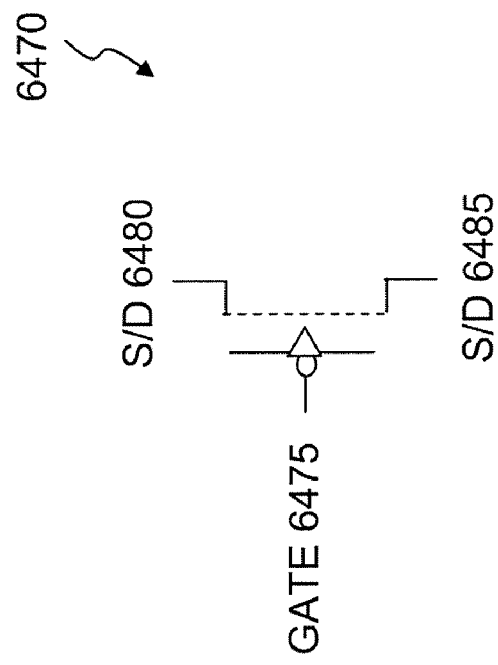
FIG. 64D shows a schematic representation of a p-type NV-CNFET device (NV-pCNFET device)
Figure 64C:
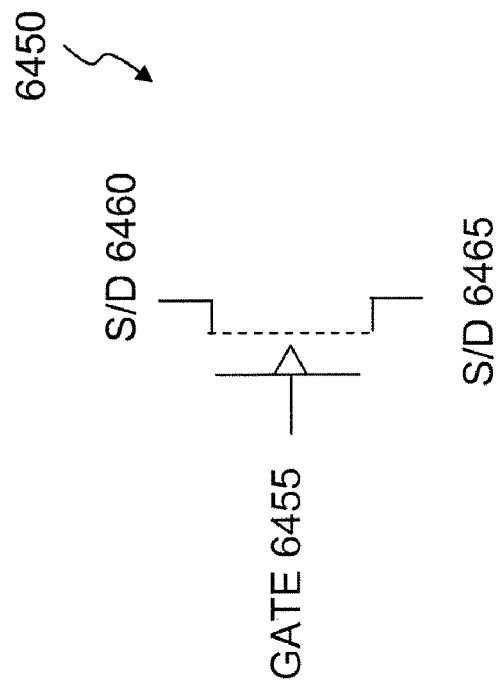
FIG. 64C shows a schematic representation of an n-type NV-CNFET device (NV-nCNFET device)

NV-nCNFET 6450 illustrated in FIG. 64C is a modification of a symbolic representation that is similar to nCNFET symbol 5970 illustrated in FIG. 59C except that a triangle has been added in contact with gate 6455 to indicate that both NV NT switch-type nonvolatile storage and nCNFET volatile modes of operation are possible. NV-nCNFET 6450 is a symbolic representation of an n-version of NV-CNFET 6400 or 6400' illustrated in FIGS. 64A and 64B, respectively, that shows gate 6455, corresponding to gate 6415, S/D 6460 corresponding to S/D region 6422, and S/D 6465 corresponding to S/D region 6428. NV-pCNFET 6470 illustrated in FIG. 64D is a modification of a symbolic representation that is similar to pCNFET symbol 5980 illustrated in FIG. 59D except that a triangle has been added in contact with gate 6475 to indicate that both NV NT switch-type nonvolatile storage and pCNFET volatile modes of operation are possible. NV-pCNFET 6470 is a symbolic representation of a p-version of NV-CNFET 6400 or 6400' illustrated in FIGS. 64A and 64B, respectively, that shows gate 6475, corresponding to gate 6415, S/D 6580 corresponding to S/D region 6422, and S/D 6485 corresponding to S/D region 6428.

In operation, FIG. 64A shows a cross section of NV-CNFET 6400 that may be operated as NV-nCNFET 6450 illustrated schematically in FIG. 64C, for example, with the channel region controlled by the voltage on gate 6415 relative to contacts 6425 and 6430. The operating voltage may be in the 1-3 volt range for example. In other words, NV-CNFET 6450 is in a SET or ON state. In this example, a positive gate forms a channel region which enables current flow contacts 6425 and 6430. However, NV-CNFET 6400' shows the channel region in a RESET or OFF state. In this case, an applied gate voltage in the 1-3 volt range does not form a continuous channel region and no current flows between contacts 6425 and 6430.

In a SET mode of operation, a relatively high gate voltage such as 4-6 volts may be applied one or more times to gate 6415 relative to one of the contacts 6425 or 6430 and the state of NV-CNFET 6400' transitions from a RESET to a SET state corresponding to NV-nCNFET 6400. Alternatively, SET voltage and current pulses may be applied to terminals 6425 and 6430 independent of gate 6415 which causes NV-CNFET 6400' to transition from a RESET to a SET state corresponding to NV-CNFET 6400.

In a RESET mode of operation, a relatively high RESET voltage and current in the 4-6 volt range may be applied to terminals 6425 and 6430 of NV-CNFET 6400 which is a SET or ON state that causes a transition to a RESET or OFF state as illustrated by NV-CNFET 6400 with switch 6440 in the open position.

A second gate (not shown) on the opposite side of channel region 6412 from gate 6415 may be added to shift the threshold (switching point) of NV-CNFET 6400 or to form a second control gate such that channel region 6412 may be controlled by gate 6415 or a second gate or both gates. Control by both gates may be used to form a two-input logic function such as an OR function by sharing the same channel region. The use of front gates and back gates in CNFET-type devices is described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006.

NRAM® and NanoLogic® Application Examples Using Nonvolatile Nanotube FET Devices NRAM® Memory Arrays Using NV-CNFET Devices Dense NRAM® memory arrays may be formed using NV-CNFET structures such as NV-CNFETs 6400 and 6400' illustrated in FIGS. 64A and 64B, respectively, for example, and represented symbolically by NV-nCNFET 6450 or NV-pCNFET 6470 illustrated in FIGS. 64C and 64D, respectively, or both depending on the application.

Figure 65:
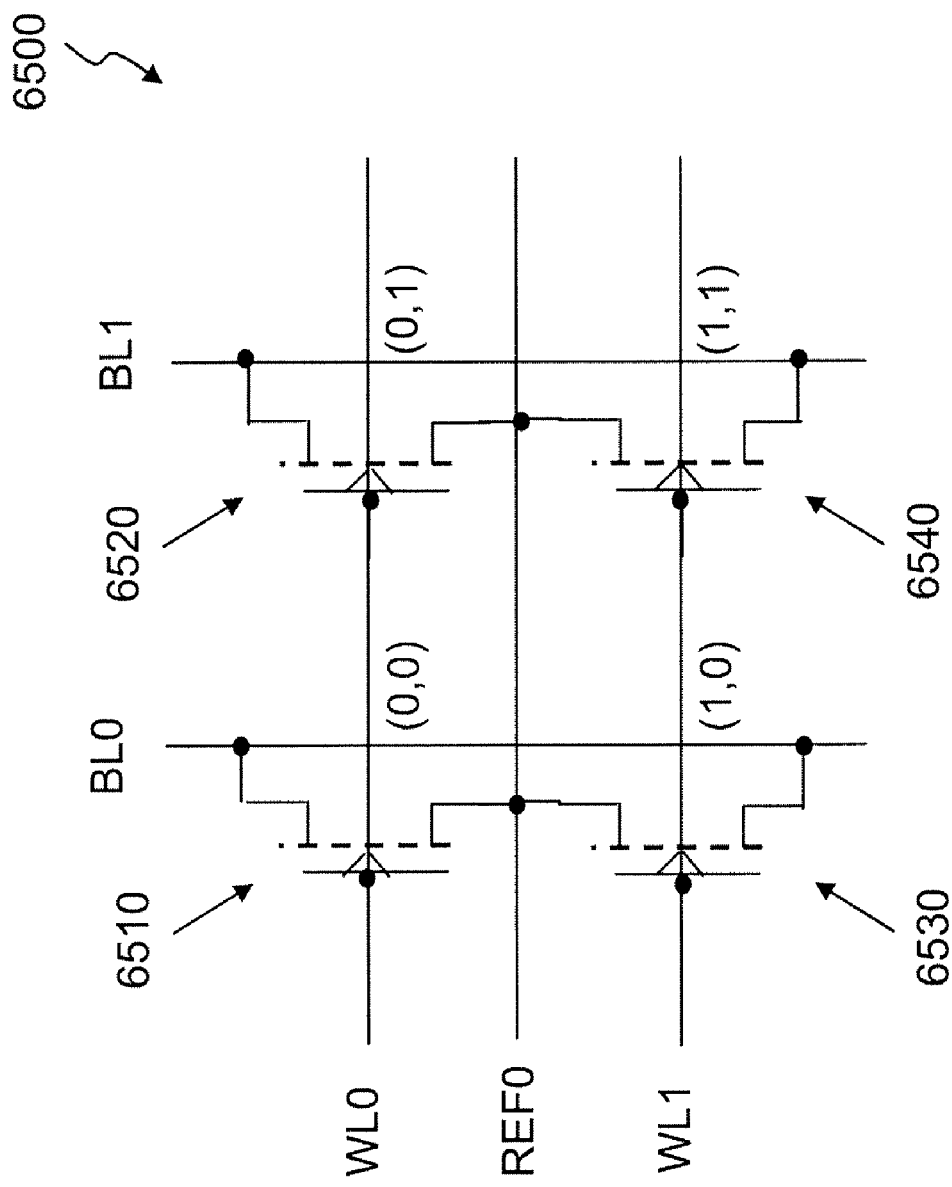
FIG. 65 shows a schematic representation of an NRAM® formed using one NV-CNFET device for each cell.

FIG. 65 illustrates NRAM® array schematic 6500 formed using NV-nCNFETs 6510, 6520, 6530, and 6540 that perform both CNFET select and NV NT switch storage functions in each NV-nCNFET-based cells (0,0), (0,1), (1,0), and (1,1) as described further above with respect to FIGS. 64A and 64B and corresponding to NV-nCNFET 6450-type devices illustrated symbolically in FIG. 64C. The gates of NV-nCNFETs 6510 and 6520 are connected to array word line WL0 and the first S/Ds are connected to shared array REF0 line. The gates of NV-nCNFETs 6530 and 6540 are connected to array word line WL1 and the first S/Ds are also connected to shared array REF0 line to maximize array density. The second S/Ds of NV-nCNFET 6510 and 6530 are connected to array bit line BL0 and the second S/Ds of NV-nCNFET 6520 and 6540 are connected to array bit line BL1.

NRAM® array schematic 6500 using three-terminal NV-nCNFETs may achieve approximately the same density as two-terminal NV NT switches connected between corresponding array word lines WL0 and WL1 and array bit lines BL0 and BL1 at each of cells (0,0), (0,1), (1,0), and (1,1) but without the resulting sneak paths that prevent operation of such arrays as described in incorporated U.S. patent application Ser. No. 12/486,602, entitled "NRAM ARRAYS WITH NANOTUBE BLOCKS, NANOTUBE TRACES, AND NANOTUBE PLANES AND METHODS OF MAKING SAME," filed on Jun. 17, 2009, the entire contents of which are incorporated herein by reference.

A READ cells (0,0) and (0,1) operation may be performed by pre-charging bit lines BL0 and BL1, reference line REF0 is at a reference voltage such as zero volts, and pulsing word line WL0. Word line WL1 remains at a low voltage such as ground, for example. If NV-nCNFET 6510 is in a low resistance ON state, then bit line BL0 is partially discharged and the low resistance state ON state is sensed (detected). If NV-nCNFET 6510 is in a high resistance OFF state, then bit line BL0 is not discharged and a high resistance OFF state is sensed (detected). If NV-nCNFET 6520 is in a low resistance ON state, then bit line BL1 is partially discharged and the low resistance state ON state is sensed (detected). If NV-nCNFET 6520 is in a high resistance OFF state, then bit line BL1 is not discharged and a high resistance OFF state is sensed (detected). NV-nCNFETs 6530 and 6540 remain OFF because word line WL1 is at a low voltage such as ground. Multiple resistance ON state values may be stored in NV-nCNFET 6510, 6520, 6530, and 6540 devices at each cell location corresponding to multiple resistance states stored in NV NT switches described in more detail in incorporated U.S. patent application Ser. No. 11/835,612, entitled "NONVOLATILE RESISTIVE MEMORIES HAVING SCALABLE TWO-TERMINAL NANOTUBE SWITCHES", filed on Aug. 8, 2007. An NRAM® memory array layout corresponding to NRAM® array schematic 6500 approaches a maximum of 4 $F^2$ per cell density when storing one bit per cell (one low resistance ON state or one high resistance OFF state). Greater density is possible with additional ON resistance states per cell.

In operation, RESET and SET or CC SET switching operations as described above with respect to FIGS. 64A and 64B may be applied to an NRAM® memory array structure corresponding to NRAM® array schematic 6500. In this example, NV-nCNFETs 6510 and 6520 may be selected by WL0. WL1 is held at a low voltage such as ground such that NV-nCNFETs 6530 and 6540 are in OFF state. Then, one or more CC SET pulses may be applied to WL0 with BL0, BL1, and REF0 at a low voltage such as ground, for example. After the CC SET operation, both NV-nCNFETs 6510 and 6520 are in a low resistance ON state. That is, if one or both NV-nCNFETs 6510 and 6520 are in a high resistance OFF state, one or both transition to a low resistance ON state, respectively, as described further above with respect to FIGS. 51-58. But if one or both NV-nCNFETs are in a low resistance ON state, they remain in a low resistance ON state after the CC SET operation. Next, a RESET operation may be selectively performed by selectively activating one or more bit lines corresponding to NV-nCNFET devices that are to be switched to a high resistance ON state. In this example, cell (0,0) is to remain in a low resistance state and cell (0,1) is to switch to a high resistance state. Word line WL0 is activated (switched to a higher voltage) and bit line BL0 is held at a low voltage such as ground. Reference line REF0 is held at a low voltage such as ground. Bit line BL1 is pulsed and RESET current flows through NV-nCNFET 6520 from bit line BL0 to reference REF0, for example. Therefore, NV-nCNFET 6520 transitions from a low resistance ON state to a high resistance OFF state. The resistance states of NV-nCNFET 6530 and 6540 remain unchanged.

In operation, a SET function may be used instead of a CC SET operation. Also, one or more pulses may be used when programming a resistance state or when programming multiple resistance states.

NanoLogic® Programmable NPAL and NPLA Logic Arrays Using NV-CNFET Devices

Figure 66:
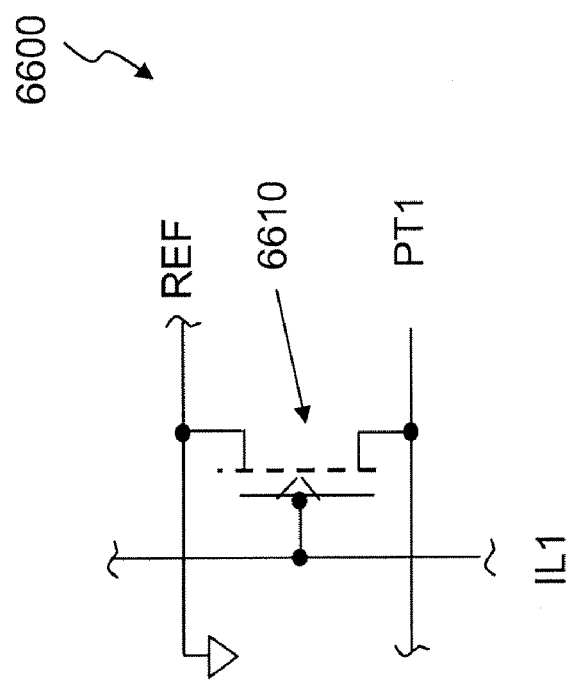
FIG. 66 shows a schematic representation of a nonvolatile programmable/reprogrammable logic array cell formed using one NV-CNFET device.

Programmable AND array 3505, which forms the programmable logic array of NPLA 3500 illustrated in FIG. 35, uses storage cells corresponding to NRAM® memory arrays in which cells are formed by a select FET and a NV NT switch in series as described further above with respect to FIG. 35. FIG. 66 illustrates denser (smaller) programmable logic array cell 6600 which may be used to replace programmable AND array 3505 cells for greater density and/or more NPAL logic function in the same area. Programmable logic array cell 6600 uses NV-nCNFET 6610 for both select and nonvolatile state storage functions. A first S/D of NV-nCNFET 6610 is connected to logic array reference line REF which may be connected to a reference voltage such as ground, for example, a second S/D of NV-nCNFET is connected to logic array product term PT1, and the gate of NV-nCNFET is connected to logic array input line IL1. Programmable logic array cell 6600 is compatible with other circuits in NPAL 3500 and operates as described further above with respect to FIG. 35.

Programmable logic array cell 6600 may also be used in AND array 3605 and OR array 3610 of NPLA 3600 illustrated further above in FIG. 36A.

NanoLogic® Programmable Multiplexer Logic Using NV-CNFET Devices

Figure 67:
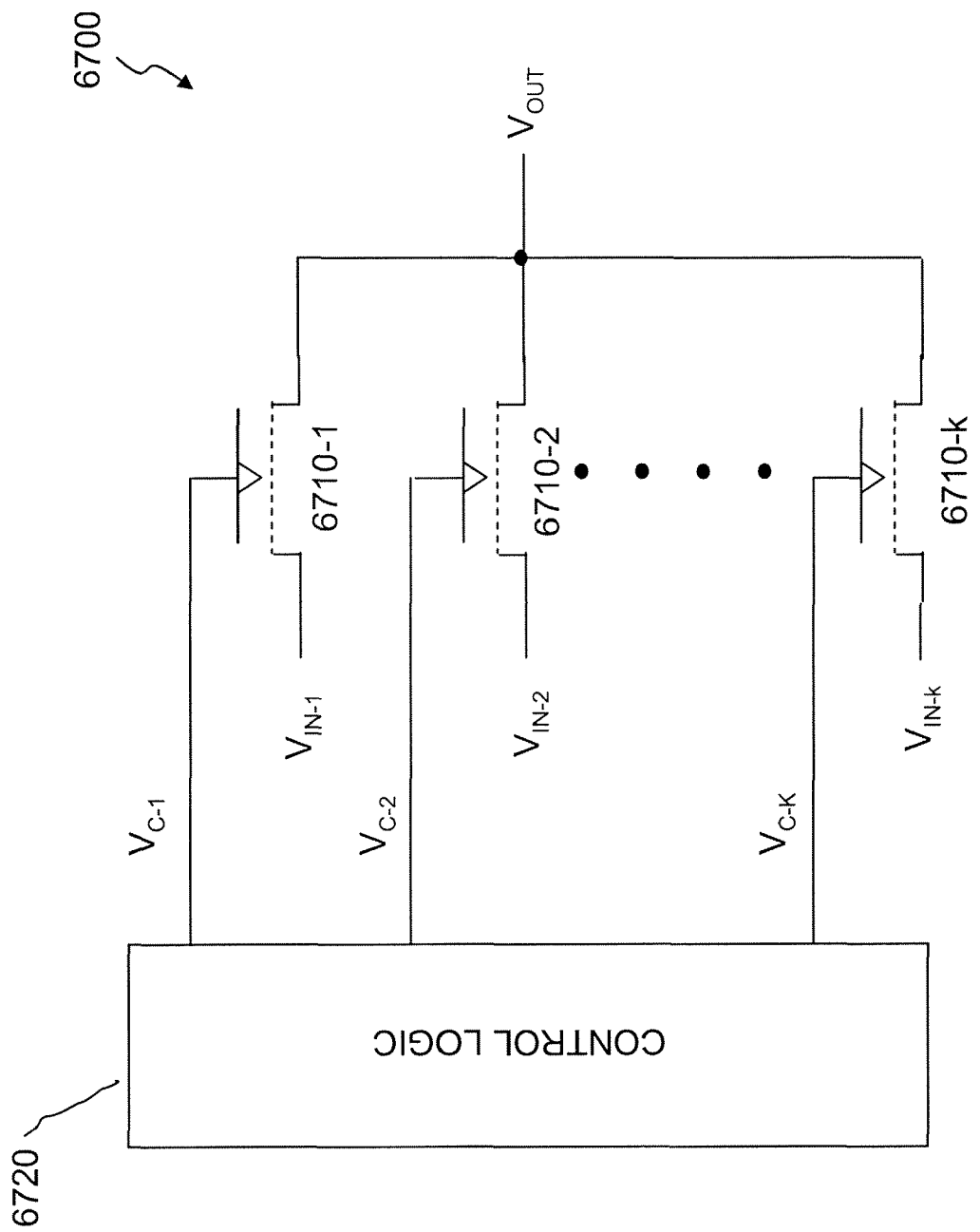
FIG. 67 shows a schematic representation of a nonvolatile programmable/reprogrammable multiplexer (MUX) logic circuit formed using NV-CNFET devices.

NV-CNFET devices such as NV-nCNFET 64C illustrated in symbolic form in FIG. 64C may be used to form Nano-Logic® programmable multiplexer (MUX) logic functions. FIG. 67 illustrates programmable multiplexer (MUX) 6700 in schematic form. Programmable MUX 6700 includes k inputs $V_{IN-1}, V_{IN-2}, \ldots, V_{IN-K}$ to first S/Ds of k NV-nCNFET devices 6710-1, 6710-2, ..., 6710-$k$. Outputs of the k NV-nCNTFET devices 6710-1, 6710-2, ..., 6710-$k$ are connected and form output $V_{OUT}$. Control logic 6720 applies control voltages $V_{C-1}, V_{C-2}, \ldots, V_{C-K}$ to the gate terminals of NV-nCNFET devices 6710-1, 6710-2, ..., 6710-k.

In a first mode of operation, NV-nCNFETs 6710-1, 6710-2, ..., 6710-k of programmable MUX 6700 are in a low resistance ON state and the transfer of one input voltage such as $V_{IN-K}$ to output $V_{OUT}$ is determined by control logic 6720 control logic voltages. In this example, $V_{C-1}$ and $V_{C-2}$ and all other voltages except $V_{C-K}$ are at a low voltage such as ground and $V_{C-K}$ is a higher voltage which turns NV-nCNFET 6710-k ON thereby transferring signal $V_{IN-K}$ to output $V_{OUT}$.

In a second mode of operation, control logic 6720 performs a RESET operation in which all NV-nCNFETs 6710-1, 6710-2, and all other NV-nCNFETs transition to a nonvolatile OFF state except for NV-nCNFET 6710-k which remains or transitions to a nonvolatile ON state. In this second mode of operation, the programmable MUX logic 6700 function is restored to the pre-power-down setting when power is restored. In the second mode of operation, only NV-nCNFET 6710-k is in ON state while NV-nCNFETs 6710-1, 6710-2, and all other NV-nCNFETs except 6710-k are in a nonvolatile OFF high resistance RESET state. In this case, $V_{C-1}$, $V_{C-2}$, and all other gate voltages except $V_{C-K}$ may be at any voltage within an operating range, 0-3 volts for example. So for example, control logic 6720 may activate all gate control lines $V_{C-1}, V_{C-2}, \ldots, V_{C-K}$; however only $V_{IN-K}$ is transferred to output $V_{OUT}$.

CNFET Devices for Digital & Analog Applications

Complementary integrated CNFET device pairs are illustrated. These pCNFET and nCNFET devices fabricated using bottom contacts and top gates with semiconductor nanotube fabric may be interconnected to form complementary carbon nanotube integrated circuits such as CCN-NOT circuits for example.

Multiple integrated CNFET devices pairs are formed using various methods of fabrication to generate integrated complementary CNFETs that may be interconnected to form CCN-NOT circuits. Additional complementary CNFET devices may also be fabricated to form more complex digital circuits such as NAND and NOR for example as well as analog circuits.

One method of fabrication is used to form a complementary integrated CNFET pair that uses annealing temperatures and oxygen exposure to generate integrated complementary CNFET device pairs. Another method of fabricating a complementary integrated CNFET device pair includes optimization of electrical characteristics using ion implantation methods. Still another method of fabricating a complementary integrated CNFET device pair enables sharing one contact between an integrated complementary CNFET pair that increases density (reduces circuit area) by approximately 30%. The shared contact includes ion implantation methods to enable shared contact to inject both holes and electrons.

CNFET Devices with Bottom Contacts & a Top Gate

CNFET devices have similarities and differences with respect to structure and electric properties when compared with bulk, SOI, thin film, or other semiconductor FETs. The electrical behavior of CNFET devices may be analyzed in a classical approach in terms of channel region formation, threshold voltage, carriers scattering due to adsorbed impurities on CNT surfaces, and trapped charges at gate oxide/CNT interfaces for example. Semiconducting CNTs exhibit bandgaps (energy gaps) that are proportional to the inverse of CNT diameters (Eg $\alpha$ $1/d_{CNT}$) such that Eg~0.6 eV for SWNTs with $d_{CNT}$=1.4 nm and Eg~0.85 eV for single-wall nanotubes (SWNTs) with $d_{CNT}$=1 nm for individual CNTs for example. While CNFET devices may be formed using multi-wall nanotubes (MWNTs) assuming a semiconducting outer wall, higher CNT outer wall diameters such as $d_{CNT}$~15 nm, for example, result in smaller bandgaps (less than 0.1 eV) and parallel current paths due to coupling to CNT inner walls that are not controlled by the CNFET device gate thereby making MWNTs less desirable than SWNTs for use in CNFET devices. Electrical characteristics of patterned semiconductor nanotube fabric-based CNFET devices in these examples are formed using patterned semiconducting nanotube fabrics formed with SWNT carbon nanotubes (CNTs) and exhibit electrical characteristics (properties) corresponding at least one or several CNTs in parallel as described further above with respect to FIGS. 59 and 60. Threshold voltages may be estimated based on gate insulator thickness and relative dielectric constant. Electron or hole mobility in the channel region is limited by scattering due to adsorbed impurities on CNT surfaces and trapped charges gate insulator/CNT interfaces for example.

Source/drain regions and associated contacts behave differently when contacting individual CNTs that form CNFET devices than when contacting highly doped regions of bulk or SOI FET devices for example. In the case of bulk or SOI FET devices for example, contacts resistance is approximately ohmic and typically of low resistance in the milliohm to a few ohms range depending on the area of the contact region and the semiconductor doping level. In the case of CNTs, there is a quantum contact resistance between a CNT and a macroscopic contact that exists because of a mismatch between the small number of available conducting channels in the CNT and the large number of conducting channels available in the macroscopic contact. The well known theoretical minimum contact resistance per contact is approximately 6.5 k$\Omega$ per contact. Typically, the contact resistance is higher than 6.5 k$\Omega$. For Ti/Pd contacts to SWNTs, measurements indicate a range of 10 k$\Omega$ to 30 k$\Omega$ resistance per CNT contact. For nanotube fabrics, the contact resistance per contact is divided by the number of parallel active CNTs. The relatively high transconductance associate with CNFET devices is reduced by the contact resistance value.

Another importance difference between contacts to CNTs for CNFET devices and contacts to highly doped semiconductor regions for FETs is that conductors forming contacts to CNTs form both the contact region and the source/drain region of CNFET devices in the form of Schottky barrier-type junctions. The contact barrier in the contact region may enable or disable injections of holes or electrons for pCNFET or nCNFET devices, respectively, or may enable injection of both holes and electrons for ambipolar CNFET devices as illustrated further above with respect to FIGS. 59 and 60.

Three-terminal CNFET device structures and corresponding electrical characteristics are discussed further below for CNFET devices with bottom contacts to individual CNTs in a patterned semiconductor nanotube fabric and a top gate on a gate insulator above the patterned semiconductor nanotube fabric that electrostatically couples to the underlying semiconductor nanotube fabric forms and unforms a channel region in the nanotube fabric between a pair of contacts. Integrated pCNFET and nCNFET device structures are illustrated because complementary circuits are required for many high density technology applications to limit dc current and control power dissipation. nCNFET and pCNFET devices may be combined to form complementary carbon nanotube functions such as NOT (inverters), NAND, NOR and other digital logic circuits as well as analog circuits. Integrated carbon nanotube device examples using one device type, pCNFET or nCNFET for example, are illustrated in FIGS. 64A and 64B for example. Integrated complementary carbon nanotube device examples using both pCNFET and nCNFET devices illustrated further below with respect to FIGS. 68C-68J illustrate various integrated pCNFET and nCNFET devices with electrical characteristics illustrated in FIGS. 68K and 68L that may be connected to form an integrated CCN-NOT circuit.

Figure 68A:
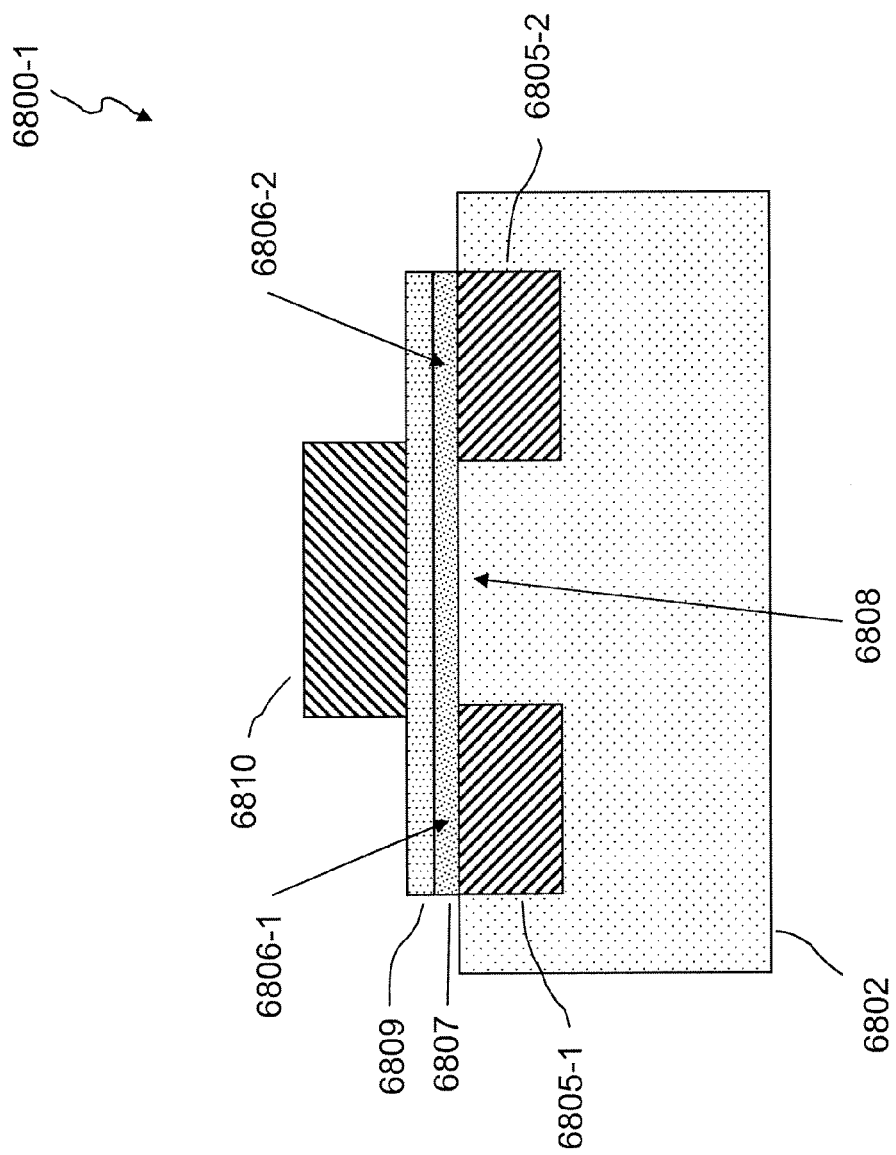
FIG. 68A shows a cross section of a CNFET similar to FIG. 59B.

Integrated Complementary Carbon Nanotube (CCN) Technology Formed Using Annealing Temperature and Oxygen Exposure CNFET device 6800-1 illustrated as a cross section in FIG. 68A is similar to CNFET device 5940 illustrated in FIG. 59B described further above. CNFET device 6800-1 includes patterned gate insulator 6809 on patterned semiconducting nanotube fabric 6807 on an underlying insulator 6802 that includes embedded bottom contacts such as contacts 6805-1 and 6805-2 in electrical and physical contact with the underside of semiconductor nanotube fabric 6807. A top gate such as gate 6810 is formed on gate insulator 6809 which is in contact with the top surface of semiconductor nanotube fabric 6807. Contact 6805-1 which is in contact with S/D region 6806-1, contact 6805-2 which is in contact with S/D region 6806-2, and gate 6810 which is electrostatically coupled to channel region 6808 form the three terminals of CNFET device 6800-1. An optional backgate for additional control of the electrical characteristics of CNFET device 6800-1 may be included (not shown) as described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006. The device channel length $L_{CH}$ is defined by the separation of S/D regions 6806-1 and 6806-2 which is approximately equal to the separation between contacts 6805-1 and 6805-2 illustrated in FIG. 68A. Semiconductor nanotube fabric 6807 replaces the semiconductor substrate used for well known industry NFET and PFET devices.

CNFET device 6800-1 may have electrical characteristics of a pCNFET, an nCNFET, or of an ambipolar CNFET as described further above with respect to CNFET device 5940 in FIG. 50B and electrical characteristics shown in FIGS. 60A and 60B and as described further below with respect to FIGS. 68B-68L. For a pCNFET device (p-type CNFET device behavior), a more negative voltage than the threshold voltage applied to gate 6810 relative to contacts 6805-1 and 6805-2 makes channel region 6808 more conductive and a less negative voltage makes channel region 6808 less conductive as illustrated further above with respect to FIG. 60A. For an ambipolar CNFET device (both p-type and n-type CNFET device behavior), a more negative voltage than the threshold voltage applied to gate 6810 relative to contacts 6805-1 and 6805-2 makes channel region 6808 more conductive. However, a more positive voltage than the threshold voltage applied to gate 6810 relative to contacts 6805-1 and 6805-2 also makes channel region 6808 more conductive as illustrated further above with respect to FIG. 60B. For an nCNFET device (n-type CNFET device behavior), a more positive voltage than the threshold voltage applied to gate 6810 relative to contacts 6805-1 and 6805-2 makes channel region 6808 more conductive and a less positive voltage makes channel region 6808 less conductive. As described further above with respect to FIG. 59B, CNFET device are typically p-type (pCNFET) as initially fabricated (formed) and can be modified by various methods described further below.

Contacts 6805-1 and 6805-2 are preferably made of conductive materials such as Ru, Ti, Cr, Al, Au, Pd, Ni, W, Cu, Co, Mo, Ag, In, Ir, Pb, Sn, as well as other suitable metals, and combinations of these such as Ti/Pd, for example. pCNFET electrical characteristics 6000 were measured on a pCNFET device that included Ti/Pd contacts. Metal alloys such as TiAu, TiCu, TiPd, PbIn, TiC, and TiW and conductive nitrides, oxides, or silicides such as RuN, RuO, TiN, TaN, $CoSi_x$ and $TiSi_x$ may also be used. Semiconducting material such as polysilicon, germanium, and silicides of silicon, and other semiconducting materials may also be used. Carbon may be used as a contact material as well as carbon nanotube fabrics themselves (single walled, multiwalled, and/or double walled, for example) typically in the form of patterned nanotube fabrics that may include both metallic and semiconducting carbon nanotubes. Also, contacts may be formed of mixed or nanoscopic materials that include conductor and semiconductor nanoscopic particles such as W, Ti, TiN, TiC, B, P, K, Pd, Si, and Ge and may also include carbon and one more allotropes of carbon, and other conductive materials such as those listed further above. Nanoscopic particles may also include insulators such as $SiO_2$, SiN, $Al_2O_3$, and other insulators. Mixed or nanoscopic materials and nanoscopic particles are described in more detail in the incorporated U.S. patent application Ser. No. 12/356,447, entitled "Nonvolatile Nanotube Diodes and Nonvolatile Nanotube Blocks and Systems Using Same and Methods of Making Same," filed on Jan. 20, 2009. Other kinds of conductor, semiconductor, or insulating materials may also be used. Contacts 6805-1 and 6805-2 generally have a thickness in the range of 5 to 500 nm, for example.

Gate insulator 6809 may be formed of $SiO_2$, SiN, $Al_2O_3$, BeO, and also high relative dielectric constant materials such as $Ta_2O_5$ (tantalum pentoxide) and $HfO_2$ (hafnium oxide) or other suitable insulating material, and have a thickness in the range of less than 2 to greater than 10 nm, for example. Gate 6810 may be formed of the same materials listed above with respect to contacts 6805-1 and 6805-2. The channel length, approximately equal to the spacing between contacts 6805-1 and 6805-2, is scaled based on gate insulator type and thickness, gate and contact electrical characteristics, and may range from sub-10 nm to 100 nm or more for example. The various conductor, semiconductor, and insulator materials listed above with respect to FIG. 68A may also be used in CNFET device structures illustrated in FIGS. 68B-68J illustrated further below.

Figure 68B:
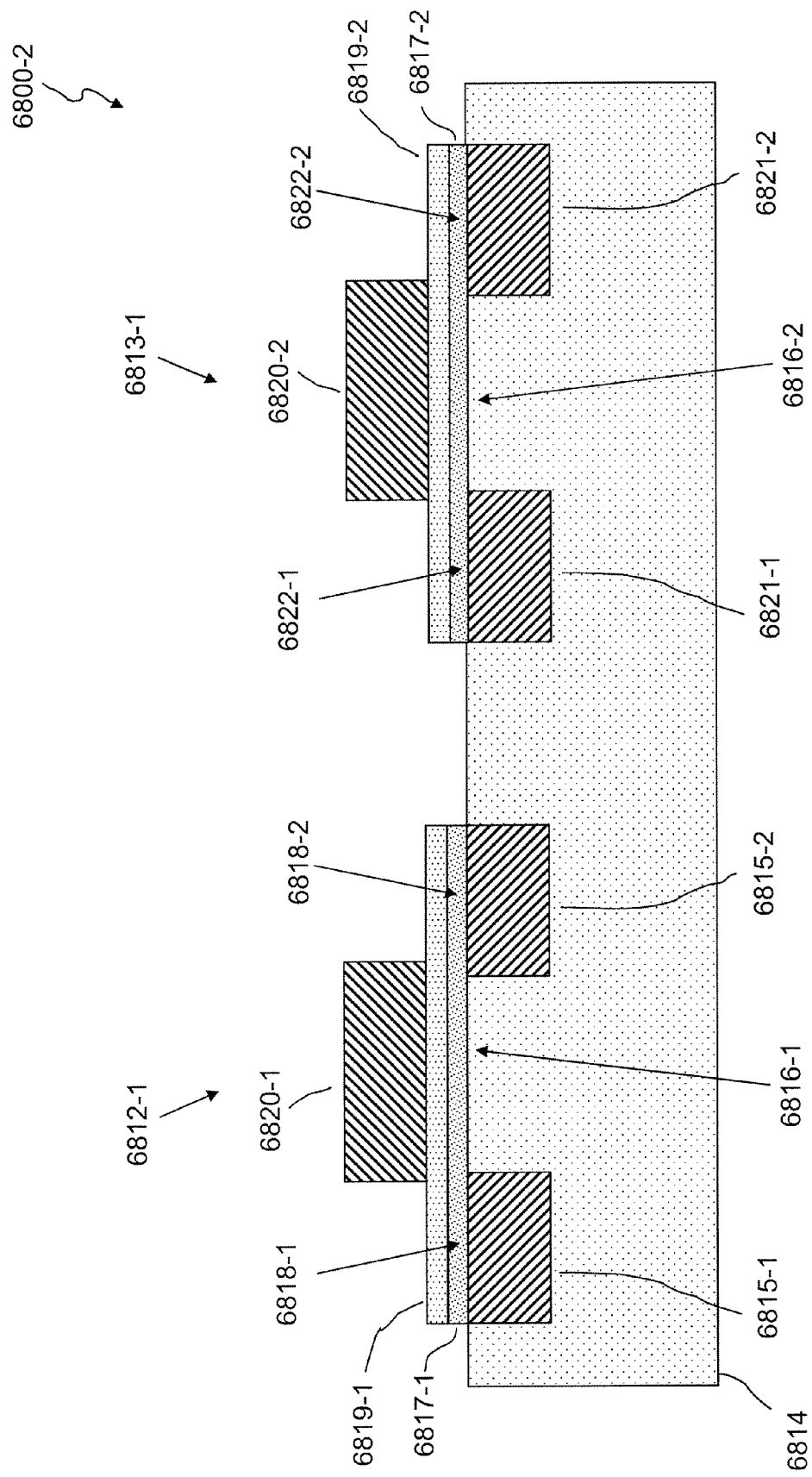
FIG. 68B shows a cross section of an integrated CNFET device pair formed using CNFET devices similar to the CNFET device of FIG. 68A.

FIG. 68B illustrates the fabrication of an integrated pair of CNFET devices that may both be pCNFET devices sharing an insulating substrate. Also, the integrated pair of CNFET devices may both be nCNFET devices sharing an insulating substrate. Also, the pair of CNFET devices may be a pair of ambipolar CNFET devices sharing an insulating substrate. FIG. 68B may also be used as a starting point for the fabrication of complementary CNFET devices, at least one pCNFET and one nCNFET device, as illustrated further below with respect to FIGS. 68C-68J.

Figure 68C:
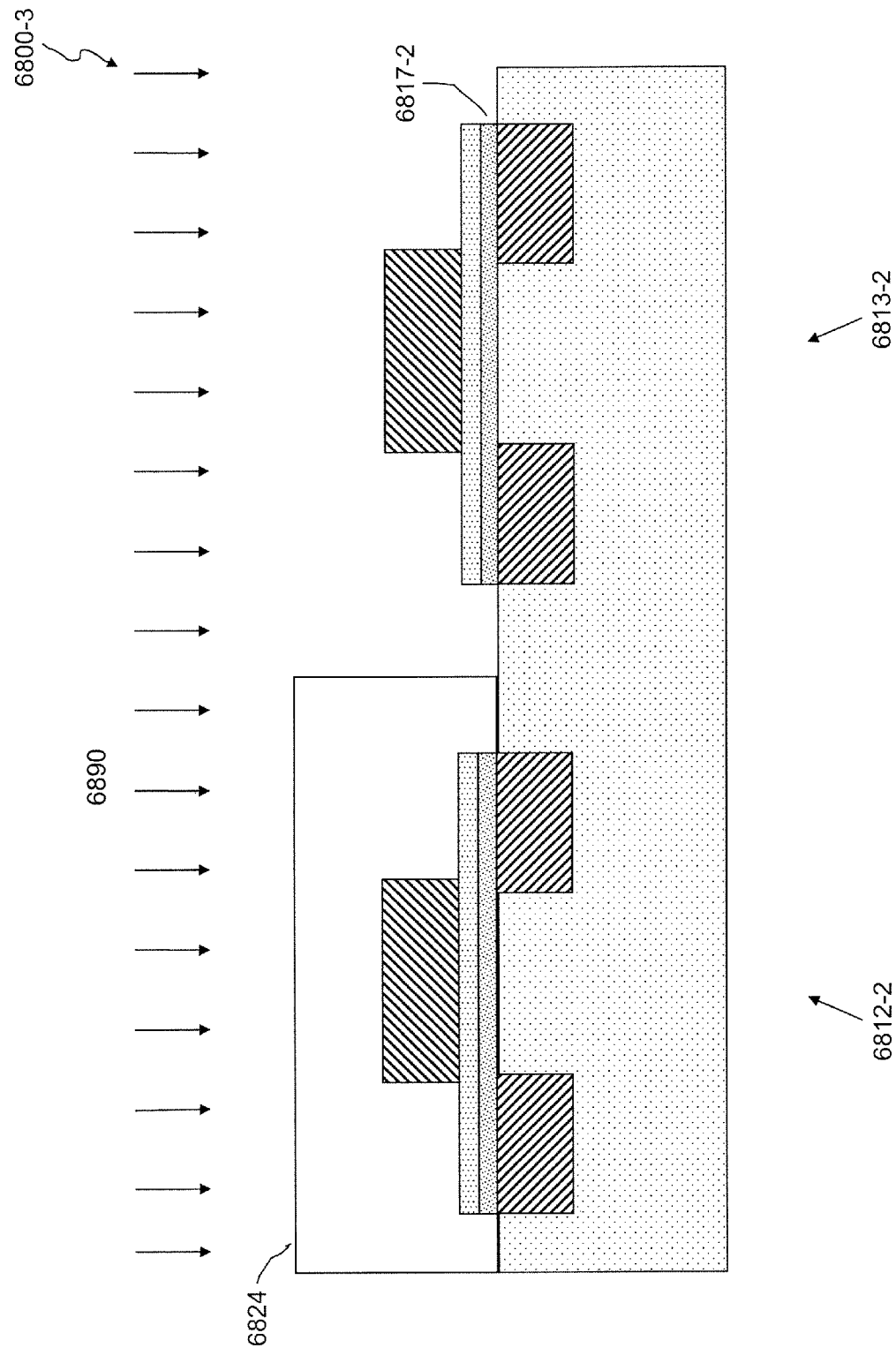
FIG. 68C shows the cross section of FIG. 68B in which one of the CNFET devices is protected while the is exposed to a gas.
Figure 68D:
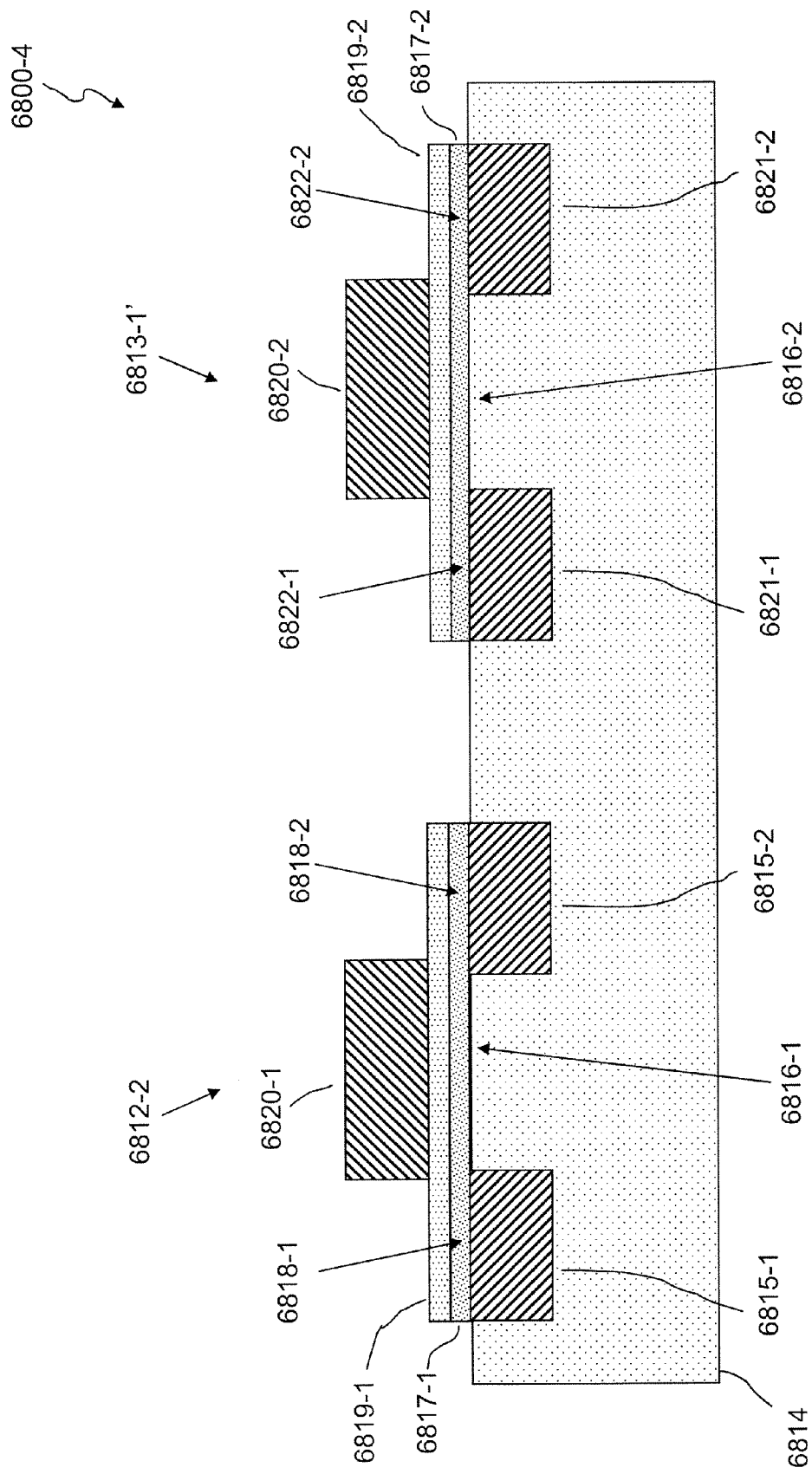
FIG. 68D shows the cross section of FIG. 68B with one n-type CNFET and one p-type CNFET to form integrated complementary pCNFET and nCNFET devices.

FIGS. 68B-68D illustrates the fabrication (formation) of a pair of adjacent complementary pCNFET and nCNFET devices in the same insulator (integrated pair of complementary CNFET devices) that may be interconnected to form a CCN-NOT circuit for example. Integrated CNFET device pair 6800-2 illustrated in FIG. 58B shows CNFET device 6812-1 and CNFET device 6813-1 which are typically both pCNFET devices because CNFET devices using semiconductor nanotube fabrics are typically p-type as-fabricated as described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006. CNFET devices 6812-1 and 6813-1 may both be changed to n-type CNFET devices 6812-2 and 6813-2 as illustrated by integrated CNFET device pair 6800-3 in FIG. 68C by annealing in a vacuum or inert gas. Then, nCNFET device 6812-2, which is protected by a sacrificial film layer, remains unchanged. However, nCNFET device 6813-2 which is not protected is exposed to oxygen (exposure to air may also be used) and converts back to a pCNFET illustrated in FIG. 68D as pCNFET device 6813-1' resulting in a complementary integrated CNFET device pair illustrated in FIG. 68D.

Integrated CNFET device pair 6800-2 illustrated in FIG. 68B includes CNFET device 6812-1 and CNFET device 6813-1 integrated in the same insulator 6814. CNFET devices 6812-1 and 6813-1 correspond to CNFET device 6800-1 illustrated in FIG. 68A. For the CNFET device 6812-1 structure, insulator 6814 corresponds to insulator 6802, contacts 6815-1 and 6815-2 correspond to contacts 6805-1 and 6805-2, respectively, semiconductor nanotube fabric 6817-1 corresponds to semiconductor nanotube fabric 6807, S/D regions 6818-1 and 6818-2 correspond to S/D regions 6806-1 and 6806-2, respectively, channel region 6816-1 corresponds to channel region 6808, gate insulator 6819-1 corresponds to gate insulator 6809, and gate 6820-1 corresponds to gate 6810. For the CNFET device 6813-1 structure, insulator 6814 corresponds to insulator 6802, contacts 6821-1 and 6821-2 correspond to contacts 6805-1 and 6805-2, respectively, semiconductor nanotube fabric 6817-2 corresponds to semiconductor nanotube fabric 6807, S/D regions 6822-1 and 6822-2 correspond to S/D regions 6806-1 and 6806-2, respectively, channel region 6816-2 corresponds to channel region 6808, gate insulator 6819-2 corresponds to gate insulator 6809, and gate 6820-2 corresponds to gate 6810. Both CNFET devices are assumed to p-type as initially fabricated.

After initial fabrication using methods described with respect to FIGS. 68A and 68B and 59B, methods of fabrication result in a pair of adjacent complementary devices, one pCNFET devices and one nCNFET using the relatively simple and well known steps of masking using a sacrificial mask, annealing at elevated temperatures, and exposure to air or oxygen at elevated temperatures as described further below with respect to FIGS. 68C and 68D.

After initial fabrication, integrated CNFET device pair 6800-2 is annealed at elevated temperatures in a vacuum or in an inert gas for a sufficient time to change pCNFET devices 6812-1 and 6813-1 to nCNFET devices 6812-2 and 6813-2 illustrated by integrated CNFET device pair 6800-3 in FIG. 68C. During annealing, both pCNFET devices 6812-1 and 6813-1 first become ambipolar as illustrated by electrical characteristic 6050 illustrated in FIG. 60B and then both pCNFET devices change to nCNFET devices 6812-2 and 6813-3 illustrated in FIG. 68C. $O_2$ desorption through gate insulators 6819-1 and 6819-2 results in these changes in electrical characteristics for example.

Next, methods pattern a sacrificial mask 6824 to protect nCNFET device 6812-2. Sacrificial mask 6824 may be formed using a hard photoresist, an insulator, conductor, semiconductor or other materials that may later be removed by etching selective to the exposed structures of nCNFET device 6813-2.

Then, methods expose nCNFET device 6813-2 to an oxygen source 6890 such as a gas or an ion implantation for example and semiconductor nanotube fabric 6817-2 adsorbs oxygen and nCNFET device 6813-2 changes back to a pCNFET device shown as pCNFET device 6813-1' illustrated in FIG. 68D. Methods then etch (remove) sacrificial mask 6824 resulting in integrated CNFET device pair 6800-4 illustrated in FIG. 68D with complementary CNFET devices nCNFET 6812-2 and pCNFET device 6813-1'.

In the process of converting fabricated CNFET devices from p-type to n-type and back to p-type by annealing and then oxygen adsorption as described further above with respect to FIGS. 68B to 68D, hole and electron injection at contact barriers formed by Schottky diodes is modified. These Schottky barrier diodes are formed by contacts 6815-1, 6815-2, 6821-1, and 6821-2 which form S/D regions 6818-1, 6818-2, 6822-1, and 6822-2, respectively, in corresponding semiconductor nanotube fabric 6817-1 and 6817-2 regions. These regions are more exposed to changes caused by annealing and oxygen adsorption than semiconducting nanotube fabric channel regions 6816-1 and 6816-2. The resulting modulation of electrical characteristics of contact barriers formed by corresponding Schottky diodes enables hole injection but blocks electrons for pCNFET operation; enables electron injection but blocks holes for nCNFET operation; and enables both hole and electron injection for ambipolar CNFET operation as illustrated by electrical characteristic 6060 in FIG. 60B. Hole and electron carrier modulation may be caused by a movement of the Fermi level caused by desorption and absorption of oxygen in semiconducting CNTs in the nanotube fabric in contact with contacts 6815-1, 6815-2, 6821-1, and 6821-2 for example.

A CCN-NOT (inverter) circuit may be formed by connecting gates 6820-1 and 6820-2 to each other and to a logic input using known interconnect methods, contact 6815-1 may be connected to ground, and contact 6821-2 may be connected to a power supply such as $V_{DD}$. Contacts 6815-2 and 6821-1 may be connected together using known methods to form a logic output. Known methods may be used to complete fabrication and passivation.

Integrated Complementary Carbon Nanotube Technology Formed Using CNT Channel Doping and Contact Region Doping Integrated complementary carbon nanotube technology using annealing temperature and oxygen exposure described further above with respect to FIGS. 68A-68D and FIG. 59B uses relatively simple anneal and oxygen doping methods to achieve integrated complementary pCNFET and nCNFET devices for use in CCN-circuits. This approach corresponds to methods used to fabricate CNFET devices as described in incorporated U.S. patent application Ser. No. 11/332,529, "Field effect device having a channel of nanofabric and methods of making same," filed on Jan. 13, 2006, U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006. However, such an approach does not use (leverage) well known and well controlled semiconductor industry doping methods that may be applied to semiconducting nanotube fabrics using plasma deposition or ion implantation, for example, for more precise control of CNFET electrical characteristics. In this example, ion implantation is used to change one of a pair of pCNFETs devices to an nCNFET device.

Figure 68E:
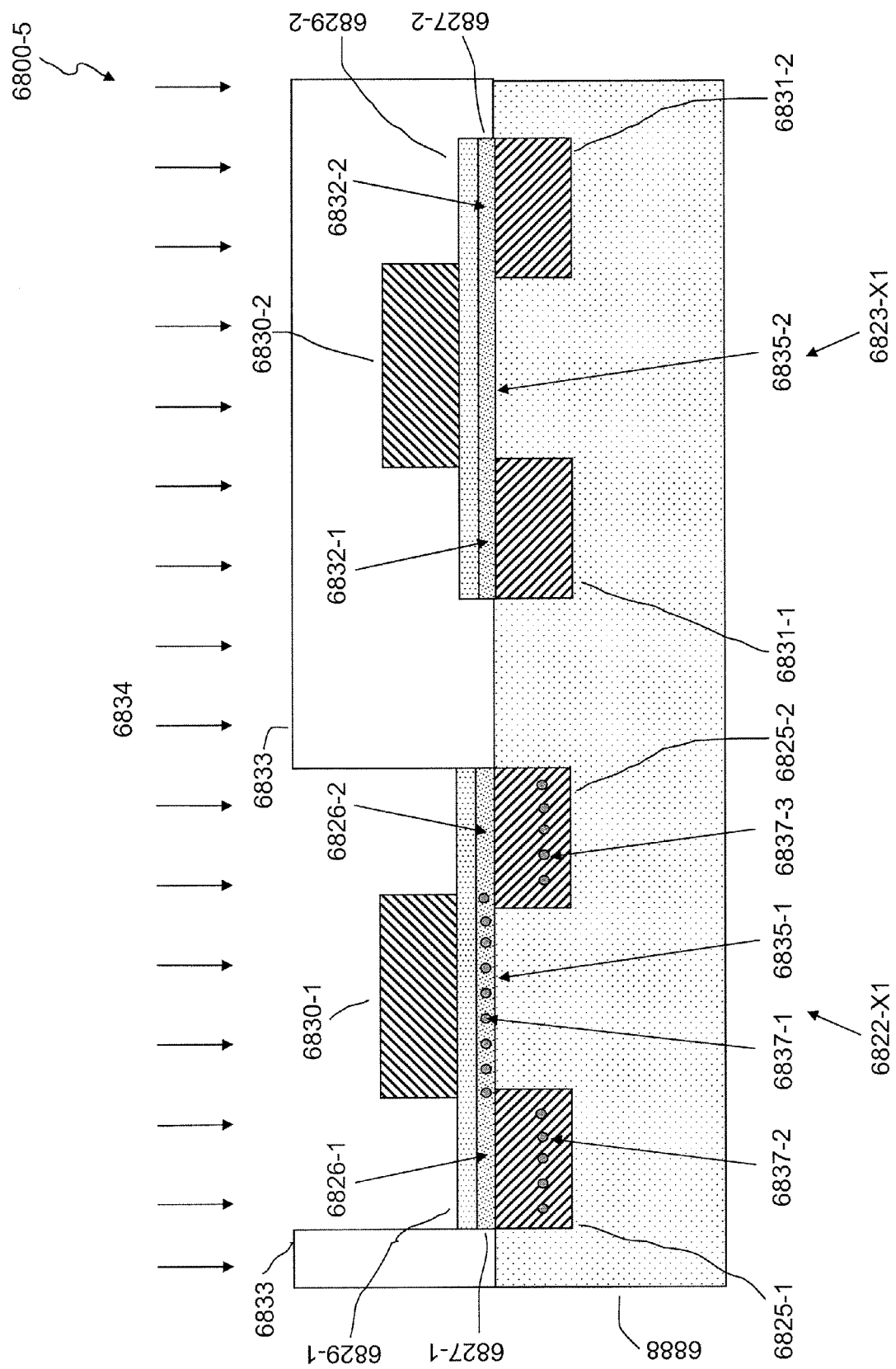
FIG. 68E shows the cross section of FIG. 68B with one protected CNFET device and one exposed CNFET device with ion implanted atoms in the semiconducting nanotube fabric, in the channel region of the CNFET device.

FIG. 68B illustrates CNFET devices 6812-1 and 6813-1, where both are pCNFET devices as-fabricated. FIG. 68E illustrates integrated CNFET device pair 6800-5 in which CNFET device 6812-1 channel region 6816-1 illustrated in FIG. 68B has been modified by ion implantation methods to form CNFET device 6822-X1 illustrated in FIG. 68E with electron donor atoms 6837-1, while CNFET 6813-1 remains unchanged and corresponds to CNFET device 6823-X1 illustrated in FIG. 68E. CNFET device 6822-X1 includes a top gate such as gate 6830-1 which is formed on gate insulator 6829-1 which is in contact with the top surface of patterned semiconductor nanotube fabric 6827-1. Contact 6825-1 which is in contact with S/D region 6826-1, contact 6825-2 which is in contact with S/D region 6826-2, and gate 6830-1 which is electrostatically coupled to channel region 6835-1 form the three terminals of CNFET device 6822-X1. Nanotube fabric 6827-1 is in contact with the top surface of insulator 6888 and the top surface of contacts 6825-1 and 6825-2. An optional backgate for additional control of the electrical characteristics of CNFET device 6822-X1 may be included (not shown). The device channel length $L_{CH}$ is defined by the separation of S/D regions 6826-1 and 6826-2 which is approximately equal to the separation between contacts 6825-1 and 6825-2 illustrated in FIG. 68E. Semiconductor nanotube fabric 6827-1 replaces the semiconductor substrate used for well known industry NFET and PFET devices.

CNFET device 6823-X1 shown in FIG. 68E includes a top gate such as gate 6830-2 which is formed on gate insulator 6829-2 which is in contact with the top surface of patterned semiconductor nanotube fabric 6827-2. Contact 6831-1 which is in contact with S/D region 6832-1, contact 6831-2 which is in contact with S/D region 6832-2, and gate 6830-2 which is electrostatically coupled to channel region 6835-2 form the three terminals of CNFET device 6823-X1. Nanotube fabric 6827-2 is in contact with the top surface of insulator 6888 and the top surface of contacts 6831-1 and 6831-2. An optional backgate for additional control of the electrical characteristics of CNFET device 6823-X1 may be included (not shown). The device channel length $L_{CH}$ is defined by the separation of S/D regions 6832-1 and 6832-2 which is approximately equal to the separation between contacts 6831-1 and 6831-2 illustrated in FIG. 68E. Semiconductor nanotube fabric 6827-2 replaces the semiconductor substrate used for well known industry NFET and PFET devices. Since CNFET device 6823-X1 is protected from further processing by sacrificial mask 6833, CNFET device 6823-1 remains unchanged and in this case, CNFET device 6823-X1 is a pCNFET device as-fabricated.

CNFET device 6822-X1 is shown after ion implantation 6834 by electron donor atoms such as phosphorous (P) or an alkali electron donor atoms such as potassium (K) in channel region 6835-1. Ion implantation 6834 energy is adjusted so the P or K donor atoms 3837-1 may be ion implanted through gate 6830-1 and positioned in semiconductor nanotube fabric channel region 3835-1. The relatively high ion implant 6834 energy required to penetrate gate 6830-1 results in donor atoms also penetrating contact 6825-1 to form donor atoms 3837-2 well below the contact region between semiconductor nanotube fabric 6827-1 and contact 6825-1 so no significant modulation of the contact barrier occurs. Similarly, the relatively high ion implant 6834 energy required to penetrate gate 6830-1 results in donor atoms also penetrating contact 6825-2 to form donor atoms 3837-3 well below the contact region between semiconductor nanotube fabric 6827-1 and contact 6825-2 so no significant modulation of contact the contact barrier occurs. Donor atoms 6837-1 in channel region 6835-1 below gate 6830-1 may be used to accurately determine the threshold voltage of CNFET device 6822-X1. For example, in combination with gate insulator 6829-1 thickness and dielectric constant an n-type CNFET threshold voltage in the range of 0.3 to 1 volt may be set consistent with channel lengths in the range of less than 20 to greater than 100 nm for example.

It should be noted for all ion implant processes discussed above and below in this application, full electrical activation of the implanted species may require a thermal annealing process following the ion implant process at sufficient temperature to fully activate the implanted species in the CNT fabric. The thermal process to activate a particular ion implant in the CNT fabric may depend on several factors such as ion implanted species (mass, chemical reactivity, diffusivity, etc), annealing ambient, annealing time, and the ion implant dose. Depending on the process integration sequence used, the annealing process could follow each ion implant. Alternatively, the annealing process may be combined with other implant anneals or with other thermal processes such as dielectric depositions. The anneal process may be done in standard thermal furnace reactor or in Rapid Thermal Reactor (RTA) to limit diffusion of the ion species; both are commonly found in semiconductor fabrication facilities.

As discussed further above, the contact resistance between contacts 6825-1 and 6825-2 and semiconducting nanotube fabric 6827-1 is dependent on the selection of contact metallurgy, Ti/Pd and Ti/W for example, although many other choices are available as described further above with respect to FIG. 68A. The contact resistance may vary in the range of 10 kΩ to 30 kΩ for example.

Still another important consideration discussed further above with respect to FIGS. 68B-68D is the type of carrier injection in the barrier contact region. Since CNFET 6822-X1 is to be an n-type CNFET, electron injection is required. A second ion implantation 6849 with relatively low energy is used to positioned electron donor atoms 6850-1 in semiconductor nanotube fabric 6827-1 in the contact 6825-1 region and donor atoms 6850-2 in semiconductor nanotube fabric 6827-1 in the contact 6825-2 region. At low these low energies, ion implant 6849 atoms do not penetrate gate 6830-1. Donor atoms 6850-1 and 6850-2 increase the electron injection needed for n-type CNFET operation. The donor atoms may be P or K, for example, however other donor atoms may be used. Ion implantation in structures with nanotube fabric layers is described in incorporated U.S. patent application Ser. No. 12/356,447, entitled "Nonvolatile Nanotube Diodes and Nonvolatile Nanotube Blocks and Systems Using Same and Methods of Making Same," filed on Jan. 20, 2009.

Figure 68F:
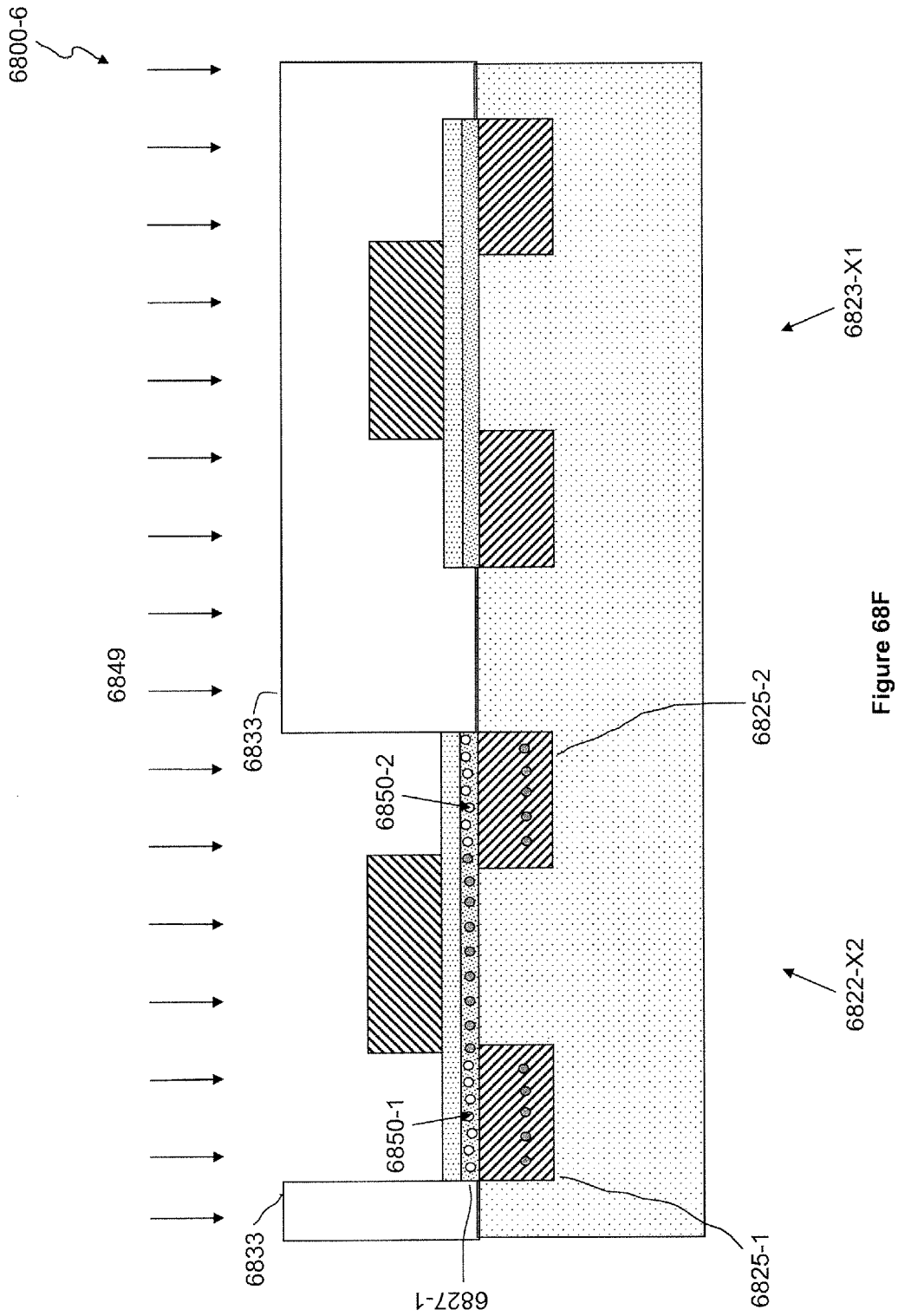
FIG. 68F shows the cross section of FIG. 68E in which the semiconducting nanotube fabric has ion implanted atoms in the contact region of the exposed CNFET device.

At this point in the process, integrated CNFET device pair 6800-6 as illustrated in FIG. 68F has formed a complementary pair of CNFET devices in which CNFET device 6822-X2 is n-type and may be referred to as nCNFET device 6822-X2 and CNFET device 6823-X1 remains unchanged and may be referred to as pCNFET device 6823-X1.

Figure 68G:
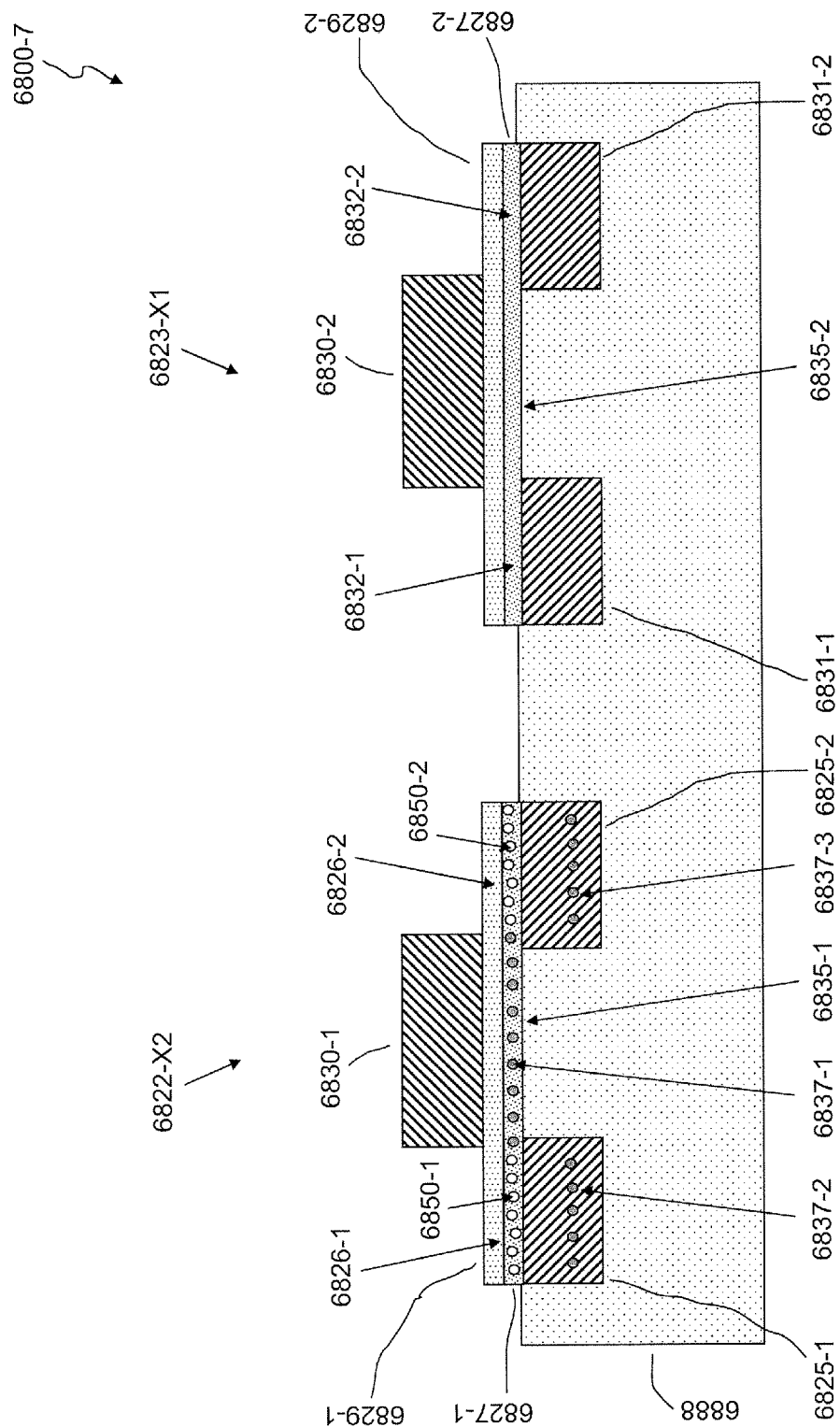
FIG. 68G shows the cross section of figure F after removal of the protective coating showing an integrated complementary CNFET device pair with the nCNFET device electrically optimized using ion implanted atoms.

Next, sacrificial mask 6833 is removed and integrated CNFET device pair 6800-7 with nCNFET 6822-X2 and pCNFET 6823-X1 illustrated in FIG. 68G may be interconnected to form complementary carbon nanotube logic circuits. For example, a CCN-NOT (inverter) circuit may be formed by connecting gates 6830-1 and 6830-2 to each other and to a logic input using known interconnect methods, contact 6825-1 is connected to ground, and contact 6831-2 is connected to a power supply such as $V_{DD}$. Contacts 6825-2 and 6831-1 may be connected together using known methods to form a logic output. Known methods may be used to complete fabrication and passivation.

Note that pCNFET device 6923-X1 remains an as-fabricated pCNFET device. However, ion implantations (not shown) of acceptor atoms such as boron in channel region 6835-2 and acceptor atoms in semiconductor nanotube fabric 6827-2 in the regions above contact 6831-1 and contact 6831-2 in semiconducting nanotube fabric 6827-2 corresponding to ion implantations 6834 and 6849 may be used to optimize the electrical performance of pCNFET device 6823-X1.

Although ion implantation has been shown as the preferred method of doping of the CNT fabric for modifying conduction and transport properties of the fabric, there are additional methods available such plasma doping, chemical vapor deposition (CVD, PECVD, PhECVD), rapid thermal processing (RTP or RTCVD), CNT functionalization, CNT chemical modification such acid treatments for example 1n the case of plasma doping, it can be a standalone process such as plasma ion implantation in a processor such as the Varian VIISta 10 P2LAD or it could be in a processor that is very similar to a standard plasma reactor chamber normally used for etch or deposition such a system manufactured by Applied Materials the Applied Materials' Centura platform. In both techniques, the semiconductor wafer which has the CNT film incorporated as film on the wafer is either immersed in the plasma or ions from the plasma are extracted and accelerated to the wafer surface and implanted into the film for doping then subsequently followed by an anneal in-situ or in another reactor to activate the dopants. Key process advantages that may be derived from plasma doping are ultra low ion energies for very thin transparent films, dopant purity control, high throughput with high doses and whole wafer exposure, and isotropic doping which potentially can provide better CNT exposure and dopant functionalization of the CNTs.

Chemical vapor deposition (CVD) can be applied for CNT doping in several different techniques 1) thermally activated only which can be in single or batch reactors/furnaces at either low pressure or atmospheric pressure (APCVD) reactors such as those manufactured by Tokyo Electron, Ltd (TEL), 2) plasma enhance CVD (PECVD) reactor where the thermal CVD process is enhanced or assisted with a plasma reaction that breaks down the chemical dopant precursors (e.g., gaseous organic or inorganic compounds containing B, P, or As dopants for example) allowing lower process temperatures than CVD alone, 3) photo enhanced CVD (PhECVD) where the thermal CVD process is assisted by broad spectrum photons (e.g., arc lamp) or narrow spectrum sources such as lasers, and 4) other CVD enhanced processes are possible such as, but not limited to, microwave surface-wave plasma CVD or filtered Cathodic arc deposition (FCAD), but these other processes have been typically used in a laboratory environment. Typically PECVD is the preferred CVD method for CNT fabric since it allows lower temperature processing and this equipment is available from several commercial suppliers such as Applied Materials, Inc., Tokyo Electron, Ltd., Novellus Systems, Inc. and Kokusai Electric, Inc. to name a few.

Rapid thermal processing (RTP or RTCVD) including sub-millisecond processing (one form that occurs in the sub-millisecond region as described further above as photo enhanced CVD (PhECVD)) is in one form a thermal CVD technique as described further above but occurring at a much shorter time thermal cycle as compared to a mostly isothermal furnace process. The fast thermal cycle limits the amount of dopant diffusion while still activating the dopants. However another RTP application does not require CVD for doping, but instead uses a dopant solution or doped film applied to the wafer after CNT deposition or it could also use a CNT solution with the dopant added prior to CNT film formation. The RTP process is used to diffuse (if needed) and activate the dopant, drive off solvents, and chemically react with unwanted solvents depending on the ambient used in the RTP process. In order for the RTP techniques to be useful forming n and p conductivity regions concurrently, appropriate masking techniques must be employed to form these regions. RTP fabrication equipment is available from the suppliers listed in the previous section.

Figure 68H:
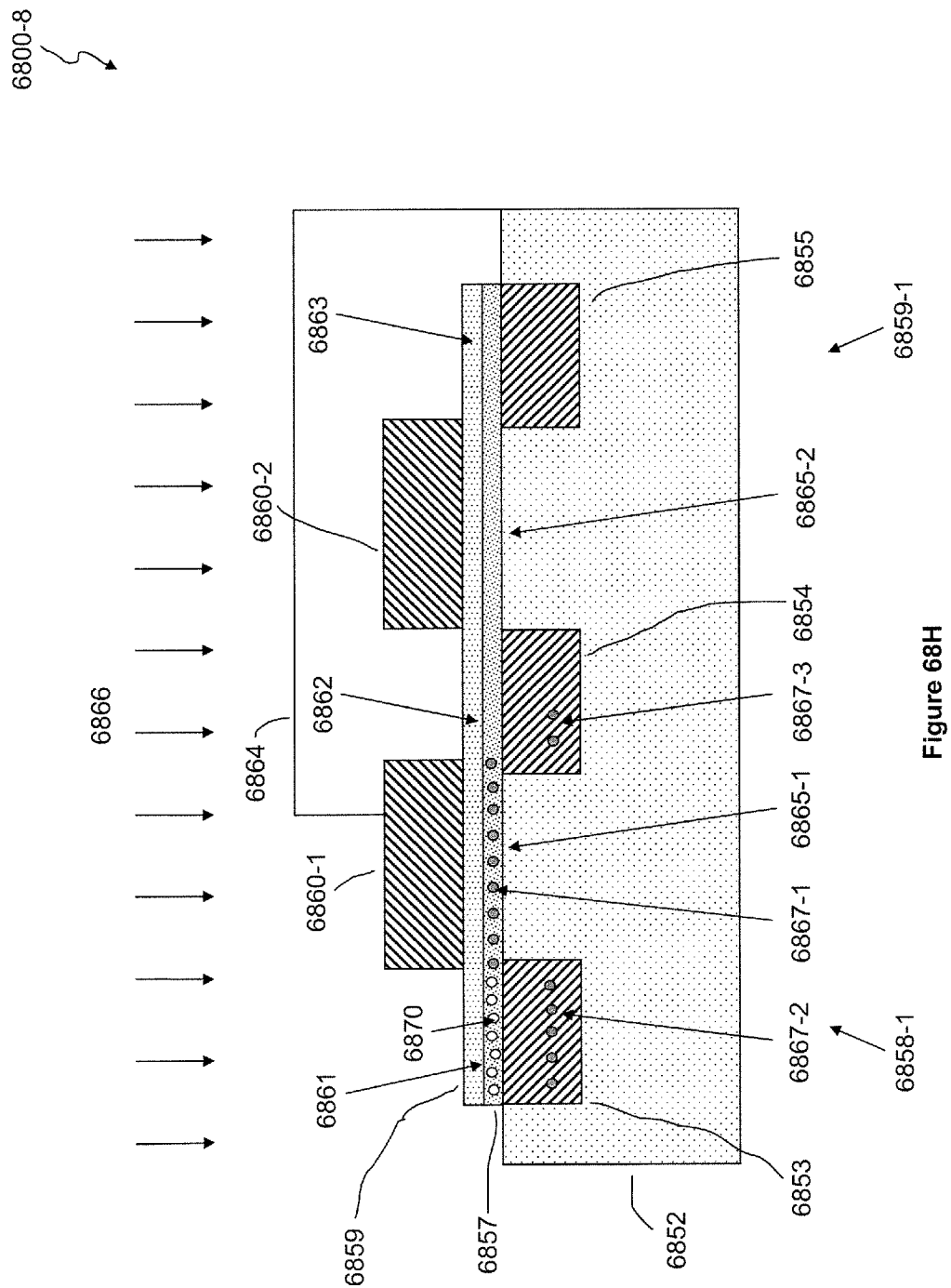
FIG. 68H shows a cross section of an integrated CNFET device pair having a shared contact region and ion implanted atoms in the semiconductor nanotube fabric in the channel region and one contact region.
Figure 68I:
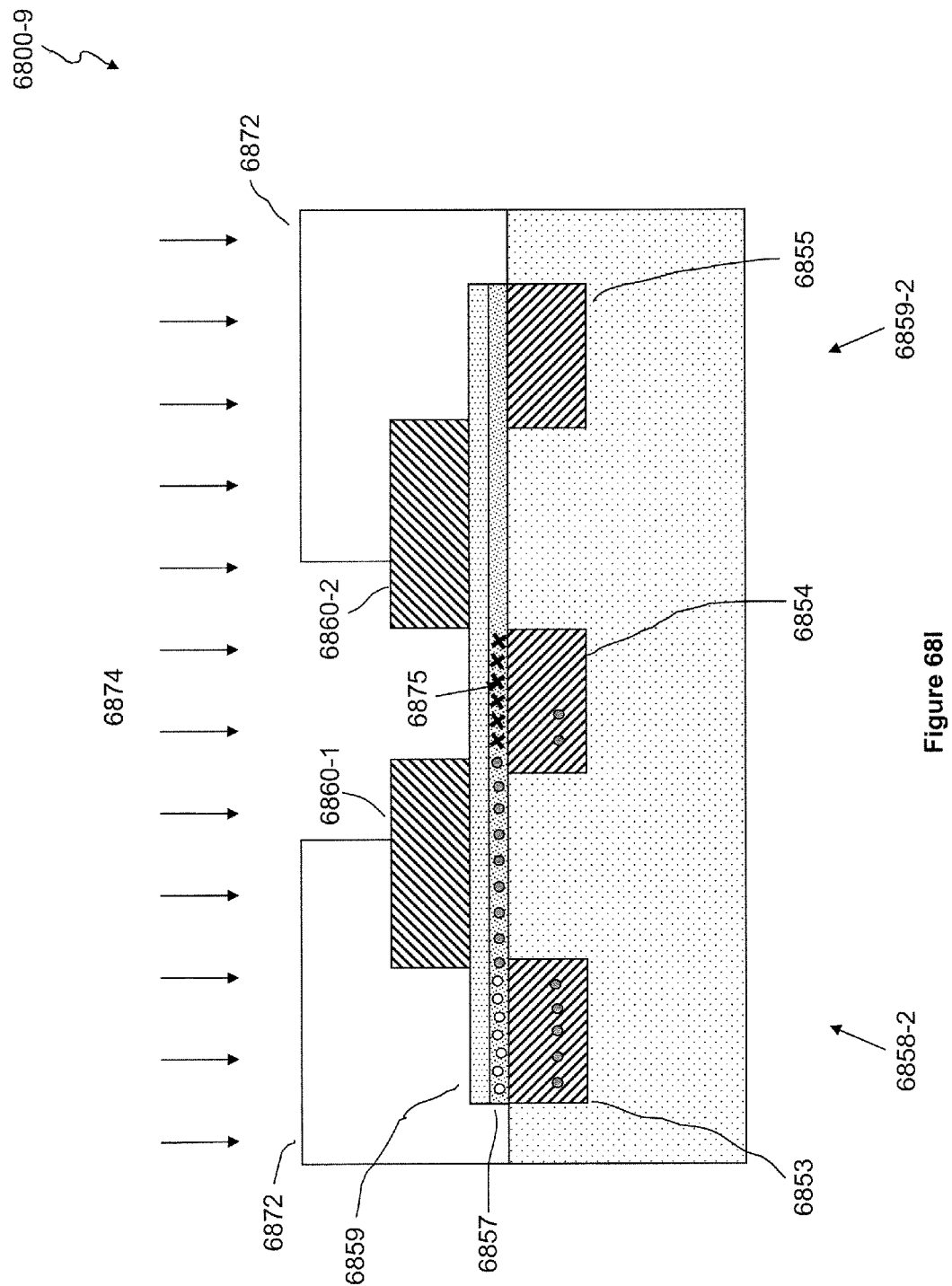
FIG. 68I shows the cross section of FIG. 68H with portions of both CNFET devices protected and the shared contact region exposed to ion implantation. Ion implanted atoms are shown in the semiconductor nanotube fabric in the shared contact region.
Figure 68J:
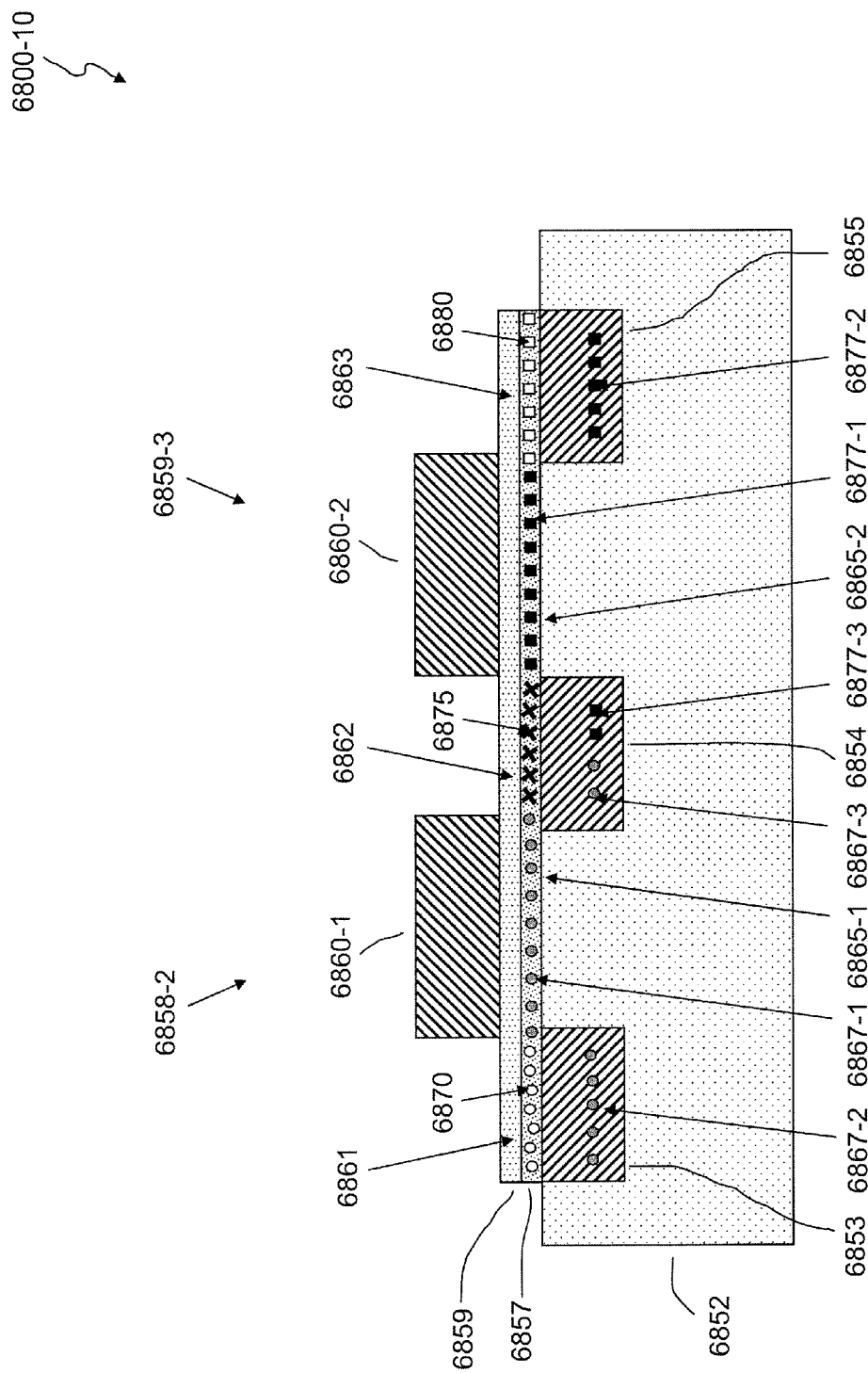
FIG. 68J shows a cross section of a complementary integrated CNFET device pair with a shared contact in which both the nCNFET and pCNFET devices have ion implanted atoms in the semiconductor nanotube fabric in the channel regions and contact regions.

Integrated Complementary Carbon Nanotube Technology Formed Using a Shared Contact Between Adjacent CNFET Devices for Greater Density Increasing density, that is reducing the area occupied by an electronic circuit, may increase performance, reduce power dissipation or both. In this example, integrated CNFET device pair 6800-7 with complementary CNFET device pair nCNFET device 6822-X2 and pCNFET device 6823-X1 illustrated in FIG. 68G are modified to share an output contact and are formed within the same semiconductor nanotube fabric region by combining the function of contacts 6825-2 and 6631-1 into a single output contact as illustrated in FIGS. 68H-68J. The increased density is realized by eliminating the separation between contacts 6825-2 and 6831-1 and eliminating the need for two contacts by combining them into one shared output contact. If each contact and space region is approximately equal, then the overall length for the complementary device pair in the channel length direction is reduced from 7 squares to 5 squares. Contact and space width is assumed to remain approximately the same. Therefore, complementary device pair density is increased by almost 30% for the same layout ground rules and NOT circuits formed using complementary device pairs as described further above with respect to FIG. 68G may also be approximately 30% denser.

In order for a complementary device pair to share a common output contact, this contact must support the injection of both electron and holes. Ambipolar CNFET devices, such as illustrated by electrical characteristic 6050 illustrated in FIG. 60B, include contact barrier regions that can inject both electrons and holes as also described further above with respect to FIG. 68B. Ion implantation may be used to optimize barrier regions for both electron and hole injection as described further below with respect to FIGS. 68H-68J.

FIG. 68H illustrates integrated CNFET device pair 6800-8 in which CNFET device 6858-1 channel region 6865-1 has been modified by ion implantation methods similar to ion implantation methods used to form CNFET device 6822-X1 illustrated in FIG. 68E with electron donor atoms 6867-1, while CNFET 6859-1 remains unchanged and corresponds to CNFET device 6823-X1 illustrated in FIG. 68E. CNFET device 6858-1 includes a top gate such as gate 6860-1 which is formed on gate insulator 6859 which is in contact with the top surface of semiconductor nanotube fabric 6857. Contact 6853 which is in contact with S/D region 6861, shared contact 6854 which is in contact with S/D region 6862, and gate 6860-1 which is electrostatically coupled to channel region 6865-1 form the three terminals of CNFET device 6858-1. Nanotube fabric 6857 is in contact with the top surface of insulator 6852 and the top surface of contacts 6853, 6854, and 6855. An optional backgate for additional control of the electrical characteristics of CNFET device 6858-1 may be included (not shown). The device channel length $L_{CH}$ is defined by the separation of S/D regions 6861 and 6862 which is approximately equal to the separation between contact 6853 and shared contact 6854 illustrated in FIG. 68H. Semiconductor nanotube fabric 6857 replaces the semiconductor substrate used for well known industry NFET and PFET devices.

CNFET device 6859-1 shown in FIG. 68H includes a top gate such as gate 6860-2 which is formed on gate insulator 6859 which is in contact with the top surface of patterned semiconductor nanotube fabric 6857. Shared contact 6854 which is in contact with S/D region 6862, contact 6855 which is in contact with S/D region 6863, and gate 6860-2 which is electrostatically coupled to channel region 6865-2 form the three terminals of CNFET device 6859-1. An optional backgate for additional control of the electrical characteristics of CNFET device 6859-1 may be included (not shown). The device channel length $L_{CH}$ is defined by the separation of S/D regions 6862 and 6863 which is approximately equal to the separation between shared contact 6854 and contact 6855 illustrated in FIG. 68H. Patterned semiconductor nanotube fabric 6857 replaces the semiconductor substrate used for well known industry NFET and PFET devices. Since CNFET device 6859-1 is protected from ion implantation 6866 by sacrificial mask 6864, CNFET device 6859-1 remains unchanged and in this case, CNFET device 6859-1 is a pCNFET device as-fabricated.

CNFET device 6858-1 includes a prior ion implantation step corresponding to ion implantation 6834 described with respect to FIG. 68E by electron donor atoms such as phosphorous (P) or an alkali electron donor atoms such as potassium (K) in channel region 6835-1 as illustrated in FIG. 68E in which a sacrificial mask (not shown) such as mask 6864 was used, except that this mask extended only to the midpoint of shared contact 6854. As described further above with respect to FIG. 58E, the energy of this prior ion implant step is adjusted so the P or K donor atoms 3867-1 may be ion implanted through gate 6860-1 and positioned in the semiconductor nanotube fabric channel region 3865-1. The relatively high ion implant energy required to penetrate gate 6860-1 results in donor atoms also penetrating contact 6853 to form donor atoms 6867-2 well below the contact region between semiconductor nanotube fabric 6857 and contact 6853 so no significant modulation of contact barrier occurs. Similarly, this relatively high ion implant energy required to penetrate gate 6860-1 results in donor atoms also penetrating shared contact 6954 to form donor atoms 3867-3 well below the contact region between semiconductor nanotube fabric 6857 and contact 6864 so no significant modulation of contact barrier change occurs. However, donor atoms 6867-3 span only about half the length of shared contact 6854. because approximately half the length of shared contact 6854 is covered by a sacrificial mark layer. Donor atoms 6867-1 in channel region 6865-1 below gate 6860-1 may be used to accurately determine the threshold voltage of CNFET device 6858-1. For example, in combination with gate insulator 6859 thickness and dielectric constant an n-type CNFET threshold voltage in the range of 0.3 to 1 volt may be set consistent with channel lengths in the range of less than 20 to greater than 100 nm for example.

As discussed further above with respect to FIG. 68E ion implantation 6849, a second ion implantation 6866 with relatively low energy may be used to position electron donor atoms 6870 in semiconductor nanotube fabric 6857 in the contact 6853 region. At low energies, ion implant 6866 atoms do not penetrate gate 6860-1. Donor atoms 6870 increase the electron injection needed for n-type CNFET operation for CNFET device 6058-1 at contact 6853. The donor atoms may be P or K for example.

Next, sacrificial mask 6864 is removed, and replaced with sacrificial mask 6872 as shown in FIG. 68I which exposes shared contact 6854 and overlaps a portion of gates 6860-1 and 6860-2. Shared contact 6854 low energy ion implantation 6874 results in donor atoms 6875 in semiconductor nanotube fabric 6857 above shared contact 6854 such that shared contact 6854 injects both electrons and holes as illustrated in electrical characteristic 6050 illustrated in FIG. 60B for example. If CNFET device 6958-2 is a pCNFET device as-fabricated, then donor atoms 6875 are used to adjust the Fermi level to enable shared contact 6854 to inject both electrons and holes. A smaller dosage of donor atoms 6875 is needed for shared contact 6854 that injects both electrons and holes than the dosage of donor atoms 6870 needed for electron injection at contact 6853 for example. At this point in the process, integrated CNFET device pair 6800-9 illustrated in FIG. 68I includes CNFET 6058-2 which operates as an n-type CNFET device with electron injection at contact 6853 and electron injection at shared contact 6854. Shared contact 6854 also provides hole injection for CNFET 6059-2.

Since CNFET 6059-2 is a p-type CNFET as formed, 6059-2 may be operated as illustrated in FIG. 68I. However, is may be desirable to also improve the electrical characteristics using ion implantation as well. In this case a sacrificial mask (not shown) may be used to shield CNFET 6058-2 using a method similar to the method used to shield CNFET device 6059-1 illustrated in FIG. 68H. Accordingly, a sacrificial mask is used to overlap contact 6853, gate 6860-1, and approximately half of shared contact 6854. A higher energy ion implant is used to optimized the electrical characteristics of channel region 6865-2 followed by a lower energy implant to optimize hole injection at contact 6855. Assuming p-type FET needs a more negative threshold voltage for example, then acceptor atoms 6877-1 are used, boron (B) for example, as illustrated in FIG. 68J. Acceptor atoms 6877-2 and acceptor atoms 6877-3 may also be present in contact 6855 and shared contact 6854, respectively, as illustrated in FIG. 68J because of the relatively high energy requirements to penetrate gate 6860-2 above channel region 6865-2 in order to ion implant donor atoms 6877-1 in the semiconductor nanotube fabric in channel region 6865-2. However, acceptor atoms 6877-2 and 6877-3 do not contribute to electrical properties at the contact 6855 and shared contact 6854 interface with semiconductor nanotube fabric 6857. Acceptor atoms 6877-1 may be used to increase the negative threshold voltage of p-type CNFET 6059-2. However, if the threshold voltage is too negative, then donor atoms may be used instead to make the threshold voltage less negative.

Next, a relatively low dosage of acceptor atoms 6880 may be ion implanted in semiconductor nanotube fabric 6857 above contact 6855 to enhance hole injection for p-type operation as illustrated in FIG. 68J.

FIG. 68J illustrates integrated CNFET device pair 6800-10 with a complementary pair of devices with enhanced electrical characteristics. The enhanced n-type CNFET is referred to as nCNFET device 6858-2 and the p-type CNFET is referred to as pCNFET device 6859-3, both with a shared contact 6854.

Integrated CNFET device pair 6800-10 with nCNFET 6858-2 and pCNFET 6859-3 illustrated in FIG. 68J may be interconnected to form complementary carbon nanotube logic circuits. For example, a CCN-NOT (inverter) circuit may be formed by connecting gates 6860-1 and 6860-2 to each other and to a logic input using known interconnect methods, contact 6853 is connected to ground, and contact 6855 is connected to a power supply such as $V_{DD}$. Shared contact 6854 provides the logic output. Known methods may be used to complete fabrication and passivation.

Figure 68L:
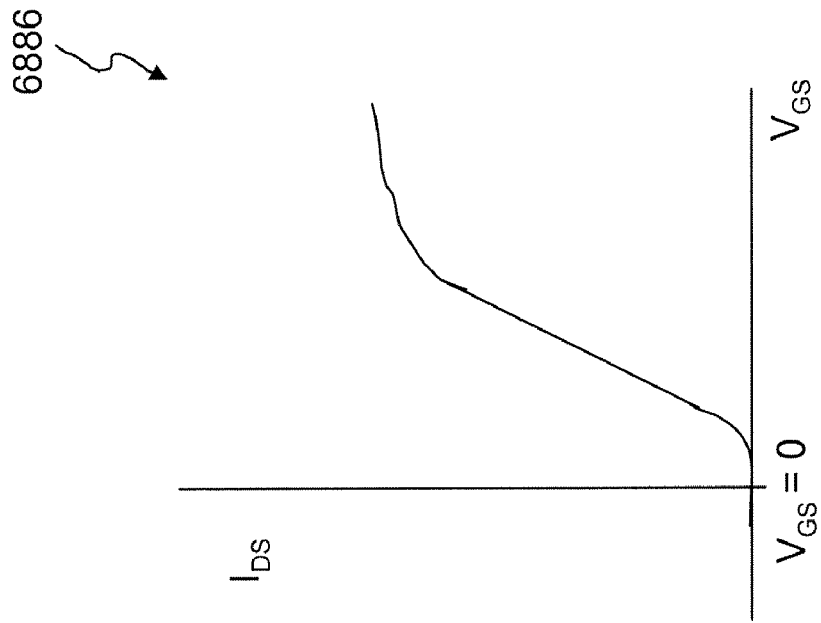
FIG. 68L shows an electrical characteristic of an nCNFET device.
Figure 68K:
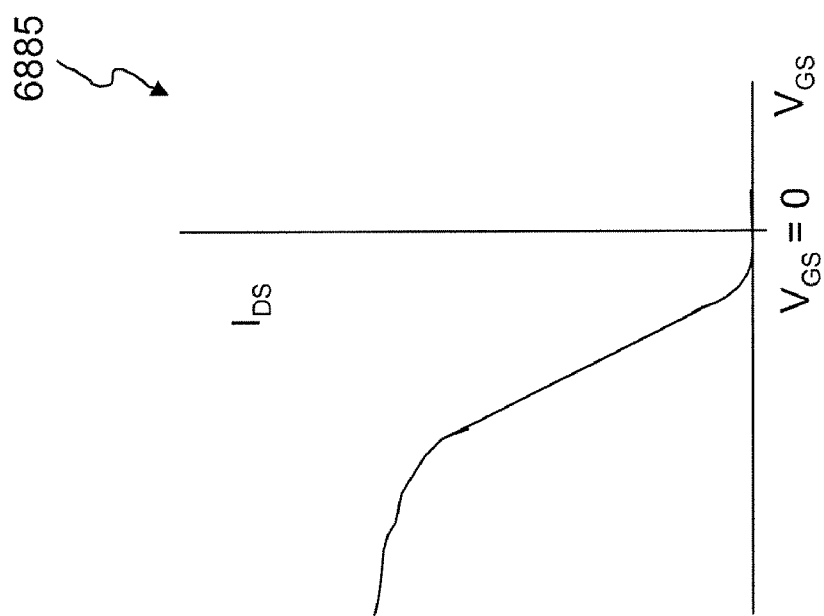
FIG. 68K shows an electrical characteristic of a pCNFET device.

Electrical characteristic 6885 illustrated in FIG. 68K is representative of the electrical characteristics of pCNFET devices 6813-1' illustrated in FIG. 68D, 6823-X1 illustrated in FIG. 68G, and 6859-2 illustrated in FIG. 68J and is similar to electrical characteristic 6000 illustrated in FIG. 60A. Electrical characteristic 6886 illustrated in FIG. 68L is representative of nCNFET devices 6812-2 illustrated in FIG. 68D, 6822-X2 illustrated in FIG. 68G, and 6858-2 illustrated in FIG. 68J.

Ion implantation was used as the preferred method in most of the example described with respect to FIGS. 68A-68J. However, plasma doping of semiconductor nanotube fabric may also be used. For example, in FIGS. 68A and 66B, methods such as plasma doping of semiconducting nanotube fabric 6807 and 6817-1 and 6817-2 may be used prior to deposition of gate insulator 6809, 6819-1, and 6819-2, respectively.

High Performance CNFET Devices for Digital & Analog Applications

CNFET devices described further above with respect to FIGS. 59, 60, and 68 may be further enhanced with self aligned gates in combination with high dielectric insulators, doping of nanotube fabrics, gate insulators, gates, and contacts, using ion implantation, for example, and other methods described in incorporated U.S. patent application Ser. No. 12/356,447, entitled "Nonvolatile Nanotube Diodes and Nonvolatile Nanotube Blocks and Systems Using Same and Methods of Making Same," filed on Jan. 20, 2009, the entire contents of which are incorporated herein by reference.

Semiconducting SWNTs (s-SWNTs) are becoming available from various suppliers such as Carbon Solutions Riverside, Calif.; Nano-C Westwood, Mass.; NanoIntegris Evanston, Ill.; Nanotailor Austin, Tex.; and Southwest NanoTechnologies, Inc. Norman, Okla. for example. The primary synthesis technologies for producing CNTs in significant quantities are arc discharge, laser ablation, high pressure carbon monoxide (HiPCO), Chemical Vapor Deposition (CVD) including Plasma Enhanced CVD (PECVD), and controlled flame synthesized SWNTs (e.g., Nano-C). However, CNT materials with 100% s-SWNTs are not as yet available through suppliers thus requiring follow up with additional separation techniques to isolate the s-SWNT from contaminates such as MWNTs, metallic SWNTs (i.e., $Eg \approx 0$; large diameter SWNTs), catalytic metals, amorphous carbon, and other allotropes of carbon. Current separation techniques of metallic SWNTs and MWNTs impurities from s-SWNT result in s-SWNT concentrations in the range of greater than 80%, but less than 100%, with some metallic CNTs remaining Examples of separation techniques in use are dielectrophoresis (e.g., AC dielectrophoresis and agarose gel electrophoresis), amine extraction, polymer wrapping, selective oxidation, CNT functionalization, and density-gradient ultracentrifugation. Some of these techniques of separating s-SWNTs are on a laboratory scale. However, 100% s-SWNTs using separation on a commercial scale is not presently available.

Other methods of further processing (post processing) of metallic CNTs (m-SWNTs or MWNTs) to either convert them to semiconducting CNTs or remove them after they have formed the CNT nano-fabric layer may require 1) functionalizing the metallic CNTs so that they are converted to semiconducting CNTs or non-conducting CNTs (e.g., opens) or 2) functionalizing the metallic CNTs so that they can be selectively removed from the nano-fabric layer. Process techniques to convert metallic CNTs to semiconducting CNTs such as a plasma treatment to convert metallic CNTs to semiconductor type (Chen, et al., Japanese Journal of Applied Physics, vol 45, no. 4B, pp. 3680-3685, 2006) or using protein-coated nanoparticles in the device contact areas to convert metallic CNTs to semiconductor type (Na, et. al., Fullerenes, Nanotubes, and Carbon Nanostructures, vol. 14, pp. 141-149, 2006) are further described in these references which are hereby incorporated by reference. It has also been demonstrated that due to the higher conductivity and larger diameter of the metallic CNTs that it is possible to attack the metallic CNTs without attacking the higher resistance and smaller diameter semiconducting CNTs (An, et. al., Science 301, pp. 344-347, 2003) which is hereby incorporated by reference. Thus, one or more of these process techniques may be used to either remove or convert the metallic CNTs to semiconductor CNTs. Integrated CNFET devices and associated functions described further above may be formed using less than 100% s-SWNT nanotube fabrics. However, the number of integrated CNFET devices and density per unit area may be increased as the s-SWNT content of the nanotube fabric increases and approaches 100%.

Preferred methods of fabrication include formation of solutions approaching 100% s-SWNTs or removal of non-s-SWNTs from the nanotube fabric as described further above. However, when less than 100% s-SWNTs are available to form s-SWNT solutions, additional post processing of the NRAM® and NanoLogic® digital and analog circuits described in this application may be required to remove remaining metallic CNTs may be used until technology is developed that provides 100% s-SWNTs solutions. One method at the device level is to selectively remove the metallic CNTs using electrical breakdown or burn-off of the remaining metallic CNTs in circuit as described in incorporated U.S. patent application Ser. No. 11/332,529, "Field effect device having a channel of nanofabric and methods of making same," filed on Jan. 13, 2006. Since metallic CNTs (m-SWNTs or MWNTs) are found as parallel conducting paths in channels of either pCNFET or nCNFET devices, applying the proper voltage between the source and drain of the device can generate a current that flows primarily through the less resistive metallic CNTs causing electrical breakdown or burning off the metallic CNTs while leaving the s-SWNTs intact. Using a gate to turn-off the semiconducting CNTs makes the burn-off method even more effective.

Methods of preparing semiconducting SWNT solutions, deposition methods, and patterning methods may be similar to methods described, for example in the following U.S. patents and U.S. patent applications the entire contents of which are incorporated herein by reference in their entirety:

U.S. Pat. No. 6,835,591, entitled "Methods of Nanotube Films and Articles," filed on Apr. 23, 2002;

U.S. Pat. No. 7,335,395, entitled Methods of Using Pre-Formed Nanotubes to Make Carbon Nanotube Films, Layers, Fabrics, Ribbons, Elements, and Articles, filed on Jan. 13, 2003;

U.S. Pat. No. 7,259,410, entitled "Devices Having Horizontally-Disposed Nanofabric Articles and Methods of Making the Same," filed Feb. 11, 2004;

U.S. Pat. No. 6,924,538, entitled "Devices Having Vertically-Disposed Nanofabric Articles and Methods of Making Same," filed on Feb. 11, 2004;

U.S. Pat. No. 7,375,369, entitled "Spin-Coatable Liquid for Formation of High Purity Nanotube Films," filed on Jun. 3, 2004;

U.S. patent application Ser. No. 10/341,005, entitled "Methods of Making Carbon Nanotube Films, Layers, Fabrics, Ribbons, Elements, and Articles," filed on Jan. 13, 2003; and U.S. patent application Ser. No. 10/860,332, entitled "High Purity Nanotube Fabrics and Films," filed Jun. 3, 2004.

Structures for optimizing CNFET devices for use in NRAM® and NanoLogic® digital and analog circuits used in various applications are described further below.

High Performance Optimized pCNFET and nCNFET Devices and Circuits

Figure 69A:
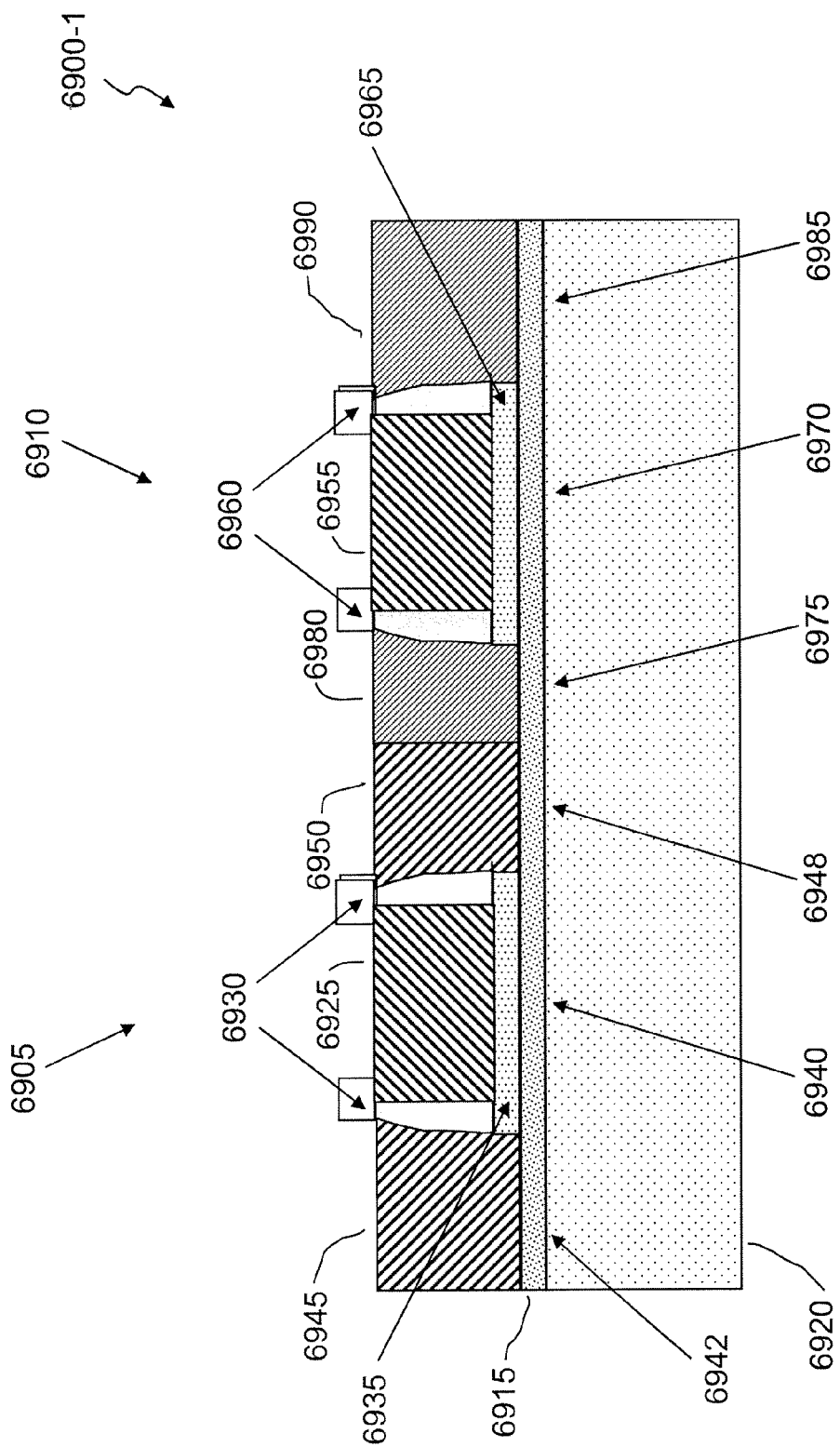
FIG. 69A shows a cross section of an integrated CNFET device pair in which each CNFET device has a self-aligned gate on a gate insulator above a semiconducting nanotube fabric with a pair of contacts above and in contact with the semiconducting nanotube fabric. Two adjacent contacts are in electrical and physical contact. The CNFET device pair are on an insulator and do not require a semiconductor substrate.

FIG. 69A illustrates adjacent CNFETs 6900-1 devices pCNFET 6905 and nCNFET 6910 that are formed with enhanced structures, such as self-aligned gates for example, with higher performance than those described further above with respect to FIGS. 59, 60, and 68. pCNFETs and nCNFETs may each be optimized individually. In this example, one contact of pCNFET 6905 and one contact of nCNFET 6910 are adjacent and form a common contact to highlight the greater density (smaller circuit size) of complementary carbon nanotube circuits fabricated with pCNFETs and nCNFETs instead of current industry CMOS circuits using presently available PFET and NFET devices. This is because current industry CMOS circuits require a p-doped region (substrate or well) for NFETs and an n-doped region (substrate or well) for PFETs which substantially increase the area required for CMOS circuits. pCNFETs and nCNFETs do not require a semiconductor substrate and, therefore, may be denser. Denser circuits result in less capacitance which may be used to achieve higher performance, lower power dissipation, or a combination of both. Circuit performance is a function of CNFET device and interconnect capacitance and resistance. Adjacent CNFET 6900-1 may be used to form a complementary carbon nanotube inverter by connecting each of the gates of pCNFET and nCNFET as illustrated schematically in FIG. 70.

In FIGS. 68H-68J illustrated further above, a shared contact 6854 was used to achieve approximately 30% greater density by doping the semiconducting nanotube fabric adjacent to shared contact 6854 so as to enable both electron and hole injection. This approach may also be used in FIGS. 69A-69F. However, in FIGS. 69A-69F adjacent contacts are formed in direct contact with one another for greater density and each of the semiconductor nanotube regions under each of these contacts may instead be optimized for electron injection for the nCNFET device and hole injection for the pCNFET device.

pCNFET device 6905 illustrated in FIG. 69A includes patterned semiconducting nanotube fabric 6915 on an underlying insulator 6920, with gate insulator 6935 on underlying patterned semiconducting nanotube fabric 6915 and gate 6925 with sidewall spacers 6930 in contact with the top surface of gate insulator 6935. Gate structures with sidewall spacers are well known in the industry. S/D region 6942 in contact with contact 6945, S/D region 6948 in contact with contact 6950, and gate 6925 electrostatically coupled through gate insulator 6935 to channel region 6940 form the three terminals of pCNFET device 6905. The device channel length of pCNFET device 6905 is defined by the separation of S/D regions 6942 and 6948 which is approximately equal to the separation between contacts 6945 and 6950 illustrated in FIG. 69A. Patterned semiconductor nanotube fabric 6915 replaces the semiconductor substrate used for well known industry NFET and PFET devices. For pCNFET 6905, a more negative voltage applied to gate 6925 relative to contacts 6945 and 6950 makes channel region 6940 more conductive and a less negative voltage makes channel region 6940 less conductive as illustrated further above by pCNFET electrical characteristics 6000 illustrated in FIG. 60A.

Contacts 6945 and 6950 are preferably made of conductive materials such as Ru, Ti, Cr, Al, Au, Pd, Ni, W, Cu, Co, Mo, Ag, In, Ir, Pb, Sn, as well as other suitable metals, and combinations of these such as Ti/Pd, for example. pCNFET electrical characteristics 6000 were measured on a pCNFET device that included Ti/Pd contacts. Metal alloys such as TiAu, TiCu, TiPd, PbIn, TiC, and TiW and conductive nitrides, oxides, or silicides such as RuN, RuO, TiN, TaN, $CoSi_x$ and $TiSi_x$ may be used. Semiconducting material such as polysilicon, germanium, and silicides of silicon, and other semiconducting materials may also be used. Carbon may be used as a contact material as well as carbon nanotube fabrics themselves (single walled, multiwalled, and/or double walled, for example) typically in the form of patterned nanotube fabric. Also, contacts may be formed of mixed or nanoscopic materials that include conductor and semiconductor nanoscopic particles such as W, Ti, TiN, TiC, B, P, K, Pd, Si, and Ge and may also include carbon and one more allotropes of carbon, and other conductive materials such as those listed further above. Nanoscopic particles may also include insulators such as $SiO_2$, SiN, $Al_2O_3$, and other insulators. Mixed or nanoscopic materials and nanoscopic particles are described in more detail in incorporated U.S. patent application Ser. No. 12/356,447, entitled "Nonvolatile Nanotube Diodes and Nonvolatile Nanotube Blocks and Systems Using Same and Methods of Making Same," filed on Jan. 20, 2009. Other kinds of conductor, semiconductor, or insulating materials may also be used. Contacts 6945 and 6950 generally have a thickness in the range of 5 to 500 nm, for example.

Gate insulator 6935 may be formed of $SiO_2$, SiN, $Al_2O_3$, BeO, and also high relative dielectric constant materials such as $TaO_5$ and hafnium oxide ($H_fO_2$) or other suitable insulating material, and have a thickness in the range of less than 2 to greater than 10 nm, for example. Gate 6950 may be formed of the same materials listed above with respect to contacts 6930. Sidewall spacers 6930 may be formed using silicon dioxide or another insulating material known in the industry.

nCNFET device 6910 also illustrated in FIG. 69A includes patterned semiconducting nanotube fabric 6915 on an underlying insulator 6920, with gate insulator 6965 on underlying patterned semiconducting nanotube fabric 6915 and gate 6955 with sidewall spacers 6960 in contact with the top surface of gate insulator 6965. S/D region 6975 in contact with contact 6980, S/D region 6985 in contact with contact 6990, and gate 6955 electrostatically coupled through gate insulator 6965 to channel region 6970 form the three terminals of nCNFET device 6910. The device channel length of nCNFET device 6910 is defined by the separation of S/D regions 6975 and 6985 which is approximately equal to the separation between contacts 6980 and 6990 illustrated in FIG. 69B. Patterned semiconductor nanotube fabric 6915 replaces the semiconductor substrate used for well known industry NFET and PFET devices. For nCNFET 6910, a more positive voltage applied to gate 6955 relative to contacts 6980 and 6990 makes channel region 6970 more conductive and a less positive voltage makes channel region 6970 less conductive.

Contacts 6980 and 6990 of nCNFET 6910 may be formed using materials and thicknesses such as listed further above with respect to contacts 6945 and 6950 of pCNFET 6905. Gate insulator 6965 and gate 6955 of nCNFET 6920 may be formed using materials and thicknesses such as listed further above with respect to gate insulator 6965 and gate 6935, respectively, of pCNFET 6905.

In the adjacent CNFETs 6900-1 example illustrated in FIG. 69A, pCNFET 6905 and nCNFET 6910 use the same patterned semiconducting nanotube fabric 6915. However, channel region 6940 behavior corresponds to a p-type CNFET and channel region 6970 behaves corresponds to an n-type CNFET. If pCNFET 6905 electrical characteristics correspond to those of pCNFET electrical characteristics 6000 of FIG. 60A as-fabricated, then changes to gate insulator 6965, and/or gate 6955, and/or channel region 6970 may be needed for nCNFET device operation. Changes to pCNFET to enhance device operation may also be made. In this example, Ti/Pd may be used for contacts 6945 and 6950 although TiN and other materials listed above may also be used.

In the example shown in FIG. 69A, an industrial high dielectric constant material such as hafnium oxide ($HfO_2$) may be used for gate insulator 6935 of pCNFET 6905 so as to reduce operating voltages to a range of 0.5 to 2 volts for example, instead of the relatively high voltages shown in pCNFET electrical characteristics 6000 illustrated in FIG.

60A. The semiconductor industry also uses hafnium oxide with lithium oxide to introduce polarized charges in the dielectric to shift threshold voltages in a more positive direction. In the example illustrated in FIG. 69A, gate insulator 6965 may use hafnium oxide with lithium oxide to introduce polarized charges in gate insulator 6965 such that channel region 6970 is changed from pCNFET to nCNFET behavior by electrostatic coupling. An electrostatically coupled back gate (not shown) may also be used. Contacts 6980 and 6990 may be formed using conductor or semiconductor materials other than Ti/Pd for nCNFET operation. A list of various conductors and semiconductors that may be used for contacts is given further above.

Figure 69B:
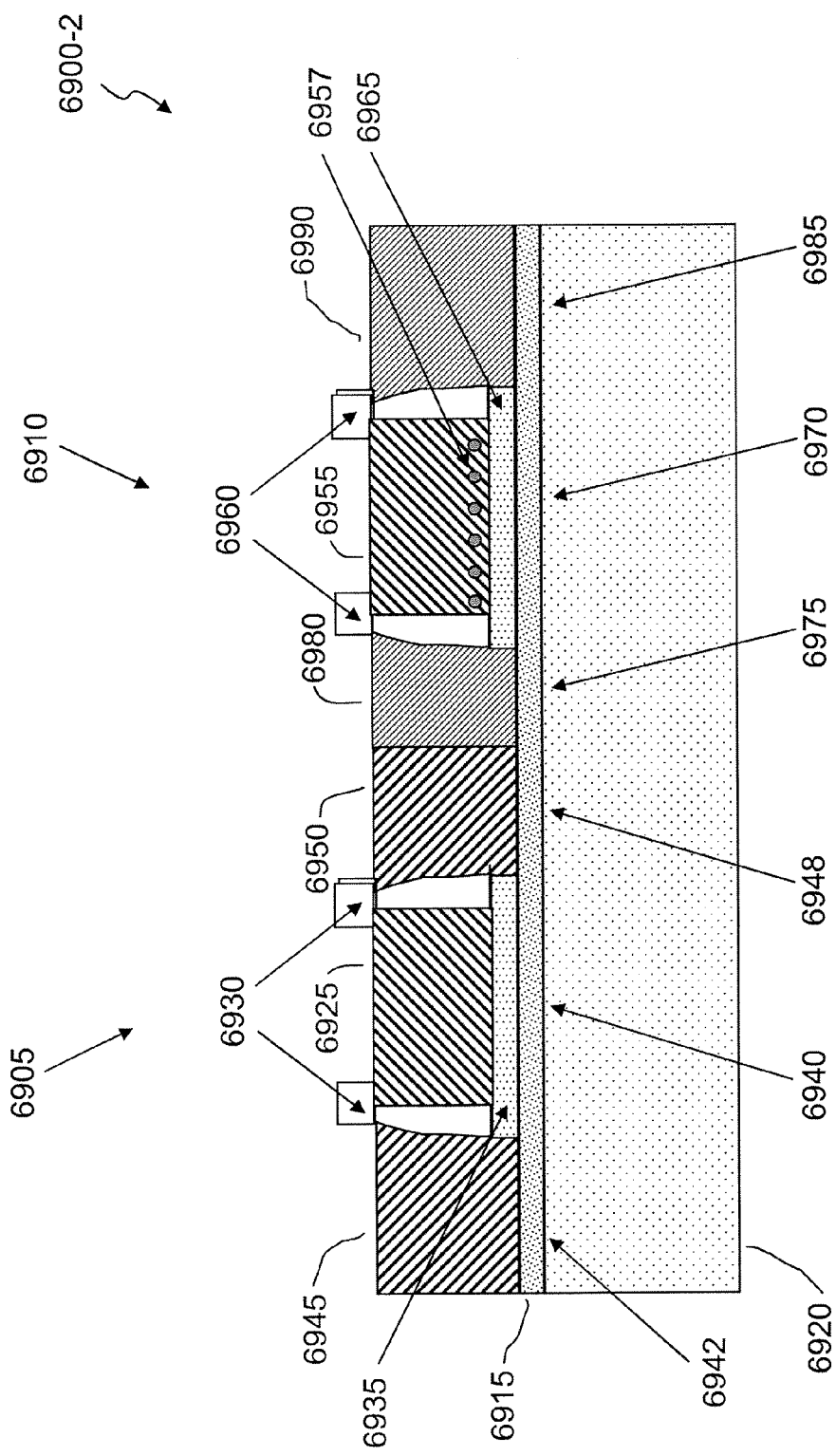
FIG. 69B shows the cross section of FIG. 69B with ion implanted atoms in the gate in proximity to the gate insulator interface for one of the device pair.

FIG. 69B is an illustration of adjacent CNFETs 6900-2 devices pCNFET 6905 and nCNFET 6910 in which ion implantation layer 6957 may be added to gate 6955 near the interface with gate insulator 6965 to change the work function between gate 6955 and channel region 6970 such that channel region 6970 changes from pCNFET to nCNFET behavior. Gate dielectric 6965 may be changed or remain the same as described with respect to FIG. 69A. Various methods of ion implantation are described further above with respect to FIGS. 68E-68J. Also, various methods of doping including ion implantation are described in more detail further above and in incorporated U.S. patent application Ser. No. 12/356, 447, entitled "Nonvolatile Nanotube Diodes and Nonvolatile Nanotube Blocks and Systems Using Same and Methods of Making Same," filed on Jan. 20, 2009.

Figure 69C:
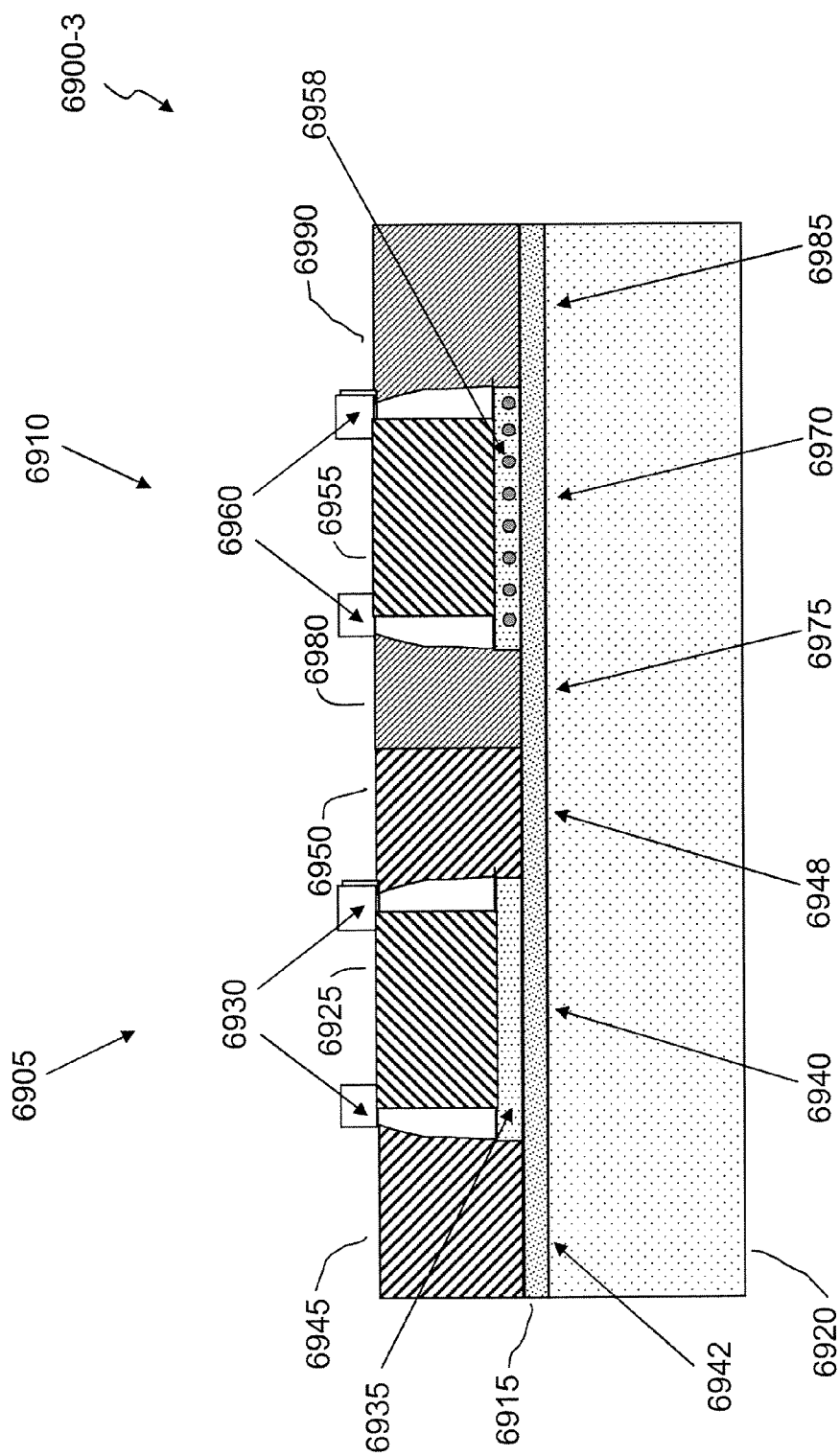
FIG. 69C shows the cross section of FIG. 69A with ion implanted atoms in the gate insulator region for one of the device pair.

FIG. 69C is an illustration of adjacent CNFETs 6900-3 devices pCNFET 6905 and nCNFET 6910 in which ion implantation layer 6958 may be added to gate insulator 6965 to change dielectric properties such that channel region 6970 changes from pCNFET to nCNFET behavior.

Figure 69D:
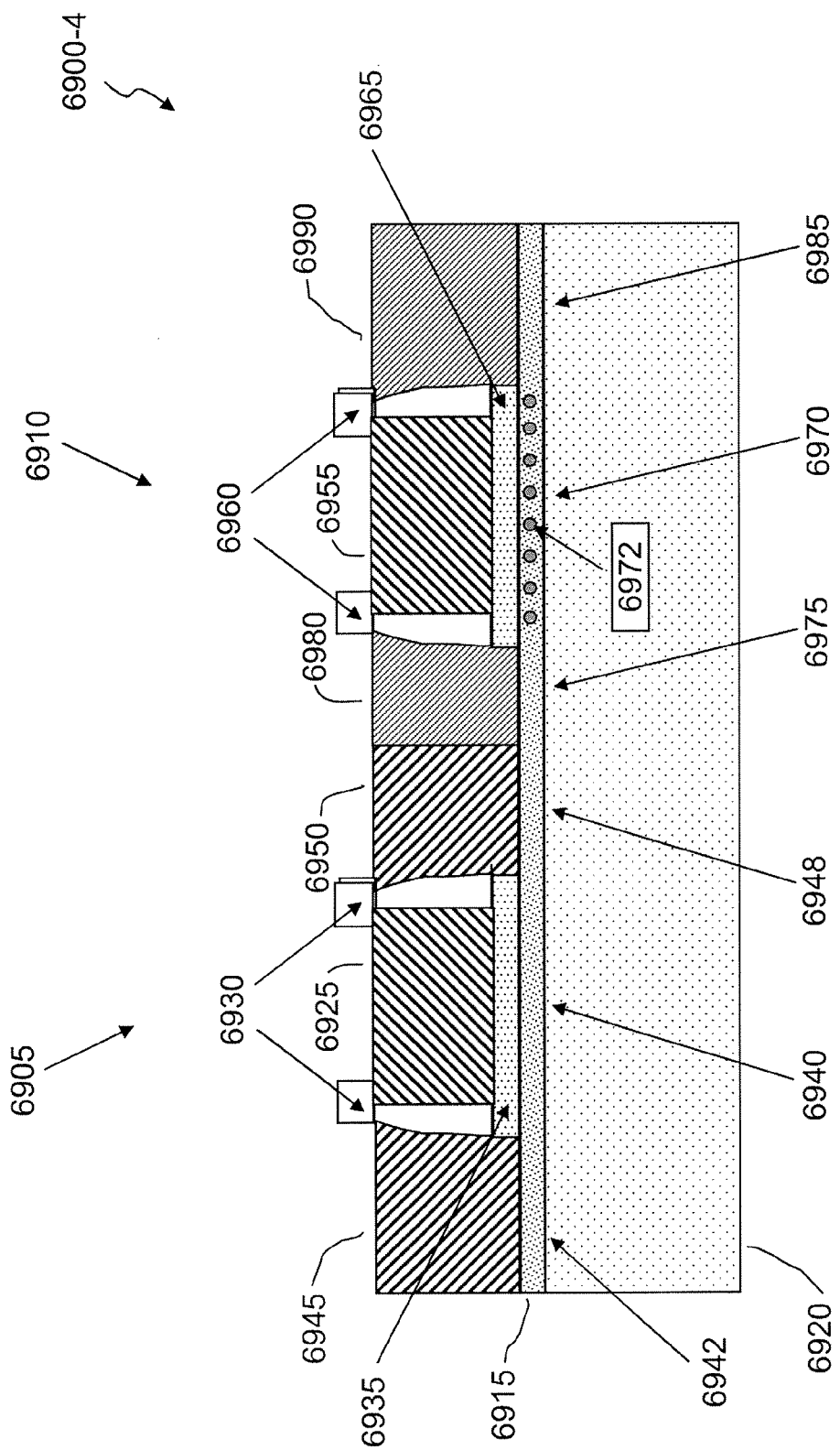
FIG. 69D shows the cross section of FIG. 69A with ion implanted atoms in the semiconductor nanotube fabric in the channel region for one of the device pair.

FIG. 69D is an illustration of adjacent CNFETs 6900-4 devices pCNFET 6905 and nCNFET 6910 in which the electrical properties of patterned semiconducting nanotube fabric 6915 may be modified by ion implantation layer 6972 in channel region 6970 to change the electrical properties of channel region 6970 from pCNFET to nCNFET behavior. Arsenic or phosphorous atoms (or others) may be implanted, for example. Gate dielectric 6965 may be changed or remain the same as described with respect to FIG. 69A. Various combinations of ion implant layers may be used, for example, combinations of ion implant layers 6957, 6958 and 6972.

Figure 69E:
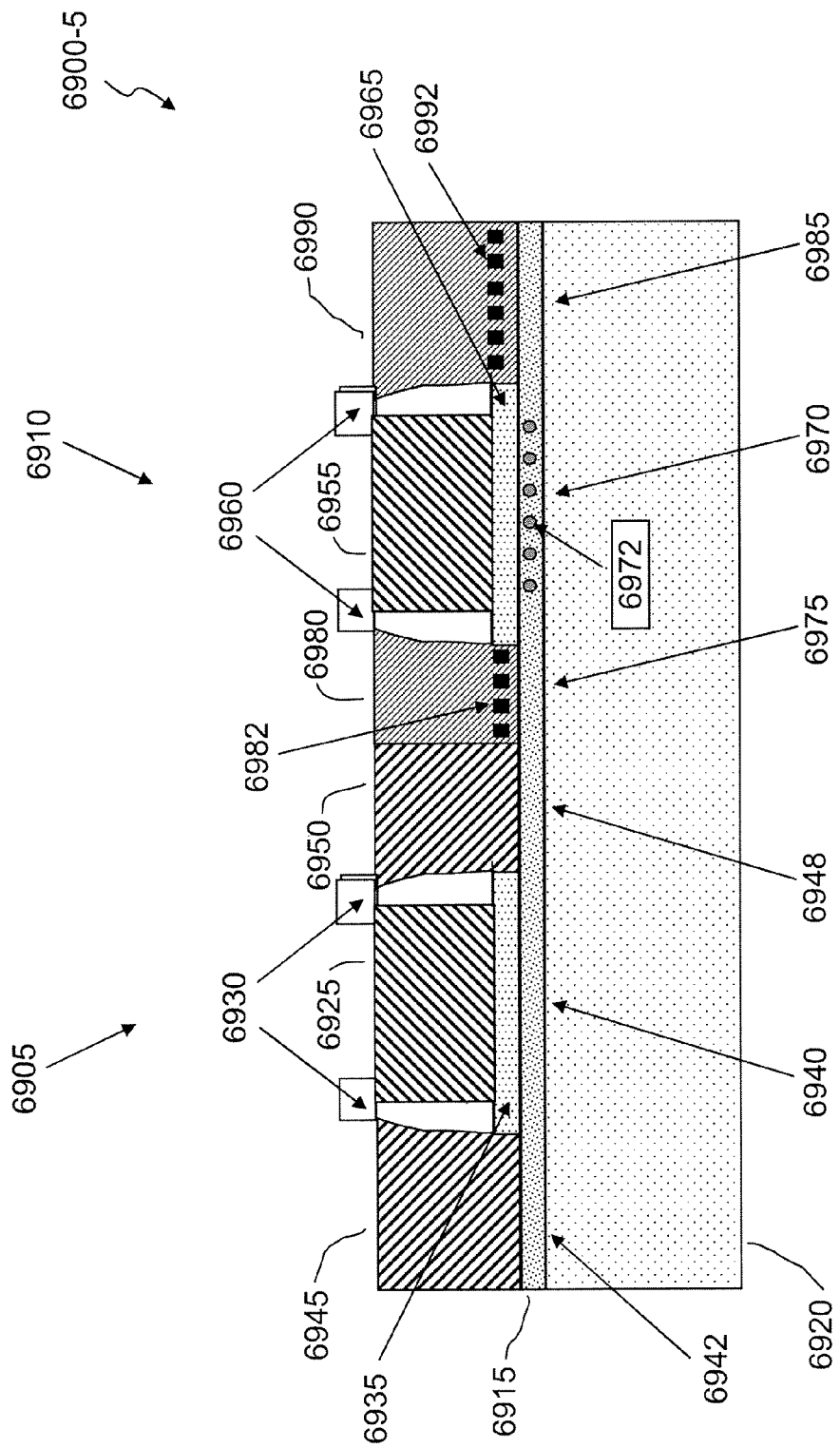
FIG. 69E shows the cross section of FIG. 69D with ion implanted atoms in the contacts of one of the device pair. The ion implanted atoms are in proximity to the semiconductor nanotube fabric in the contact region.

FIG. 69E is an illustration of adjacent CNFETs 6900-5 devices pCNFET 6905 and nCNFET 6910 in which the electrical properties of patterned semiconducting nanotube fabric 6915 may be modified by ion implantation layer 6972 in channel region 6970 to change the electrical properties of channel region 6970 from pCNFET to nCNFET behavior as described further above with respect to figure D. Gate dielectric 6965 may be changed or remain the same as described with respect to FIG. 69A. Contacts 6980 and 6990 material may be changed as described further above with respect to FIG. 69A. In addition, ion implanted layers 6982 and 6992 may be added at or near the interface between contacts 6980 and 6990 and S/D regions 6975 and 6985, respectively. Barrier contact regions form between contacts such as contacts 6980 and 6990 and underlying regions in semiconductor nanotube fabric 6915 forming S/D regions 6975 and 6985, respectively. These barrier contact regions determine electron injection and hole injection as described further above with respect to FIGS. 59 and 60 and FIG. 68. Ion implantation layers 6982 and 6992 may be used to enhance electron injection at contacts 6980 and 6990 for example.

Figure 69F:
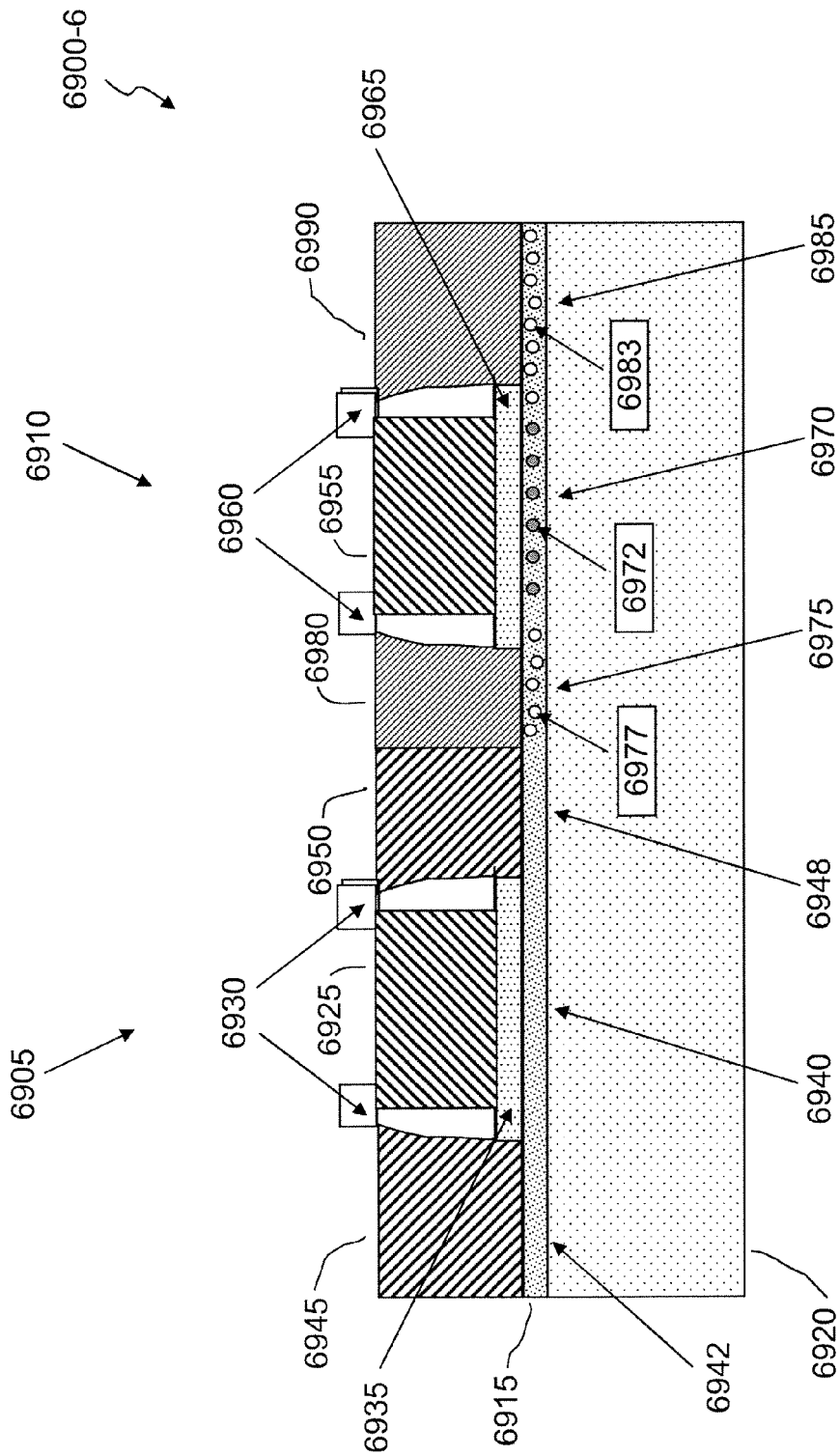
FIG. 69F shows the cross section of 69D with ion implanted atoms in the semiconductor nanotube fabric in the contact region and the channel region of one of the device pair.

FIG. 69F is an illustration of adjacent CNFETs 6900-6 devices pCNFET 6905 and nCNFET 6910 in which the electrical properties of patterned semiconducting nanotube fabric 6915 may be modified by ion implantation layer 6972 in channel region 6970 to change the electrical properties of channel region 6970 from pCNFET to nCNFET behavior as described further above with respect to FIG. 69D. Gate dielectric 6965 may be changed or remain the same as described with respect to FIG. 69A. Contacts 6980 and 6990 material may be changed as described further above with respect to FIG. 69A. In addition, ion implanted layers 6977 and 6983 may be formed in S/D regions 6975 and 6985, respectively. Ion implant layers 6977 and 6983 may be formed using boron, Si, Ge, C, or other atoms for nCNFET 6910 operation. Ion implantation layers 6982 and 6992 illustrated in FIG. 69E may also be included along with ion implantation layers 6977 and 6983. These ion implantation layers or combinations of these layers may be used to enhance electron injection at contacts 6980 and 6990 for example as described further above with respect to FIG. 69E.

In the examples described with respect to FIGS. 69A-69E, various contact, gate, and gate insulator materials may be used and ion implantation layers introduced to modify electrical characteristics. While ion implantation layers were applied to optimize nCNFET 6910, ion implant layers may be added to pCNFET 6905. Also, a common patterned semiconducting nanotube fabric 6915 was assumed for both pCNFET and nCNFET devices. However, pCNFET 6905 and nCNFET 6910 may be formed in separate deposition steps using semiconducting solutions optimized for pCNFET and nCNFET operation.

Figure 69G:
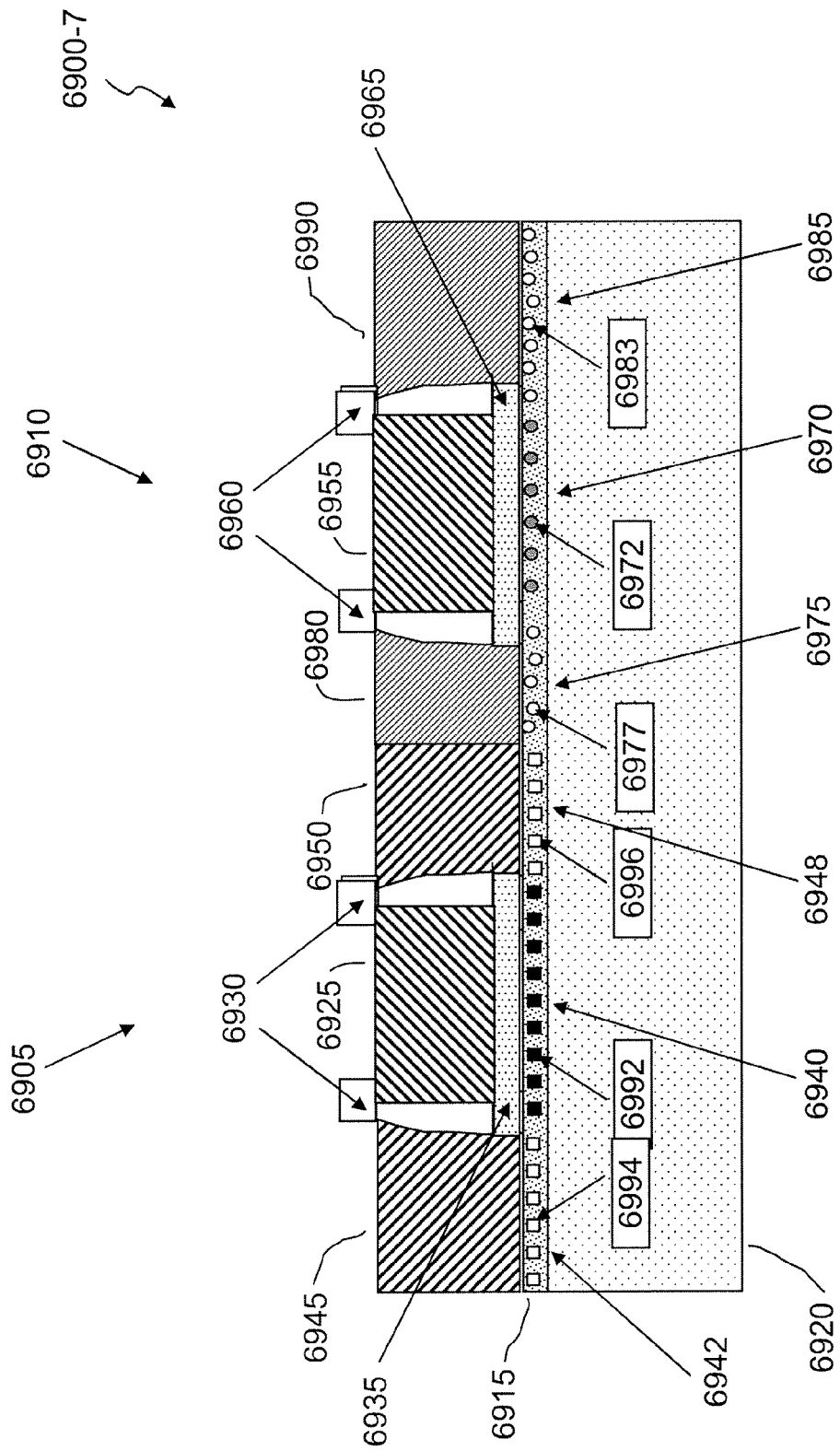

FIG. 69G is an illustration of adjacent CNFETs 6900-7 devices pCNFET 6905 and nCNFET 6910 in which the electrical properties of both pCNFET 6905 and nCNFET 6910 have been modified by ion implantation in semiconducting nanotube fabric 6915 in channel regions 6940 and 6970, respectively, and under contacts 6945 and 6950 and contacts 6980 and 6990, respectively. pCNFET 6905 electrical characteristics have been modified by ion implantation layer 6992 in channel region 6940 to optimize the electrical properties of channel region. Gate dielectric 6935 may be changed or remain the same as described with respect to FIG. 69A. Contacts 6945 and 6950 material may be changed as described further above with respect to FIG. 69A. In addition, ion implanted layers 6994 and 6996 may be formed in S/D regions 6942 and 6948, respectively. Selection of donor and acceptor ion implant atoms is described in FIGS. 68E-68J further above. Optimized nCNFET 6910 electrical characteristics formed by a combination of gate insulator 6965 thickness and dielectric constant, ion implants layer 6972 in channel region 6970, ion implant layers 6977 and 6983 in contacts 6980 and 6990 regions, respectively may result in n-type CNFET threshold voltage in the range of 0.3 to 1 volt consistent with channel lengths in the range of less than 15 to greater than 35 nm for example.

Optimized pCNFET 6905 electrical characteristics formed by a combination of gate insulator 6935 thickness and dielectric constant, ion implants layer 6992 in channel region 6940, ion implant layers 6994 and 6996 in contacts 6945 and 6950 regions, respectively may result in p-type CNFET threshold voltage in the range of −0.3 to −1 volt consistent with channel lengths in the range of less than 15 to greater than 35 nm for example.

Figure 70:
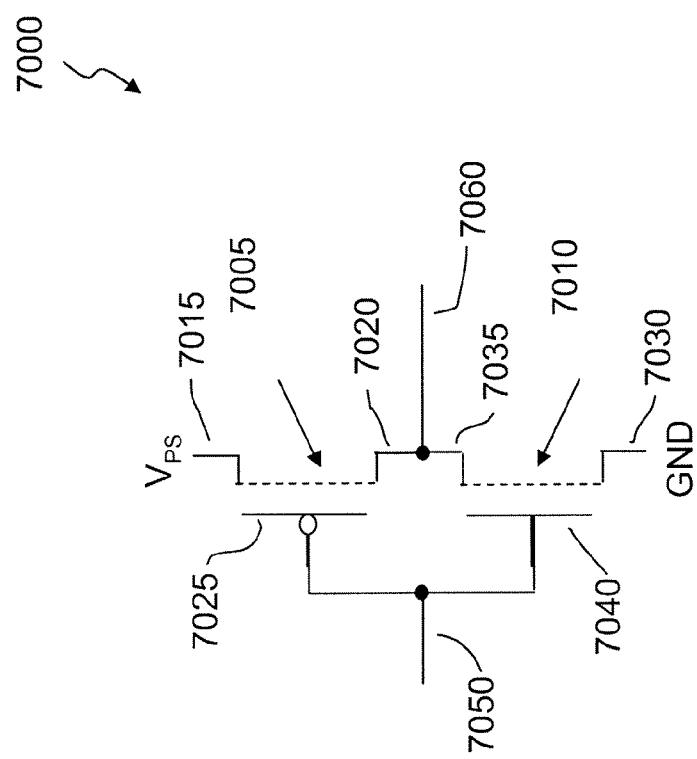

FIG. 70 is a schematic representation of complementary carbon nanotube inverter (CCN-inverter) 7000 formed by pCNFET 7005 in series with nCNFET 7010. pCNFET 7005 corresponds to pCNFET 6905 illustrated in FIGS. 69A-G and nCNFET 7010 corresponds to nCNFET 6910, also illustrated in FIGS. 69A-G. S/D 7015 is connected to power source $V_{PS}$ and corresponds to S/D region 6942 in contact with contact 6945 illustrated in FIGS. 69A-69G, S/D 7020 corresponds to S/D region 6948 in contact with contact 6950, and gate 7025 corresponds to gate 6925. S/D 7035 is connected to power source ground GND and corresponds to S/D region 6985 in contact with contact 6990 illustrated in FIGS. 69A-69G, S/D 7030 corresponds to S/D region 6975 in contact with contact 6980, and gate 7040 corresponds to gate 6955. Gates 7025 and 7040 are connected to form inverter input 7050 and S/D 7020 and 7030 are connected to form inverter output 7060.

Figure 71:
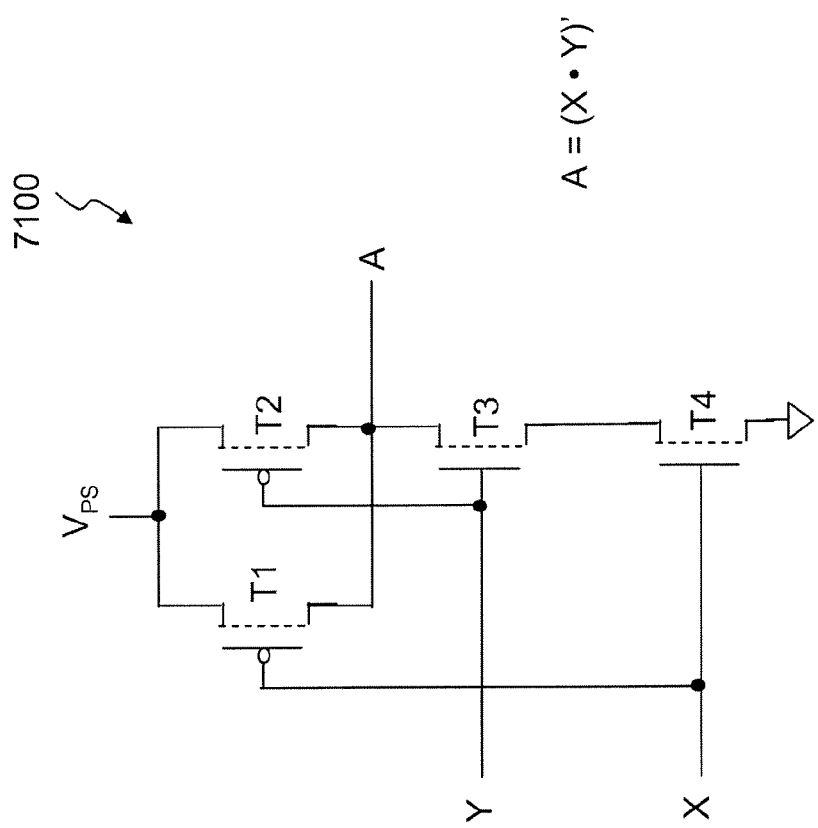

FIG. 71 is a schematic representation of complementary carbon nanotube NAND (CCN-NAND) circuit 7100 which is a two-input CNFET-based NAND circuit. pCNFETs T1 and T2 are connected in parallel with sources connected to power source $V_{PS}$ and drains connected to output A and to a drain of nCNFET T3 in series with nCNFET T4 whose source is connected to ground GND. Input X drives the gates of nCNFET T4 and pCNFET T1 and input Y drives the gates of nCNFET T3 and pCNFET T2. Logic inputs X and Y result in a CCN-NAND circuit 71000 output A in which A=(X·Y)'.

CCN-NAND circuit 7100 does not require a semiconductor substrate and may be denser than current industry CMOS circuits such as CMOS NAND circuit 3615-1 illustrated in FIG. 36B which requires a p-doped region (substrate or well) for NFETs and a n-doped region (substrate or well) for PFETs which substantially increase the area required for CMOS circuits. CCN-NAND circuit 7100 can, therefore, fit on a tighter AND array 3605 pitch corresponding to a two-input logic input circuit such as logic-In-1 circuit of logic input circuits 3615 shown in FIG. 36A. Any logic function may be realized using CCN-NAND circuit 7100. Also, since no substrate is required for the CNFET devices, CCN-NAND circuit 7100 may be placed anywhere (at any level) in the integration flow and enables three-dimensional logic integration.

CNFET devices may be used to form analog circuits such as a differential amplifier, for example. A differential amplifier formed using industry PFET and NFET devices in a semiconductor substrate is illustrated schematically and described in the reference R. Baker, H. Li, and D. Boyce, "CMOS Circuit Design, Layout, and Simulation," IEEE Press, 1998, pp. 579-583. Such a differential amplifier may also be formed using pCNFET devices and nCNFET devices such as pCNFET 6905 and nCNFET 6910 illustrated in FIGS. 69A-69F. pCNFET 6905 and nCNFET 6910 device characteristics may be optimized for various digital applications such as faster operation, or low leakage current, for example, and may also be modified for better threshold voltage tracking in analog applications, for example. Various CNFET device structural options are described further above with respect to FIGS. 69A-69G and multiple nCNFET and pCNFET optimized structures may be used in circuit design. A CNFET-based differential amplifier, such as CNFET differential amplifier 7200 illustrated in FIG. 72, may be formed at any level of a semiconductor process enabling two-D and/or three-dimensional analog function integration and integration with two-D and/or three-dimensional NRAM® and digital NanoLogic® functions as well.

CNFET differential amplifier 7200 illustrated in FIG. 72 includes nCNFETs T1, T2, T5, T6 and pCNFETs T3 and T4. Current flow $I_{SS}$ is determined by a current source formed by T5 and T6 with sources connected to common low voltage reference $V_{SS}$. The gate and drain of T5 are connected to each other, to the gate of T6, and to a first terminal of resistor R with a second terminal of resistor R connected to power source $V_{PS}$. The resistor R determines the value of current $I_{SS}$ as described in the Baker et al. reference. Resistor R may be made of metallic or semiconducting materials. Resistor R may also be formed from carbon nanotube fabrics as described in U.S. Pat. No. 7,365,632, entitled "RESISTIVE ELEMENTS USING CARBON NANOTUBES," filed on Sep. 20, 2005, the entire contents of which are incorporated herein by reference. Carbon nanotube fabric resistors maintain their values in harsh environments such high temperature an in the presence of high levels of radiation. The drain of T6 is connected to the source of T1 and T2 that form a differential pair with a first input $v_{I1}$ connected to the gate of T1 and a second input $v_{I2}$ connected to the gate of T2. Transistors T3 and T4 are used to form a current source load. The sources of M3 and M4 are connected to power source $V_{PS}$. The gate and drain of T3 are connected to each other and to the gate of transistor T4 as well as connected to the drain of T1. The drain of T4 is connected to the drain of T2. Output voltage $v_{OUT}$ reflects the difference in input voltage values between inputs $v_{I1}$ and $v_{I2}$ as described in the Baker et al. reference.

Nanotube-Based Field Programmable Analog Arrays (NF-PAAs) Based on pCNFET and nCNFET Devices and Circuits Nanotube-based NFPGA, NSPLD, and NCPLD field programmable circuits and programmable wiring using digital logic circuits are described further above. Nanotube-based field programmable analog arrays (NFPAA) may be formed using similar concepts with programmable wiring based on NV NT switches used to form programmable/reprogrammable nonvolatile crosspoint antifuses or to control FET switching matrices. FIG. 73 illustrates configurable NFPAA 7300 that may be used as a stand alone or embedded device. Wiring, such as vertical wires 7310 and horizontal wires 7315 may be programmed and reprogrammed from I/O terminals by programming NV NT switches 7320 to high (OFF) or low (ON) resistance states as described further above. Analog blocks such as differential amplifiers 7325, 7330, and 7335, precision nanofabric resistors 7340 and 7345, precision capacitors 7350 and 7355, and other analog functions 7360 and 7365 may be interconnected by programming/reprogramming NV NT switches 7320, for example. Other analog functions may include digital to analog converters, for example. Differential amplifiers 7325, 7330, and 7335 may be formed using industry PFET and NFET devices. However, differential amplifiers 7325, 7330, and 7335, and other analog circuits, may also be formed using pCNFETs and nCNFETs such as CNFET differential amplifier 7200 illustrated in FIG. 72. Also, precision nanofabric resistors 7340 and 7345 may also be used. Precision capacitors 7350 and 7355 are formed geometrically by a dielectric sandwiched between conductors and/or semiconductors as is well known in the industry. By using pCNFETs and nCNFETs for circuits decoupled from a semiconductor substrate and precision resistors and capacitors also decoupled from semiconductor substrates, NFPAA may be integrated at any level of assembly to form two-dimensional or three-dimensional functions combinations of digital and analog circuits with programmable circuits and wiring. Any combination of CNFET-based circuits such as CCN-inverter 7000 illustrated in FIG. 70, CCN-NAND circuit 7100 illustrated in FIG. 71, and CNFET differential amplifier 7200 illustrated in FIG. 72, and other CNFET circuits (not shown) may be included in configurable NFPAA 7300.

Three-Dimensional System Using Various Combinations of NRAM®, NanoLogic® Circuits, Processors and Other Functions Using Three-Dimensional Wiring An important aspect of carbon nanotube technology formed using patterned nanotube fabric and patterned semiconductor nanotube fabric is the enablement of system-level solutions using memory and logic functions that do not require a semiconductor substrate. The availability of integrated optimized complementary CNFET devices (pCNFET and nCNFET), illustrated in FIGS. 59, 60, 68, and 69 enables the implementation of memory and logic functions integrated at any level (layer) of the process; integrated with wiring layers in stacked three-dimensional layers for the most efficient placement and wiring of system functions. Such three-dimensional system implementations result in shorter and lower capacitive interconnections for higher performance and lower power dissipation. While the use of complementary CNFET-based logic, memory, and analog circuit functions offer the most desirable combination of performance and power dissipation, these circuit functions may be implemented in part or entirely using only one type of CNFET device, such as only pCNFET or only nCNFET devices for example. A three-dimensional system, such as three-dimensional system 7400 illustrated in FIG. 74, integrated with complementary CNFET devices, may be realized using any combination of the NRAM® and NanoLogic® functions described in this specification as well other functions (not shown).

NRAM® cells may use a CNFET select devices in series with NV NT switches as illustrated in FIG. 61 for example. Carbon nanotube digital circuits using CNFET devices such as illustrated in FIG. 71 and analog carbon nanotube circuits such as illustrated in FIG. 72 may be used for on-pitch driver, sense amplifier, and logic circuits to form a complete NRAM® memory function within a layer. Such complete NRAM® memory functions may be stacked for even greater density.

NanoLogic® in the form of nanotube-based logic circuits illustrated in FIGS. 11 and 12, array logic such as NFPGAs illustrated in FIGS. 12-34, NSPLD functions such as illustrated in FIGS. 35-38, and analog functions such as NFPAA illustrated in FIG. 73 may be integrated at any level (layer) of the process because FET devices have been replace by CNFET devices that do not require a semiconductor substrate.

By way of example, FET devices such as FET 1165 illustrated in FIG. 11B, and all FET devices illustrated in FIG. 12 including FET devices used to form logic functions such as NAND gate 1260 and NOR gate 1280 may be replaced with CNFET devices; all FET devices and circuits formed using FET devices illustrated in FIGS. 13, 14, 16, 17, 18, may be replaced with CNFET devices; all FET devices and circuits formed using FET devices illustrated in FIGS. 19-24 may be replaced with CNFET devices; all FET devices in nonvolatile SRAM cells illustrated in FIGS. 25 and 26 may be replaced with CNFET devices; all FET devices and circuits formed using FET devices in the shift register illustrated in FIGS. 27 and 28 may be replaced with CNFET devices; all FET devices and circuits formed using FET devices illustrated in FIGS. 29 and 30 may be replaced with CNFET devices; all FET devices and circuits formed using FET devices illustrated in FIGS. 31-34 may be replaced with CNFET devices; all FET devices and circuits formed using FET devices illustrated in FIGS. 35-38 may be replaced with CNFET devices; all FET devices and circuits formed using FET devices illustrated in FIGS. 39-44 and 48 may be replaced with CNFET devices; all FET devices and circuits formed using FET devices illustrated in FIGS. 56-58 may be replaced with CNFET devices; and all FET devices and circuits formed using FET devices illustrated in FIG. 73 may replaced with CNFET devices.

Multiple microprocessors capable of high performance may also be designed and fabricated using optimized complementary pCNFET and nCNFET devices. These processors may be connected to subsystems such as high speed caches also formed using for example. These subfunctions may be on at the same integration level (layer) or integrated in other layers.

These and other functions may be formed in various stacked layers and be interconnected by horizontal and vertical wiring in a three-dimensional system implementation as illustrated by three-dimensional system 7400 illustrated in FIG. 74. Power dissipation and control of timing is very important three-dimensional system 7400. Each processor operating frequency is controlled by a system controller and by precision timing functions (PTFs) illustrated in FIGS. 39-48 to maximize the three-dimensional system 7400 operation.

System security may be provided by a security function that rapidly changes the state of NV NT switches such that information is deleted and logic is rewired without leaving a trace. This is because NV NT switches are difficult to physically cross section and examine. Also, NV NT switches leave no trace of prior storage states.

FIG. 74 illustrates three-dimensional system 7400. Three-dimensional system 7400 is formed using patterned nanotube mixed metallic and semiconductor nanotube fabric-based devices such as NV NT switches for example and patterned semiconductor nanotube fabric-based devices such as CNFET devices forming nonvolatile storage nodes, electrical circuits, and various logic and memory subsystem functions described further above. No semiconductor substrate is required. However, NV NT switches and CNFET devices are formed using semiconductor process tools and are compatible with semiconductor fabricators, therefore three-dimensional system 7400 may also be formed on a semiconductor substrate which includes memory and logic functions as well.

Three-dimensional system 7400 includes five levels (layers). Each level (layers) may include multiple contacts and interconnect layers as well NRAM®, NanoLogic®, processors, other electronic digital or analog functions, and other I/O functions as illustrated in FIG. 74. I/O functions may include, for example, electrical, optical, or any other coupling method. In this example, level 7401 includes analog NFPAA 7412, I/O function 7415, NRAM® 7417, and security function 7470. Level (layer) 7403 includes processor 7420 and subsystem 7422 interconnected by BUS 7424 and includes precision timing function PTF 7426. Level (layer) 7405 includes subsystem 7430 interconnected with processor 7420 on level (layer) 7403 by BUS 7432 and includes PTF 7434. Precision timing functions are described further above with respect to FIGS. 39-43 and are used to synchronize processor and subsystem operation. In this example, PTF 7426 that synchronizes processor 7420 and subsystem 7430 placed in the same level (layer) and PTF 7434 that synchronizes processor 7420 and subsystem 7430 placed on different levels and interconnected by a combination of horizontal and vertical three-dimensional wiring. Subsystems 7422 and 7430 may be high speed caches for example. Level (layer) 7405 also includes NanoLogic® 7465. Level (layer) 7407 includes processor 7440 and subsystem 7442 interconnected by BUS 7442 which includes PTF 7444. Level (layer) 7409 includes NanoLogic® functions NFPGA 7450, NCPLD 7452, and NSPLD 7454 as well as system controller 7410. The three-dimensional system 7400 further includes power and ground supplies which are not shown.

Only a few examples of two dimensional wiring within levels (layers) and three-dimensional wiring between levels (layers) are shown in FIG. 74. BUS 7424 and BUS 7442 are examples of two-dimensional horizontal wiring. BUS 7432 is an example of three-dimensional wiring between functions in level (layer) 7403 and 7405. Security function 7470 wiring is two dimensional such as input wire 7472 and wire 7476 connected to NRAM® 7417. In this example, security function 7470 three-dimensional wire 7478 interconnects security function 7470 with at least one function in each of the levels (layers). For example, wire 7480 connects with processor 7420, NanoLogic® 7465, subsystem 7442, and NFPGA 7450. Wire 7880 may be one or more wires. BUS 7424, 7434, and 7442 may use multiple wires per bus. System controller 7410 is connected (not shown) to various functions in each of levels (layers) 7401, 7403, 7405, 7407, and 7409.

Three-dimensional system 7400 operation is enabled by CNTFET and NV NT switch technology decoupled from semiconductor substrate requirements. Also, nonvolatile logic array functions such as NFPGA 7450, NCPLD 7452, NSPLD 7454 are enabled by NV NT switches that can be programmed and reprogrammed so that 100% pretested and cycled for reliability (if needed) NV NT switches are available for programming. Programmable and reprogrammable switches are also used as part of precision timing functions PTF 7426, 7434, and 7444 to manage power and data timing for three-dimensional system 7400 enabling various functions to be placed at various distances and stacked in various levels (layers) while maintaining data timing integrity. Security is ensured by security function 7470 which can rapidly reconfigure a system without leaving a trace.

Self-timed circuits enable the optimization of function, performance, and power dissipation. The function of this three-dimensional system may be modified remotely in an application, even in space for example, because of the NRAM® memory and NanoLogic® circuit functions such as NFPGAs and self-timed NanoLogic®-based precision timing functions that can readjust three-dimensional system 7400 timing.

Figure 60B:
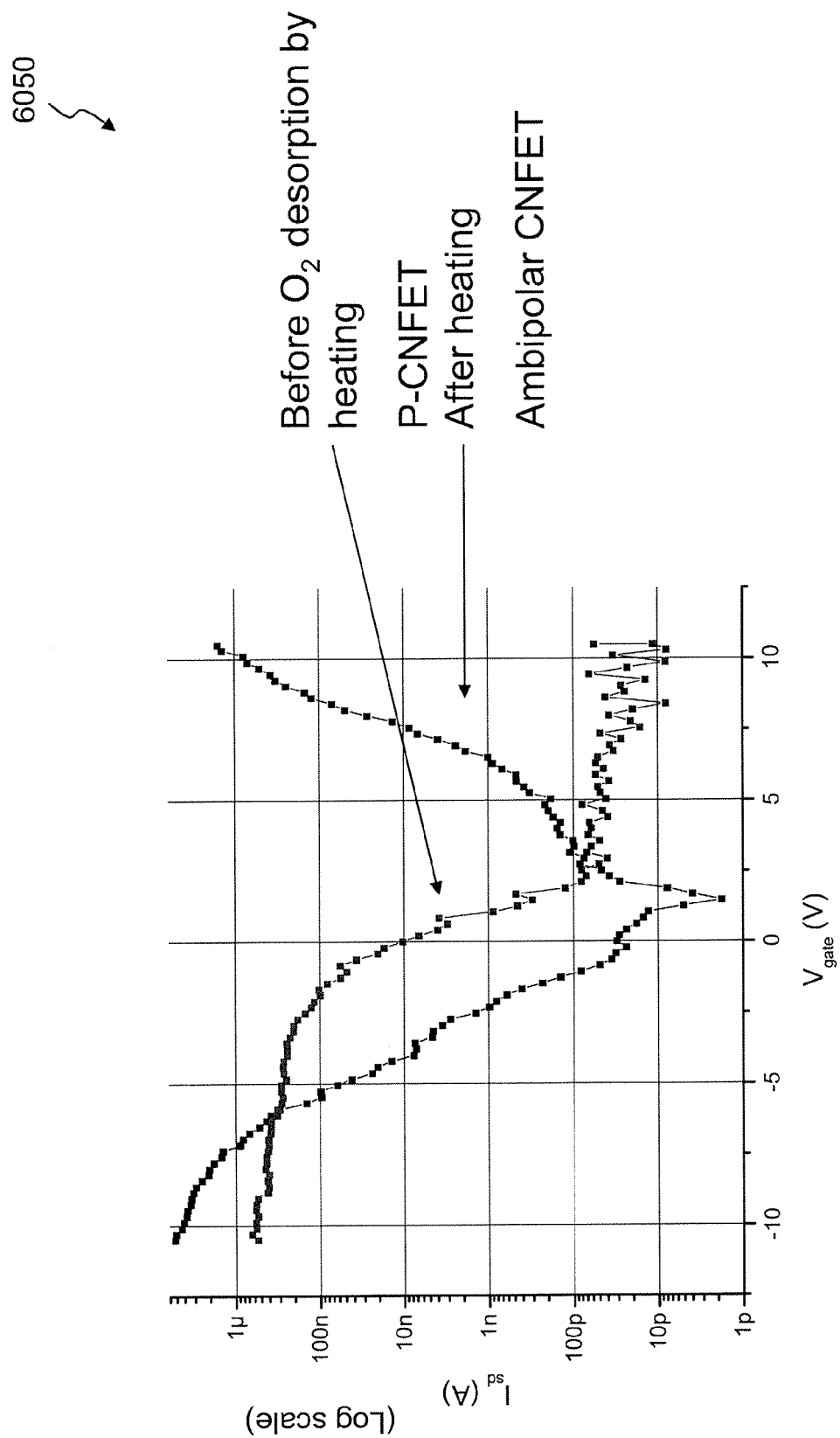
FIG. 60B shows an electrical characteristic of an ambipolar CNFET device.

While a semiconductor substrate is not required in the implementation of three-dimensional system 7400 and is not shown in FIG. 74, functioning CNFET devices have been fabricated as illustrated in FIGS. 60A and 60B and described in incorporated U.S. patent application Ser. No. 11/332,529, "Field effect device having a channel of nanofabric and methods of making same," filed on Jan. 13, 2006, and U.S. patent application Ser. No. 11/332,080, entitled "HYBRID CARBON NANOTUBE FET(CNFET)-FET STATIC RAM (SRAM) AND METHOD OF MAKING SAME," filed on Jan. 13, 2006, and working NV NT switch and NV NT block switch devices have been fabricated on insulators deposited on semiconductor wafers as described in incorporated U.S. patent application Ser. No. 11/280,786, entitled "Two-terminal nanotube devices and systems and methods of making same," filed on Nov. 15, 2005, U.S. patent application Ser. No. 11/835,651, entitled "NONVOLATILE NANOTUBE DIODES AND NONVOLATILE NANOTUBE BLOCKS AND SYSTEMS USING SAME AND METHODS OF MAKING SAME," filed on Aug. 8, 2007, and U.S. patent application Ser. No. 11/835,613, entitled "MEMORY ELEMENTS AND CROSS POINT SWITCHES AND ARRAYS OF SAME USING NONVOLATILE NANOTUBE BLOCKS," filed on Aug. 8, 2007. Therefore, when desirable electrical functions are available in a semiconductor substrate such as silicon for example, then the levels (layers) such as layers 7401, 7403, 7405, 7407, and 7409 can be integrated on semiconductor substrates that include the desired electrical functions.

Incorporated Patent References

The following commonly-owned patent references, referred to herein as "incorporated patent references," describe various techniques for creating nanotube elements (nanotube fabric articles and switches), e.g., creating and patterning nanotube fabrics, logic circuits formed therefrom, devices and structures using nanotube articles and switches, etc. and are incorporated by reference in their entireties:

U.S. patent application Ser. No. 11/280,786, filed on Nov. 15, 2005, entitled TWO-TERMINAL NANOTUBE DEVICES AND SYSTEMS AND METHODS OF MAKING SAME;

U.S. patent application Ser. No. 11/835,583, filed on Aug. 8, 2007, entitled LATCH CIRCUITS AND OPERATION CIRCUITS HAVING SCALABLE NONVOLATILE NANOTUBE SWITCHES AS ELECTRONIC FUSE REPLACEMENT ELEMENTS;

U.S. patent application Ser. No. 11/835,612, filed on Aug. 8, 2007, entitled NONVOLATILE RESISTIVE MEMORIES HAVING SCALABLE TWO-TERMINAL NANOTUBE SWITCHES;

U.S. patent application Ser. No. 11/835,651, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,759, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,845, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,852, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,856, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,865, filed on Aug. 8, 2007, entitled NONVOLATILE NANOTUBE DIODES AND NONVOLATILE NANOTUBE BLOCKS AND SYSTEMS USING SAME AND METHODS OF MAKING SAME;

U.S. patent application Ser. No. 11/835,613, filed on Aug. 8, 2007, entitled MEMORY ELEMENTS AND CROSS POINT SWITCHES AND ARRAYS OF SAME USING NONVOLATILE NANOTUBE BLOCKS;

U.S. Patent Application No. 61/039,204, filed on Mar. 25, 2008, entitled CARBON NANOTUBE-BASED NEURAL NETWORKS AND METHODS OF MAKING AND USING SAME;

U.S. Pat. No. 7,394,687, filed on Nov. 15, 2005, entitled NON-VOLATILE SHADOW LATCH USING A NANOTUBE SWITCH;

U.S. patent application Ser. No. 12/165,007, filed on Jun. 30, 2008, entitled NON-VOLATILE SHADOW LATCH USING A NANOTUBE SWITCH;

U.S. patent application Ser. No. 11/274,967, filed on Nov. 15, 2005, entitled MEMORY ARRAYS USING NANOTUBE ARTICLES WITH REPROGRAMMABLE RESISTANCE;

U.S. Pat. No. 7,115,901, filed on Jun. 9, 2004, entitled NON-VOLATILE ELECTROMECHANICAL FIELD

EFFECT DEVICES AND CIRCUITS USING SAME AND METHODS OF FORMING SAME;

U.S. Pat. No. 7,268,044, filed on Oct. 2, 2006, entitled NON-VOLATILE ELECTROMECHANICAL FIELD EFFECT DEVICES AND CIRCUITS USING SAME AND METHODS OF FORMING SAME;

U.S. patent application Ser. No. 11/731,946, filed on Apr. 2, 2007, entitled NON-VOLATILE ELECTROMECHANICAL FIELD EFFECT DEVICES AND CIRCUITS USING SAME AND METHODS OF FORMING SAME;

U.S. Pat. No. 6,982,903, filed on Jun. 9, 2004, entitled FIELD EFFECT DEVICES HAVING A SOURCE CONTROLLED VIA A NANOTUBE SWITCHING ELEMENT;

U.S. Pat. No. 7,280,394, filed on Jun. 9, 2004, entitled FIELD EFFECT DEVICES HAVING A DRAIN CONTROLLED VIA A NANOTUBE SWITCHING ELEMENT;

U.S. Pat. No. 7,211,854, filed on Jun. 9, 2004, entitled FIELD EFFECT DEVICES HAVING A GATE CONTROLLED VIA A NANOTUBE SWITCHING ELEMENT;

U.S. patent application Ser. No. 11/742,290, filed on Apr. 30, 2007, entitled FIELD EFFECT DEVICES HAVING A GATE CONTROLLED VIA A NANOTUBE SWITCHING ELEMENT;

U.S. Pat. No. 7,301,802, filed on Jun. 9, 2004, entitled CIRCUIT ARRAYS HAVING CELLS WITH COMBINATIONS OF TRANSISTORS AND NANOTUBE SWITCHING ELEMENTS;

U.S. Pat. No. 7,112,493, filed on Jun. 9, 2004, entitled METHOD OF MAKING NON-VOLATILE FIELD EFFECT DEVICES AND ARRAYS OF SAME;

U.S. patent application Ser. No. 11/527,127, filed on Sep. 26, 2006, entitled METHOD OF MAKING NON-VOLATILE FIELD EFFECT DEVICES AND ARRAYS OF SAME;

U.S. Pat. No. 7,115,960, filed on Aug. 13, 2004, entitled NANOTUBE-BASED SWITCHING ELEMENTS;

U.S. patent application Ser. No. 11/542,524, filed on Oct. 3, 2006, entitled NANOTUBE-BASED SWITCHING ELEMENTS;

U.S. Pat. No. 6,990,009, filed on Aug. 13, 2004, entitled NANOTUBE-BASED SWITCHING ELEMENTS WITH MULTIPLE CONTROLS;

U.S. Pat. No. 7,339,401, filed on Aug. 4, 2005, entitled NANOTUBE-BASED SWITCHING ELEMENTS WITH MULTIPLE CONTROLS;

U.S. patent application Ser. No. 11/971,476, filed on Jan. 9, 2008, entitled NANOTUBE-BASED SWITCHING ELEMENTS WITH MULTIPLE CONTROLS;

U.S. Pat. No. 7,228,970, filed on Sep. 24, 2001, entitled INTEGRATED NANOTUBE AND FIELD EFFECT SWITCHING DEVICE;

U.S. patent application Ser. No. 11/929,076, filed on Oct. 30, 2007, entitled INTEGRATED NANOTUBE AND FIELD EFFECT SWITCHING DEVICE;

U.S. Pat. No. 7,329,931, filed on Jan. 10, 2005, entitled RECEIVER CIRCUIT USING NANOTUBE-BASED SWITCHES AND TRANSISTORS;

U.S. patent application Ser. No. 12/029,118, filed on Feb. 11, 2008, entitled RECEIVER CIRCUIT USING NANOTUBE-BASED SWITCHES AND TRANSISTORS;

U.S. Pat. No. 7,330,709, filed on Jan. 10, 2005, entitled RECEIVER CIRCUIT USING NANOTUBE-BASED SWITCHES AND LOGIC;

U.S. patent application Ser. No. 12/029,661, filed on Feb. 12, 2008, entitled RECEIVER CIRCUIT USING NANOTUBE-BASED SWITCHES AND LOGIC;

U.S. Pat. No. 7,164,744, filed on Jan. 10, 2005, entitled NANOTUBE-BASED LOGIC DRIVER CIRCUITS;

U.S. Pat. No. 7,265,575, filed on Jan. 16, 2007, entitled NANOTUBE-BASED LOGIC DRIVER CIRCUITS;

U.S. patent application Ser. No. 11/897,812, filed on Aug. 31, 2007, entitled NANOTUBE-BASED LOGIC DRIVER CIRCUITS;

U.S. Pat. No. 7,161,403, filed on Jan. 16, 2007, entitled STORAGE ELEMENTS USING NANOTUBE SWITCHING ELEMENTS;

U.S. Pat. No. 7,405,605, filed on Jan. 9, 2007, entitled STORAGE ELEMENTS USING NANOTUBE SWITCHING ELEMENTS;

U.S. patent application Ser. No. 12/147,315, filed on Jun. 26, 2008, entitled STORAGE ELEMENTS USING NANOTUBE SWITCHING ELEMENTS;

U.S. Pat. No. 7,167,026, filed on Jan. 10, 2005, entitled TRI-STATE CIRCUIT USING NANOTUBE SWITCHING ELEMENTS;

U.S. Pat. No. 7,288,961, filed on Jan. 22, 2007, entitled TRI-STATE CIRCUIT USING NANOTUBE SWITCHING ELEMENTS;

U.S. patent application Ser. No. 11/928,538, filed on Oct. 30, 2007, entitled TRI-STATE CIRCUIT USING NANOTUBE SWITCHING ELEMENTS;

U.S. Pat. No. 6,706,402, filed on Apr. 23, 2002, entitled NANOTUBE FILMS AND ARTICLES;

U.S. Pat. No. 6,942,921, filed on Feb. 11, 2004, entitled NANOTUBE FILMS AND ARTICLES;

U.S. patent application Ser. No. 10/774,682, filed on Feb. 9, 2004, entitled NANOTUBE FILMS AND ARTICLES;

U.S. patent application Ser. No. 11/111,582, filed on Apr. 21, 2005, entitled NANOTUBE FILMS AND ARTICLES;

U.S. Pat. No. 6,835,591, filed on Apr. 23, 2002, entitled METHODS OF NANOTUBE FILMS AND ARTICLES;

U.S. Pat. No. 7,264,990, filed on Dec. 13, 2004, entitled METHODS OF NANOTUBE FILMS AND ARTICLES;

U.S. Pat. No. 7,335,528, filed on Dec. 8, 2004, entitled METHODS OF NANOTUBE FILMS AND ARTICLES;

U.S. patent application Ser. No. 10/341,130, filed on Jan. 13, 2003, entitled CARBON NANOTUBE FILMS, LAYERS, FABRICS, RIBBONS, ELEMENTS AND ARTICLES; and U.S. patent application Ser. No. 12/486,602, filed on Jun. 17, 2009, entitled NRAM ARRAYS WITH NANOTUBE BLOCKS, NANOTUBE TRACES, AND NANOTUBE PLANES AND METHODS OF MAKING SAME.

The invention may be embodied in other specific forms without departing from the spirit or essential characteristics thereof. The present embodiments are therefore to be considered in respects as illustrative and not restrictive.

What is claimed is:

1. A nonvolatile nanotube memory cell comprising:
a nanotube field effect transistor comprising:
- a first nanotube fabric article, the first nanotube fabric article comprising a semiconducting nanotube fabric and having a drain region and a source region in a spaced relation to one another, wherein the spaced relation defines a channel region in the first nanotube fabric article;
- a gate node electrically coupled to the first nanotube fabric, wherein the gate node modulates the conductivity of the channel region to form or unform a first electrically conductive channel between the source and drain regions in response to a first electrical stimulus; and a nanotube switching element comprising:
- a second nanotube fabric article electrically coupled to the source region of the nanotube field effect transistor and an electrode;
- the second nanotube fabric article forming or unforming a second electrically conductive channel between the source region and the electrode in response to a second electrical stimulus on at least the electrode;

wherein the forming of the first and second electrically conductive channels corresponds to at least a first memory state of the nanotube memory cell;

wherein the unforming of the first and second electrically conductive channels corresponds to at least a second memory state of the nanotube memory cell.

* * * * *